(12) United States Patent
Nagata et al.

(10) Patent No.: US 9,081,273 B2
(45) Date of Patent: Jul. 14, 2015

(54) RADIATION-SENSITIVE COLORED COMPOSITION, COLOR FILTER, METHOD FOR PRODUCING A COLOR PATTERN, METHOD FOR PRODUCING COLOR FILTER, SOLID-STATE IMAGING DEVICE, AND LIQUID CRYSTAL DISPLAY APPARATUS

(75) Inventors: Yuzo Nagata, Haibara-gun (JP); Atsuyasu Nozaki, Haibara-gun (JP); Kenta Ushijima, Haibara-gun (JP); Yushi Kaneko, Haibara-gun (JP); Yousuke Murakami, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 652 days.

(21) Appl. No.: 13/428,926

(22) Filed: Mar. 23, 2012

(65) Prior Publication Data
US 2012/0242940 A1     Sep. 27, 2012

(30) Foreign Application Priority Data

Mar. 25, 2011 (JP) .................. 2011-068983
Aug. 22, 2011 (JP) .................. 2011-180864

(51) Int. Cl.
| G03F 7/004 | (2006.01) |
| --- | --- |
| G02B 5/20 | (2006.01) |
| G03F 7/00 | (2006.01) |
| G02F 1/1335 | (2006.01) |
| C09B 69/10 | (2006.01) |
| G03F 7/027 | (2006.01) |
| G03F 7/033 | (2006.01) |
| G03F 7/105 | (2006.01) |
| G02B 5/22 | (2006.01) |
| H01L 27/146 | (2006.01) |

(52) U.S. Cl.
CPC ............ *G03F 7/0007* (2013.01); *C09B 69/101* (2013.01); *C09B 69/105* (2013.01); *C09B 69/108* (2013.01); *C09B 69/109* (2013.01); *G02F 1/133516* (2013.01); *G03F 7/027* (2013.01); *G03F 7/033* (2013.01); *G03F 7/105* (2013.01); *G02B 5/201* (2013.01); *G02B 5/223* (2013.01); *G02F 2202/022* (2013.01); *G02F 2202/023* (2013.01); *G02F 2202/04* (2013.01); *H01L 27/14621* (2013.01)

(58) Field of Classification Search
CPC . G03F 7/0007; G03F 7/105; G03F 1/133516; G02B 5/223
USPC ............. 430/7, 270.1; 349/106; 257/432, 440
See application file for complete search history.

(56) References Cited

U.S. PATENT DOCUMENTS

| 6,509,125 B1 | 1/2003 | Ito et al. | |
| 2008/0076044 A1 | 3/2008 | Mizukawa et al. | |
| 2013/0012648 A1* | 1/2013 | Fujie et al. | 524/547 |

FOREIGN PATENT DOCUMENTS

| JP | 06-075375 A | 3/1994 |
| JP | 2000-162429 A | 6/2000 |
| JP | 2005-316012 A | 11/2005 |
| JP | 3736221 B2 | 1/2006 |
| JP | 2008-292970 A | 12/2008 |
| WO | WO 2011/122707 A1 * | 10/2011 |

OTHER PUBLICATIONS

Printout of www.chemicalize.org/structure/#!mol=thiomalic+acid (Dec. 2014).*

* cited by examiner

*Primary Examiner* — John A McPherson
(74) *Attorney, Agent, or Firm* — Sughrue Mion, PLLC

(57) ABSTRACT

The radiation-sensitive colored composition contains (A) a dye polymer containing a structural unit having a dye structure polymerized using a chain-transfer agent having a LogP value of 5 or less, and (B) a solvent.

14 Claims, No Drawings

RADIATION-SENSITIVE COLORED COMPOSITION, COLOR FILTER, METHOD FOR PRODUCING A COLOR PATTERN, METHOD FOR PRODUCING COLOR FILTER, SOLID-STATE IMAGING DEVICE, AND LIQUID CRYSTAL DISPLAY APPARATUS

BACKGROUND OF THE INVENTION

1. Field of the Invention

The present invention relates to a color-sensitive radiation composition, a color filter having a color pattern formed using the color-sensitive radiation composition, a method for producing a color pattern, furthermore, a solid-state imaging device using the color filter, and a liquid crystal display apparatus.

2. Description of the Related Art

Recently, in accordance with the development of personal computers, in particular, large-screen liquid crystal televisions, liquid crystal displays (LCD), in particular, color liquid crystal displays have tended to be in increased demand. In accordance with the demand for higher image qualities, predominance of organic EL displays is required. Meanwhile, as digital cameras, camera-mounted mobile phones are predominant, and solid-state imaging devices such as CCD image sensors are also being rapidly developed.

Color filters are used as key devices of displays or imaging devices, and the demand for higher quality and cost reduction is increasing. A color filter commonly includes color patterns with three colors of red (R), green (G), and blue (B) and divides light that passes through displays or imaging devices into three colors.

Coloring agents used for color filters require the following characteristics in common. That is, coloring agents should have spectral characteristics that are desirable in terms of color reproduction, be free from optical disorders such as light scattering that causes deterioration in contrast of liquid crystal displays and non-uniform optical concentration that causes color unevenness in solid-state imaging devices, have superior resistance such as heat resistance, light resistance and moisture resistance under environmental conditions, and have a high molar extinction coefficient and ability to be formed into thin films. For this reason, a pigment is generally used as a coloring agent.

Recently, higher accuracy of color filters for solid-state imaging devices has been required.

However, it is difficult to further improve resolution of a means using a pigment as a conventional coloring agent, since color unevenness is caused by coarse particles of the pigment. In addition, when a pigment is used as a coloring agent with respect to liquid crystal displays, the manufactured liquid crystal displays exhibit superior light resistance or heat resistance, but have a problem in which contrast is deteriorated or haze is increased in order to realize light scattering by pigment particles.

For this reason, use of dyes other than pigments as coloring agents may be considered. When a dye is used as a coloring agent, color filters for solid-state imaging devices solve the problem of color unevenness, thus accomplishing high resolution. In color filters for liquid crystal displays or organic EL displays, improvement in optical properties such as contrast or haze is expected.

Under the aforementioned circumstances, use of dyes as coloring agents is considered. (For example, see JP-1994-75375A (JP-H6-75375A)). However, disadvantageously, a curable composition containing a dye generally has lower light resistance or heat resistance than a pigment and tends to inhibit radical polymerization reaction, has a low solubility in an alkali aqueous solution or an organic solvent (hereinafter, also referred to simply as a solvent), thus making it difficult to obtain a curable composition having a desired spectrum, and often exhibits interactions with other components, thus making it difficult to control solubility of uncured parts (development property). For this reason, formation of thin films and color patterns of color filters with superior resistance at a high accuracy using a dye has been difficult to date.

Regarding such problems, a variety of methods such as selection of the type of conventional initiators or increase of added amount of initiators are suggested (for example, see JP-2005-316012A).

Also, focusing on spectral characteristics suitable for color filters, a radiation-sensitive colored composition and a dye compound using a dipyrromethane dye is considered (for example, see JP-2008-292970A).

Also, to solve problems associated with a sublimation property in production of color filters, a color filter containing a polymer having a triphenylmethane dye in the molecule as a coloring agent is suggested (for example, see JP-3736221B).

SUMMARY OF THE INVENTION

However, although dye polymers having a dye structure are used as coloring agents, they cannot satisfy increasing needs from the market for color unevenness or contrast. Accordingly, there is need for novel improvement.

The present invention has been made in consideration of these points and is designed to accomplish the following objects.

That is, it is a first object of the present invention to provide a radiation-sensitive colored composition that contains a dye polymer containing structural units having a dye structure, thus enabling formation of coatings with uniform color in which color unevenness is inhibited, exhibiting a superior development property in non-exposed regions after an exposure process, and pattern formability when color patterns are formed.

It is a second object of the present invention to provide a method for producing a color pattern that enables formation of coatings with uniform color in which color unevenness is inhibited and color patterns having an excellent shape.

It is a third object of the present invention to provide a color filter that is formed using the color-sensitive radiation composition, inhibits concentration evenness and has a colored region with superior color characteristics, and a liquid crystal display apparatus and a solid-state imaging device including the color filter.

As a result of repeated research, the inventors of the present invention discovered that dye polymers capable of inhibiting color unevenness of the radiation-sensitive colored composition can be obtained by incorporating a specific chain-transfer agent when dye polymers are synthesized. The present invention has been completed based on this discovery.

That is, the radiation-sensitive colored composition of the present invention obtained by accomplishing the objects contains (A) a dye polymer containing a structural unit having a dye structure polymerized using a chain-transfer agent having a LogP value of 5 or less, and (B) a solvent.

In a preferred embodiment of the present invention, the chain-transfer agent having a LogP value of 5 or less may be an alkyl mercaptan or an alkyl mercaptan having 10 or less carbon atoms, or an alkyl mercaptan having at least one structure selected from an ester structure, and an ether structure.

Also, in a preferred embodiment of the present invention, the dye structure is derived from a dipyrromethane metal complex compound or a tautomer thereof obtained from a dipyrromethane compound represented by formula (III) and a metal or metal compound.

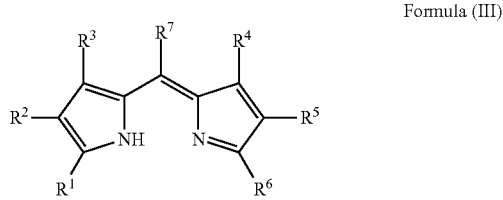

Formula (III)

[in formula (III), $R^1$, $R^2$, $R^3$, $R^4$, $R^5$, and $R^6$ each independently represent a hydrogen atom or a monovalent substituent group, $R^7$ represents a hydrogen atom, a halogen atom, an alkyl group, an aryl group or a heterocyclic group, $R^1$ and $R^6$ are not bonded together to form a ring] Also, the radiation-sensitive colored composition of the present invention further contains (C) a polymer having a different structure from (A) the dye polymer, further contains (D) a pigment, (C) a polymer having a different structure from (A), as a pigment dispersant, and further contains (E) a polymerizable compound, and (F) a polymerization initiator.

The present invention provides a color filter with color patterns formed on a substrate using the color-sensitive radiation composition.

Also, the present invention provides a method for producing a color pattern including applying the radiation-sensitive colored composition to a support to form a radiation-sensitive colored composition layer, exposing the formed radiation-sensitive colored composition layer and developing the radiation-sensitive colored composition layer after exposure to remove a non-exposed region.

Also, the present invention provides a method for producing a color filter including applying the radiation-sensitive colored composition to a substrate to form a radiation-sensitive colored layer and exposing the radiation-sensitive colored layer.

Also, the present invention provides a solid-state imaging device or a liquid crystal display apparatus including the color filter.

Actions of the radiation-sensitive colored composition of the present invention to solve these objects are not clear, but are thought to be as follows.

That is, (A) the dye polymer containing a structural unit having a dye structure polymerized using a chain-transfer agent having a LogP value of 5 or less has a structure in which a hydrophilic moiety derived from a chain-transfer agent is incorporated into a polymer end. For this reason, compatibility with other components that coexist in the dye polymer and the composition, in particular, (C) the polymer having a different structure from (A) the dye polymer is improved, phase separation during application is inhibited, and color unevenness caused by phase separation of dye polymer in thin films is inhibited. In particular, when (C) the polymer having a different structure from (A) the dye polymer is used as a pigment dispersant, the effects are remarkable. Also, since the hydrophilic moiety is incorporated into an end of (A) the dye polymer, hydrophilicity of the entire polymer is improved and a development property is enhanced.

Accordingly, by using the radiation-sensitive colored composition of the present invention, color filters in which color unevenness is inhibited and which have superior color characteristics can be produced.

Effects of the Invention

According to the present invention, provided is a radiation-sensitive colored composition that contains a dye polymer containing structural units having a dye structure, thus enabling formation of coatings with uniform color in which color unevenness is inhibited.

According to the present invention, provided is a radiation-sensitive colored composition that exhibits a superior development property in non-exposed regions after an exposure process and pattern formability when color patterns are formed.

According to the present invention, provided is a method for producing a color pattern that enables formation of coatings with uniform color in which color unevenness is inhibited and color patterns having an excellent shape.

According to the present invention, provided is a color filter that is formed using the color-sensitive radiation composition, inhibits concentration evenness and has a colored region with superior color characteristics, and a liquid crystal display apparatus and a solid-state imaging device including the color filter.

DESCRIPTION OF THE PREFERRED EMBODIMENTS

Hereinafter, the color-sensitive radiation composition, the color filter, the color pattern, the method for producing a color filter, the solid-state imaging device, and the liquid crystal display apparatus according to the present invention will be described in detail.

<<Color-sensitive Radiation Composition>>

The radiation-sensitive colored composition of the present invention may contains (A) a dye polymer containing a structural unit having a dye structure polymerized using a chain-transfer agent having a LogP value of 5 or less (hereinafter, suitably referred to as "specific dye polymer"), and (B) a solvent, and optionally, (C) a polymer other than (A) the specific dye polymer, (D) a pigment, (E) a polymerizable compound, and (F) a polymerization initiator and the like.

Hereinafter, components contained in the radiation-sensitive colored composition of the present invention will be described.

<(A) Dye Polymer Containing a Structural Unit Having a Dye Structure Polymerized Using a Chain-transfer Agent Having a LogP Value of 5 or Less (Specific Dye Polymer)>

(A) The specific dye polymer related to the present invention is preferably a dye polymer containing a plurality of structural units having a dye structure. The structural unit having a dye structure is for example a structural unit represented by the following formula (A).

Formula (A)

In formula (A), $XA^1$ represents a linking group formed by polymerization, $LA^1$ represents a single bond or a bivalent linking group, and Dye represents a dye structure. The dye structure is generally a pigment residue in which one hydrogen atom is arbitrarily removed from a pigment compound.

Here, the plurality of structural units having a dye structure contained in the specific dye polymer may be identical or different.

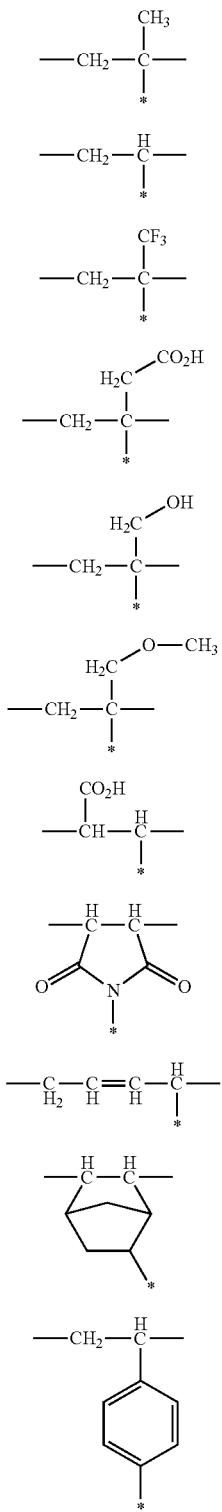

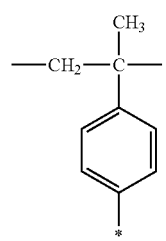

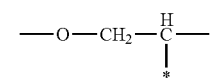

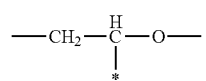

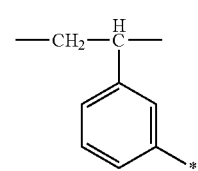

In formula (A), $XA^1$ represents a linking group formed by polymerization. That is, $XA^1$ represents a part that forms a repeating unit corresponding to a main chain formed by polymerization reaction. In addition, a part present in brackets means a repeating unit. Examples of $XA^1$ include a linking group formed by polymerizing a substituted or unsubstituted unsaturated ethylene group and a linking group formed by ring-opening polymerizing a cyclic ether. Preferably, $XA^1$ is a linking group formed by polymerizing an unsaturated ethylene group. Specific examples include the following linking groups, but the present invention is not limited thereto.

In addition, in the following formulae (X-1) to (X-15), * represents a part that links to $LA^1$.

In formula (A), $LA^1$ represents a single bond or a bivalent linking group. Examples of the bivalent linking group when $LA^1$ represents a bivalent linking group include substituted or unsubstituted linear, branched or cyclic alkylene groups having 1 to 30 carbon atoms (for example, a methylene group, an ethylene group, a trimethylene group, a propylene group, a butylene group and the like), substituted or unsubstituted allylene groups having 6 to 30 carbon atoms (for example, a phenylene group, a naphthalene group and the like), substituted or unsubstituted heterocyclic linking groups, —$CH_2$=$CH_2$—, —O—, —S—, —NR—, —C(=O)—, —SO—, —$SO_2$—, a linking group represented by the following formula (La), a linking group represented by the following formula (Lb), or a linking group represented by the following formula (Lc), and linking groups formed by linking two or more of these compounds [for example, —N(R)C(=O)—, —OC(=O)—, —C(=O)N(R)—, —C(=O)O—, in which each R independently represents a hydrogen atom, an alkyl group, an aryl group, or a heterocyclic group]. The bivalent linking group represented by $LA^1$ is not limited so long as it can realize the effects of the present invention.

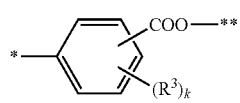

Formula (La)

-continued

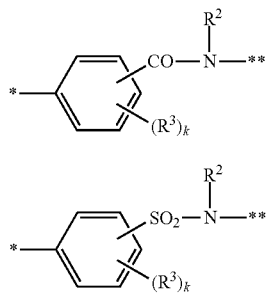

Formula (Lb)

Formula (Lc)

In formula (Lb) and formula (Lc), $R^2$ represents a hydrogen atom, an alkyl group, an aryl group, or a heterocyclic group. In formula (La), formula (Lb) and formula (Lc), $R^3$ represents a hydrogen atom, or a substituent group, k represents an integer of 0 to 4, * represents a position that is bonded to $XA^1$ in the formula (A), and ** represents a position that is bonded to Dye in the formula above.

The dye structure contained in the specific dye polymer, that is, dye structure constituting Dye in the formula above is not particularly limited and may be selected from various dye structures containing known dye structures.

Examples of the known dye structure include azo dyes, azomethine dyes (such as indoleaniline dyes, indolephenol dyes), dipyrromethane dyes, quinone dyes (such as benzoquinone dyes, naphtoquinone dyes, anthraquinone dyes, anthrapyridone dyes), carbonium dyes (such as diphenylmethane dyes, triphenylmethane dyes, xanthene dyes, acridine dyes), quinoneimine dyes (such as oxazine dyes and thiazine dyes), azine dyes, polymethine dyes (oxonol dyes, merocyanine dyes, arylidene dyes, styryl dyes, cyanine dyes, cyanine dyes such as squarylium dyes, croconium dyes), quinophthalone dyes, phthalocyanine dyes, perinone dyes, indigo dyes, thioindigo dyes, quinoline dyes, nitro dyes, nitroso dyes, and metal complex dyes thereof. A residue in which at least one hydrogen atom is removed therefrom is incorporated into a structural unit.

Of dye structures, azo dyes, azomethine dyes, dipyrromethane dyes, quinone dyes (of these, anthraquinone dyes), carbonium dyes (of these, xanthene dyes), polymethine dyes (of these, cyanine dyes and oxonol dyes) are preferred, and azo dyes, dipyrromethane dyes, azomethine dyes, and polymethine dyes are more preferred, and dipyrromethane dyes are particularly preferred.

Examples thereof include dyes described in "Dye Handbook" Ed. by The Society of Synthetic Organic Chemistry, Japan, Maruzen Co., Ltd. (1970), "Color Index" (The Society of Dyers and Colourists), "Colorant Handbook", Ed. by M. Ogawara, Kodansha Ltd. (1986), etc.

In this specification, dipyrromethane dye refers to a compound that has a "dipyrromethane skeleton" in the molecule, and includes those modified by a substituent group. In addition, in this specification "dipyrromethane skeleton" refers to a skeleton represented by the structure formula of the following formula (III). Also, the dye structure incorporated into the specific dye polymer is a preferably dye structure derived from a dipyrromethane metal complex compound or tautomers thereof obtained from a dipyrromethane compound represented by the following formula (III) and a metal or metal compound, which are dye structures represented by the following formula (III-1) to formula (III-3).

Formula (III)

[in formula (III), $R^1$, $R^2$, $R^3$, $R^4$, $R^5$, and $R^6$ each independently represent a hydrogen atom or a monovalent substituent group, and $R^7$ represents a hydrogen atom, a halogen atom, an alkyl group, an aryl group or a heterocyclic group, and $R^1$ and $R^6$ are not bonded to each other to form a ring]

In formula (III), specific examples of the substituent groups represented by $R^1$ to $R^6$ include the following monovalent groups (hereinafter, a group of the exemplified monovalent groups may be generally referred to "a substituent group R").

That is, specific examples of the substituent group include halogen atoms (for example, a fluorine atom, a chlorine atom, a bromine atom), alkyl groups (preferably a linear, branched or cyclic alkyl group having 1 to 48 carbon atoms, more preferably having 1 to 24 carbon atoms, such as a methyl group, an ethyl group, a propyl group, an isopropyl group, a butyl group, a t-butyl group, a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbornyl group, a 1-adamantyl group), alkynyl groups (preferably alkynyl groups having 2 to 48 carbon atoms, more preferably having 2 to 18 carbon atoms, such as a vinyl group, an allyl group, a 3-buten-1-yl group), aryl groups (preferably aryl groups having 6 to 48 carbon atoms, more preferably having 6 to 24 carbon atoms, such as a phenyl group, or a naphthyl group), heterocyclic groups (a heterocyclic group having 1 to 32 carbon atoms, more preferably a heterocyclic group having 1 to 18 carbon atoms, such as a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, a benzotriazol-1-yl group), silyl groups (preferably silyl groups having 3 to 38 carbon atoms, more preferably having 3 to 18 carbon atoms, such as a trimethylsilyl group, a triethylsilyl group, a tributylsilyl group, a t-butyldimethylsilyl group, a t-hexyldimethylsilyl group), a hydroxyl group, a cyano group, a nitro group, alkoxy groups (preferably an alkoxy group having 1 to 48 carbon atoms, more preferably an alkoxy group having 1 to 24 carbon atoms, for example, a methoxy group, an ethoxy group, a 1-butoxy group, a 2-butoxy group, an isopropoxy group, a t-butoxy group, a dodecyloxy group. Also, the substituent group may include cycloalkyloxy groups, such as a cyclopentyloxy group or a cyclohexyloxy group), aryloxy groups (preferably aryloxy groups having 6 to 48 carbon atoms, more preferably aryloxy groups having 6 to 24 carbon atoms, such as a phenoxy group, a 1-naphthoxy group), heterocyclic oxy groups (preferably heterocyclic oxy groups having 1 to 32 carbon atoms, more preferably heterocyclic oxy groups having 1 to 18 carbon atoms, for example, 1-phenyltetrazole-5-oxy groups and 2-tetrahydropyranyloxy groups), silyloxy groups (preferably silyloxy groups having 1 to 32 carbon atoms, more preferably silyloxy groups having 1 to 18 carbon atoms, such as a trimethylsilyloxy group, a t-butyldimethylsilyloxy group, a diphenylmethylsilyloxy group), acyloxy groups (preferably acyloxy groups having 2 to 48 carbon atoms, more preferably acyloxy groups having 2 to 24 carbon atoms, such as an acetoxy group, a pivaloyloxy group, a benzoyloxy group, a dodecanoyloxy group), alkoxycarbonyloxy groups (preferably an alkoxycarbonyloxy group having 2 to 48 carbon atoms, more preferably an alkoxycarbonyloxy group having 2 to 24 carbon atoms, for example, an ethoxycarbonyloxy group, a t-butoxycarbonyloxy group, additionally, examples include cycloalkyloxycarbonyloxy groups including cyclohexyloxycarbonyloxy groups, aryloxycarbonyloxy groups (preferably aryloxycarbonyloxy groups having 7 to 32 carbon atoms, more preferably aryloxycarbonyloxy groups having 7 to 24 carbon atoms, for example, a phenoxycarbonyloxy group), carbamoyloxy groups (preferably carbamoyloxy groups having 1 to 48 carbon atoms, more preferably carbamoyloxy groups having 1 to 24 carbon atoms, such as an N,N-dimethylcarbamoyloxy group, an N-butylcarbamoyloxy group, an N-phenylcarbamoyloxy group, an N-ethyl-N-phenylcarbamoyloxy group), sulfamoyloxy groups (preferably sulfamoyloxy groups having 1 to 32 carbon atoms, more preferably sulfamoyloxy groups having 1 to 24 carbon atoms, for example, an N,N-diethylsulfamoyloxy group, an N-propylsulfamoyloxy group), alkylsulfonyloxy groups (preferably an alkylsulfonyloxy group having 1 to 38 carbon atoms, more preferably an alkylsulfonyloxy group having 1 to 24 carbon atoms, for example, a methylsulfonyloxy group, a hexadecylsulfonyloxy group, a cyclohexylsulfonyloxy group), arylsulfonyloxy groups (preferably an arylsulfonyloxy group having 6 to 32 carbon atoms, more preferably an arylsulfonyloxy group having 6 to 24 carbon atoms, for example, a phenylsulfonyloxy group), acyl groups (preferably an acyl group having 1 to 48 carbon atoms, more preferably an acyl group having 1 to 24 carbon atoms, for example, a formyl group, an acetyl group, a pivaloyl group, a benzoyl group, a tetradecanoyl group, a cyclohexanoyl group), alkoxycarbonyl groups (preferably alkoxycarbonyl groups having 2 to 48 carbon atoms, more preferably alkoxycarbonyl groups having 2 to 24 carbon atoms, such as a methoxycarbonyl group, an ethoxycarbonyl group, an octadecyloxycarbonyl group, a cyclohexyloxycarbonyl group, a 2,6-di-tert-butyl-4-methylcyclohexyloxycarbonyl group), aryloxycarbonyl groups (preferably aryloxycarbonyl groups having 7 to 32 carbon atoms, more preferably aryloxycarbonyl groups having 7 to 24 carbon atoms, such as a phenoxycarbonyl group), carbamoyl groups (preferably carbamoyl groups having 1 to 48 carbon atoms, more preferably carbamoyl groups having 1 to 24 carbon atoms, such as, a carbamoyl group, an N,N-diethylcarbamoyl group, an N-ethyl-N-octylcarbamoyl group, an N,N-dibutylcarbamoyl group, an N-propylcarbamoyl group, an N-phenylcarbamoyl group, an N-methyl-N-phenylcarbamoyl group, an N,N-dicyclohexylcarbamoyl group), amino groups (preferably amino groups having 32 or less carbon atoms, more preferably amino groups having 24 or less carbon atoms, for example, an amino group, a methylamino group, an N,N-dibutylamino group, a tetradecylamino group, a 2-ethylhexylamino group, a cyclohexylamino group), anilino groups (preferably anilino groups having 6 to 32 carbon atoms, more preferably anilino groups having 6 to 24 carbon atoms, such as an anilino group, an N-methylanilino group), heterocyclic amino groups (preferably heterocyclic amino groups having 1 to 32 carbon atoms, more preferably heterocyclic amino groups having 1 to 18 carbon atoms, such as a 4-pyridylamino group), carbonamide groups (preferably carbonamide groups having 2 to 48 carbon atoms, more preferably carbonamide groups having 2 to 24 carbon atoms, such as an acetamide group, a benzamide group, a tetradecanamide group, a pivaloylamide group, a cyclohexanamide group), ureide groups (preferably a ureide group having 1 to 32 carbon atoms, more preferably a ureide group having 1 to 24 carbon atoms, such as a ureide group, an N,N-dimethylureide group, an N-phenylureide group), imide groups (preferably an imide group having 36 or less carbon atoms, more preferably an imide group having 24 or less carbon atoms, for example, an N-succinimide group, an N-phthalimide group), alkoxycarbonylamino groups (preferably an alkoxycarbonylamino group having 2 to 48 carbon atoms, more preferably an alkoxycarbonylamino group having 2 to 24 carbon atoms, for example, a methoxycarbonylamino group, an ethoxycarbonylamino group, a t-butoxycarbonylamino group, an octadecyloxycarbonylamino group, a cyclohexyloxycarbonylamino group), aryloxycarbonylamino groups (preferably an aryloxycarbonylamino group having 7 to 32 carbon atoms, more preferably an aryloxycarbonylamino group having 7 to 24 carbon atoms, for example, a phenoxycarbonylamino group), sulfonamide groups (preferably sulfonamide groups having 1 to 48 carbon atoms, more preferably sulfonamide groups having 1 to 24 carbon atoms, such as, a methanesulfonamide group, a butanesulfonamide group, a benzenesulfonamide group, a hexadecanesulfonamide group, a cyclohexanesulfonamide group), sulfamoylamino groups (preferably sulfamoylamino groups having 1 to 48 carbon atoms, more preferably sulfamoylamino groups having 1 to 24 carbon atoms, such as a N,N-dipropylsulfamoylamino group, an N-ethyl-N-dodecylsulfamoylamino group), azo groups (preferably azo groups having 1 to 32 carbon atoms, more preferably azo groups having 1 to 24 carbon atoms, such as a phenylazo group, a 3-pyrazolylazo group), alkylthio groups (preferably alkylthio groups having 1 to 48 carbon atoms, more preferably alkylthio groups having 1 to 24 carbon atoms, such as a methylthio group, an ethylthio group, an octylthio group, a cyclohexylthio group), arylthio groups (preferably arylthio groups having 6 to 48 carbon atoms, more preferably arylthio groups having 6 to 24 carbon atoms, such as a phenylthio group), heterocyclic thio groups (preferably heterocyclic thio groups having 1 to 32 carbon atoms, more preferably heterocyclic thio groups having 1 to 18 carbon atoms, such as a 2-benzothiazolylthio group, a 2-pyridylthio group, a 1-phenyltetrazolylthio group), alkylsulfinyl groups (preferably alkylsulfinyl groups having 1 to 32 carbon atoms, more preferably alkylsulfinyl groups having 1 to 24 carbon atoms, such as a dodecanesulfinyl group), arylsulfinyl groups (preferably arylsulfinyl groups having 6 to 32 carbon atoms, more preferably arylsulfinyl groups having 6 to 24 carbon atoms, such as a phenylsulfinyl group), alkylsulfonyl groups (preferably alkylsulfonyl groups having 1 to 48 carbon atoms, more preferably alkylsulfonyl groups having 1 to 24 carbon atoms, for example, a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group, a cyclohexylsulfonyl group), arylsulfonyl groups (preferably arylsulfonyl groups having 6 to 48 carbon atoms, more preferably arylsulfonyl groups having 6 to 24 carbon atoms, such as a phenylsulfonyl group, a 1-naphthylsulfonyl group), sulfamoyl groups (preferably sulfamoyl groups having 32 or less carbon atoms, more preferably sulfamoyl groups having 24 or less carbon atoms, such as a sulfamoyl group, an N,N-dipropylsulfamoyl group, an N-ethyl-N-dodecylsulfamoyl group, an N-ethyl-N-phenylsulfamoyl group, an N-cyclohexylsulfamoyl group), sulfo groups, phosphonyl groups (preferably phosphonyl groups having 1 to 32 carbon atoms, more preferably phosphonyl group having 1 to 24 carbon atoms, such as a phenoxyphosphonyl group, an octyloxyphosphonyl group, a phenylphosphonyl group), phosphinoylamino groups (preferably phosphinoylamino groups having 1 to 32 carbon atoms, more preferably phosphinoylamino groups having 1 to 24 carbon atoms, for example, a diethoxyphosphinoylamino group, a dioctyloxyphosphinoylamino group).

When the aforementioned monovalent group can be further substituted, it may be substituted by any of the respective groups. In addition, when the monovalent group has two or more substituent groups, the substituent groups thereof may be different.

In formula (III), $R^1$ and $R^2$, $R^2$ and $R^3$, $R^4$ and $R^5$, and $R^5$ and $R^6$ each independently are bonded together to form a 5-membered ring, a 6-membered ring, or a 7-membered ring. In addition, the ring formed may be a saturated ring or an unsaturated ring. Examples of the 5-membered ring, 6-membered ring, or 7-membered saturated ring or unsaturated ring include a pyrrole ring, a furan ring, a thiophene ring, a pyrazole ring, an imidazole ring, a triazole ring, oxazole ring, a thiazole ring, a pyrrolidine ring, a piperidine ring, a cyclopentene ring, a cyclohexene ring, a benzene ring, a pyridine ring, a pyrazine ring, a pyridazine ring, preferably, a benzene ring, and a pyridine ring.

In addition, when the formed 5-membered rings, 6-membered rings, and 7-membered rings are groups that are further substituted, the rings may be substituted by any of R of the substituent group R and when the rings are substituted by two or more substituent groups, the substituent groups thereof may be identical or different.

[Metal Atom or Metal Compound]

In the present invention, a metal atom or metal compound constituting a specific complex may be any of a metal atom or metal compound capable of forming a complex and includes a bivalent metal atom, a bivalent metal oxide, a bivalent metal hydroxide, or a bivalent metal chloride. For example, examples of the metal atom or metal compound include, in addition to Zn, Mg, Si, Sn, Rh, Pt, Pd, Mo, Mn, Pb, Cu, Ni, Co, and Fe, metal chlorides such as AlCl, InCl, FeCl, $TiCl_2$, $SnCl_2$, $SiCl_2$, $GeCl_2$, metal oxides such as TiO and VO, metal hydroxide such as $Si(OH)_2$ and the like.

Of these, from viewpoints of stability of a complex, spectral characteristics, heat resistance, light resistance, production suitability and the like, Fe, Zn, Mg, Si, Pt, Pd, Mo, Mn, Cu, Ni, Co, TiO, or VO is preferred and Fe, Zn, Mg, Si, Pt, Pd, Cu, Ni, Co, or VO is further preferred, and Fe, Zn, Cu, Co, or VO(V=O) is most preferred.

A preferred embodiment of a complex in which the compound represented by formula (III) is coordinated with a metal atom or metal compound is as follows.

That is, in this embodiment, in formula (III), $R^1$ and $R^6$ each independently represent a hydrogen atom, an alkyl group, an alkynyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamide group, a ureide group, an imide group, an alkoxycarbonylamino group, an aryloxycarbonylamino group, a sulfonamide group, an azo group, an alkylthio group, an arylthio group, a heterocyclic thio group, an alkylsulfonyl group, an arylsulfonyl group, or a phosphinoylamino group, $R^2$ and $R^5$ each independently represent a hydrogen atom, a halogen atom, an alkyl group, an alkynyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imide group, an alkoxycarbonylamino group, a sulfonamide group, an azo group, an alkylthio group, an arylthio group, a heterocyclic thio group, an alkylsulfonyl group, an arylsulfonyl group, or a sulfamoyl group, $R^3$ and $R^4$ each independently represent a hydrogen atom, a halogen atom, an alkyl group, an alkynyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamide group, a ureide group, an imide group, an alkoxycarbonylamino group, a sulfonamide group, an azo group, an alkylthio group, an arylthio group, a heterocyclic thio group, an alkylsulfonyl group, an arylsulfonyl group, a sulfamoyl group, or a phosphinoylamino group, $R^7$ represents a hydrogen atom, a halogen atom, an alkyl group, an aryl group, or a heterocyclic group, and the metal atom or metal compound represents Zn, Mg, Si, Pt, Pd, Mo, Mn, Cu, Ni, Co, TiO, or VO.

A more preferred embodiment of a complex in which the compound represented by formula (III) is coordinated with a metal atom or metal compound is as follows.

That is, in this embodiment, in formula (III), $R^1$ and $R^6$ each independently represent a hydrogen atom, an alkyl group, an alkynyl group, an aryl group, a heterocyclic group, a cyano group, an acyl group, an alkoxycarbonyl group, a carbamoyl group, an amino group, a heterocyclic amino group, a carbonamide group, a ureide group, an imide group, an alkoxycarbonylamino group, an aryloxycarbonylamino group, a sulfonamide group, an azo group, an alkylsulfonyl group, an arylsulfonyl group, or a phosphinoylamino group, $R^2$ and $R^5$ each independently represent an alkyl group, an alkynyl group, an aryl group, a heterocyclic group, a cyano group, a nitro group, an acyl group, an alkoxycarbonyl group, an aryloxycarbonyl group, a carbamoyl group, an imide group, an alkylsulfonyl group, an arylsulfonyl group, or a sulfamoyl group, $R^3$ and $R^4$ each independently represent a hydrogen atom, an alkyl group, an alkynyl group, an aryl group, a heterocyclic group, a cyano group, an acyl group, an alkoxycarbonyl group, a carbamoyl group, a carbonamide group, a ureide group, an imide group, an alkoxycarbonylamino group, a sulfonamide group, an alkylthio group, an arylthio group, a heterocyclic thio group, an alkylsulfonyl group, an arylsulfonyl group, or a sulfamoyl group, $R^7$ represents a hydrogen atom, a halogen atom, an alkyl group, an aryl group, or a heterocyclic group, the metal atom or metal compound represents Zn, Mg, Si, Pt, Pd, Cu, Ni, Co, or VO.

A particularly preferred embodiment of a complex in which the compound represented by formula (III) is coordinated with a metal atom or metal compound is as follows.

That is, in this embodiment, in formula (III), $R^1$ and $R^6$ each independently represent a hydrogen atom, an alkyl group, an aryl group, a heterocyclic group, an amino group, a heterocyclic amino group, a carbonamide group, a ureide group, an imide group, an alkoxycarbonylamino group, a sulfonamide group, an azo group, an alkylsulfonyl group, an arylsulfonyl group, or a phosphinoylamino group, $R^2$ and $R^5$ each independently represent an alkyl group, an aryl group, a heterocyclic group, a cyano group, an acyl group, an alkoxycarbonyl group, a carbamoyl group, an alkylsulfonyl group, or an arylsulfonyl group, $R^3$ and $R^4$ each independently represent a hydrogen atom, an alkyl group, an aryl group, or a heterocyclic group, $R^7$ represents a hydrogen atom, an alkyl group, an aryl group, or a heterocyclic group, and the metal atom or metal compound represents Zn, Cu, Co, or VO.

In particular, in formula (III), $R^3$ and $R^4$ preferably represent a phenyl group in that color patterns with superior resistance can be formed.

Also, in formula (III), $R^2$ and/or $R^5$ are preferably a 2,6-di-tert-butyl-4-methylcyclohexyloxycarbonyl group in that color-sensitive radiation compositions with superior solvent solubility can be obtained.

(Compound Represented by Formula (III-1))

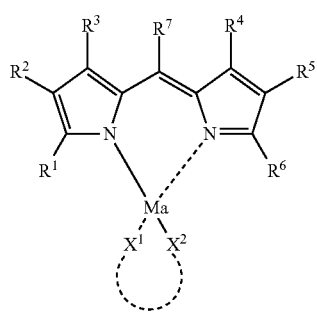

(III-1)

In formula (III-1), $R^1$ to $R^6$ each independently represent a hydrogen atom or a substituent group. $R^7$ represents a hydrogen atom, a halogen atom, an alkyl group, an aryl group or a heterocyclic group. $M^a$ represents a metal atom or a metal compound, $X^1$ represents a group that can be bonded to Ma, and $X^2$ represents a group required for neutralization of electric charges of Ma. $R^1$ and $R^6$ are not bonded together to form a ring. In addition, $X^1$ and $X^2$ are bonded together to form a 5-membered ring, 6-membered ring or 7-membered ring with Ma. In addition, the compound represented by formula (III-1) includes tautomers.

In formula (III-1), $R^1$ to $R^6$ are the same as $R^1$ to $R^6$ in formula (III) and preferred embodiments of $R^1$ to $R^6$ are also the same as those of $R^1$ to $R^6$ in formula (III).

Ma in formula (III-1) represents a metal atom or a metal compound, has the same meaning as the aforementioned metal atom or metal compound constituting the specific complex and also has the same preferred range as that of the aforementioned metal atom or metal compound.

$R^7$ in formula (III-1) has the same meaning as $R^7$ in formula (III) and preferred embodiments of $R^7$ are the same as those of $R^7$ in formula (III).

$X^1$ in formula (III-1) may be any of groups that can be bonded to Ma and examples thereof include water, alcohols (for example, methanol, ethanol, and propanol) or groups derived from compounds described in "Metal Chelates", [1] Takeichi Sakaguchi/Keihei Ueno (1995, Nankodo Co., Ltd.), the same [2] (1996), and the same [3] (1997).

$X^2$ in formula (III-1) represents a group required for neutralization of electric charges of Ma and examples thereof include halogen atoms, a hydroxyl group, a carboxyl group, a phosphate group, a sulfonate group and the like.

$X^1$ and $X^2$ in formula (III-1) may be bonded together with Ma to form a 5-membered ring, a 6-membered ring, or a 7-membered ring. The formed 5-membered ring, 6-membered ring, and 7-membered ring may be a saturated ring or an unsaturated ring. Also, the 5-membered ring, 6-membered ring and 7-membered ring may be composed of carbon atoms and hydrogen atoms exclusively, and may be a heterocyclic group having at least one atom selected from a nitrogen atom, an oxygen atom, and a sulfur atom.

(Compound Represented by Formula (III-2))

The dipyrromethane dye of the present invention is one of preferred embodiments of the following compounds represented by formula (III-2).

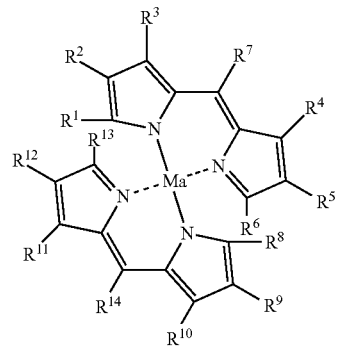

(III-2)

$R^1$ to $R^6$ and $R^8$ to $R^{13}$ in formula (III-2) each independently represent a hydrogen atom or a substituent group. $R^7$ and $R^{14}$ each independently represent a hydrogen atom, a halogen atom, an alkyl group, an aryl group or a heterocyclic group. Ma represents a metal atom or metal compound. $R^1$ and $R^6$, and $R^8$ and $R^{13}$ are not bonded together to form a ring. In addition, the compound represented by formula (III-2) includes tautomers.

$R^1$ to $R^6$ in formula (III-2) are the same as $R^1$ to $R^6$ in formula (III) and preferred embodiments thereof are also the same as those of $R^1$ to $R^6$ in formula (III).

The substituent groups represented by $R^8$ to $R^{13}$ in formula (III-2) are the same as those of the substituent groups represented by $R^1$ to $R^6$ in formula (III) and preferred embodiments are also the same as those of those of the substituent groups represented by $R^1$ to $R^6$ in formula (III). When the substituent groups represented by $R^8$ to $R^{13}$ of the compound represented by formula (III-2) are further substituted groups, they may be substituted by any of the aforementioned substituent groups R, and when they are substituted by two or more substituent groups, the substituent groups thereof may be identical or different.

$R^7$ in formula (III-2) are the same as $R^7$ in formula (III) and preferred embodiments thereof are also the same as those of $R^7$ in formula (III).

$R^{14}$ in formula (III-2) represents a hydrogen atom, a halogen atom, an alkyl group, an aryl group, or a heterocyclic group, and the preferred range of $R^{14}$ is the same as that of $R^7$. When $R^{14}$ is a further substituted group, it may be substituted by any of the aforementioned substituent groups R, and when it is substituted by two or more substituent groups, the substituent groups thereof may be identical or different.

Ma in formula (III-2) represents a metal or a metal compound, is the same as the aforementioned metal atom or metal compound constituting the specific complex and a preferred range thereof is also the same as that of the aforementioned metal atom or metal compound.

In formula (III-2), $R^8$ and $R^9$, $R^9$ and $R^{10}$, $R^{11}$ and $R^{12}$, and $R^{12}$ and $R^{13}$ may be bonded together to form a 5-membered ring, a 6-membered ring, or a 7-membered saturated ring or unsaturated ring. The formed saturated ring or unsaturated ring is the same as the saturated ring or unsaturated ring formed by $R^1$ and $R^2$, $R^2$ and $R^3$, $R^4$ and $R^5$, and $R^5$ and $R^6$ and preferred examples thereof are also the same as those of as the saturated ring or unsaturated ring.

(Compound Represented by Formula (III-3))

The dipyrromethane dye of the present invention is one of preferred embodiments of the following compounds represented by formula (III-3).

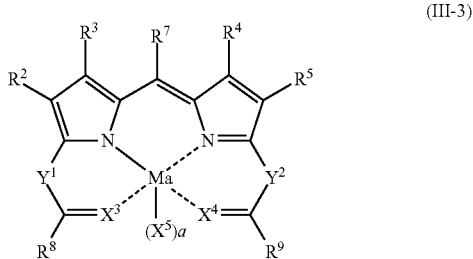
(III-3)

$R^2$ to $R^5$ in formula (III-3) each independently represent a hydrogen atom or a substituent group. $R^7$ represents a hydrogen atom, a halogen atom, an alkyl group, an aryl group or a heterocyclic group. Ma represents a metal atom or metal compound. $X^3$ and $X^4$ each independently represent NR (in which R represents a hydrogen atom, an alkyl group, an alkynyl group, an aryl group, a heterocyclic group, an acyl group, an alkylsulfonyl group or an arylsulfonyl group), a nitrogen atom, an oxygen atom or a sulfur atom. $Y^1$ and $Y^2$ each independently represent NR (in which R represents a hydrogen atom, an alkyl group, an alkynyl group, an aryl group, a heterocyclic group, an acyl group, an alkylsulfonyl group or an arylsulfonyl group), a nitrogen atom or a carbon atom. $R^8$ and $R^9$ each independently represent an alkyl group, an alkynyl group, an aryl group, a heterocyclic group, an alkoxy group, an aryloxy group, an alkylamino group, an arylamino group or a heterocyclic amino group. $R^8$ and $Y^1$ may be bonded together to form a 5-membered ring, a 6-membered ring, or a 7-membered ring, or $R^9$ and $Y^2$ may be bonded together to form a 5-membered ring, a 6-membered ring, or a 7-membered ring. $X^5$ represents a group that can be bonded to Ma and a represents 0, 1 or 2. In addition, the compound represented by formula (III-3) includes tautomers.

$R^2$ to $R^5$, and $R^7$ in formula (III-3) are the same as $R^1$ to $R^6$, and $R^7$ in formula (III) and preferred embodiments thereof are also the same as those of $R^1$ to $R^6$, and $R^7$ in formula (III).

Ma in formula (III-3) represents a metal or a metal compound and is the same as the aforementioned metal atom or metal compound constituting the specific complex and a preferred range thereof is also the same as that of the aforementioned metal atom or metal compound.

$R^8$ and $R^9$ in formula (III-3) each independently represent an alkyl group (preferably a linear, branched, or cyclic alkyl group having 1 to 36 carbon atoms, more preferably 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, a 1-adamantyl group), an alkynyl group (preferably an alkynyl group having 2 to 24 carbon atoms, more preferably 2 to 12 carbon atoms, for example, a vinyl group, an allyl group, a 3-buten-1-yl group), an aryl group (preferably an aryl group having 6 to 36 carbon atoms, more preferably 6 to 18 carbon atoms, for example, a phenyl group, a naphthyl group), a heterocyclic group (preferably a heterocyclic group having 1 to 24 carbon atoms, more preferably 1 to 12 carbon atoms, for example, a 2-thienyl group, a 4-pyridyl group, a 2-furyl group, a-pyrimidinyl group, a 1-pyridyl group, a 2-benzothiazolyl group, a 1-imidazolyl group, a 1-pyrazolyl group, a benzotriazol-1-yl group), an alkoxy group (preferably an alkoxy group having 1 to 36 carbon atoms, more preferably 1 to 18 carbon atoms, for example, a methoxy group, an ethoxy group, a propyloxy group, a butoxy group, a hexyloxy group, a 2-ethylhexyloxy group, a dodecyloxy group, a cyclohexyloxy group), an aryloxy group (preferably an aryloxy group having 6 to 24 carbon atoms, more preferably 1 to 18 carbon atoms, for example, a phenoxy group and a naphthyloxy group), an alkylamino group (preferably an alkylamino group having 1 to 36 carbon atoms, more preferably an alkylamino group having 1 to 18 carbon atoms, for example, a methylamino group, an ethylamino group, a propylamino group, a butylamino group, a hexylamino group, a 2-ethylhexylamino group, an isopropylamino group, a t-butylamino group, a t-octylamino group, a cyclohexylamino group, a N,N-diethylamino group, a N,N-dipropyl amino group, a N,N-dibutylamino group, a N-methyl-N-ethylamino group), an arylamino group (preferably an arylamino group having 6 to 36 carbon atoms, more preferably an arylamino group having 6 to 18 carbon atoms, for example, a phenylamino group, a naphthylamino group, a N,N-diphenylamino group, a N-ethyl-N-phenylamino group), or a heterocyclic amino group (preferably a heterocyclic amino group having 1 to 24 carbon atoms, more preferably heterocyclic amino group having 1 to 12 carbon atoms, for example, a 2-aminopyrrole group, a 3-aminopyrazole group, a 2-aminopyridine group, a 3-aminopyridine group).

When the alkyl group, alkynyl group, aryl group, heterocyclic group, alkoxy group, aryloxy group, alkylamino group, arylamino group, or heterocyclic amino group represented by $R^8$ and $R^9$ in formula (III-3) are further substituted groups, they may be substituted by any of the aforementioned substituent groups R, and when they are substituted by two or more substituent groups, the substituent groups thereof may be identical or different.

$X^3$ and $X^4$ in formula (III-3) each independently represent NR, a nitrogen atom, an oxygen atom, or a sulfur atom, R represents a hydrogen atom, an alkyl group (preferably a linear, branched, or cyclic alkyl group having 1 to 36 carbon atoms, more preferably 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, a 1-adamantyl group), an alkynyl group (preferably an alkynyl group having 2 to 24 carbon atoms, more preferably 2 to 12 carbon atoms, for example, a vinyl group, allyl group, a 3-buten-1-yl group), an aryl group (preferably an aryl group having 6 to 36 carbon atoms, more preferably 6 to 18 carbon atoms, for example, a phenyl group, a naphthyl group), a heterocyclic group (preferably a heterocyclic group having 1 to 24 carbon atoms, more preferably 1 to 12 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, a benzotriazol-1-yl group), an acyl group (preferably an acyl group having 1 to 24 carbon atoms, more preferably 2 to 18 carbon atoms, for example, an acetyl group, a pivaloyl group, a 2-ethylhexyl group, a benzoyl group, a cyclohexanoyl group), an alkylsulfonyl group (preferably an alkylsulfonyl group having 1 to 24 carbon atoms, more preferably 1 to 18 carbon atoms, for example, a methylsulfonyl group, an ethylsulfonyl group, an isopropylsulfonyl group, a cyclohexylsulfonyl group), an arylsulfonyl group (preferably an arylsulfonyl group having 6 to 24 carbon atoms, more preferably 6 to 18 carbon atoms, for example, a phenylsulfonyl group, a naphthylsulfonyl group).

The alkyl group, alkynyl group, aryl group, heterocyclic group, acyl group, alkylsulfonyl group and arylsulfonyl group of R may be also substituted by any of substituent groups R and when this group is substituted by a plurality of substituent groups, the substituted groups may be identical or different.

In formula (III-3), Y1 and Y2 each independently represent NR, a nitrogen atom, or a carbon atom in which R is the same as R of $X^3$ and $X^4$.

In formula (III-3), $R^8$ and $Y^1$ are bonded together with carbon atoms to form a 5-membered ring (for example, cyclopentane, pyrrolidine, tetrahydrofuran, dioxolane, tetrahydrothiophene, pyrrole, furan, thiophene, indole, benzofuran, benzothiophene), a 6-membered ring (for example, cyclohexane, piperidine, piperazine, morpholine, tetrahydropyran, dioxane, pentamethylenesulfide, dithiane, benzene, piperidine, piperazine, pyridazine, quinoline, quinazoline), or a 7-membered ring (for example, cycloheptane, hexamethylene imine).

In formula (III-3), $R^9$ and $Y^2$ may be bonded together with carbon atoms to form a 5-membered ring (for example, cyclopentane, pyrrolidine, tetrahydrofuran, dioxolane, tetrahydrothiophene, pyrrole, furan, thiophene, indole, benzofuran, benzothiophene), a 6-membered ring (for example, cyclohexane, piperidine, piperazine, morpholine, tetrahydropyran, dioxane, pentamethylenesulfide, dithiane, benzene, piperidine, piperazine, pyridazine, quinoline, quinazoline), or a 7-membered ring (for example, cycloheptane, hexamethylene imine).

When the 5-membered ring, 6-membered ring, and 7-membered ring formed by joining $R^8$ and $Y^1$, and $R^9$ and $Y^2$ in formula (III-3) are further substituted rings, they may be substituted by any of the substituent groups of R, and when they are substituted by two or more substituent groups, the substituent groups thereof may be identical or different.

In formula (III-3), $X^5$ represents a group that can be bonded to Ma and examples thereof are the same as those of $X^1$ in formula (III-1). a represents 0, 1, or 2.

A preferred embodiment of the compound represented by formula (III-3) is given as follows.

That is, in this embodiment, $R^2$ to $R^5$, $R^7$, and Ma each represent preferred embodiments of including compounds represented by formula (III) and complexes containing a metal atom or a metal compound, $X^3$ represents NR (in which R represents a hydrogen atom or an alkyl group), a nitrogen atom, or an oxygen atom, $X^4$ represents $NR^a$ (in which $R^a$ represents a hydrogen atom, an alkyl group, a heterocyclic group), or oxygen atom, $Y^1$ represents $NR^c$ (in which $R^c$ represents a hydrogen atom, or an alkyl group), a nitrogen atom, or a carbon atom, $Y^2$ represents a nitrogen atom, or a carbon atom, $X^5$ represents a group that is bonded through an oxygen atom, $R^8$ and $R^9$ each independently represent an alkyl group, an aryl group, a heterocyclic group, an alkoxy group, or an alkylamino group, $R^8$ and $Y^1$ are bonded together to form a 5-membered ring or a 6-membered ring, $R^9$ and $Y^2$ are bonded together to form a 5-membered ring, a 6-membered ring, and a represents 0 or 1.

A more preferred embodiment of the compound represented by formula (III-3) is given as follows.

That is, in this embodiment, $R^2$ to $R^5$, $R^7$, and $M_a$ each represent preferred embodiments of including compounds represented by formula (III) and complexes containing a metal atom or a metal compound, $X^3$ and $X^4$ represent an oxygen atom, $Y^1$ represents NH, $Y^2$ represents nitrogen atom, $X^5$ represents a group that is bonded through an oxygen atom, $R^8$ and $R^9$ each independently represent an alkyl group, an aryl group, a heterocyclic group, an alkoxy group, or an alkylamino group, $R^8$ and $Y^1$ are bonded together to form a 5-membered ring or a 6-membered ring, $R^9$ and $Y^2$ are bonded together to form a 5-membered ring, or a 6-membered ring, and a represents 0 or 1.

The moiety in which one or two hydrogen atoms are excluded from dipyrromethane metal complex compounds represented by formulae (III-1) to (III-3) to constitute a dye residue is not particularly limited, but in terms of synthesis suitability, are preferably one or two moieties of $R^1$ to $R^6$, one or two moieties of $R^1$, $R^2$, $R^5$ and $R^6$, more preferably, one or two moieties of $R^4$ and $R^9$.

In the formula above, Dye is preferably a dye residue in which n hydrogen atoms are arbitrarily removed from a dipyrromethane metal complex compound represented by formula (III-1) or (III-3).

Next, other dyes suitably used for the dye polymer (dye polymer) of the present invention will be described in order.

(Azo Dye)

An embodiment of the dye polymer (dye polymer represented by formula (A)) related to the present invention is a dye polymer that has a partial structure derived from an azo dye (azo compound) as a partial structure of a dye moiety (Dye in formula (A)). In the present invention, an azo compound broadly refers to a compound that has a dye moiety containing an N=N group in the molecule.

The azo dye may be suitably selected from well-known azo dyes (for example, substituted azobenzene ((AZ-4) to (AZ-6) described below as specific examples)).

An azo dye known as a magenta dye and a yellow dye may be used as the azo dye, and in particular, is preferably an azo dye represented by the following formula (d), formula (e), formula (g), formula (I-1), formula (I-2), and formula (V).

<<Magenta Dye>>

The azo dye is suitably an azo dye that is a magenta dye represented by the following formula (d).

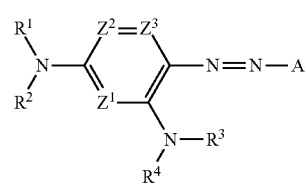

Formula (d)

In formula (d), $R^1$ to $R^4$ each independently represent a hydrogen atom, an alkyl group, an alkynyl group, an aryl group, a heterocyclic group, an acyl group, an alkoxycarbonyl group, an aryloxycarbonyl group, a carbamoyl group, an alkylsulfonyl group, or an arylsulfonyl group, A represents an aryl group, or an aromatic heterocyclic group, $Z^1$ to $Z^3$ each independently represent —C($R^5$)=, or —N=, and $R^5$ represents a hydrogen atom, or a substituent group.

Respective substituent groups in formula (d) will be described in detail.

In formula (d), $R^1$ to $R^4$ each independently represent a hydrogen atom, or an alkyl group (preferably a linear, branched, or cyclic alkyl group having 1 to 36 carbon atoms, more preferably 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, 1-adamantyl), an alkynyl group (preferably an alkynyl group having 2 to 24 carbon, atoms, more preferably 2 to 12 carbon atoms, for example, vinyl, allyl, 3-buten-1-yl), an aryl group (preferably an aryl group having 6 to 36 carbon atoms, more preferably 6 to 18 carbon atoms, for example, phenyl, naphthyl), a heterocyclic group (preferably a heterocyclic group having 1 to 24 carbon atoms, more preferably 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, benzotriazol-1-yl), an acyl group (preferably an acyl group having 1 to 24 carbon atoms, more preferably having 2 to 18 carbon atoms, for example, acetyl, pivaloyl, 2-ethylhexyl, benzoyl, cyclohexanoyl), an alkoxycarbonyl group (preferably alkoxycarbonyl group having 1 to 10 carbon atoms, more preferably 1 to 6 carbon atoms, for example, methoxycarbonyl, ethoxycarbonyl), an aryloxycarbonyl group (preferably aryloxycarbonyl group having 6 to 15 carbon atoms, more preferably 6 to 10 carbon atoms, for example, phenoxycarbonyl), a carbamoyl group (preferably a carbamoyl group having 1 to 8 carbon atoms, more preferably 2 to 6 carbon atoms, for example, dimethylcarbamoyl), an alkylsulfonyl group (preferably an alkylsulfonyl group having 1 to 24 carbon atoms, more preferably having 1 to 18 carbon atoms, for example, methylsulfonyl, ethylsulfonyl, isopropylsulfonyl, cyclohexylsulfonyl), or an arylsulfonyl group (preferably an arylsulfonyl group having 6 to 24 carbon atoms, more preferably 6 to 18 carbon atoms, for example, phenylsulfonyl, naphthylsulfonyl).

$R^1$ and $R^3$ preferably each independently represent an alkyl group, an alkynyl group, an aryl group, or a heterocyclic group. $R^2$ and $R^4$ preferably each independently represent a hydrogen atom, or an alkyl group.

When $R^1$ to $R^4$ are further substituted groups, they may be substituted by any of the aforementioned substituent groups A, and when they have two or more substituent groups, the substituent groups thereof may be identical or different.

$R^1$ and $R^2$, $R^1$ and $R^5$ (when $Z^1$ or $Z^2$ are —C($R^5$)=), $R^3$ and $R^4$, $R^3$ and $R^5$ (when $Z^1$ is —C($R^5$)=) may be bonded together to form a 5-membered ring, or a 6-membered ring.

$Z^1$ to $Z^3$ each independently represent, —C($R^5$)=, or —N=, $R^5$ represents a hydrogen atom, or a substituent group. Examples of the substituent group of $R^5$ are described in the section of the substituent group. When the substituent group of $R^5$ is a further substituted group, for example, it may be substituted by the substituent groups described in the section of the substituent group A, and when it is substituted by two or more substituent groups, the substituent groups thereof may be identical or different.

As to $Z^1$ to $Z^3$, preferably, $Z^1$ is —N=, $Z^2$ is —C($R^5$)= or —N=, and $Z^3$ is —C($R^5$)=. More preferably, $Z^1$ is —N=, and $Z^2$ and $Z^3$ are —C($R^5$)=.

A represents an aryl group, or an aromatic heterocyclic group. The aryl group, and aromatic heterocyclic group of A may be for example have a substituent group described in the section of the substituent groups, and when they are substituted by two or more substituent groups, substituent groups thereof may be identical or different.

A is preferably an aromatic heterocyclic group. More preferably, examples of A include an imidazole ring, a pyrazole ring, a triazole ring, a thiazole ring, an oxazole ring, a 1,2,4-thiadiazole ring, a 1,3,4-thiadiazole ring, a pyridine ring, a pyrimidine ring, a pyrazine ring, a benzopyrazole ring, a benzothiazole ring and the like.

In A, the moiety in which a polymerizable group involved in formation of polymers (formation of dye polymer) is incorporated is not particularly limited, but in terms of synthesis suitability, the polymerizable group is preferably incorporated into one or two or more of $R^1$, $R^2$ and A, more preferably, into $R^1$ and/or A.

The azo dye represented by formula (d) is more preferably an azo dye represented by the following formula (d').

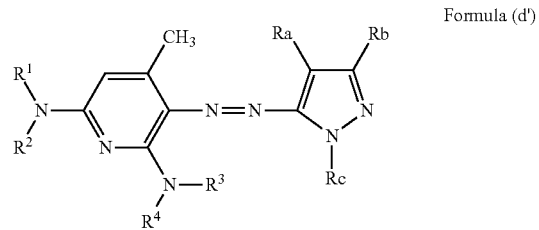

Formula (d')

$R^1$ to $R^4$ in formula (d') are the same as $R^1$ to $R^4$ in formula (d) and a preferred range thereof are the same as that of $R^1$ to $R^4$ in formula (d). $R^a$ represents an electrophilic group of a Hammett substituent group constant (σp) value of 0.2 or more, and $R^b$ represents a hydrogen atom, or a monovalent substituent group. $R^c$ represents an alkyl group, an alkynyl group, an aryl group, a heterocyclic group, an acyl group, an alkoxycarbonyl group, a carbamoyl group, an alkylsulfonyl group, or an arylsulfonyl group.

Examples of the substituent group represented by $R^b$ include substituent groups described in the section of the substituent group A.

The azo dye is suitably an azo dye that is a magenta dye represented by the following formula (e).

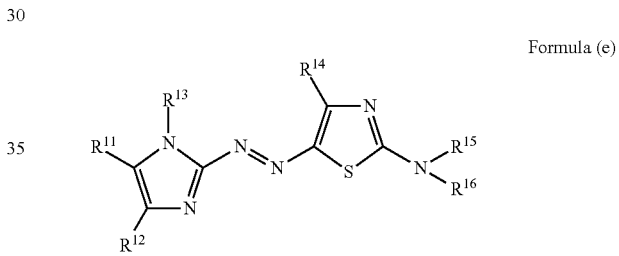

Formula (e)

In formula (e), $R^{11}$ to $R^{16}$ each independently represent a hydrogen atom, or a monovalent substituent group. $R^{11}$ and $R^{12}$, and $R^{15}$ and $R^{16}$ are each independently bonded together to form a ring.

Respective substituent groups in formula (e) will be described in detail.

$R^{11}$ to $R^{16}$ each independently represent a hydrogen atom or a monovalent substituent group. Examples of the monovalent substituent group include a halogen atom, an alkyl group having 1 to 30 carbon atoms (in which the alkyl group means a saturated aliphatic group including a cycloalkyl group, a bicycloalkyl group), an alkynyl group having 2 to 30 carbon atoms (in which the alkynyl group means an unsaturated aliphatic group having a double bond, including a cycloalkynyl group and a bicycloalkynyl group), an alkynyl group having 2 to 30 carbon atoms, an aryl group having 6 to 30 carbon atoms, a heterocyclic group having 3 to 30 carbon atoms, a cyano group, an aliphatic oxy group having 1 to 30 carbon atoms, an aryloxy group having 6 to 30 carbon atoms, an acyloxy group having 2 to 30 carbon atoms, a carbamoyloxy group having 1 to 30 carbon atoms, an aliphatic oxycarbonyloxy group having 2 to 30 carbon atoms, an aryloxycarbonyloxy group having 7 to 30 carbon atoms, an amino group having 0 to 30 carbon atoms (including an alkylamino group, an anilino group and a heterocyclic amino group), an acylamino group having 2 to 30 carbon atoms, an aminocarbonylamino group having 1 to 30 carbon atoms, an aliphatic oxycarbonylamino group having 2 to 30 carbon atoms, an aryloxycarbonylamino group having 7 to 30 carbon atoms, a sulfamoylamino group having 0 to 30 carbon atoms, an alkylsulfonylamino group having 1 to 30 carbon atoms, an aryl sulfonylamino group, an alkylthio group having 1 to 30 carbon atoms, an arylthio group having 6 to 30 carbon atoms, a sulfamoyl group having 0 to 30 carbon atoms, an alkylsulfinyl group having 1 to 30 carbon atoms, an arylsulfinyl group having 6 to 30 carbon atoms, an alkylsulfonyl group having 1 to 30 carbon atoms, an arylsulfonyl group having 6 to 30 carbon atoms, an acyl group having 2 to 30 carbon atoms, an aryloxycarbonyl group having 6 to 30 carbon atoms, an aliphatic oxycarbonyl group having 2 to 30 carbon atoms, a carbamoyl group having 1 to 30 carbon atoms, an arylazo group having 6 to 30 carbon atoms or a heterocyclic azo group having 3 to 30 carbon atoms, and an imide group, and respective groups may have further a substituent group.

$R^{11}$ and $R^{12}$ preferably each independently represent a hydrogen atom, a heterocyclic group, or a cyano group, more preferably a cyano group.

$R^{13}$ and $R^{14}$ preferably each independently represent a hydrogen atom, a substituted or unsubstituted alkyl group, or a substituted or unsubstituted aryl group, more preferably, a substituted or unsubstituted alkyl group.

$R^{15}$ and $R^{16}$ preferably each independently represent a hydrogen atom, a substituted or unsubstituted alkyl group, a substituted or unsubstituted aryl group, more preferably, a substituted or unsubstituted alkyl group.

In formula (e), the moiety in which a polymerizable group involved in formation of polymers (formation of dye polymer) is incorporated is not particularly limited, but, in terms of synthesis suitability, the polymerizable group is preferably incorporated into one or two or more of $R^{13}$, $R^{15}$, and $R^{16}$, more preferably, into $R^{13}$ and $R^{15}$, even more preferably $R^{13}$.

Of the aforementioned azo dyes, the magenta dye is more preferably an azo dye represented by formula (e).

-Yellow Dye-

Suitable examples of the azo dye include azo dyes (including tautomers thereof) that are yellow dyes represented by formula (g), formula (I-1), formula (I-2), and formula (V).

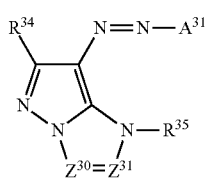

Formula (g)

In formula (g), $R^{34}$ represents a hydrogen atom, or a substituent group, and $R^{35}$ represents a hydrogen atom, an alkyl group, an alkynyl group, an aryl group, a heterocyclic group, an acyl group, an alkoxycarbonyl group, or a carbamoyl group. $Z^{30}$ and $Z^{31}$ each independently represent —C($R^{36}$)═, or —N═, and $R^{36}$ represents a hydrogen atom, or a substituent group. $A^{31}$ represents an aryl group, or an aromatic heterocyclic group.

In formula (g), respective groups will be described in detail.

$R^{34}$ represents a hydrogen atom, or a monovalent substituent group and examples thereof include substituent groups described in the section of the substituent group A, $R^{34}$ is preferably an aryl group and a heterocyclic group, more preferably a phenyl group.

$R^{35}$ represents a hydrogen atom, an alkyl group ((preferably a linear, branched, or cyclic alkyl group having 1 to 36 carbon atoms, more preferably 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, 1-adamantyl), an alkynyl group (preferably an alkynyl group having 2 to 24 carbon atoms, more preferably carbon atoms 2 to 12, for example, vinyl, allyl, 3-buten-1-yl), an aryl group (preferably an aryl group having 6 to 36 carbon atoms, more preferably 6 to 18 carbon atoms, for example, phenyl and naphthyl), a heterocyclic group (preferably a heterocyclic group having 1 to 24 carbon atoms, more preferably 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, benzotriazol-1-yl), an acyl group (preferably an acyl group having 1 to 24 carbon atoms, more preferably having 2 to 18 carbon atoms, for example, acetyl, pivaloyl, 2-ethylhexyl, benzoyl, cyclohexanoyl), an alkoxycarbonyl group (preferably an alkoxycarbonyl group having 1 to 10 carbon atoms, more preferably carbon atoms 1 to 6, for example, a methoxycarbonyl group, an ethoxycarbonyl group), or a carbamoyl group (preferably a carbamoyl group having 1 to 10 carbon atoms, more preferably 1 to 6 carbon atoms, for example, N,N-dimethylcarbamoyl).

$Z^{30}$ and $Z^{31}$ each independently represent —C($R^{36}$)═, or —N═, $R^{36}$ represents a hydrogen atom, or a substituent group. Examples of the substituent group of $R^{36}$ include substituent groups described in the section of the substituent group A. When the substituent group of $R^{36}$ is a further substituted group, it may be substituted by any of the aforementioned substituent groups R, and when it is substituted by two or more substituent groups, the substituent groups thereof may be identical or different.

Regarding $Z^{30}$ and $Z^{31}$, preferably, $Z^{30}$ is —N═, and $Z^{31}$ is —C($R^{36}$)═.

$A^{31}$ is the same as A in formula (d) and preferred embodiments thereof are also the same as those of A in formula (d).

In formula (g), the moiety in which a polymerizable group involved in formation of polymers (formation of dye polymer) is incorporated is not particularly limited, but is preferably $R^{34}$ and/or $A^{31}$ in terms of synthesis suitability.

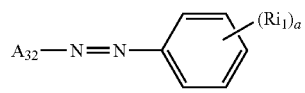

Formula (I-1)

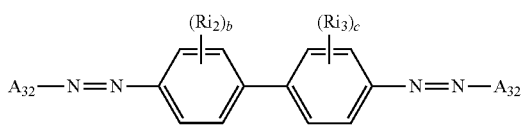

Formula (I-2)

In formula (I-1) and formula (I-2), $Ri_1$, $Ri_2$ and $Ri_3$ each independently represent a monovalent substituent group. a represents an integer of 0 to 5. When a is 2 or more, adjacent two $Ri_1$ are bonded together to form a condensed ring. b and c are each independently an integer of 0 to 4. When b and c are 1 or more, adjacent two $Ri_1$ are bonded together to form a condensed ring. $A^{32}$ represents the following formula (IA), formula (IB) or formula (IC).

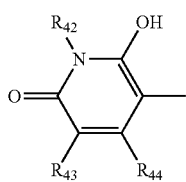

Formula (IA)

In formula (IA), $R^{42}$ represents a hydrogen atom, an alkyl group, or an aryl group. $R^{43}$ represents a monovalent substituent group. $R^{44}$ represents a hydrogen atom, an alkyl group, or an aryl group.

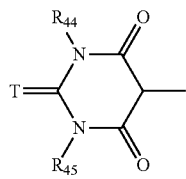

Formula (IB)

In formula (IB), $R^{44}$ and $R^{45}$ each independently represent a hydrogen atom, an alkyl group, or an aryl group. T represents an oxygen atom or a sulfur atom.

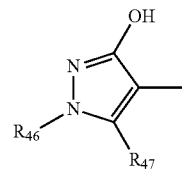

Formula (IC)

In formula (IC), $R^{46}$ represents a hydrogen atom, an alkyl group, or an aryl group. $R^{47}$ represents a monovalent substituent group.

Examples of the monovalent substituent group represented by $Ri_1$, $Ri_2$ and $Ri_3$ in formula (I-1) and formula (I-2) include substituent groups described in the section of the substituent group A. More specifically, the monovalent substituent group represents an alkyl group (preferably a linear, branched, or cyclic alkyl group having 1 to 10 carbon atoms, more preferably 1 to 5 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, 1-adamantyl), an aryl group (preferably an aryl group having 6 to 36 carbon atoms, more preferably 6 to 18 carbon atoms, for example, phenyl, naphthyl, sulfonamide group), an alkynyl group (a linear, branched, or cyclic alkynyl group having 1 to 10 carbon atoms, more preferably 1 to 5 carbon atoms, for example, vinyl, allyl, furenyl, geranyl, oleyl), a sulfo group, a sulfamoyl group (an alkylsulfamoyl group having 1 to 10 carbon atoms), in particular an alkyl group having 1 to 5 carbon atoms and alkylsulfamoyl group having 1 to 10 carbon atoms. A is preferably 1 to 3. b and c are preferably 1 to 3.

In formula (IA), $R^{42}$ represents a hydrogen atom, an alkyl group, or an aryl group and is particularly preferably an alkyl group 1 to 5 carbon atoms and a phenyl group. Examples of the monovalent substituent group represented by $R^{43}$ include substituent groups described in the section of the substituent group A and are particularly preferably a cyano group and a carbamoyl group. $R^{44}$ represents a hydrogen atom, an alkyl group, or an aryl group and is particularly preferably an alkyl group having 1 to 5 carbon atoms and a phenyl group.

In formula (IB), T represents an oxygen atom or a sulfur atom and is preferably an oxygen atom. $R^{44}$ and $R^{45}$ each independently represent a hydrogen atom, an alkyl group, or an aryl group and is particularly preferably an alkyl group having 1 to 5 carbon atoms and a phenyl group.

In formula (IC), $R^{46}$ represents a hydrogen atom, an alkyl group, or an aryl group and is particularly preferably an alkyl group having 1 to 5 carbon atoms and a phenyl group. Examples of the monovalent substituent group represented by $R^{47}$ include substituent groups described in the section of the substituent group A and the monovalent substituent group is preferably a hydrogen atom, an alkyl group and an aryl group, particularly preferably an alkyl group having 1 to 5 carbon atoms and a phenyl group.

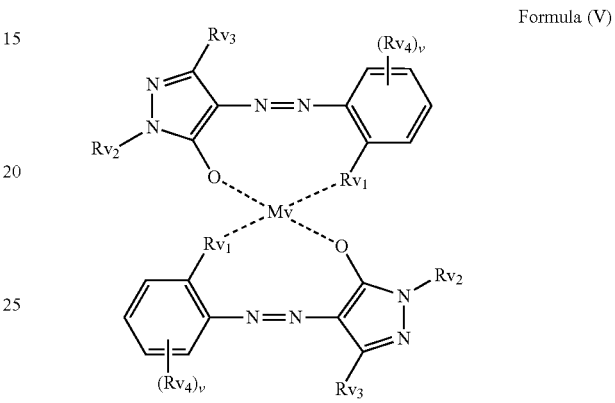

Formula (V)

In formula (V), My represents Cr or Co. $Rv_1$ represents an oxygen atom or —COO—. $Rv_2$ and $Rv_3$ each independently represent a hydrogen atom, an alkyl group or an aryl group. v represents an integer of 0 to 4. $Rv_4$ represents a monovalent substituent group. When v is 2 or more, adjacent $Rv_4$ are bonded together to form a ring.

$Rv_2$ and $Rv_3$ are particularly preferably an alkyl group having 1 to 5 carbon atoms or a phenyl group. Examples of the monovalent substituent group represented by $Rv_4$ include substituent groups described in the section of the substituent group A and the monovalent substituent group is particularly preferably an alkyl group, an aryl group, a nitro group, a sulfamoyl group and a sulfo group, most preferably an alkyl group having 1 to 5 carbon atoms, a phenyl group, and a nitro group.

Among the afore-mentioned azo dyes, the yellow dye is preferably an azo dye represented by formula (I-1), formula (I-2) or formula (V).

Specific examples of the azo dye are given as follows, but the present invention is not limited thereto.

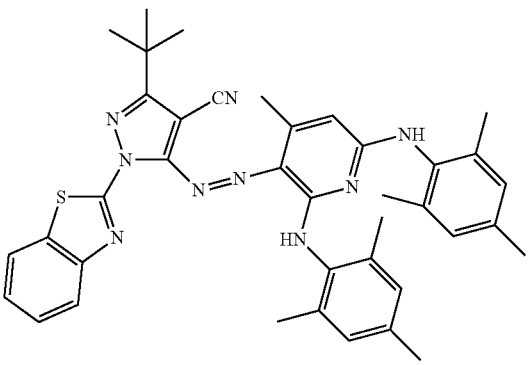

(AZ-1)

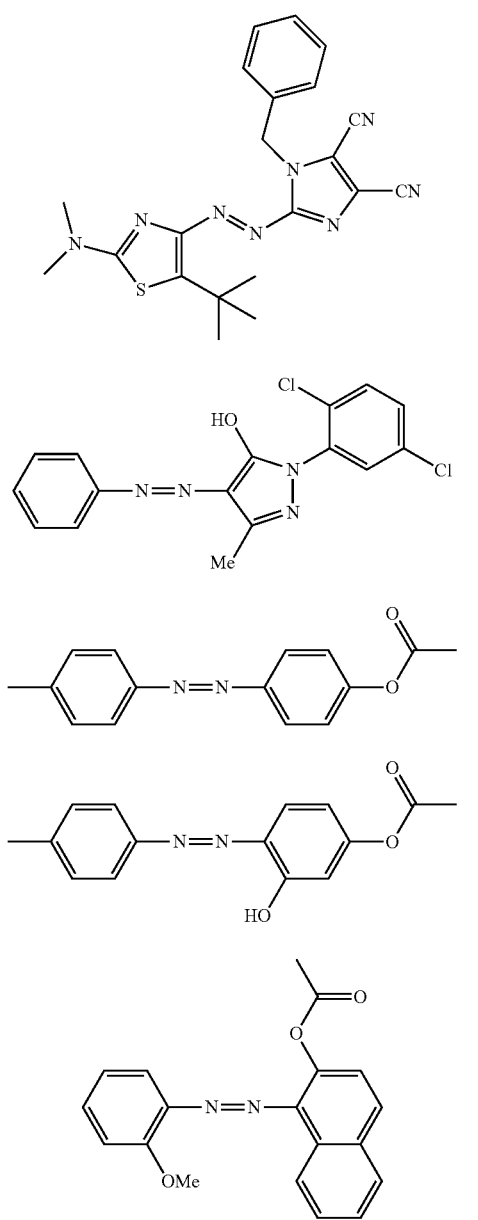
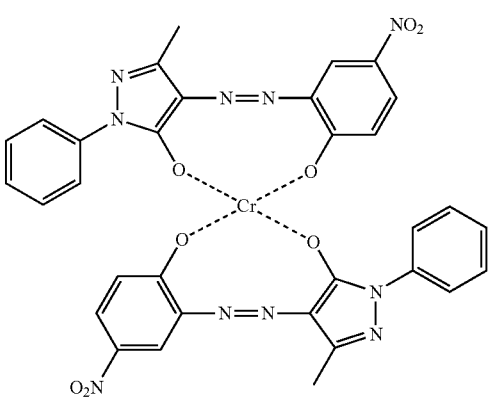

(AZ-13)
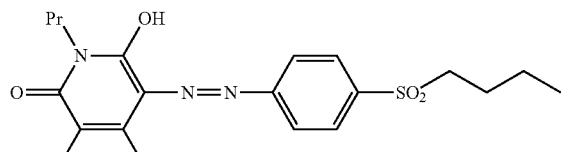

(AZ-14)
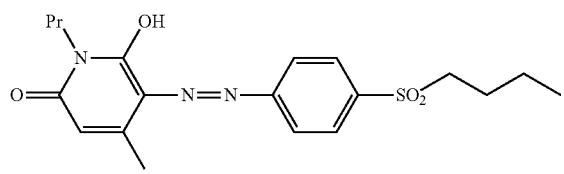

(AZ-15)
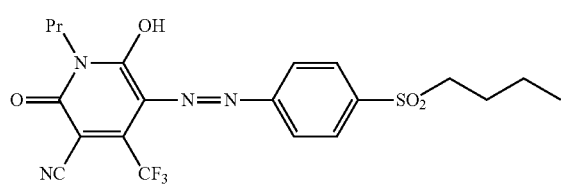

(AZ-16)
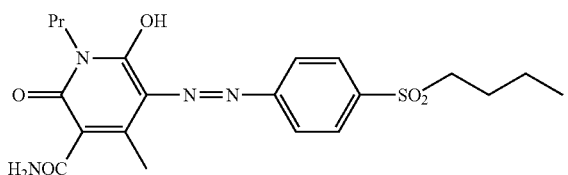

(AZ-17)
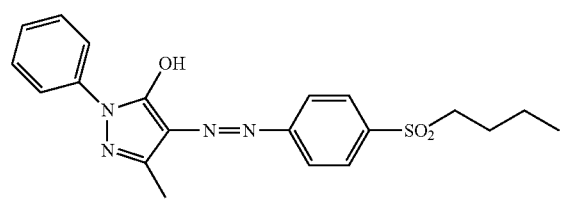

(AZ-18)
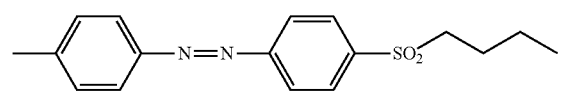

(AZ-19)
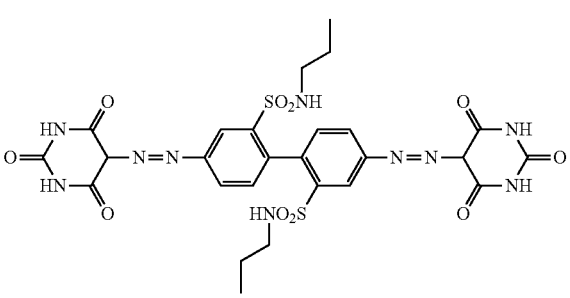

(AZ-20)
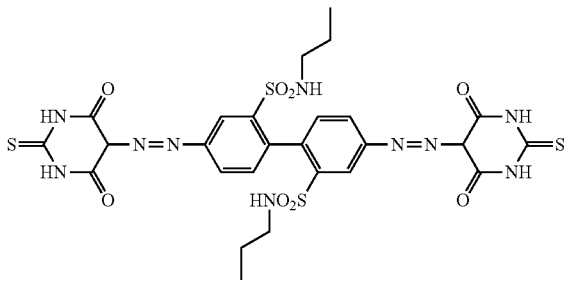

(AZ-21)
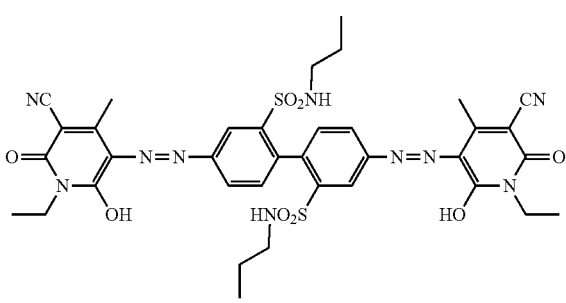

(AZ-22)
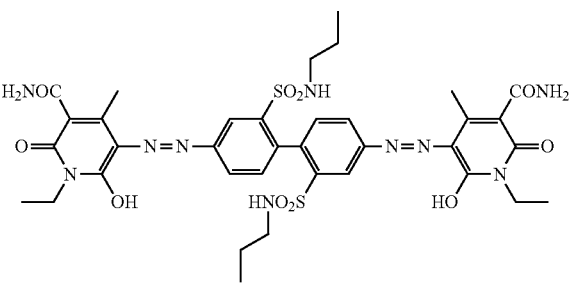

In terms of color characteristics and heat resistance, among the aforementioned specific examples, (AZ-7), (AZ-9), (AZ-11), (AZ-13), (AZ-14), (AZ-15), (AZ-16), (AZ-17), (AZ-19), (AZ-20), (AZ-21), and (AZ-22) are particularly preferable.

(Anthraquinone Dye)

An embodiment of dye polymer (dye polymer represented by formula (A)) related to the present invention is a dye polymer that has a partial structure derived from an anthraquinone dye (anthraquinone compound). The dye polymer includes a dye polymer that has a partial structure derived from the compounds (anthraquinone compounds) represented by the following formulae (AQ-1) to (AQ-3) as a partial structure of a dye moiety (Dye). In the present invention, an anthraquinone compound broadly refers to a compound that has a dye moiety including an anthraquinone skeleton in the molecule.

Formula (AQ-1)
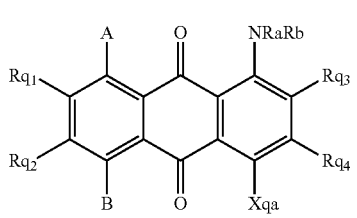

Formula (AQ-2)

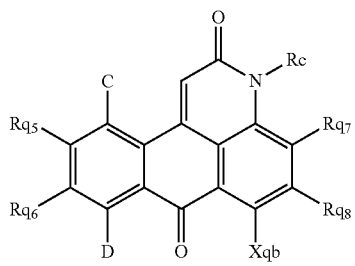

Formula (AQ-3)

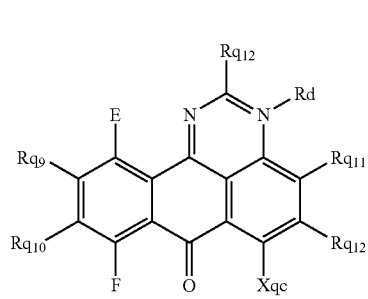

In formula (AQ-1), A and B each independently represent an amino group, a hydroxyl group, an alkoxy group or a hydrogen atom. Xqa represents ORqa$_1$ or NRqa$_2$Rqa$_3$. Rqa$_1$ to Rqa$_3$ each independently represent a hydrogen atom, an alkyl group or an aryl group. Rq$_1$ to Rq$_4$ represent a substituent group. The substituent groups that can be used for Rq$_1$ to Rq$_4$ are the same as substituent groups described in the section of the substituent group A. R$^a$ and R$^b$ each independently represent a hydrogen atom, an alkyl group or an aryl group.

C and D in formula (AQ-2) are the same as A and B in formula (AQ-1). Xqb represents ORqb$_1$ or NRqb$_2$Rqb$_3$. Rqb$_1$ to Rqb$_3$ each independently represent a hydrogen atom, an alkyl group or an aryl group. Rq$_5$ to Rq$_8$ represent a substituent group. Rq$_5$ to Rq$_8$ are the same as Rq$_1$ to Rq$_4$ in formula (AQ-1). R$^c$ is the same as R$^a$ or Rb in formula (AQ-1).

E and F in formula (AQ-3) are the same as A and B in formula (AQ-1). Xqc represents ORqc$_1$ or NRqc$_2$Rqc$_3$. Rqc$_1$ to Rqc$_3$ each independently represent a hydrogen atom, an alkyl group or an aryl group. Rq$_9$ to Rq$_{12}$ are the same as Rq$_1$ to Rq$_4$ in formula (AQ-1). R$^d$ is the same as R$^a$ or R$^b$ in formula (AQ-1).

A and B in formula (AQ-1) are preferably a hydrogen atom. Xqa is preferably ORqa$_1$ (in which Rqa$_1$ represents a hydrogen atom, an alkyl group having 1 to 5 carbon atoms or a phenyl group), or NRqa$_2$Raq$_3$ (in which Rqa$_2$ represents a hydrogen atom, Rqa$_3$ represents an alkyl group having 1 to 5 carbon atoms or a phenyl group). Rq$_1$ to Rq$_4$ represent a hydrogen atom, a halogen atom or an alkoxy group. R$^a$ is preferably a hydrogen atom. R$^b$ is preferably a hydrogen atom, an alkyl group having 1 to 5 carbon atoms or a phenyl group.

C and D in formula (AQ-2) are preferably a hydrogen atom. Xq$_b$ is preferably ORqb$_1$ (in which Rqb$_1$ represents a hydrogen atom, an alkyl group having 1 to 5 carbon atoms or a phenyl group), NRqb$_2$Rbq$_3$ (in which Rqb$_2$ represents a hydrogen atom, and Rqb$_3$ represents an alkyl group having 1 to 5 carbon atoms or a phenyl group). Rq$_5$ to Rq$_8$ are preferably a hydrogen atom, a halogen atom or an alkoxy group. R$^c$ is preferably a hydrogen atom, an alkyl group having 1 to 5 carbon atoms, or a phenyl group.

E and F in formula (AQ-3) are preferably a hydrogen atom. Xqc is preferably ORqc$_1$ (in which Rqc$_1$ represents a hydrogen atom, an alkyl group having 1 to 5 carbon atoms or a phenyl group), or NRqc$_2$Rcq$_3$ (in which Rqc$_2$ represents a hydrogen atom, and Rqc$_3$ represents an alkyl group having 1 to 5 carbon atoms or a phenyl group). Rq$_9$ to Rq$_{12}$ are preferably a hydrogen atom, a halogen atom or an alkoxy group. R$^d$ is preferably a hydrogen atom, an alkyl group having 1 to 5 carbon atoms or a phenyl group.

Specific examples of the anthraquinone dye are given as follows, but the present invention is not limited thereto.

(aq-1)

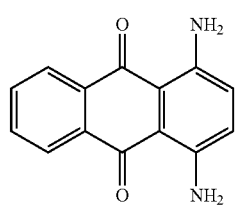

(aq-2)

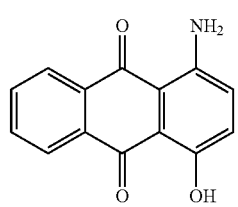

(aq-3)

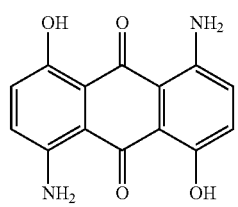

(aq-4)

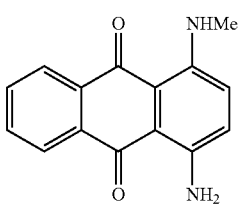

(aq-5)

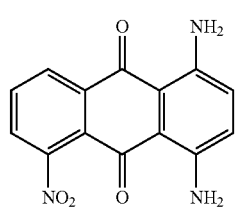

(aq-6)

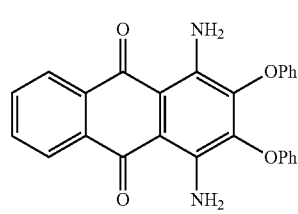

(aq-7) 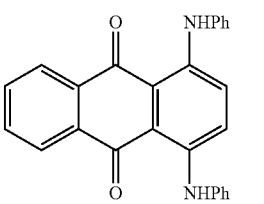

(aq-8) 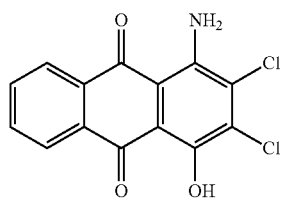

(aq-9) 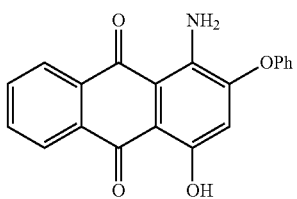

(aq-10) 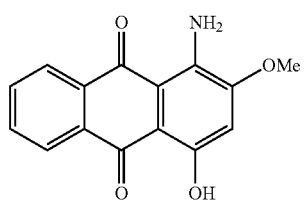

(aq-11) 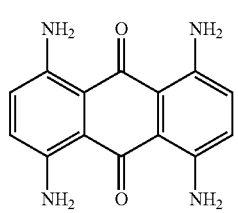

(aq-12) 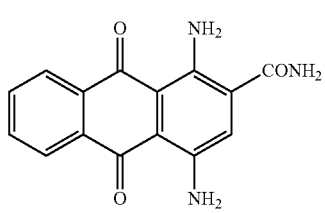

(aq-13) 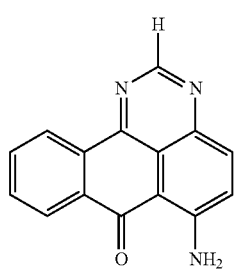

(aq-14) 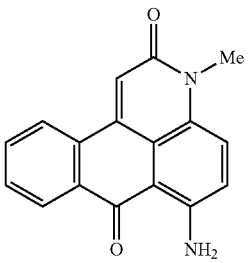

(aq-15) 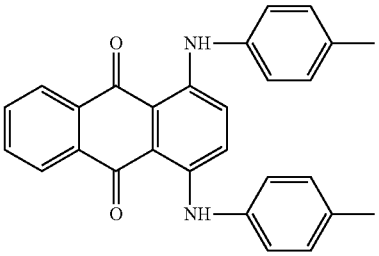

In terms of color characteristics and heat resistance, among the aforementioned specific examples, (aq-1) to (aq-4), (aq-13), (aq-14) and (aq-15) are particularly preferable.

(Triphenylmethane Dye)

An embodiment of dye polymer (dye polymer represented by formula (A)) related to the present invention is a dye polymer that has a partial structure derived from a triphenylmethane dye (triphenylmethane compound). The dye polymer includes a dye polymer that has a partial structure derived from the compounds (triphenylmethane compounds) represented by the following formula (TP) as a partial structure of a dye moiety (Dye). In the present invention, a triphenylmethane compound broadly refers to a compound that has a dye moiety including a triphenylmethane skeleton in the molecule.

Formula (TP)

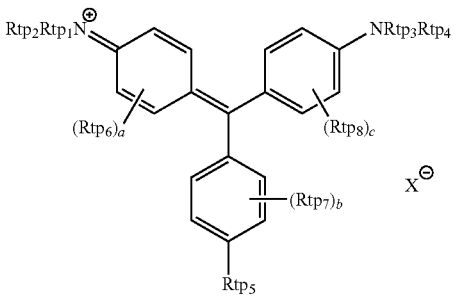

In formula (TP), $Rtp_1$ to $Rtp_4$ each independently represent a hydrogen atom, an alkyl group or an aryl group. $Rtp_5$ represents a hydrogen atom, an alkyl group, an aryl group or $NRtp_9Rtp_{10}$ (in which $Rtp_9$ and $Rtp_{10}$ represent a hydrogen atom, an alkyl group or an aryl group). $Rtp_6$, $Rtp_7$ and $Rtp_8$ represent a substituent group. a, b and c represent an integer of 0 to 4. When a, b and c are 2 or more, $Rtp_6$, $Rtp_7$ and $Rtp_8$ may be bonded together to form a ring. $X^-$ represents an anion.

$Rtp_1$ to $Rtp_6$ are preferably a hydrogen atom, a linear or branched alkyl group having 1 to 5 carbon atoms and a phenyl group. $Rtp_5$ is preferably a hydrogen atom or $NRtp_9Rtp_{10}$, most preferably $NRtp_9Rtp_{10}$. $Rtp_9$ and $Rtp_{10}$ are preferably a hydrogen atom or a linear or branched alkyl group having 1 to 5 carbon atoms or a phenyl group. The substituent groups represented by Rtp$_6$, Rtp$_7$ and Rtp$_8$ may be substituent groups described in the section of the substituent group A, but are particularly preferably a linear or branched alkyl group having 1 to 5 carbon atoms, an alkynyl group having 1 to 5 carbon atoms, an aryl group having 6 to 15 carbon atoms, a carboxyl group or a sulfo group, more preferably a linear or branched alkyl group having 1 to 5 carbon atoms, an alkynyl group having 1 to 5 carbon atoms, a phenyl group or a carboxyl group. In particular, Rtp$_6$ and Rtp$_8$ are preferably an alkyl group having 1 to 5 carbon atoms, and Rtp$_7$ are preferably an alkynyl group (particularly preferably, a phenyl group in which adjacent two alkynyl groups are bonded to each other), a phenyl group or a carboxyl group.

a, b or c each independently represents an integer of 0 to 4. In particular, a and b are preferably 0 to 1 and c is preferably 0 to 2.

X⁻ represents an anion. Specific examples of X⁻ include inorganic anions such as a fluorine anion, a chlorine anion, a bromine anion, an iodine anion, a perchlorate anion, a thiocyanate anion, a hexafluorophosphate anion, a hexafluoroantimonate anion, a hexafluoroborate anion, a carboxylate anion such as an acetate anion or a benzoate anion, organic sulfonate anions such as benzenesulfonate anion, a toluenesulfonate anion, a trifluoromethanesulfonate anion, organic phosphate anions such as an octylphosphate anion, a dodecylphosphate anion, an octadecylphosphate anion, a phenylphosphate anion, and a nonyl phenylphosphate anion. X⁻ may be joined to a dye skeleton, or to a part (such as polymer chain) of the dye polymer.

X⁻ is preferably a fluorine anion, a chlorine anion, a bromine anion, an iodine anion, a perchlorate anion, a carboxylate anion, most preferably a perchlorate anion and a carboxylate anion.

Specific examples of the compound represented by formula (TP) are given as follows, but the present invention is not limited thereto.

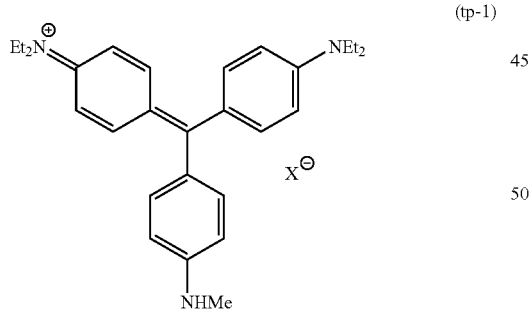
(tp-1)

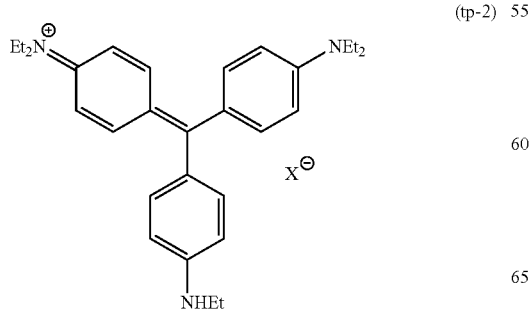
(tp-2)

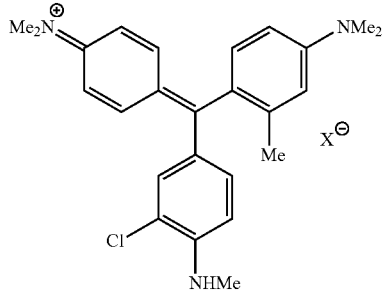
(tp-3)

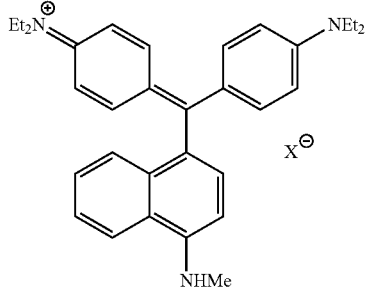
(tp-4)

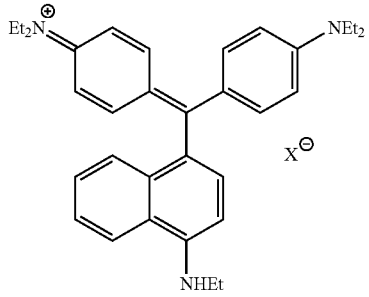
(tp-5)

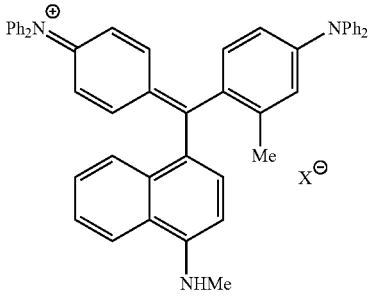
(tp-6)

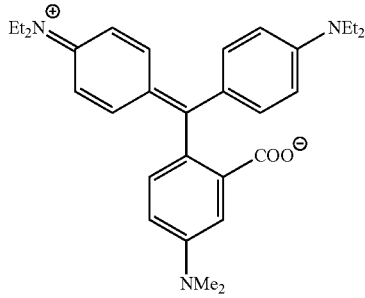
(tp-7)

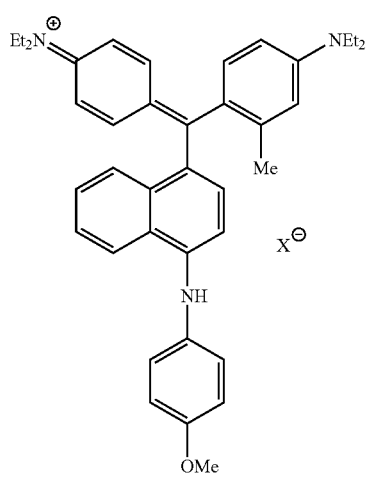
(tp-8)
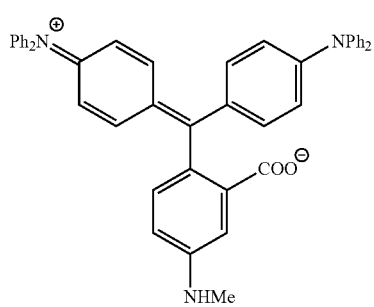
(tp-9)
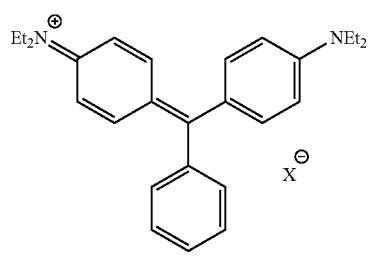
(tp-10)
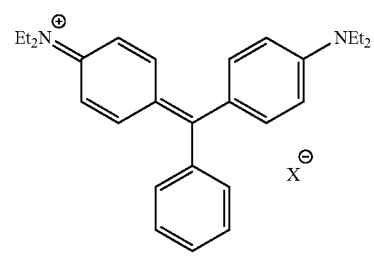
(tp-11)
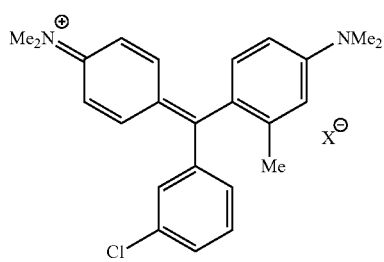
(tp-12)
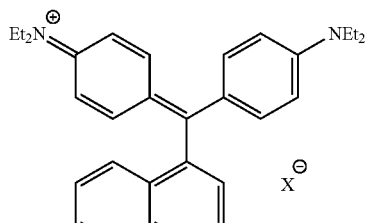
(tp-13)
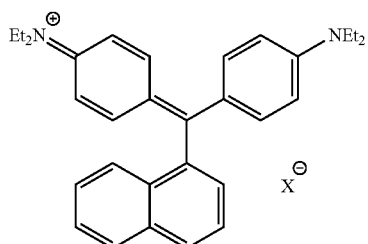
(tp-14)
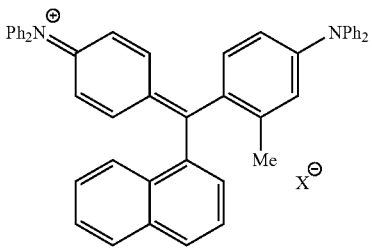
(tp-15)
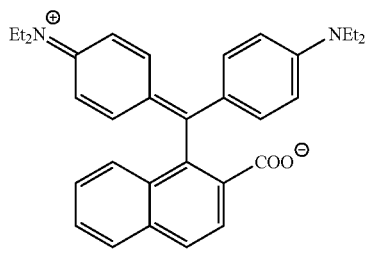
(tp-16)
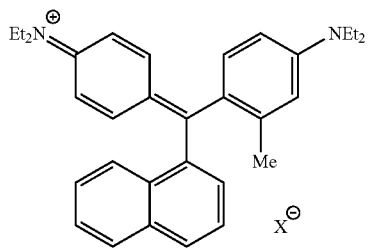
(tp-17)
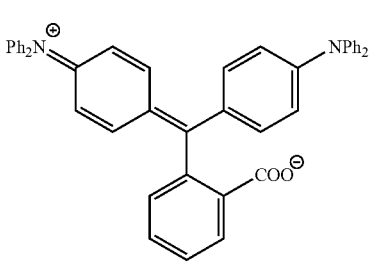
(tp-18)
In terms of color characteristics and heat resistance, among the aforementioned specific examples, (tp-4), (tp-5), (tp-6) and (tp-8) are particularly preferable.

(Xanthene Dye)

An embodiment of dye polymer related to the present invention is a dye polymer that has a partial structure derived from a xanthene dye (xanthene compound). The dye polymer includes a dye polymer that has a partial structure derived from the compounds represented by the following formula (J) as a partial structure of a dye moiety (Dye).

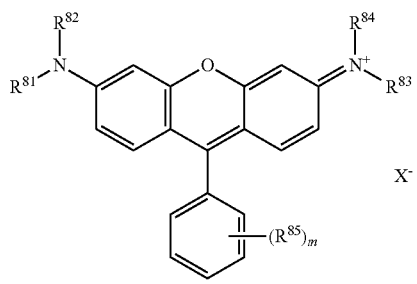

Formula (J)

In formula (J), $R^{81}$, $R^{82}$, $R^{83}$ and $R^{84}$ each independently represent a hydrogen atom or a monovalent substituent group, $R^{85}$ each independently represent a monovalent substituent group, and m represents an integer of 0 to 5. X— represents an anion.

The substituent groups of $R^{81}$ to $R^{84}$ and $R^{85}$ in formula (J) are the same as substituent groups described in the section of the substituent group A.

When $R^{81}$ and $R^{82}$, $R^{83}$ and $R^{84}$, and m in formula (J) are 2 or more, $R^{85}$ may be each independently bonded together to form a 5-, 6- or 7-membered saturated ring, or a 5-, 6- or a 7-membered unsaturated ring. When the formed 5-membered ring, 6-membered ring or 7-membered ring is a further substituted group, the ring may be substituted by the substituent group described in $R^{81}$ to $R^{85}$, and when the ring is substituted by two or more substituent groups, the substituent groups thereof may be identical or different.

When $R^{81}$ and $R^{82}$, $R^{83}$ and $R^{84}$, and m in formula (J) are 2 or more, and $R^{85}$ are each independently bonded together to form a 5-, 6- or 7-membered saturated ring having no substituent group or a 5-, 6- or 7-membered unsaturated ring, the saturated ring of the 5-, 6- or 7-membered ring having no substituent group, or the unsaturated ring of the 5-, 6- or 7-membered ring may be for example a pyrrole ring, a furan ring, a thiophene ring, a pyrazole ring, an imidazole ring, a triazole ring, an oxazole ring, a thiazole ring, a pyrrolidine ring, a piperidine rings, a cyclopentene ring, a cyclohexene ring, a benzene ring, a pyridine ring, a pyrazine ring, or a pyridazine ring, and is preferably a benzene ring or a pyridine ring.

In particular, $R^{82}$ and $R^{83}$ represent a hydrogen atom, and $R^{81}$ and $R^{84}$ are preferably a substituted or unsubstituted phenyl group. Also, $R^{85}$ is preferably a halogen atom, a linear or branched alkyl group having 1 to 5 carbon atoms, a sulfo group, a sulfonamide group, or a carboxyl group. The substituent groups of the phenyl group of $R^{81}$ and $R^{84}$ are most preferably a hydrogen atom, a halogen atom, a linear or branched alkyl group having 1 to 5 carbon atoms, a sulfo group, a sulfonamide group, and a carboxyl group.

X— represents an anion. Specific examples of X— include inorganic anions such as a fluorine anion, a chlorine anion, a bromine anion, an iodine anion, a perchlorate anion, a thiocyanate anion, a hexafluorophosphate anion, a hexafluoroantimonate anion, a hexafluoroborate anion, a carboxylate anion such as an acetate anion or a benzoate anion, organic sulfonate anions such as benzenesulfonate anion, toluenesulfonate anion, trifluoromethanesulfonate anion, organic phosphate anions such as an octylphosphate anion, a dodecylphosphate anion, an octadecylphosphate anion, a phenylphosphate anion, and a nonyl phenylphosphate anion. X— may be joined to a dye skeleton, or to a part (such as polymer chain) of the dye polymer.

X— is preferably a fluorine anion, a chlorine anion, a bromine anion, an iodine anion, a perchlorate anion, a carboxylate anion, most preferably a perchlorate anion and a carboxylate anion.

The compound having a xanthene skeleton represented by formula (J) can be synthesized by a method mentioned in literature. Specifically, the method mentioned in Tetrahedron Letters, 2003, vol. 44, No. 23, pages 4355 to 4360, Tetrahedron, 2005, vol. 61, No. 12, pages 3097 to 3106 and the like can be used.

Specific examples of the xanthene compound are given as follows, but the present invention is not limited thereto.

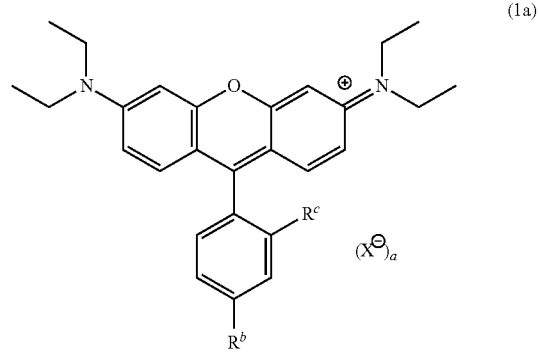

(1a)

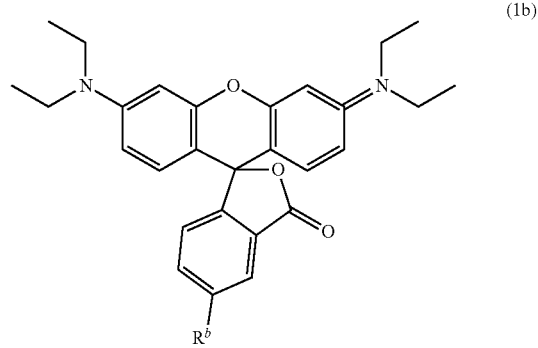

(1b)

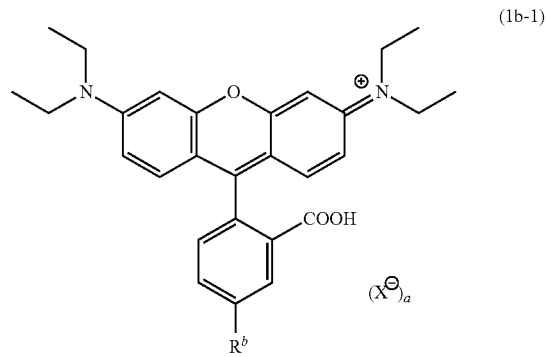

(1b-1)

-continued (1c)

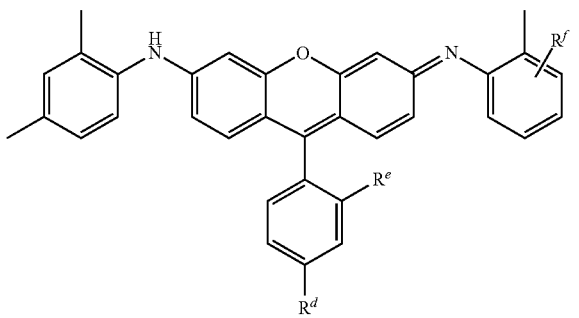

(1d)

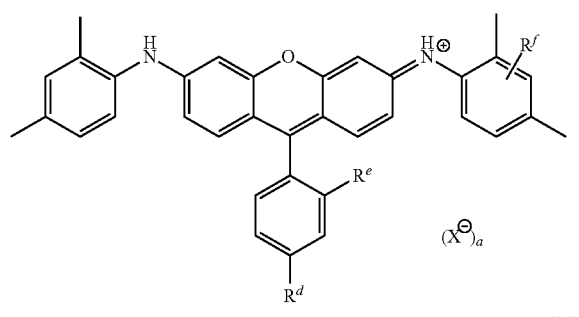

(1e)

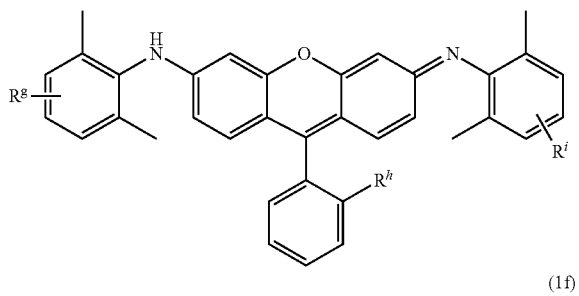

(1f)

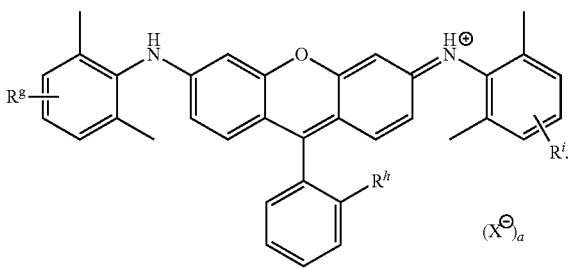

(In formulae (1a) to (1f), $R^b$ and $R^c$ each independently represent a hydrogen atom, —SO$_3$—, —CO$_2$H or —SO$_2$NHR$^a$. $R^d$, $R^e$ and $R^f$ each independently represent —SO$_3$—, —SO$_3$Na or —SO$_2$NHRa.

Rg, Rh and Ri each independently represent a hydrogen atom, —SO$_3$—, —SO$_3$H or —SO$_2$NHR$^a$.

$R^a$ represents an alkyl group having 1 to 10 carbon atoms, preferably, 2-ethylhexyl group. X and a are the same as above.)

The compound represented by formula (1b) is a tautomer of a compound represented by formula (1b-1).

Among them, in terms of color characteristics and heat resistance, formula (1e) and formula (1f) are particularly preferred.

(Cyanine Dye)

An embodiment of dye polymer related to the present invention is a dye polymer that has a partial structure derived from a cyanine dye (cyanine compound). The dye polymer includes a dye polymer that has a partial structure derived from the compound (cyanine compound) represented by the following formula (PM) as a partial structure of a dye moiety (Dye). In the present invention, a cyanine compound broadly refers to a compound that has a dye moiety including a cyanine skeleton in the molecule.

Formula (PM)

In formula (PM), ring $Z^1$ and ring $Z^2$ each independently represent a heterocyclic ring that may have a substituent group. 1 represents an integer of 0 to 3. X— represents an anion.

Ring $Z^1$ and ring $Z^2$ each independently represent oxazole, benzooxazole, oxazoline, thiazole, thiazoline, benzothiazole, indolizine, benzoindolizine, 1,3-thiadiazine and the like.

The substituent groups of ring $Z^1$ and ring $Z^2$ are the same as substituent groups described in the section of the substituent group A. Specific examples of X$^-$ include inorganic anions such as a fluorine anion, a chlorine anion, a bromine anion, an iodine anion, a perchlorate anion, a thiocyanate anion, a hexafluorophosphate anion, a hexafluoroantimonate anion, a hexafluoroborate anion, a carboxylate anion such as an acetate anion or a benzoate anion, organic sulfonate anions such as benzenesulfonate anion, a toluenesulfonate anion, a trifluoromethanesulfonate anion, organic phosphate anions such as an octylphosphate anion, a dodecylphosphate anion, an octadecylphosphate anion, a phenylphosphate anion, and a nonyl phenylphosphate anion. X may be joined to a dye skeleton, or to a part (such as polymer chain) of the dye polymer.

The compound represented by formula (PM) is preferably a compound represented by the following formula (PM-2).

Formula (PM-2)

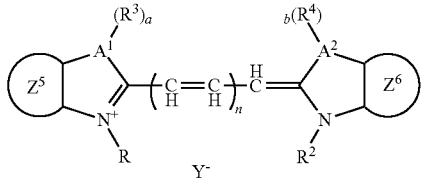

In formula (PM-2), ring $Z^5$ and ring $Z^6$ each independently represent a benzene ring that may have a substituent group or a naphthalene ring that may have a substituent group.

Y$^-$ represents Cl$^-$, Br$^-$, I$^-$, ClO$_4^-$, OH$^-$, a monovalent organic carboxylate anion, a monovalent organic sulfonate anion, a monovalent boron anion or a monovalent organic metal complex anion. Y$^-$ may be joined to a dye skeleton, or to a part (such as polymer chain) of the dye polymer.

n represents an integer of 0 to 3.

$A^1$ and $A^2$ each independently represent an oxygen atom, a sulfur atom, a selenium atom, a carbon atom or a nitrogen atom.

$R^1$ and $R^2$ each independently represent an aliphatic hydrocarbon group having 1 to 20 carbon atoms that may have a substituent group monovalent.

$R^3$ and $R^4$ each independently represent a hydrogen atom or a monovalent aliphatic hydrocarbon group having 1 to 6 carbon atoms, or a bivalent aliphatic hydrocarbon group having 2 to 6 carbon atoms formed by joining one $R^3$ with one $R^4$.

a and b each independently represent an integer of 0 to 2.

In formula (PM-2), $Y^-$ is preferably a fluorine anion, a chlorine anion, a bromine anion, an iodine anion, a perchlorate anion, or a carboxylate anion, most preferably a chlorine anion, a chlorine anion, a carboxylate anion. n is preferably 1. $A^1$ and $A^2$ each independently represent an oxygen atom, a sulfur atom or a carbon atom and both of them are most preferably a carbon atom.

Specific examples of the cyanine compound are given as follows, but the present invention is not limited thereto.

(pm-1)
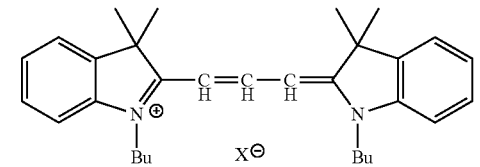

(pm-2)
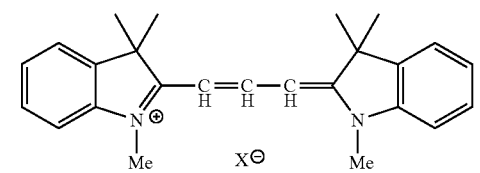

(pm-3)
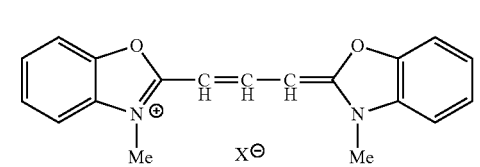

(pm-4)
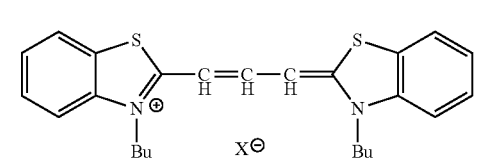

(pm-5)
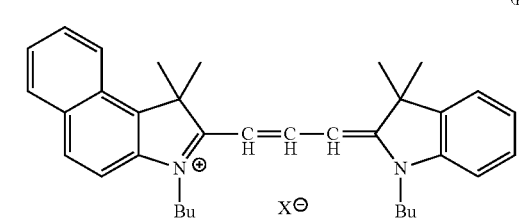

(pm-6)
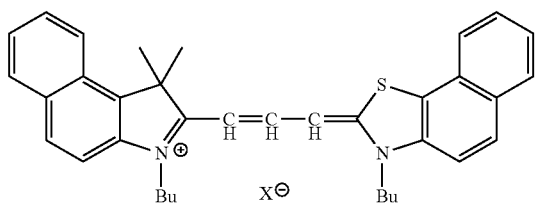

-continued (pm-7)
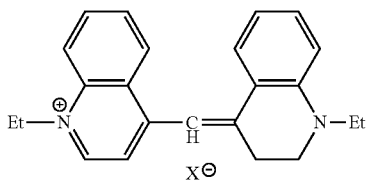

(pm-8)
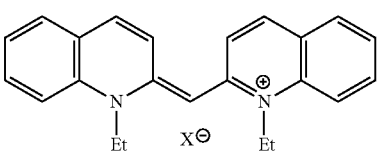

(pm-9)
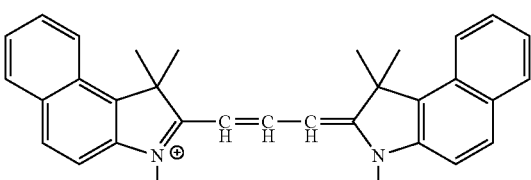

(pm-10)
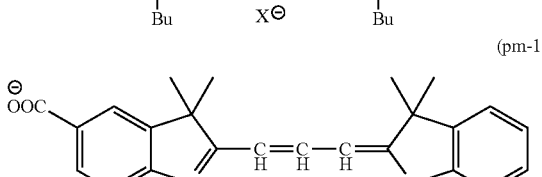

(pm-11)
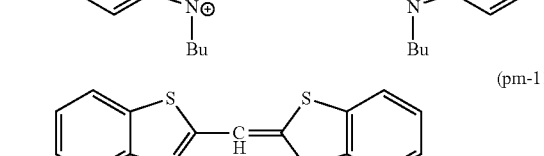

(pm-12)
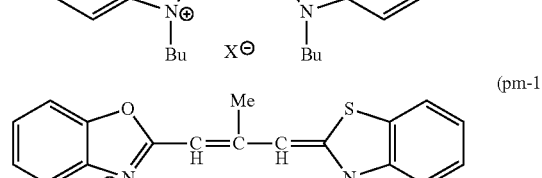

(pm-13)
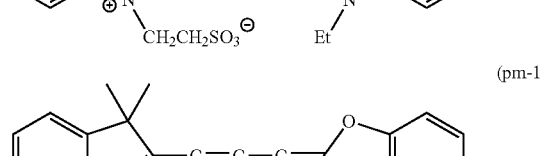

(pm-14)
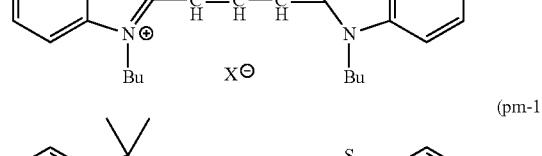

(pm-15)
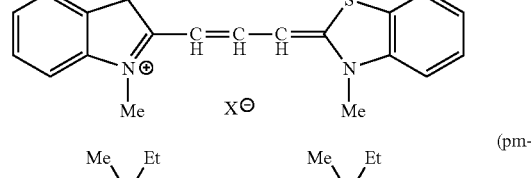

-continued

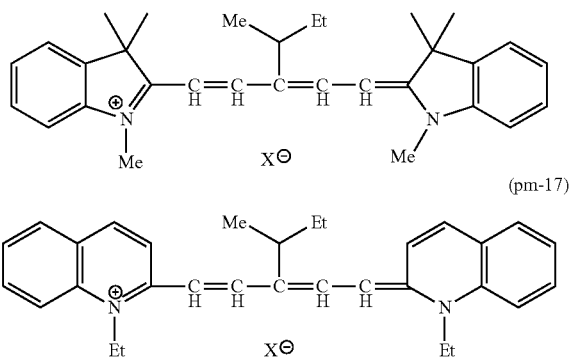

(pm-16)

(pm-17)

Among the specific examples, structures represented by (pm-1) to (pm-6), (pm-9) and (pm-10) are preferred, and in terms of color characteristics and heat resistance, among them, dye structures represented by (pm-1), (pm-2) and (pm-10) are particularly preferred.

(Squarylium Dye)

An embodiment of dye polymer related to the present invention is a dye polymer that has a partial structure derived from a squarylium dye (squarylium compound). The dye polymer includes a dye polymer that has a partial structure derived from the compound represented by the following formula (K) as a partial structure of a dye moiety (Dye). In the present invention, a squarylium compound broadly refers to a compound that has a dye moiety including a squarylium skeleton in the molecule.

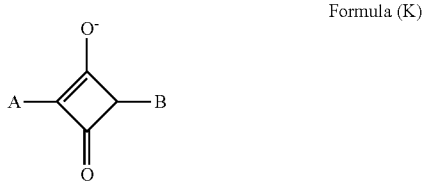

Formula (K)

In formula (K), A and B each independently represent an aryl group or a heterocyclic group. The aryl group is preferably an aryl group having 6 to 48 carbon atoms, more preferably 6 to 24 and is for example phenyl, naphthyl or the like. The heterocyclic group is preferably a heterocyclic group of a 5-membered ring or a 6-membered ring and is for example pyroyl, imidazoyl, pyrazoyl, thienyl, pyridyl, pyrimidyl, pyridazyl, triazol-1-yl, thienyl, furyl, thiadiazoyl and the like.

The compound represented by formula (K) is particularly preferably a compound represented by the following formula (K-1), formula (K-2), formula (K-3) or formula (K-4).

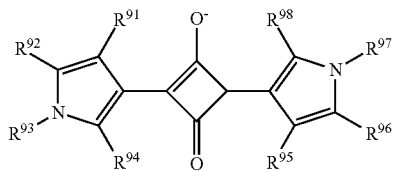

Formula (K-1)

In formula (K-1), $R^{91}$, $R^{92}$, $R^{94}$, $R^{95}$, $R^{96}$, and $R^{98}$ each independently represent a hydrogen atom, a halogen atom, a linear or branched alkyl group, a cycloalkyl group, a linear or branched alkynyl group, a cycloalkynyl group, an alkynyl group, an aryl group, a heterocyclic group, a cyano group, a hydroxyl group, a nitro group; a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imide group, a phosphino group, a phosphinyl group, a phosphinyloxy group, a phosphinylamino group, or a silyl group.

$R^{93}$ and $R^{97}$ each independently represent a hydrogen atom, a linear or branched alkyl group, a cycloalkyl group, a cycloalkynyl group, an alkynyl group, an aryl group or a heterocyclic group.

$R^{91}$ and $R^{92}$, and, $R^{95}$ and $R^{96}$ are each bonded together to form a ring.

The substituent groups of $R^{91}$, $R^{92}$, $R^{94}$, $R^{95}$, $R^{96}$, and $R^{98}$ in formula (K-1) are the same as the substituent groups described in the section of the substituent group A.

$R^{91}$ to $R^{98}$ are each independently preferably a hydrogen atom, an alkyl group, a hydroxyl group, an amino group, an aryl group or a heterocyclic group, $R^{93}$, $R^{94}$, $R^{97}$ and $R^{98}$ are an alkyl group, and $R^{91}$ and $R^{92}$, and $R^{95}$ and $R^{96}$ are more preferably bonded together to form an aryl ring, $R^{93}$, $R^{94}$, $R^{97}$ and $R^{98}$ are an alkyl group having 1 to 20 carbon atoms, and $R^{91}$ and $R^{92}$, and $R^{95}$ and $R^{96}$ are most preferably bonded together to form a benzene ring.

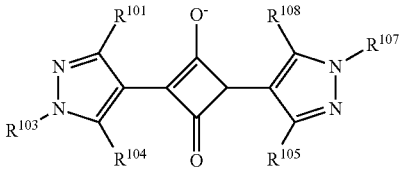

Formula (K-2)

$R^{101}$, $R^{103}$, $R^{104}$, $R^{105}$, $R^{107}$ and $R^{108}$ in formula (K-2) are the same as $R^{91}$, $R^{93}$, $R^{94}$, $R^{95}$, $R^{97}$ and $R^{98}$ in formula (K-1). $R^{103}$ and $R^{107}$ are the same as $R^{93}$ and $R^{97}$ in formula (K-1).

In formula (K-2), $R^{101}$, $R^{103}$, $R^{104}$, $R^{105}$, $R^{107}$ and $R^{108}$ are preferably a hydrogen atom, an alkyl group, a hydroxyl group, an amino group, an aryl group, or a heterocyclic group, $R^{101}$, $R^{103}$, $R^{105}$ and $R^{107}$ are more preferably an alkyl group or an aryl group, $R^{104}$ and $R^{108}$ are more preferably a hydroxyl group or amino group, $R^{101}$, $R^{103}$, $R^{105}$ and $R^{107}$ are an alkyl group having 1 to 20 carbon atoms and $R^{104}$ and $R^{108}$ are even more preferably a hydroxyl group. $R^{103}$ and $R^{107}$ represent a hydrogen atom, a linear or branched alkyl group, and an aryl group, more preferably an alkyl group having 1 to 5 carbon atoms and a phenyl group.

Formula (K-4)

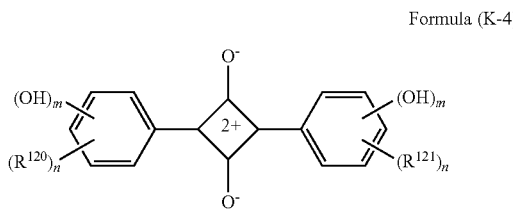

R[109], R[110], R[111], R[112], R[113], R[114], R[115], R[118] and R[119] in formula (K-3) are the same as R[91], R[93], R[94], R[95], R[97] and R[98] in formula (K-3). R[116] and R[117] are the same as R[93] and R[97] in formula (K-1).

In formula (k-3), R[109], R[110], R[111], R[112], R[113], R[114], R[115], R[118] and R[119] are preferably a hydrogen atom, a halogen atom, a linear or branched alkyl group, a hydroxyl group, or an alkoxy group. In particular, R[109], R[113], R[115], R[118] and R[119] represent a hydrogen atom, R[110], R[111] and R[112] represent a hydrogen atom or an alkoxy group, R[114] is most preferably a hydrogen atom, a halogen atom, a hydroxyl group, an alkyl group having 1 to 5 carbon atoms, or an alkoxy group having 1 to 5 carbon atoms.

Formula (K-4)

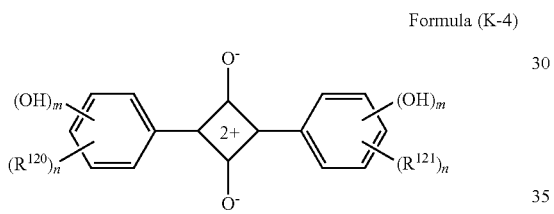

In formula (K-4), R[120] represents a halogen atom, an alkyl group, an alkoxy group, or an alkynyl group. M represents an integer of 1 to 4. n represents an integer of 0 to 4.

R[120] is particularly preferably an alkyl group having 1 to 5 carbon atoms, or an alkoxy group having 1 to 5 carbon atoms. m is preferably 1 to 3 and m is most preferably 3. n is preferably 0 to 3 and more preferably 0 or 1.

The pigment compound that can form a dye structure in the present invention is a squarylium compound represented by the following formula (K-1) in terms of color.

The squarylium compounds represented by formulae (K-1) to formula (K-4) can be synthesized using a method mentioned in J. Chem. Soc., Perkin Trans. 1, 2000, 599.

Specific examples of the squarylium compounds represented by formulae (K-1) to formula (K-4) are given as follows, but the present invention is not limited thereto.

(sq-1)

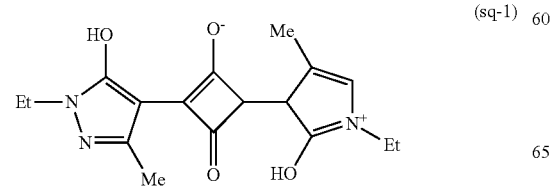

(sq-2)

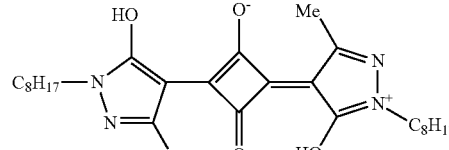

(sq-3)

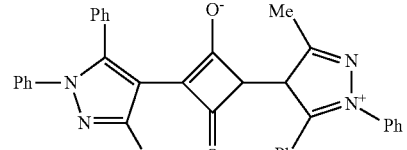

(sq-4)

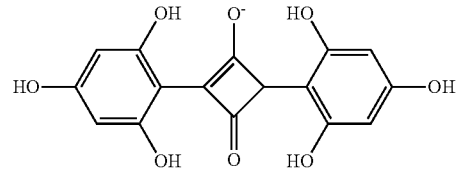

(sq-5)

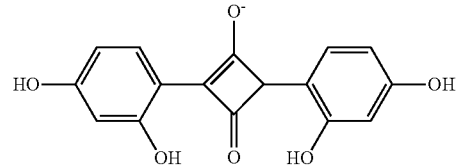

(sq-6)

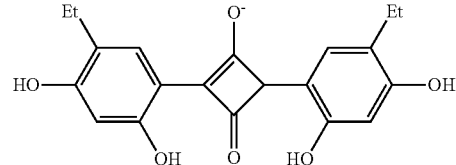

(sq-7)

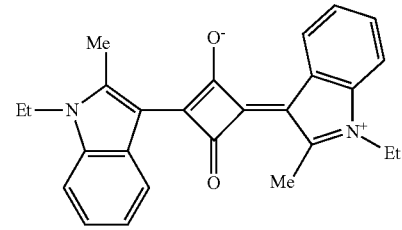

(sq-8)

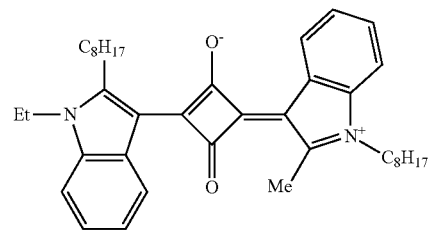

-continued (sq-9)
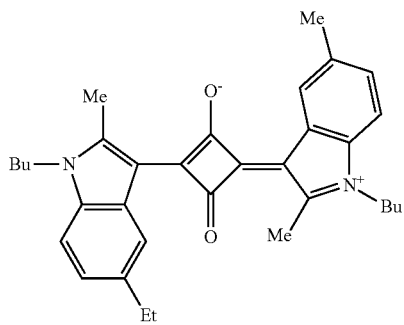

(sq-10)
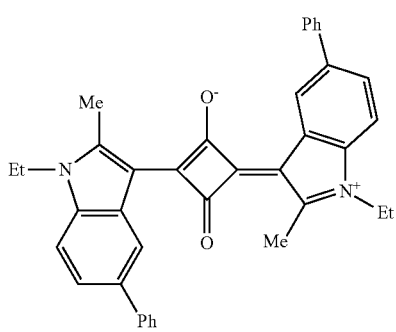

(sq-11)
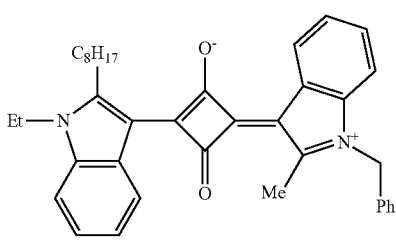

(sq-12)
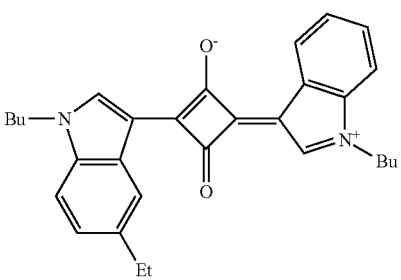

(sq-13)
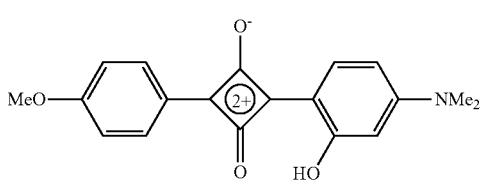

(sq-14)
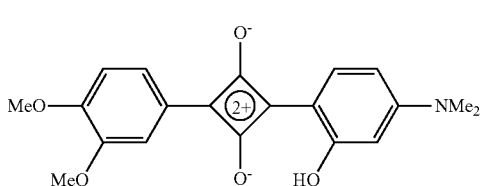

-continued (sq-15)
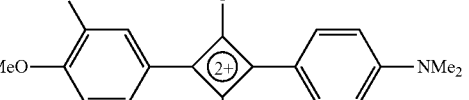

(sq-16)

Among the specific examples, in terms of color characteristics and heat resistance (sq-1), (sq-2), (sq-3), (sq-7), (sq-8), (sq-9), (sq-9), (sq-10), (sq-11) and (sq-12) are preferred.

(Quinophthalone Dye)

An embodiment of dye polymer related to the present invention is a dye polymer that has a partial structure derived from a quinophthalone dye (quinophthalone compound). The dye polymer includes a dye polymer that has a partial structure derived from the compound (quinophthalone compound) represented by the following formula (QP) as a partial structure of a dye moiety (Dye). In the present invention, a quinophthalone compound broadly refers to a compound that has a dye moiety including a quinophthalone skeleton in the molecule.

Formula (QP)

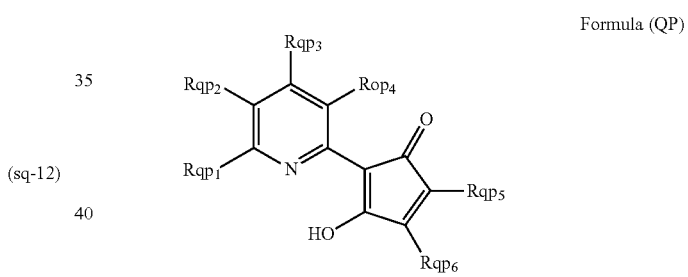

In formula (QP), $Rqp^1$ to $Rqp^6$ each independently represent a hydrogen atom or a substituent group. When at least two of $Rqp^1$ to $Rqp^6$ are adjacent, they may be bonded together to form a ring and the ring may further have a substituent group.

The substituent groups represented by $Rqp^1$ to $Rqp^6$ represent substituent groups described in the section of the substituent group A. The substituent groups represented by $Rqp^1$ to $Rqp^6$ are preferably a halogen atom, an alkyl group, an alkynyl group and an aryl group. In particular, $Rqp^1$ and $Rqp^2$, and $Rqp^5$ and $Rqp^6$ are preferably bonded together to form a substituted or unsubstituted phenyl group. $Rqp^3$ and $Rqp^4$ are preferably a hydrogen atom, a chlorine atom, or a bromine atom.

Examples of the substituent group of the phenyl group formed by joining $Rqp^1$ with $Rqp^2$, and $Rqp^5$ with $Rqp^6$ include the substituent groups described in the section of the substituent group, but the substituent group is preferably a halogen atom, a carbamoyl group, an amino group, an alkoxy group, an aryloxy group, an alkylthio group, an arylthio group and an alkoxycarbonyl group.

Specific examples of the compound represented by formulae (QP) are given as follows, but the present invention is not limited thereto.

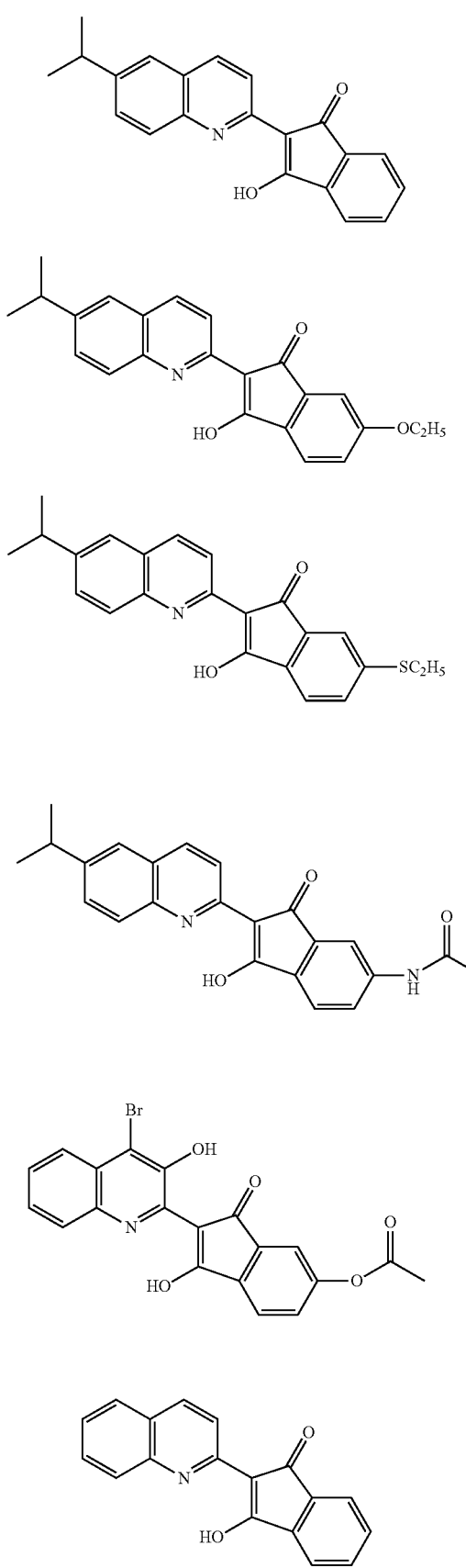

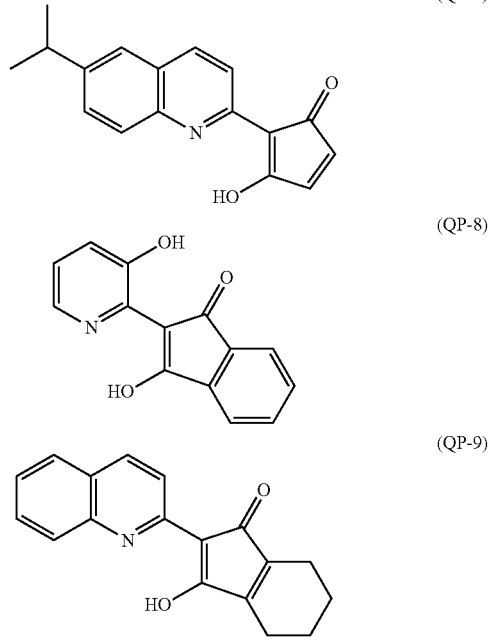

Among the specific examples, in terms of color characteristics and heat resistance, (QP-1) to (QP-5) are preferred.

(Phthalocyanine Dye)

An embodiment of dye polymer related to the present invention is a dye polymer that has a partial structure derived from a phthalocyanine dye (phthalocyanine compound). The dye polymer includes a dye polymer that has a partial structure derived from the compound (phthalocyanine dye) represented by the following formula (F) as a partial structure of a dye moiety (Dye). In the present invention, a phthalocyanine compound broadly refers to a compound that has a dye moiety including a phthalocyanine skeleton in the molecule.

Formula (F)

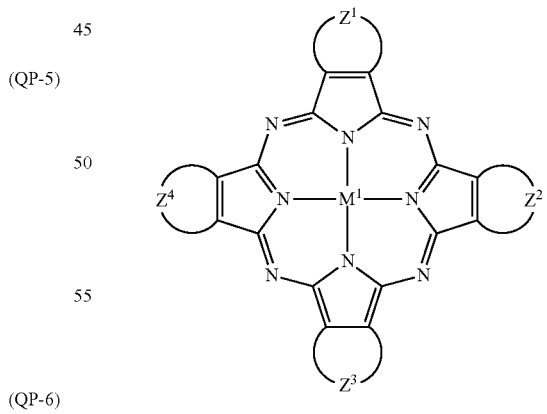

In formula (F), $M^1$ represents a metal, and $Z^1$, $Z^2$, $Z^3$, and $Z^4$ each independently represent an atom group required to form a 6-membered ring including atoms selected other than a hydrogen atom, a carbon atom and a nitrogen atom.

Formula (F) will be described in detail.

In formula (F), examples of the metal represented by $M^1$ include metal atoms such as Zn, Mg, Si, Sn, Rh, Pt, Pd, Mo, Mn, Pb, Cu, Ni, Co, and Fe, metal chlorides such as AlCl, InCl, FeCl, TiCl$_2$, SnCl$_2$, SiCl$_2$, GeCl$_2$, metal oxides such as TiO, VO, and metal hydroxides such as Si(OH)$_2$, and the metal is particularly preferably Cu and Zn.

In formula (F), $Z^1$, $Z^2$, $Z^3$, and $Z^4$ each independently represent an atom group required to form a 6-membered ring including atoms selected other than a hydrogen atom, a carbon atom and a nitrogen atom. The 6-membered ring may be a saturated ring or an unsaturated ring and may not have an unsubstituted group or have a substituent group. Examples of the substituent group include substituent groups described in the section of the substituent group A. In addition, when the 6-membered ring has two or more substituent groups, the substituent groups thereof may be identical or different. Further, the 6-membered ring may be condensed with a 5-membered ring or another 6-membered ring.

The 6-membered ring includes a benzene ring, a cyclohexane ring and the like.

Among phthalocyanine dye residues represented by formula (F), the residue derived from a phthalocyanine dye represented by formula (F-1) is particularly preferred.

Formula (F-1)

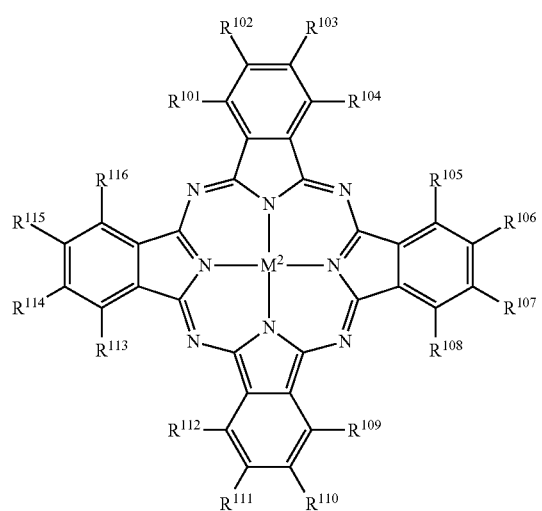

$M^2$ in formula (F-1) is the same as $M^1$ in formula (F), $M^2$ in formula (F-1) is the same as $M^1$ in formula (F) and preferred embodiments thereof are the same as those of $M^1$ in formula (F).

$R^{101}$ to $R^{116}$ in formula (F-1) each independently represent a hydrogen atom or a substituent group. When substituent groups represented by $R^{101}$ to $R^{116}$ are further substituted groups, they may be substituted by the substituent groups described in the section of the substituent group A and when they are substituted by two or more substituent groups, the substituent groups thereof may be identical or different.

Among them, the substituent groups represented by $R^{101}$ to $R^{116}$ are preferably a hydrogen atom, $SO_2NR^{117}R^{118}$ (in which $R^{117}$ and $R^{118}$ represent a hydrogen atom, a linear or branched alkyl group having carbon atoms 3 to 20, that may have a substituent group), or $SR^{119}$ (in which $R^{119}$ is a linear or branched alkyl group having 3 to 20 carbon atoms, that may have a substituent group).

Specific examples of the compound represented by formulae (F) are given as follows, but the present invention is not limited thereto.

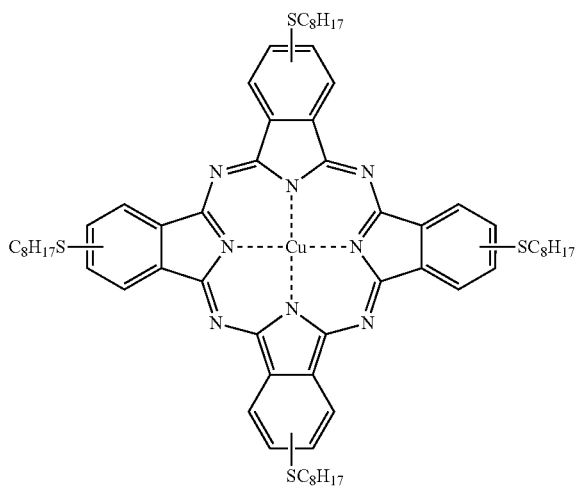

(Ph-1)

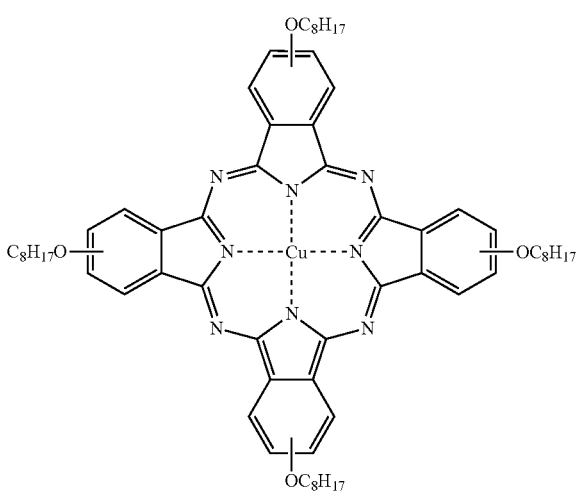

(Ph-2)

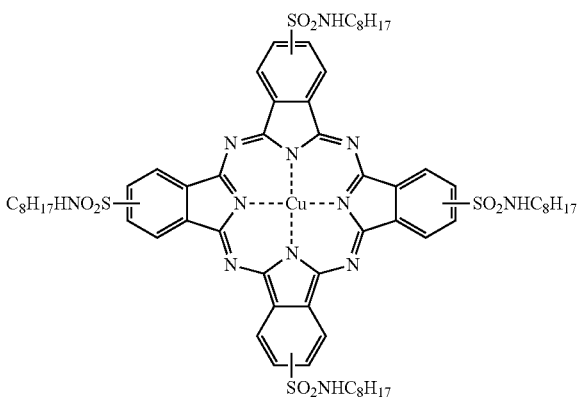

(Ph-3)

-continued (Ph-4)

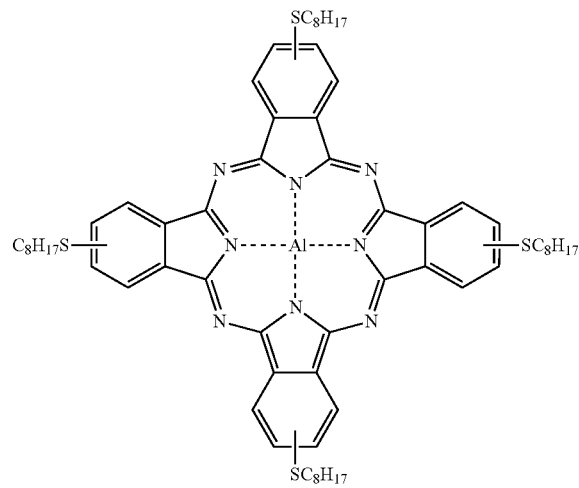

(Ph-5)

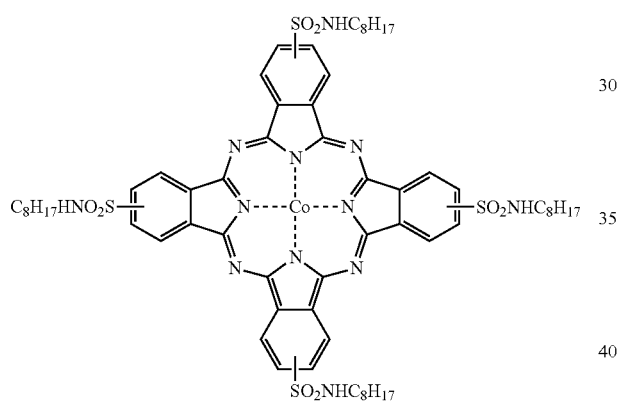

(Ph-6)

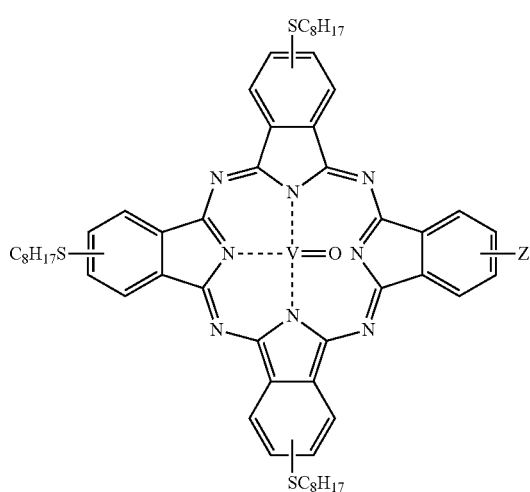

-continued (Ph-7)

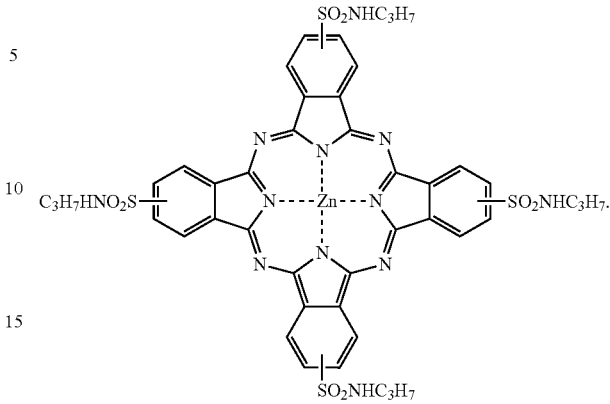

In terms of color characteristics and heat resistance, among the aforementioned specific examples, in particular, (Ph-1) to (Ph-3), (Ph-7) are preferred.

(Subphthalocyanine Compound)

An embodiment of the dye polymer related to the present invention is a dye polymer that has a partial structure derived from a subphthalocyanine dye (subphthalocyanine compound). The dye polymer includes a dye polymer that has a partial structure derived from the compound (subphthalocyanine compound) represented by the following formula (SP) as a partial structure of a dye moiety (Dye). In the present invention, a subphthalocyanine compound broadly refers to a compound that has a dye moiety including a subphthalocyanine skeleton in the molecule.

Formula (SP)

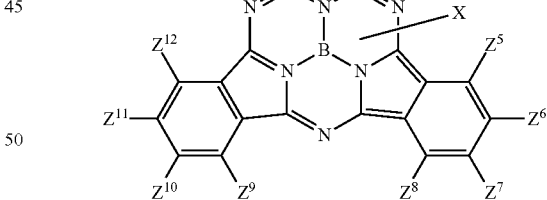

In formula (SP), $Z^1$ to $Z^{12}$ each independently represent a hydrogen atom, an alkyl group, an aryl group, a hydroxyl group, a mercapto group, an amino group, an alkoxy group, an aryloxy group, or a thioether group. X represents an anion.

Formula (SP) will be described in detail.

The alkyl group that may be present in $Z^1$ to $Z^{12}$ in formula (SP) represents a linear or branched and substituted or unsubstituted alkyl group. $Z^1$ to $Z^{12}$ particularly preferably have 1 to 20 carbon atoms, more preferably 1 to 10 carbon atoms. The substituent group that may be present in $Z^1$ to $Z^{12}$ include substituent groups described in the section of the substituent group A and are particularly preferably a fluorine atom, a hydroxyl group and a mercapto group.

In formula (SP), X represents an anion. X⁻ represents an anion. Specific examples of X— include inorganic anions such as a fluorine anion, a chlorine anion, a bromine anion, an iodine anion, a perchlorate anion, a thiocyanate anion, a hexafluorophosphate anion, a hexafluoroantimonate anion, a hexafluoroborate anion, a carboxylate anion such as an acetate anion or a benzoate anion, organic sulfonate anions such as benzenesulfonate anion, a toluenesulfonate anion, a trifluoromethanesulfonate anion, organic phosphate anions such as an octylphosphate anion, a dodecylphosphate anion, an octadecylphosphate anion, a phenylphosphate anion, and a nonyl phenylphosphate anion. X— may be joined to a dye skeleton, or to a part (such as polymer chain) of the dye polymer.

X⁻ is preferably a fluorine anion, a chlorine anion, a bromine anion, an iodine anion, a perchlorate anion, a carboxylate anion, and a phosphate anion, most preferably a perchlorate anion and a carboxylate anion.

Specific examples of the subphthalocyanine compound are given as follows, but the present invention is not limited thereto.

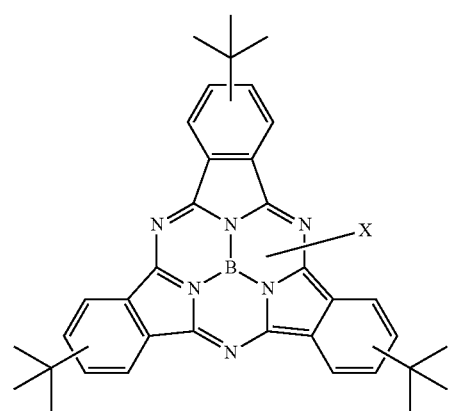

(SP-1)

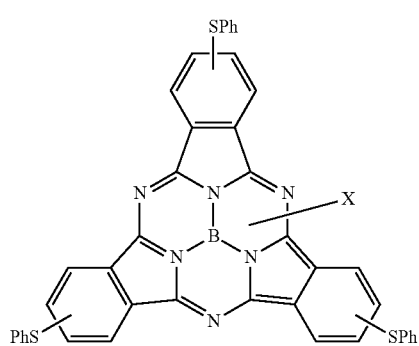

(SP-2)

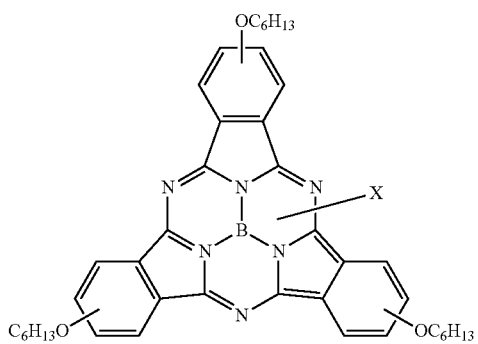

(SP-3)

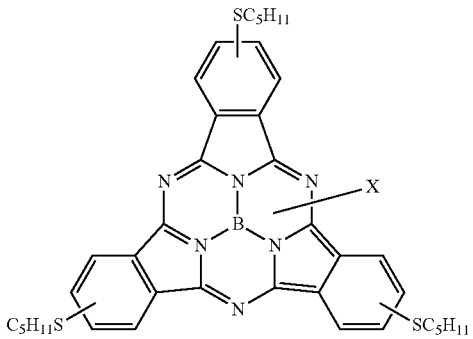

(SP-4)

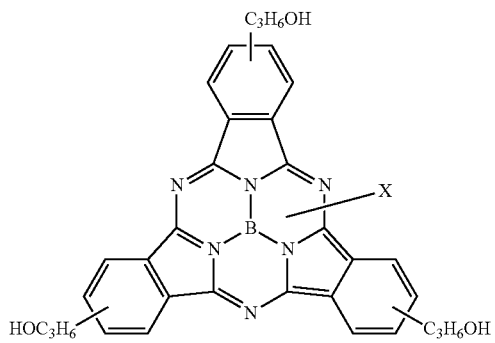

(SP-5)

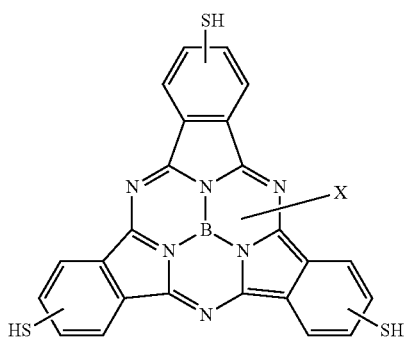

(SP-6)

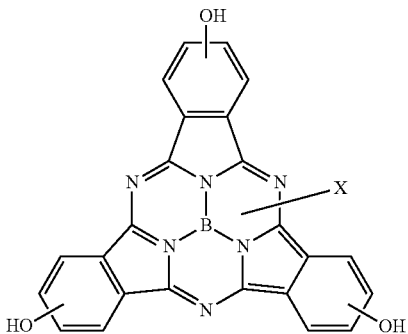

(SP-7)

(SP-8)
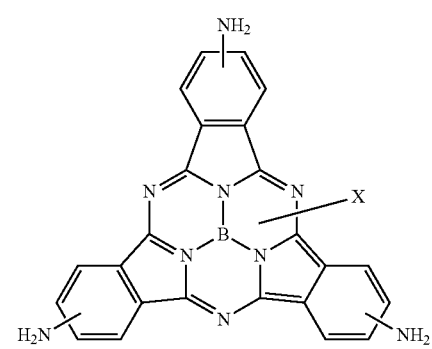

(SP-9)
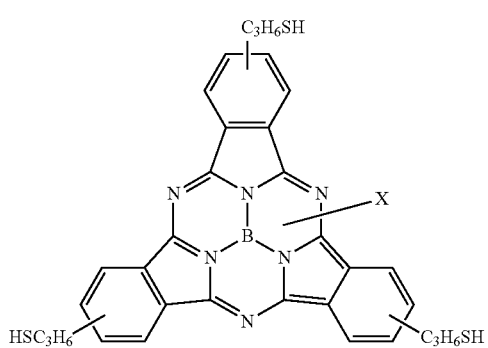

(SO-10)
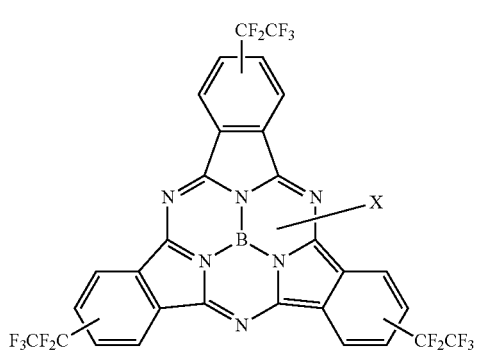

In terms of color characteristics and heat resistance, among the aforementioned specific examples, in particular (SP-2), (SP-3), (SP-4), (SP-5), (SP-6) and (SP-7) are preferred.

Hereinafter, specific examples of the structure unit represented by formula (A) are given, but the present invention is not limited thereto. First, examples of [(A-1) to (A-23)] that have a partial structure derived from a dipyrromethane metal complex compound as a partial structure of a dye moiety will be described.

(A-1)
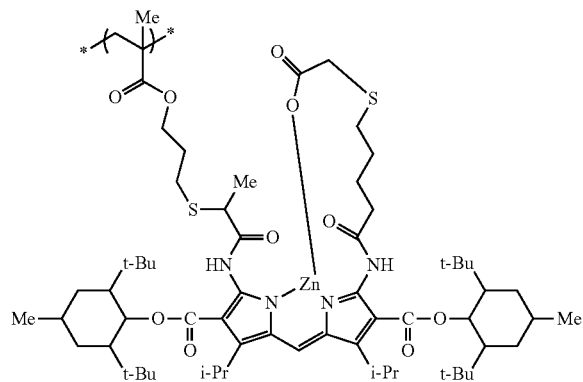

(A-2)
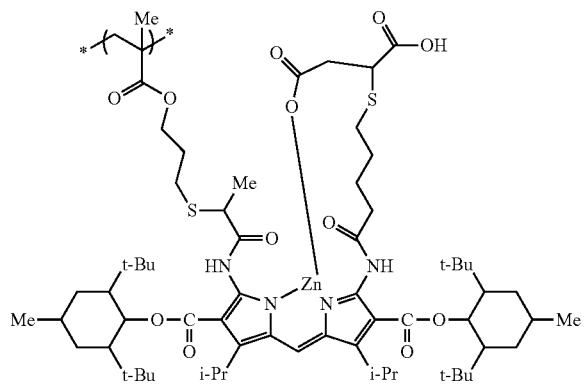

(A-3)
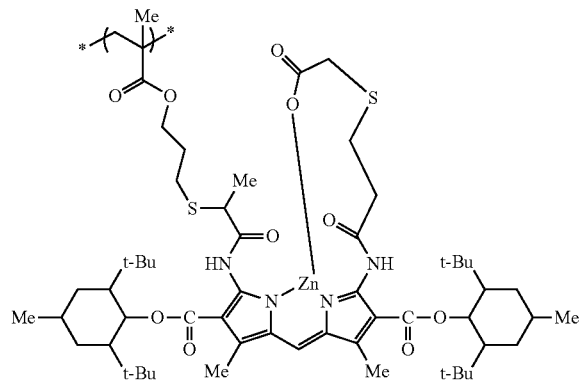

(A-4)
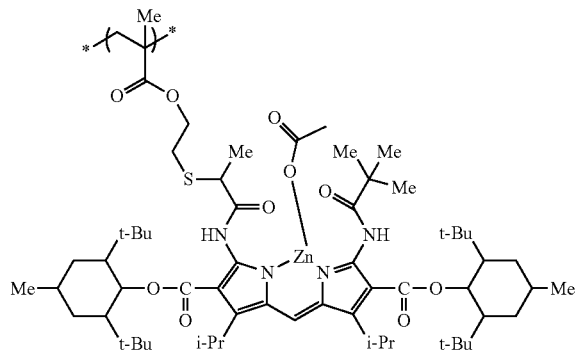

-continued
(A-5)
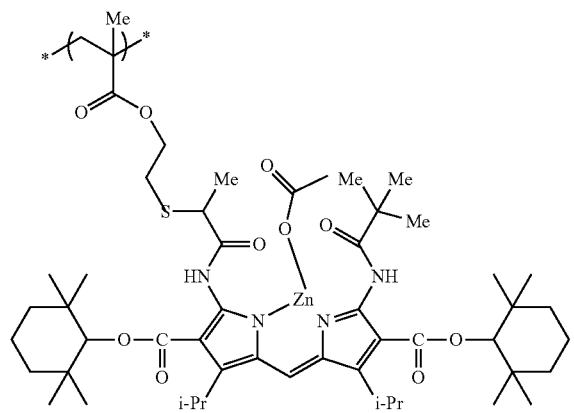
(A-6)
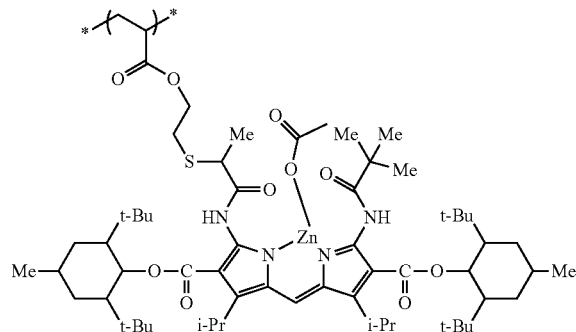
(A-7)
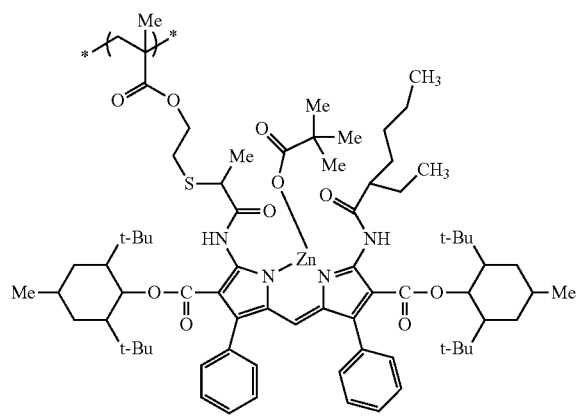
(A-8)
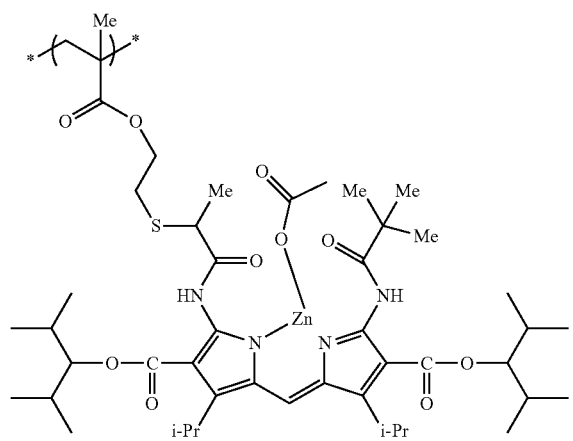
(A-9)
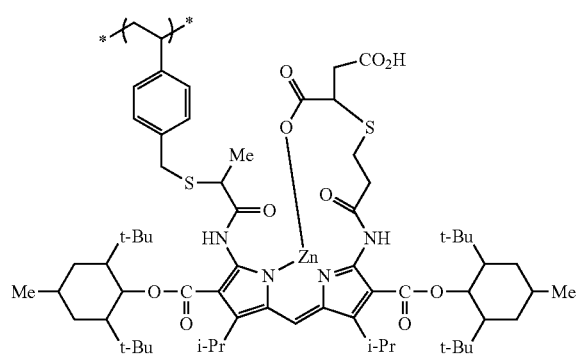
(A-10)
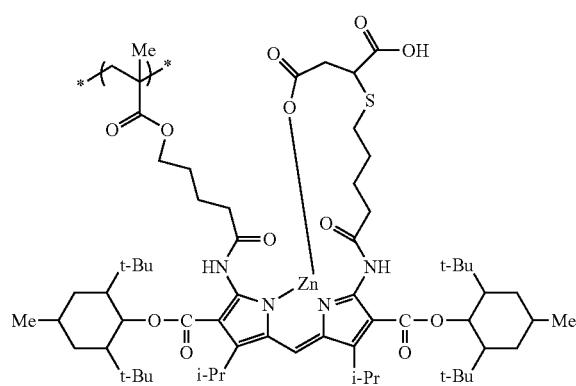

(A-11)
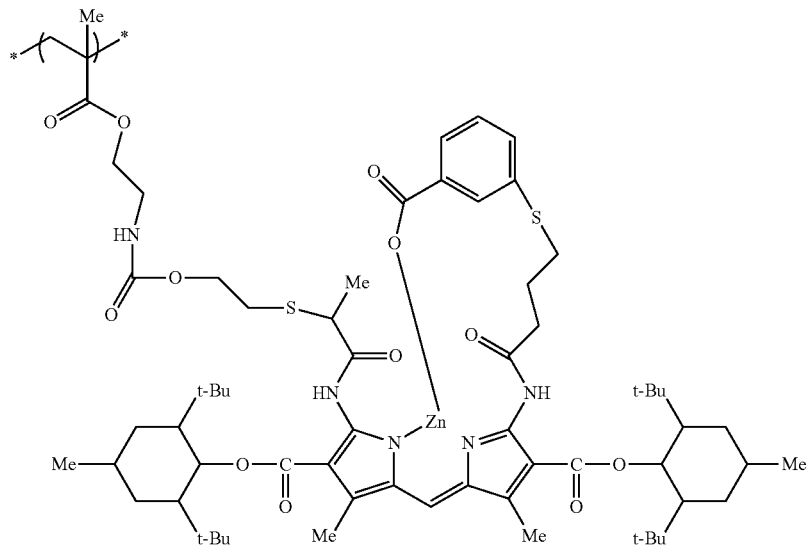
(A-12)
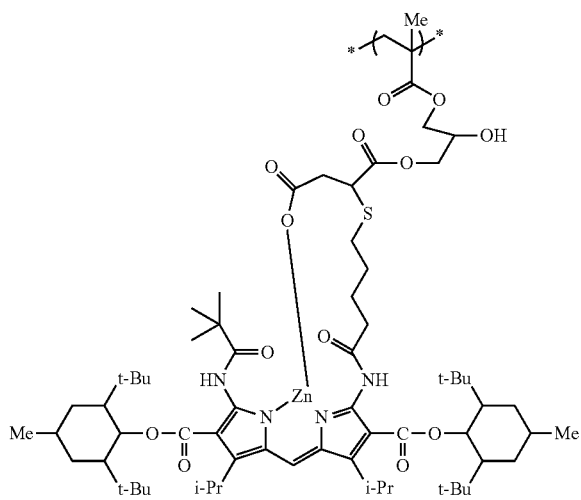
(A-13)
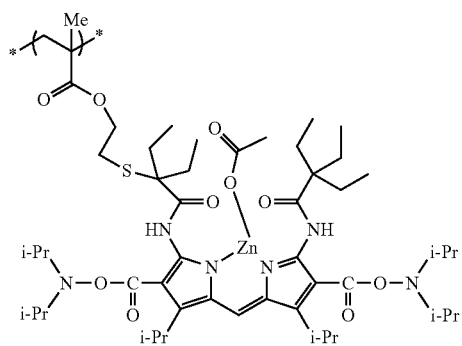
(A-15)
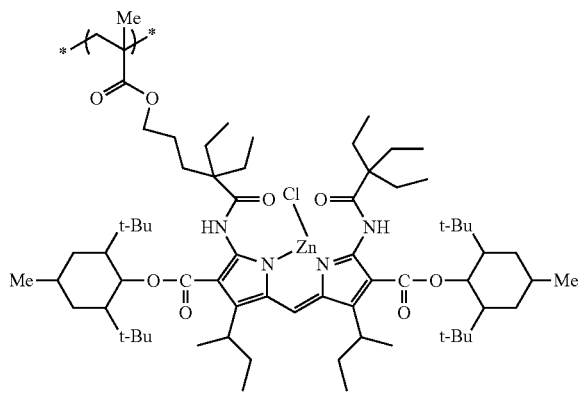
(A-16)
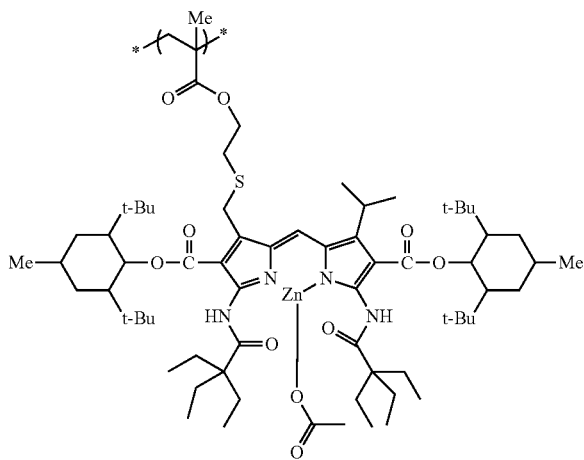

-continued
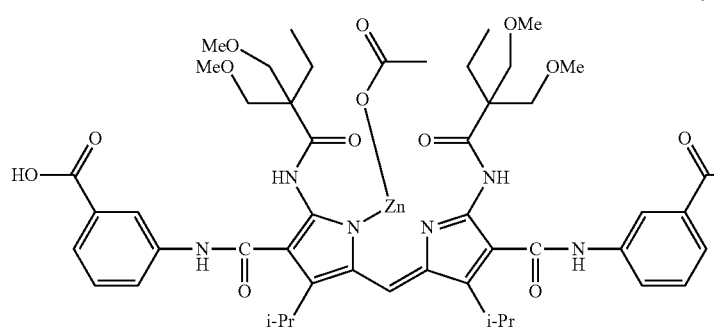
(A-17)
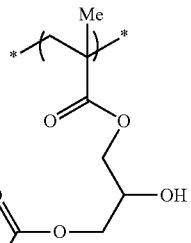
(A-18)
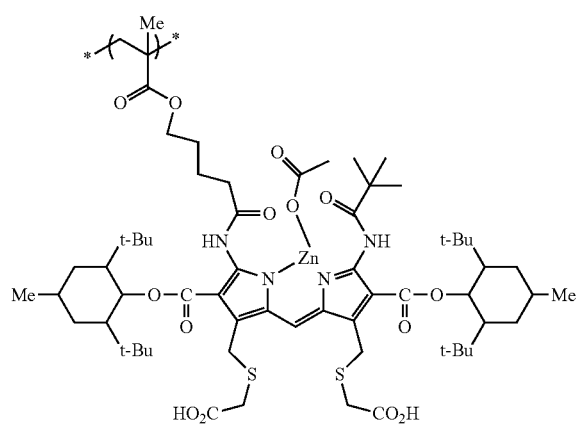
(A-19)
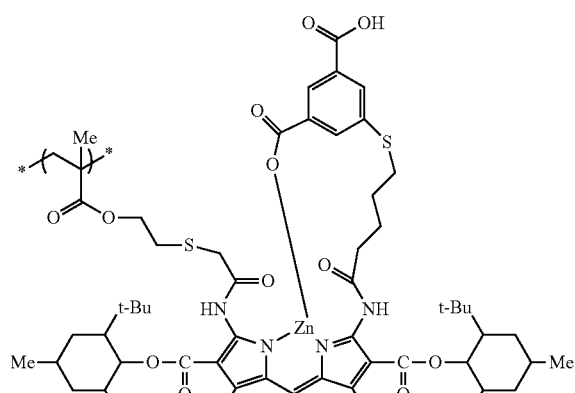
(A-20)
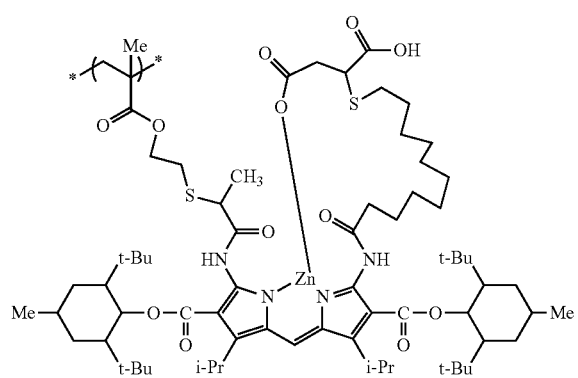
(A-21)
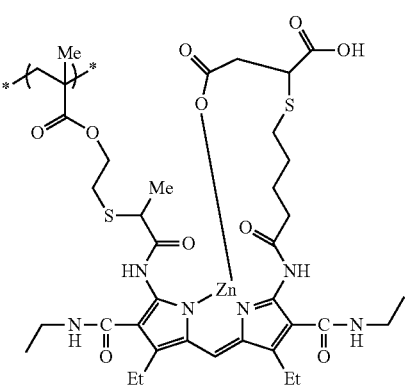
(A-22)
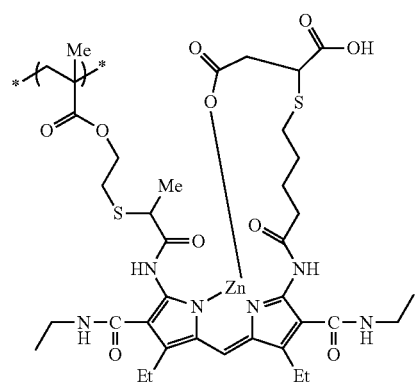
(A-21)
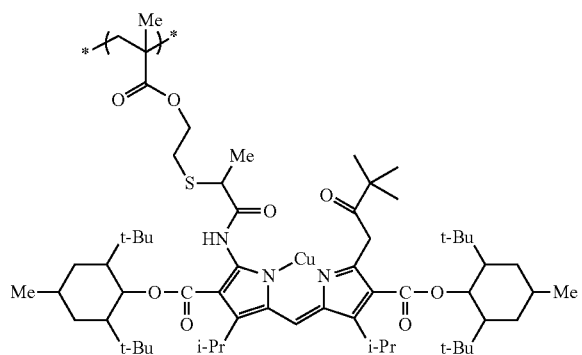
(A-22)

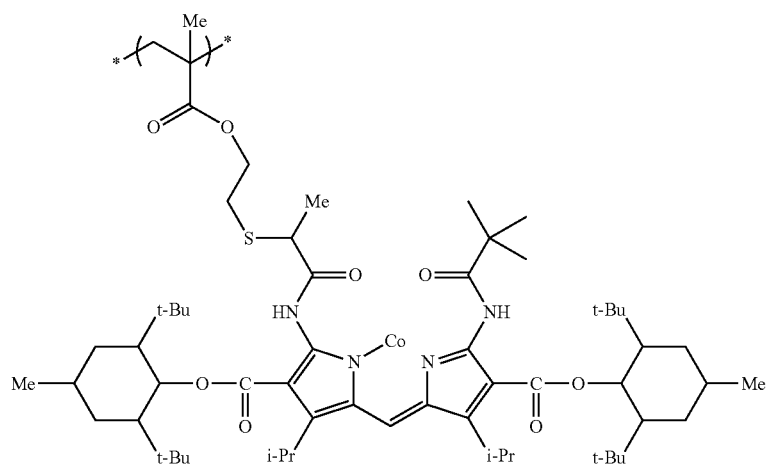
(A-23)
Specific examples of a structural unit having a dye moiety other than a pyrromethane dye as a partial structure, as the structural unit represented by formula (A) are described, but the present invention is not limited thereto.
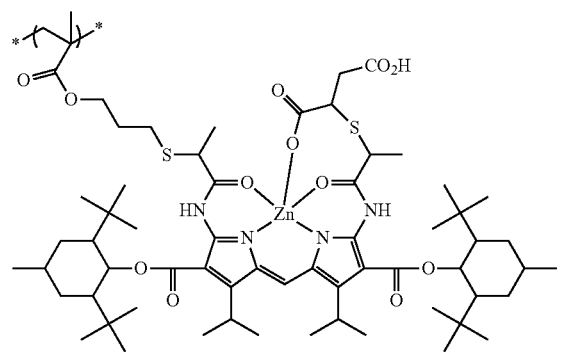
(A-dp-1)
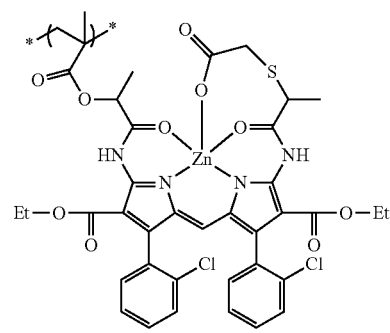
(A-dp-2)
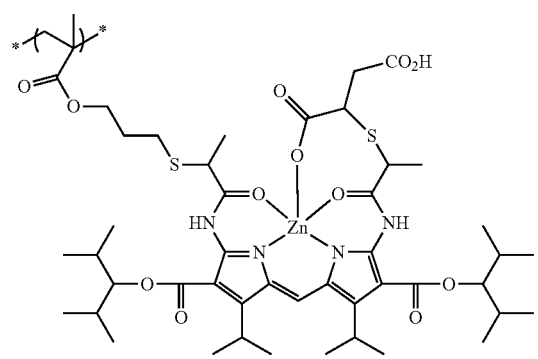
(A-dp-3)
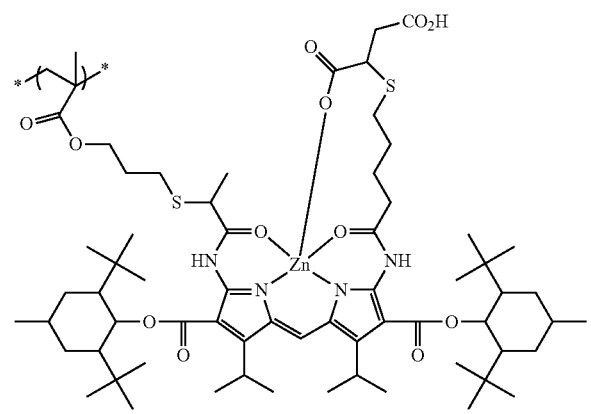
(A-dp-4)

-continued
(A-dp-5)
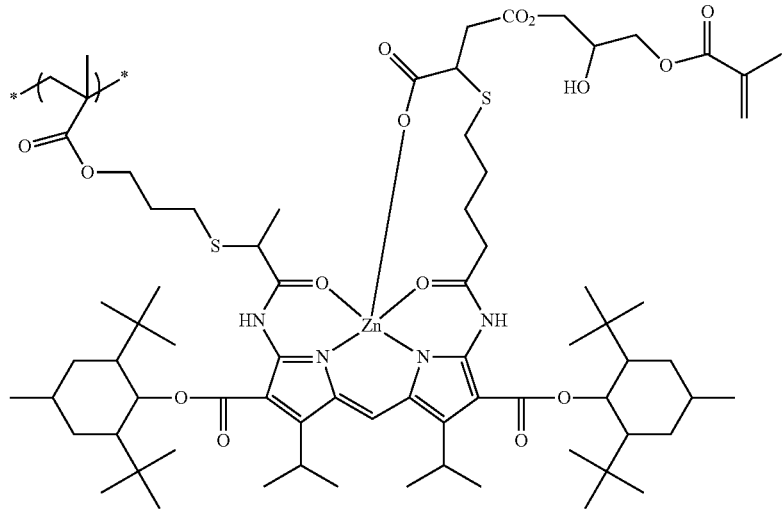
(A-dp-6)
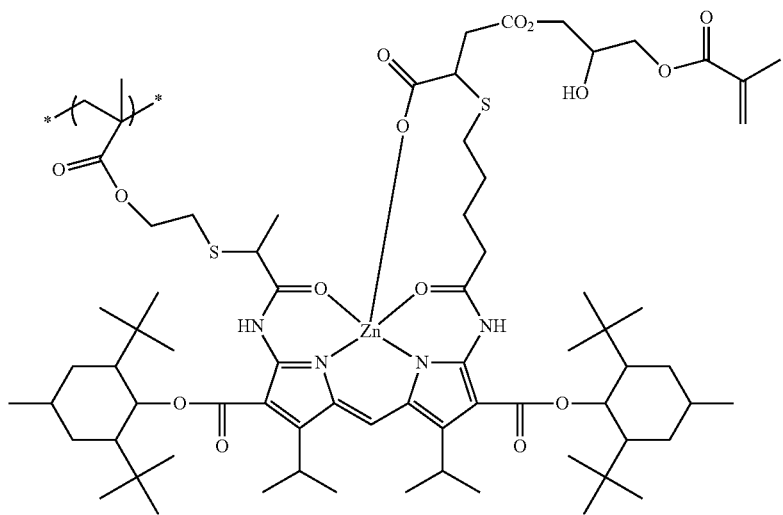
(A-dp-7)
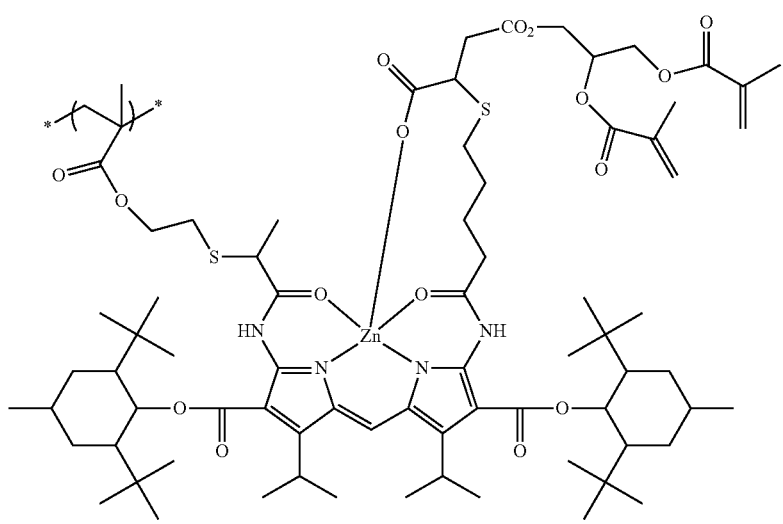

-continued
(A-dp-8)
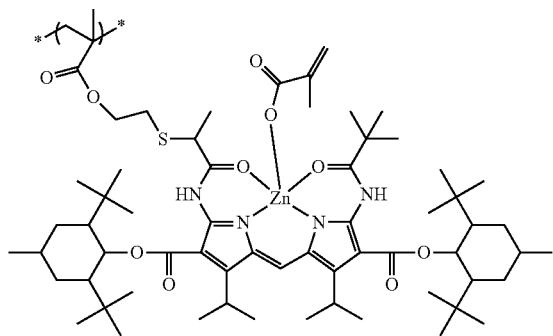
(A-dp-9)
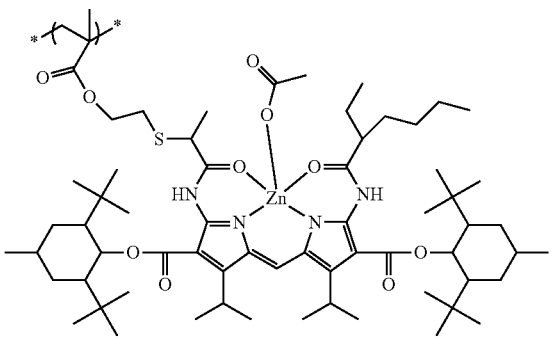
(A-dp-10)
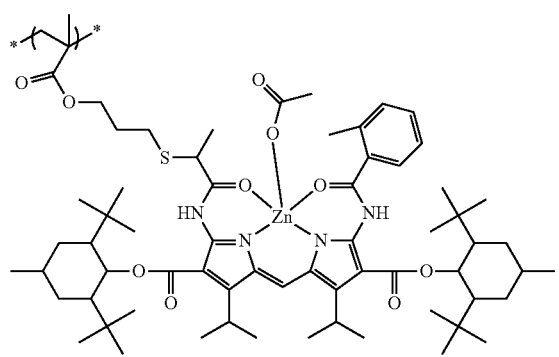
(A-dp-11)
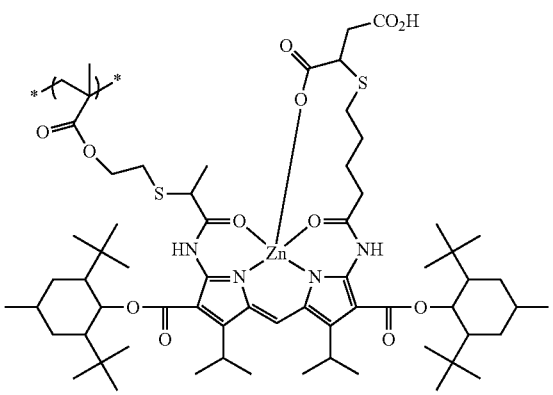
(A-dp-12)
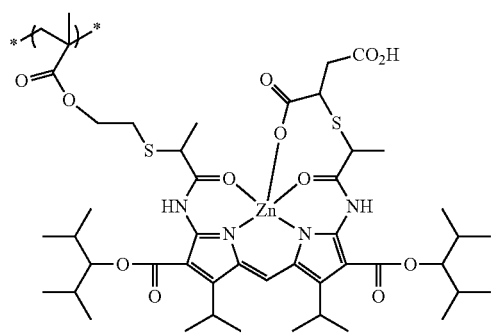
(A-dp-13)
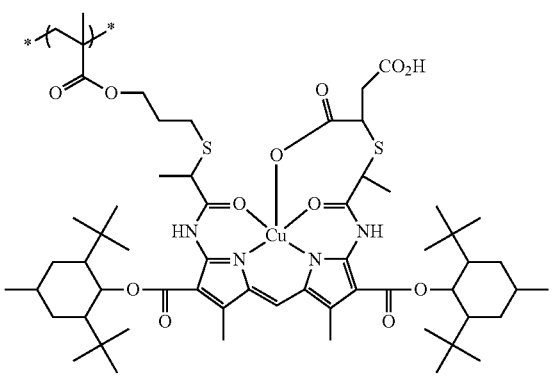
(A-dp-14)
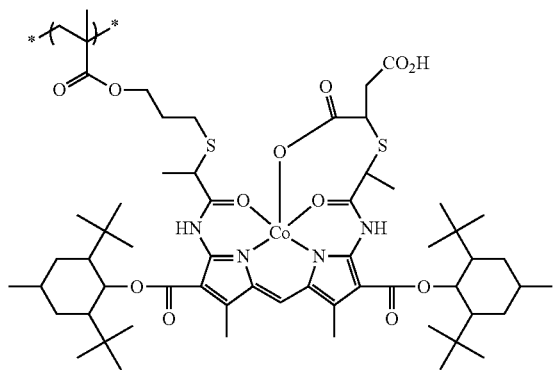
(A-dp-15)
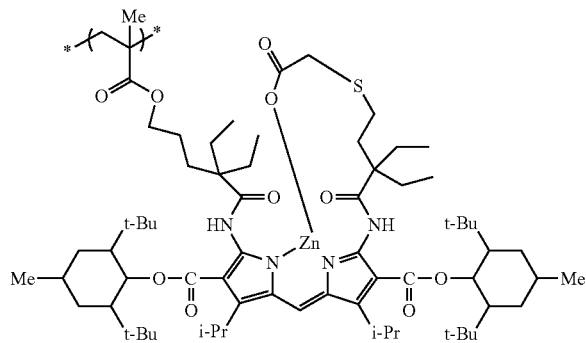

-continued
(A-dp-17)
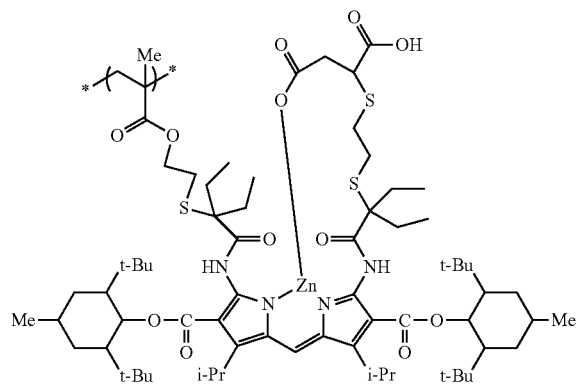
(A-dp-18)
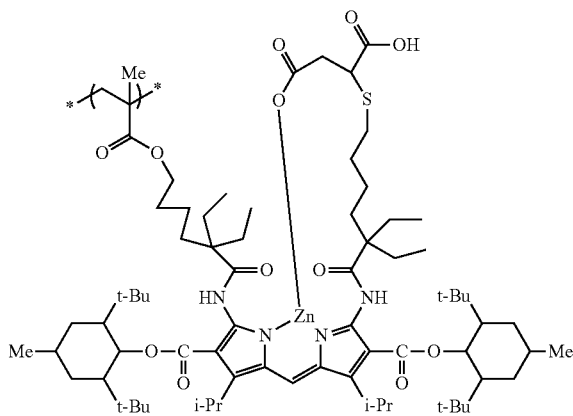
(A-dp-19)
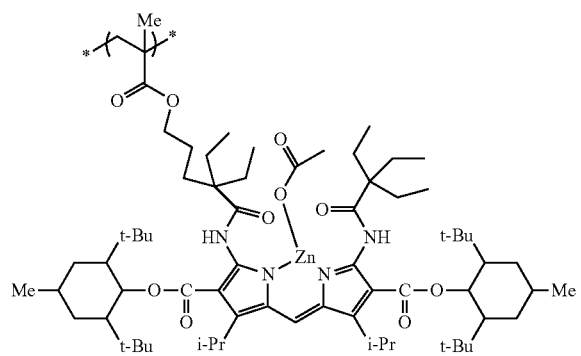
(A-dp-20)
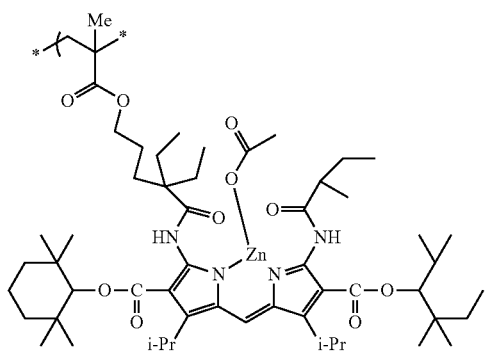
(A-dp-21)
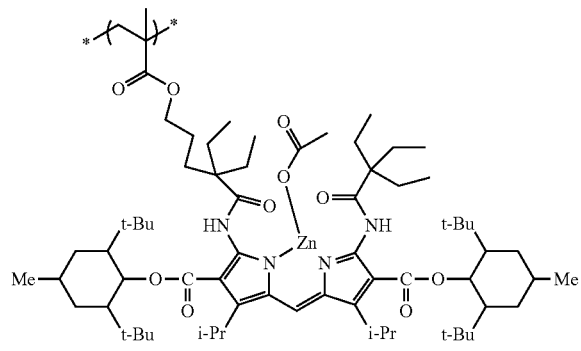
(A-dp-22)
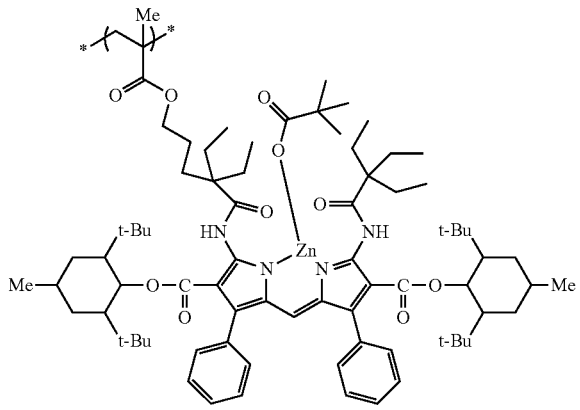
(A-dp-23)
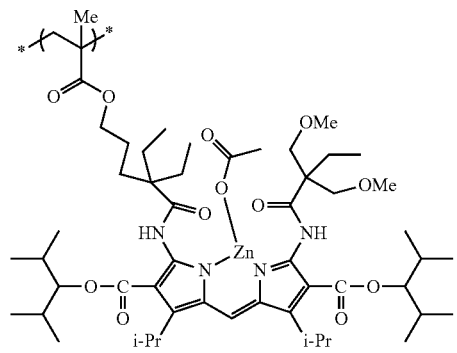
(A-dp-24)
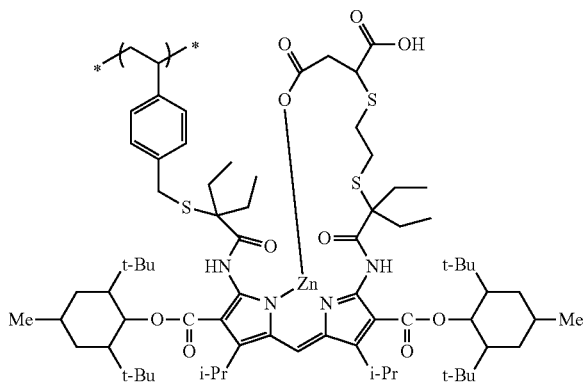

(A-dp-25)
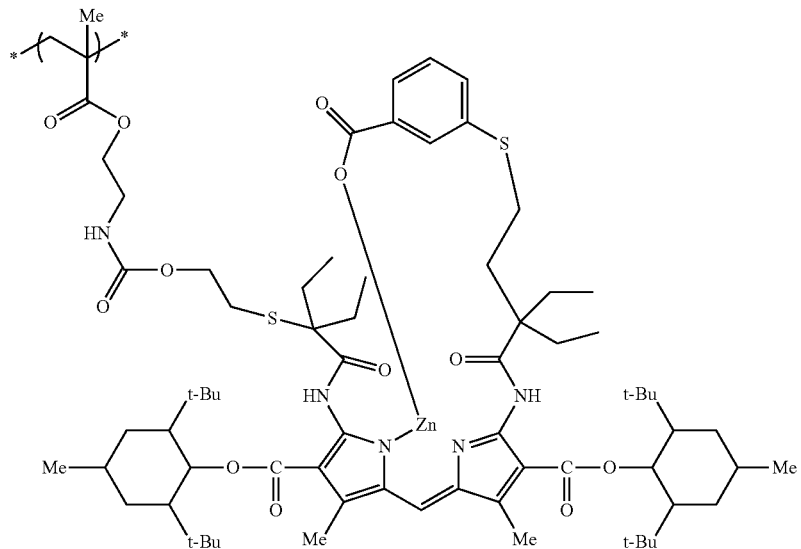
(A-dp-26)
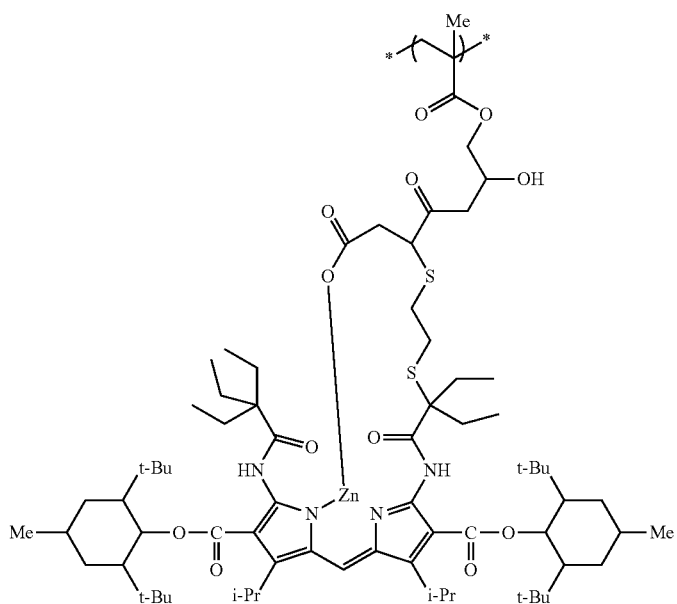
(A-az-1)
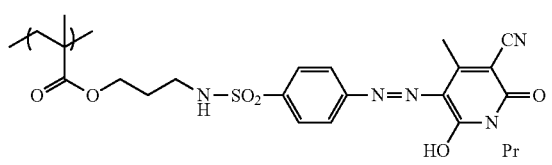
(A-az-2)
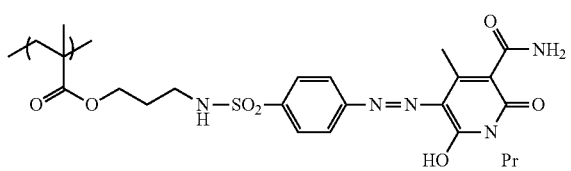
(A-az-3)
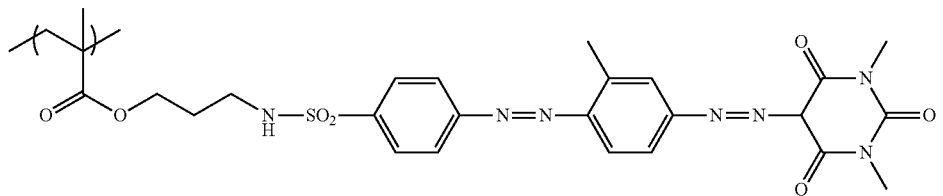

-continued
(A-az-4)
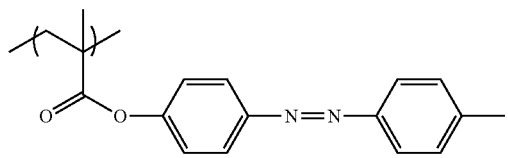
(A-az-5)
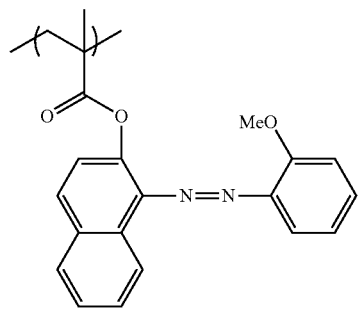
(A-az-6)
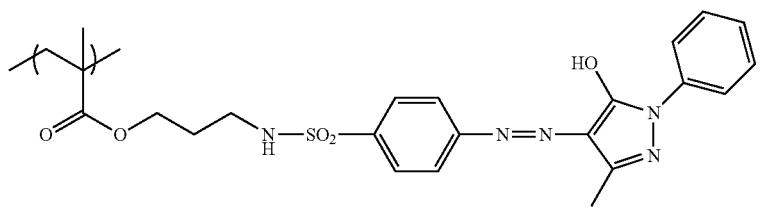
(A-az-7)
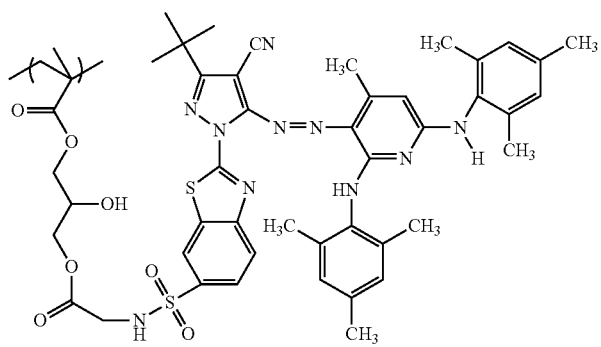
(A-az-8)
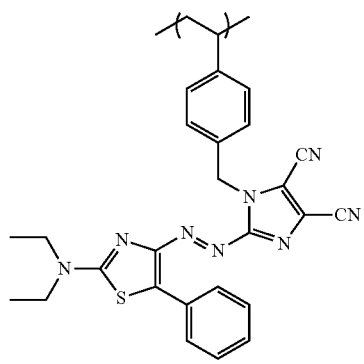
(A-az-9)
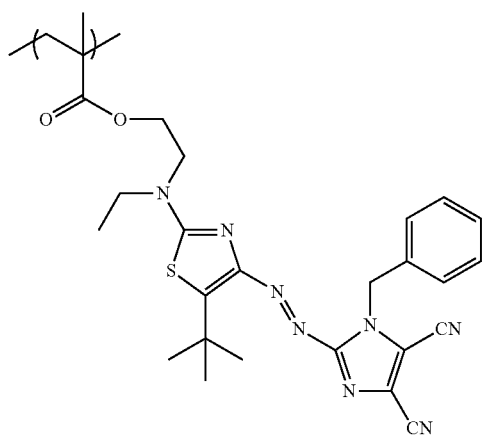
(A-az-10)
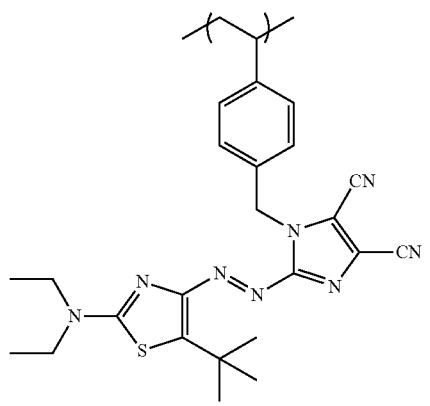

-continued
(A-az-11)
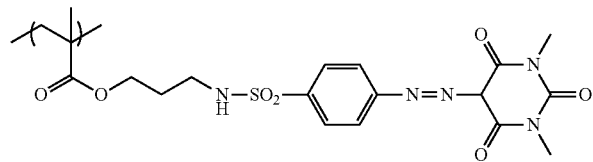
(A-aq-1)
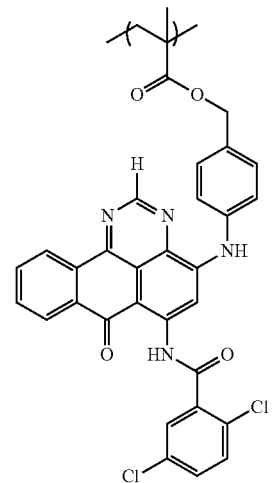
(A-aq-2)
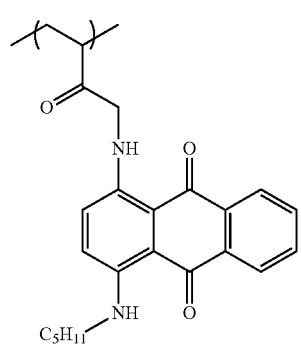
(A-aq-3)
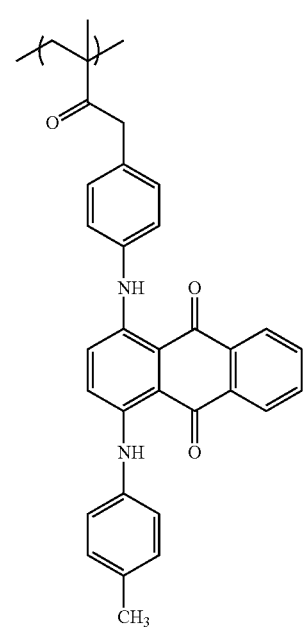
(A-aq-4)
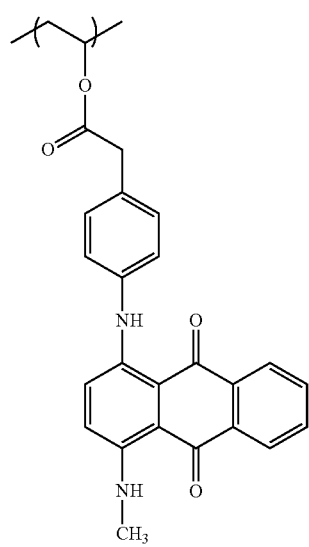
(A-aq-5)
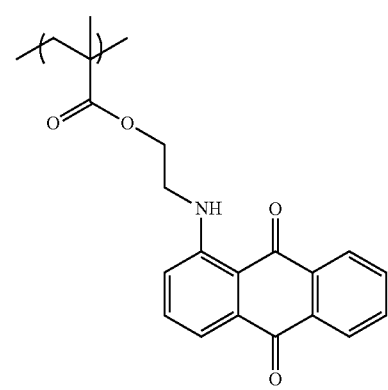

-continued
(A-aq-6)
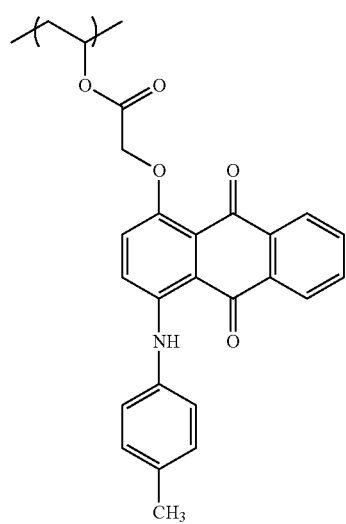
(A-aq-7)
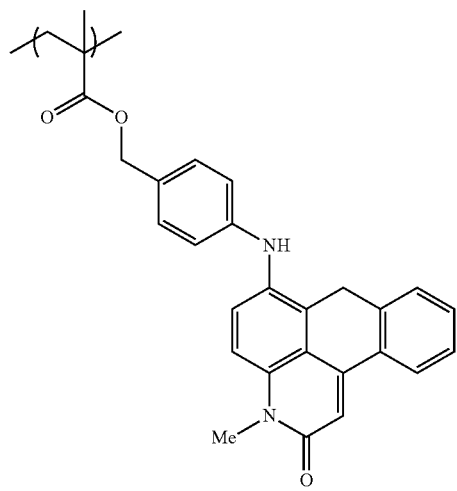
(A-aq-8)
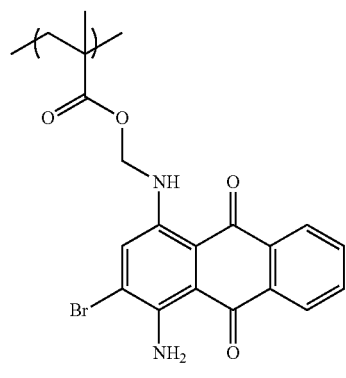
(A-aq-9)
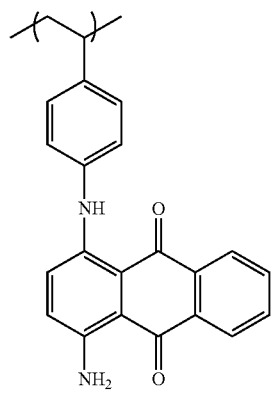
(A-aq-10)
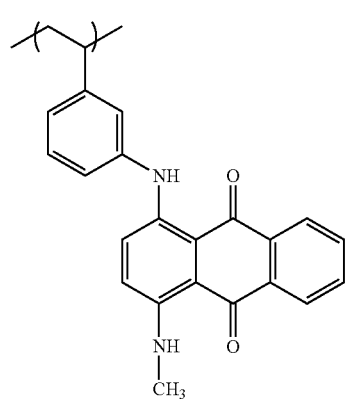
(A-aq-11)
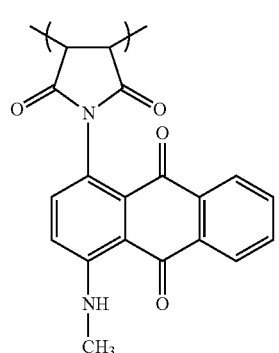

-continued
(A-aq-12)
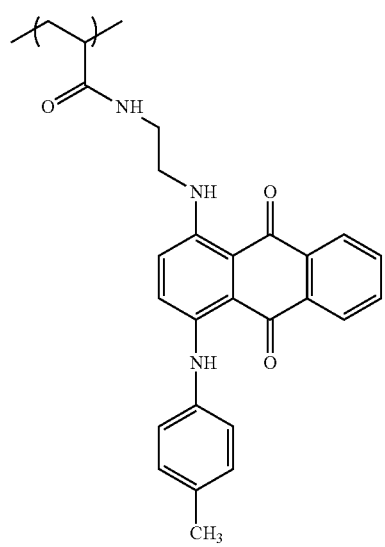
(A-tp-1)
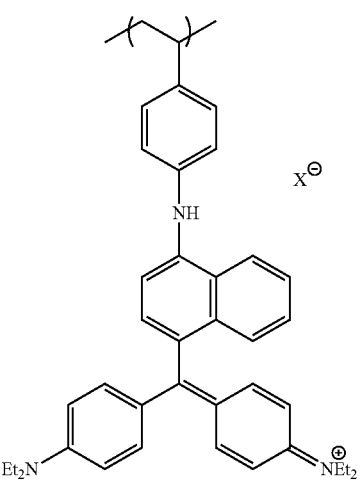
(A-tp-2)
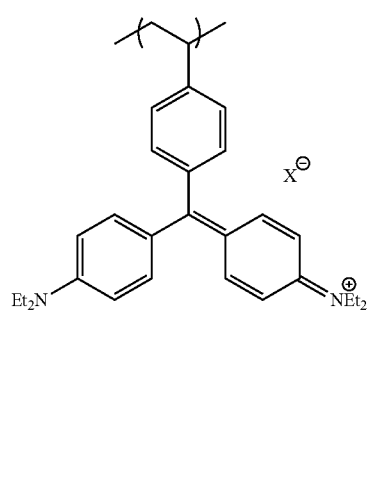
(A-tp-3)
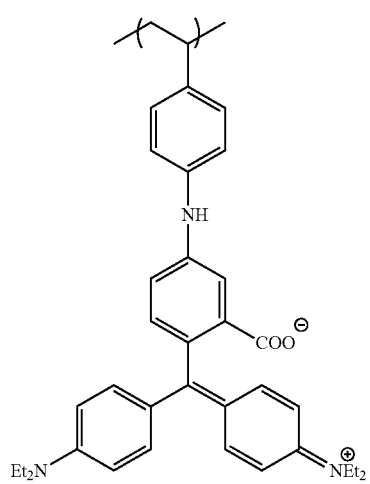
(A-xt-1)
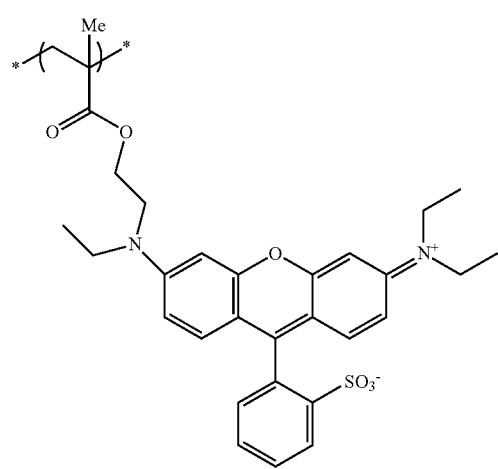
(A-xt-2)
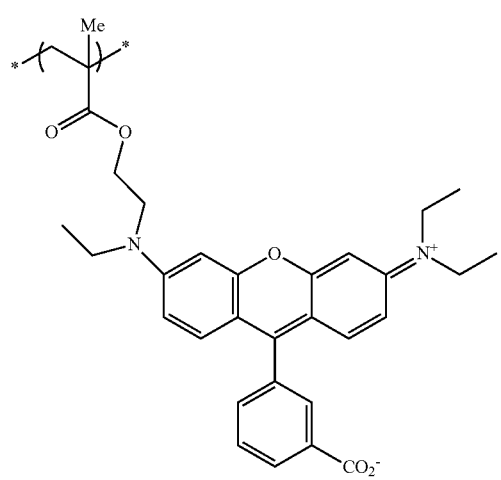

-continued
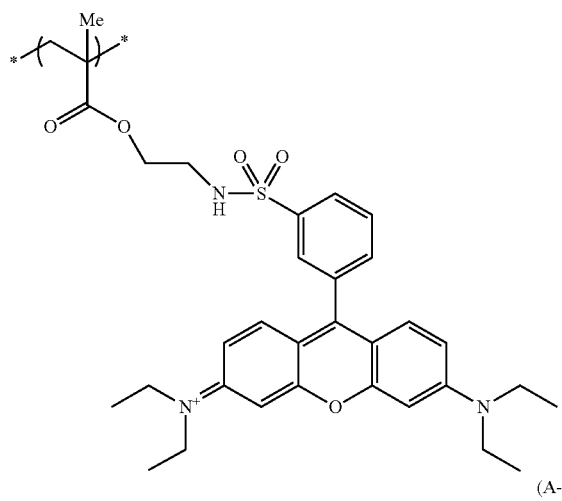
(A-xt-3)
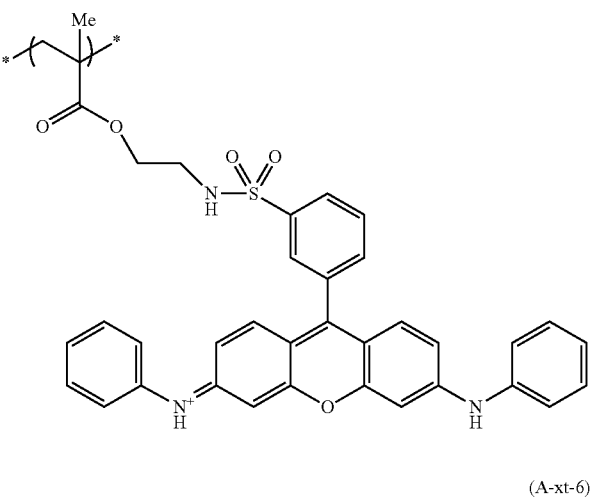
(A-xt-4)
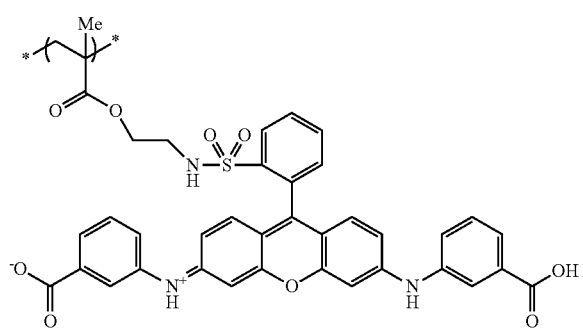
(A-xt-5)
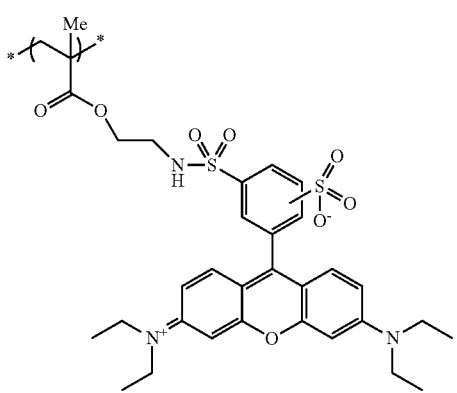
(A-xt-6)
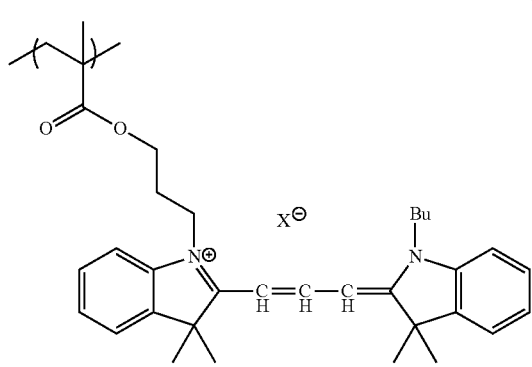
(A-pm-1)
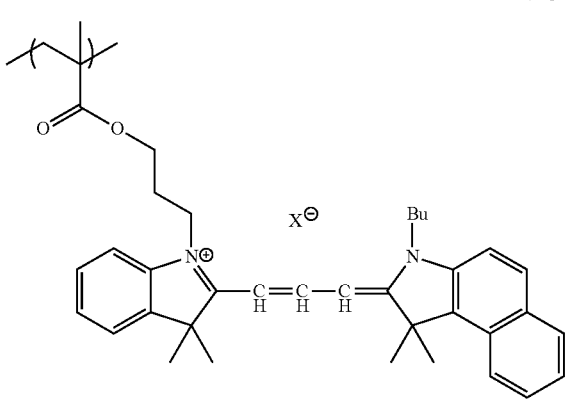
(A-pm-2)
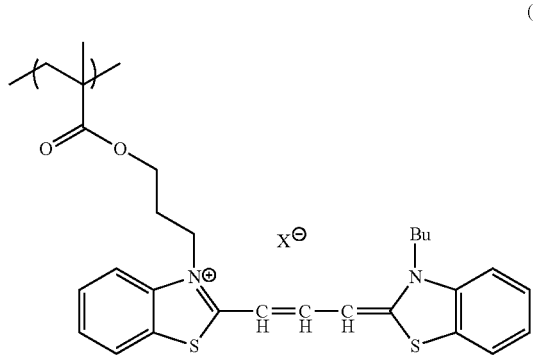
(A-pm-3)
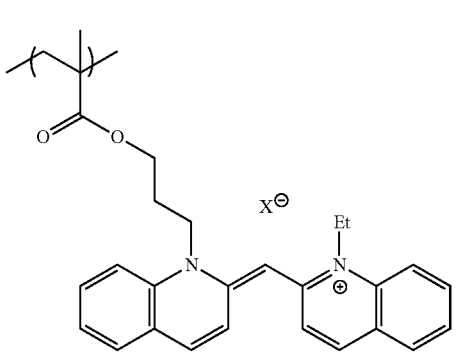
(A-pm-4)

-continued
(A-pm-5)
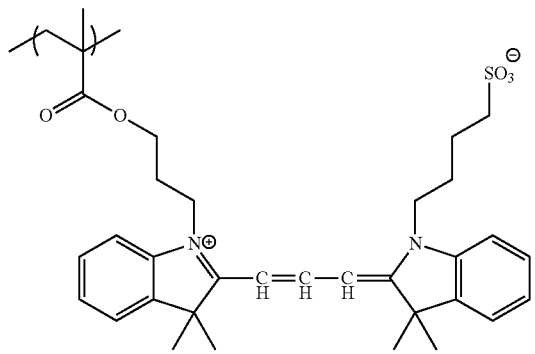
(A-pm-6)
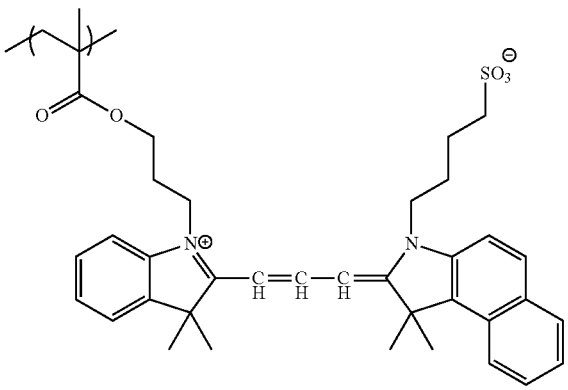
(A-sq-1)
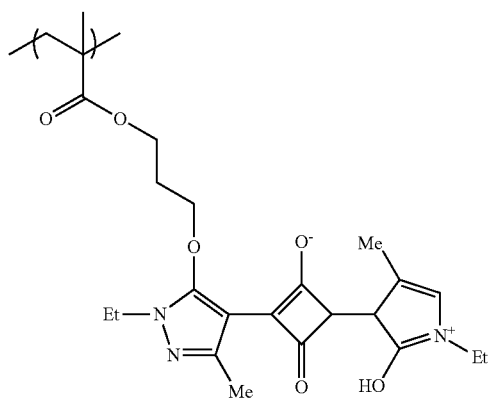
(A-sq-2)
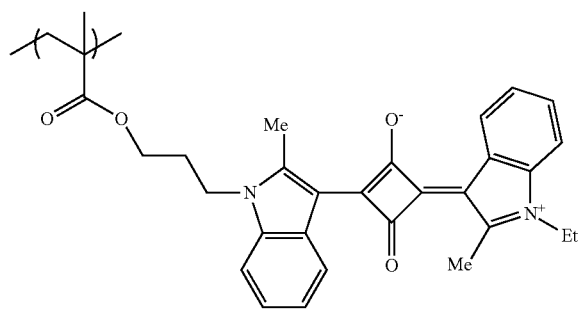
(A-sq-3)
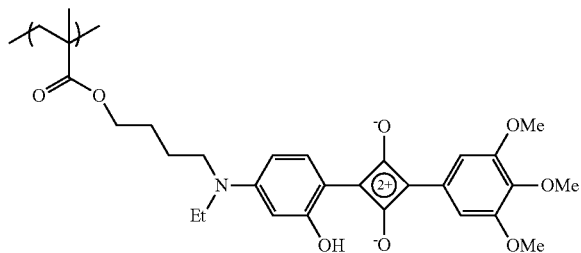
(A-sq-4)
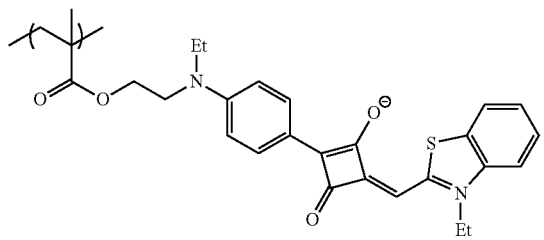
(A-qp-1)
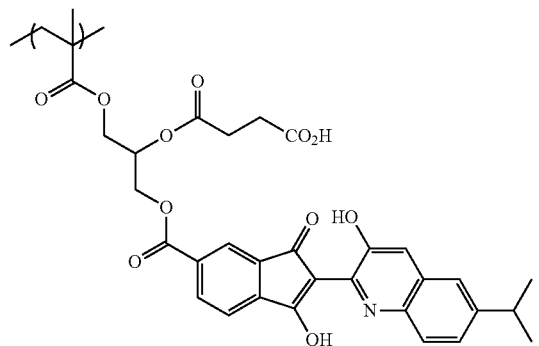

-continued
(A-qp-2)
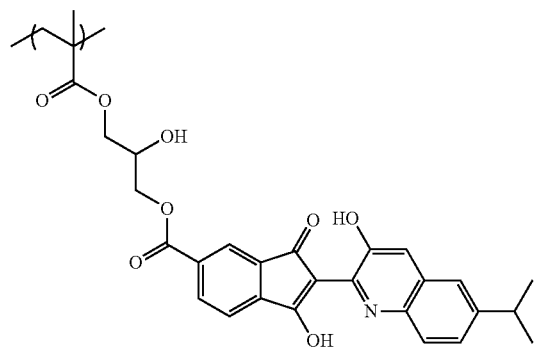
(A-SP-1)
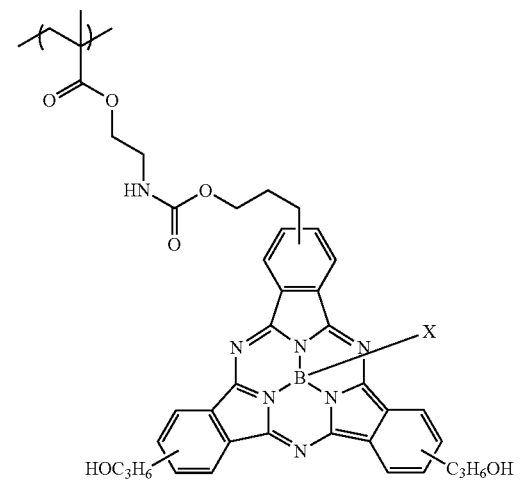
(A-SP-2)
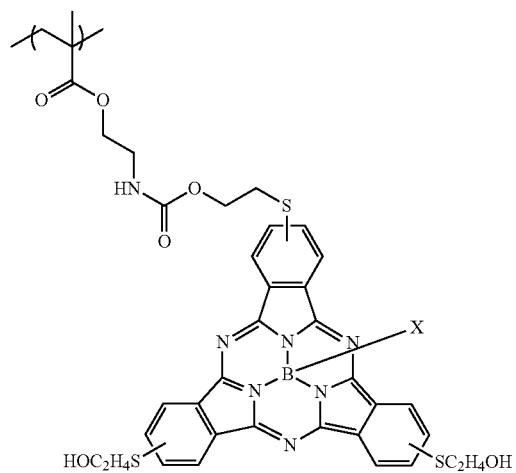
(A-SP-3)
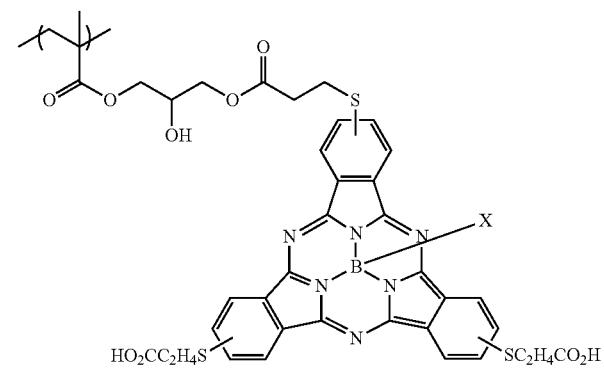
(A-SP-4)
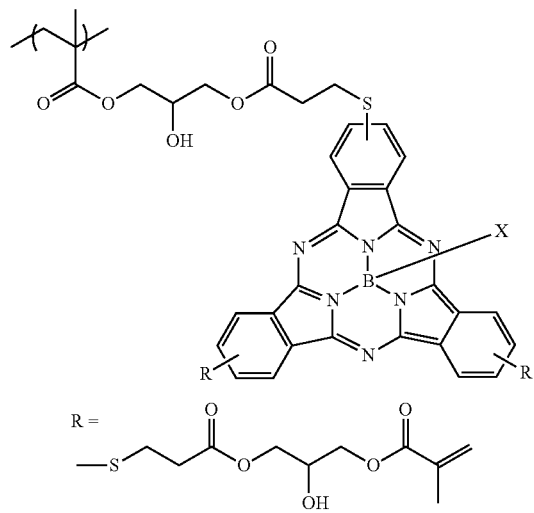
(A-ph-1)
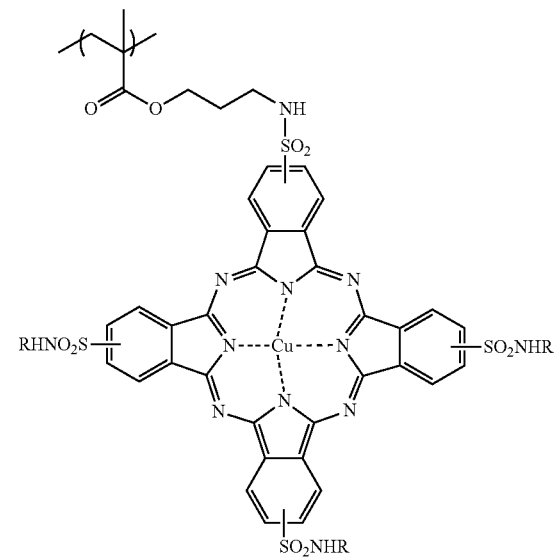
R = CH2CH2CH2OH -continued
(A-ph-2)
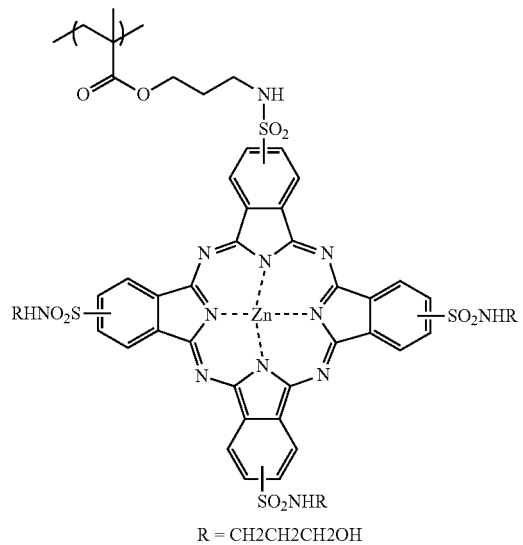
R = CH2CH2CH2OH
(A-ph-3)
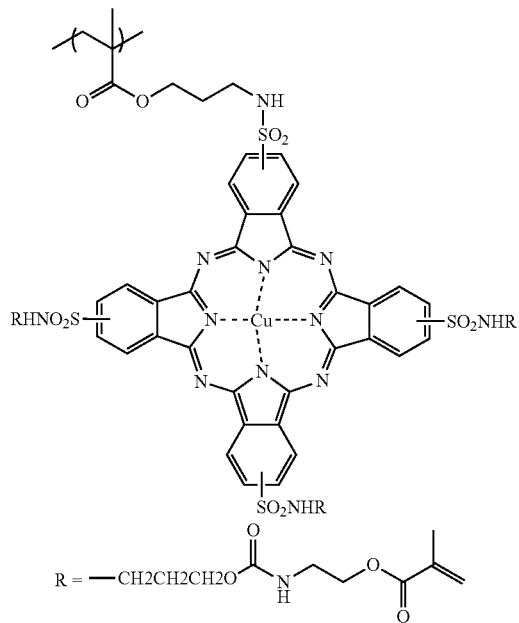
R = —CH2CH2CH2O\_{N}^{H}\_\_O\_\_O (methacrylate)
(A-ph-4)
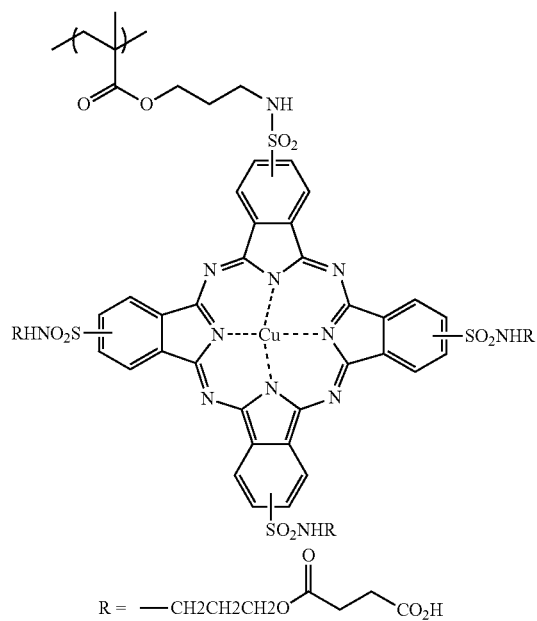
R = —CH2CH2CH2O—C(=O)—CH2CH2—CO2H
(A-st-1)
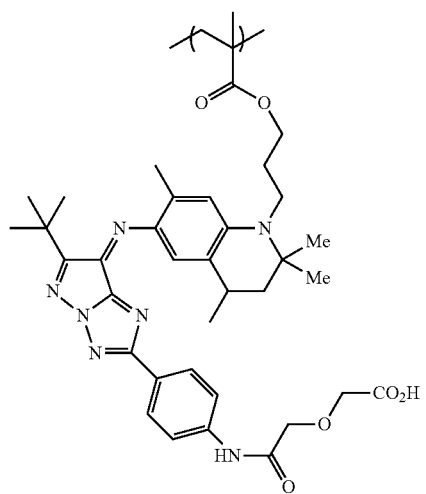

-continued

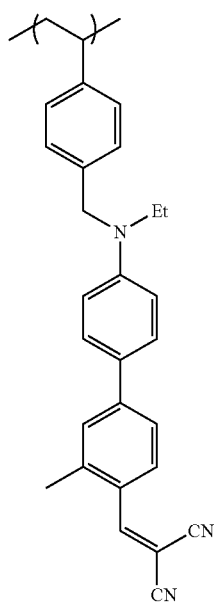
(A-st-2)

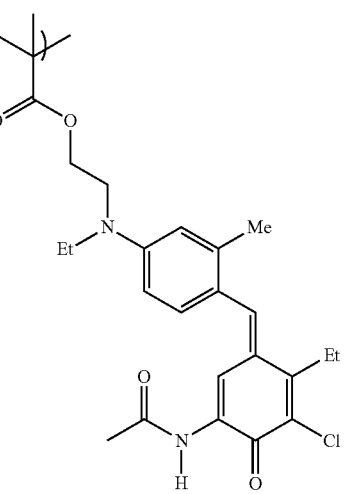
(A-st-3)

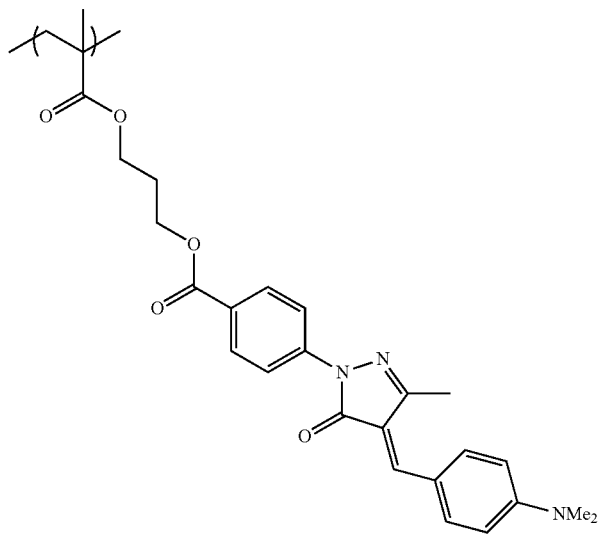
(A-st-4)

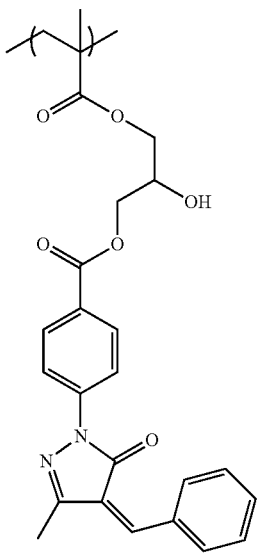
(A-st-5)

The specific dye polymer related to the present invention is polymerized from a polymerizable compound including the dye structure using a chain-transfer agent having a LogP value of 5 or less.

A LogP value is an octanol/water partition coefficient and can be calculated using various programs, and the LogP value in the present invention means a value that is calculated in accordance with "Chem Draw Pro version 12.0" produced by Cambridge Soft, Corp.

The structure of chain-transfer agent having a LogP value of 5 or less is not particularly limited, but the chain-transfer agent is preferably an alkyl mercaptan in terms of easy handling as a chain-transfer agent, and the alkyl mercaptan may have a substituent group. The alkyl mercaptan is preferably an alkyl mercaptan having 10 or less carbon atoms 10, or, an alkyl mercaptan having an ester structure, and/or, an ether structure from a viewpoint of low LogP value. Specific examples of compounds having a LogP value of 5 or less will be described below.

| Number of compound | Structure | LogP value |
|---|---|---|
| 1 | $C_6H_{13}SH$ | 2.63 |
| 2 | $C_8H_{17}SH$ | 3.47 |
| 3 | $C_{10}H_{27}SH$ | 4.30 |
| 4 | HO~~SH | 0.04 |
| 5 | HO~~~SH | 0.14 |
| 6 | HO~CH(OH)~SH | −0.50 |

-continued

| Number of compound | Structure | LogP value |
|---|---|---|
| 7 | 2-ethylhexyl mercaptoacetate | 2.98 |
| 8 | octyl mercaptoacetate | 3.00 |
| 9 | EtO-C(O)-CH2CH2-SH | 0.72 |
| 10 | MeO-C(O)-CH2-SH | 0.09 |
| 11 | MeO-C(O)-CH2CH2-SH | 0.38 |
| 12 | (3-methoxybutyl) mercaptopropionate (OMe branched) | 0.65 |
| 13 | (3-methoxy-isobutyl) mercaptoacetate | 0.35 |
| 14 | HO-C(O)-CH2CH2-SH | 0.11 |
| 15 | HO-C(O)-CH2-SH | −0.18 |
| 16 | CH3-C(O)-SH | 0.27 |
| 17 | butyl mercaptan | 1.80 |
| 18 | EtO-C(O)-CH2-SH | 0.42 |

A method for synthesizing a specific dye polymer related to the present invention using the chain-transfer agent is for example radical polymerization of dye monomers in the presence of a chain-transfer agent. Using this method, a dye polymer including structural units derived from dye monomers such as the aforementioned structural units having a dye structure can be synthesized. Hereinafter, this reaction is suitably referred to as "radical polymerization reaction".

The radical polymerization reaction is for example carried out in accordance with a method described in "The Fourth Edition, Experimental Chemistry Course 28, Polymer Synthesis". By using the method described in this document, the specific dye polymer related to the present invention can be synthesized.

The radical polymerization reaction is preferably carried out using a radical polymerization initiator. Specific examples of the radical polymerization initiator include azo initiators (such as azoisobutyronitrile, dimethyl 2,2-azobisisobutyrate, dimethyl 2,2'-azobis(2-methyl propionate)), peroxide initiators (such as benzoyl peroxide, di-t-butyl peroxide) and the like.

Also, the amount of radical polymerization initiator is not particularly limited, but is preferably 0.01 to 0.5 equivalents with respect to the dye monomer as a raw material, more preferably 0.03 to 0.3 equivalents. The radical polymerization initiator may be used alone or in combination of two or more types.

Also, there is a need in which the radical polymerization reaction of the present invention is carried out using a radical polymerization initiator and a chain-transfer agent having a LogP value of 5 or less. The amount of chain-transfer agent is not particularly limited, but is preferably 0.01 to 20 equivalents with respect to the radical polymerization initiator, more preferably 0.2 to 3.0 equivalents. The chain-transfer agent may be used alone or in combination of two or more types.

Regarding the time in which the chain-transfer agent is incorporated into a polymerization system, this may be before addition of radical polymerization initiator, or the chain-transfer agent may be previously mixed with a starting monomer such as dye monomer.

The organic solvent used for radical polymerization reaction is not particularly limited so long as it does not inhibit reaction. Suitable organic solvents include propylene glycol monomethyl ether acetate (PGMEA), N-methylpyrrolidone (NMP), cyclohexanone, butyl acetate, halogen solvents (such as dichloromethane), and acetonitrile.

The organic solvent may be used alone or in combination of two or more types.

The reaction temperature of radical polymerization reaction may be selected within a temperature range of 0° C. to 150° C., depending on the raw material used, but is preferably a temperature range of 30° C. to 120° C., more preferably a temperature range of 40° C. to 100° C.

In the synthesis of the specific dye polymer related to the present invention, other than dye monomers, as essential starting monomers, a monomer that has a different structure from the dye monomer and has a terminal ethylenically unsaturated bond, that is, a monomer having no dye structure, as a starting monomer may be present. Specific examples of the monomer that has a different structure from the dye monomer and has a terminal ethylenically unsaturated bond are not Particularly limited, but preferred specific examples thereof will be given.

The monomer that can be used as a copolymer component may be a vinyl monomer. The vinyl monomer may have an alkali-soluble group.

Since the specific dye polymer according to the present invention contains a copolymer component having an alkali-soluble group, pattern formability is improved and formation of precipitates (coarse particles causing secondary aggregation in the pigment) in a developing solution is inhibited when a color cured film is formed. The content of repeating units derived from vinyl monomers having an alkali-soluble group that are used for this purpose is an acid value of the specific dye polymer of 50 mg KOH/g or more, particularly preferably 50 mg KOH/g to 200 mg KOH/g. Within this range, formation of precipitates in a developing solution can be inhibited.

Also, since the acid value is within this range, when a radiation-sensitive colored composition is prepared from all of the dye polymer and pigment of the present invention, an aggregation force of a secondary aggregate that is an aggregate of primary particles of the pigment can be efficiently reduced.

The vinyl monomer that can be used as a copolymer component related to the specific dye polymer of the present invention is not particularly limited, but preferred examples of vinyl monomers include (meth)acrylic acid esters, crotonic acid esters, vinyl esters, maleic acid diesters, fumaric acid diesters, itaconic acid diesters, (meth)acrylamides, vinyl ethers, vinyl alcohol esters, styrenes, and (meth)acrylonitriles. Specific examples of the vinyl monomer include the compounds described below.

In the present specification, either one or both of acrylic and methacrylic may be collectively referred to as "(meth)acrylic".

Examples of the (meth)acrylic acid esters include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, n-hexyl (meth)acrylate, cyclohexyl (meth)acrylate, t-butyl cyclohexyl (meth)acrylate, 2-ethylhexyl (meth)acrylate, t-octyl (meth)acrylate, dodecyl (meth)acrylate, octadecyl (meth)acrylate, acetoxyethyl (meth)acrylate, phenyl (meth)acrylate, 2-hydroxyethyl (meth)acrylate, 2-methoxy ethyl (meth)acrylate, 2-ethoxyethyl (meth)acrylate, 2-(2-methoxyethoxy)ethyl (meth)acrylate, 3-phenoxy-2-hydroxy propyl (meth)acrylate, benzyl (meth)acrylate, diethylene glycol monomethyl ether (meth)acrylate, diethylene glycol monoethyl ether (meth)acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxy ethoxy ethyl (meth)acrylate, nonyl phenoxy polyethylene glycol (meth)acrylate, dicyclopentenyl (meth)acrylate, dicyclopentenyloxyethyl (meth)acrylate, trifluoroethyl (meth)acrylate, octafluoropentyl (meth)acrylate, perfluorooctylethyl (meth)acrylate, dicyclopentanyl (meth)acrylate, tribromo phenyl (meth)acrylate, and tribromo phenyloxy ethyl (meth)acrylate.

Examples of the crotonic acid esters include butyl crotonate and hexyl crotonate. Examples of the vinyl esters include vinyl acetate, vinyl propionate, vinyl butyrate, vinyl methoxyacetate, and vinyl benzoate.

Examples of the maleic acid diesters include dimethyl maleate, diethyl maleate, and dibutyl maleate.

Examples of the fumaric acid diesters include dimethyl fumarate, diethyl fumarate, and dibutyl fumarate.

Examples of the itaconic acid diesters include dimethyl itaconate, diethyl itaconate, and dibutyl itaconate.

Examples of (meth)acrylamides include (meth)acrylamide, N-methyl (meth)acrylamide, N-ethyl (meth)acrylamide, N-propyl (meth)acrylamide, N-isopropyl (meth)acrylamide, N-n-butylacryl (meth)amide, N-t-butyl (meth)acrylamide, N-cyclohexyl (meth)acrylamide, N-(2-methoxyethyl) (meth)acrylamide, N,N-dimethyl (meth)acrylamide, N,N-diethyl (meth)acrylamide, N-phenyl (meth)acrylamide, N-benzyl (meth)acrylamide, (meth)acryloyl morpholine, diacetone acrylamide and the like.

Examples of vinyl ethers include methylvinyl ether, butylvinyl ether, hexylvinyl ether, methoxyethylvinyl ether and the like.

Examples of styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene that can be protected with a group capable of being eliminated with an acid substance (such as t-Boc), methyl vinylbenzoate, α-methylstyrene and the like.

The amount of the monomer having no dye structure and having a terminal ethylenically unsaturated bond that can be used in conjunction is not specifically limited, but it is preferably an amount of 0.1 to 10 equivalents, and more preferably an amount of 0.2 to 5 equivalents, with respect to the dye monomer. These monomers may be used alone or in combination of two or more types, respectively.

The polymerization of radical polymerization reaction related to the present invention may be carried out by solution polymerization, suspension polymerization or emulsion polymerization, but from the viewpoint of reaction control, a solution polymerization is preferable. Further, the polymerization may be carried out in a batch polymerization manner in which raw materials except an initiator or a polymerization catalyst are mixed at once at an initial stage, and then polymerization is initiated by adding an initiator and a polymerization catalyst; or a dropping polymerization manner in which raw materials are added dropwise over plural hours; and a partial dropping polymerization process in which raw materials are partly mixed in advance, and the remainder is added thereto by dropwise addition.

(Polymerizable Group-introduction)

By incorporating a polymerizable group into the specific dye polymer related to the present invention, curing sensitivity of the obtained radiation-sensitive colored composition can be improved and color films with higher strength are formed. A method for incorporating a polymerizable group in the synthesis of the specific dye polymer will be described.

A dye polymer having a polymerizable group may be synthesized by forming a polymer via homopolymerization of a dye monomer having a dye structure, or copolymerization of the dye monomer with a monomer having no dye structure and having a terminal ethylenically unsaturated bond, and then adding, to the polymer, a compound having a copolymerizable group and a group that can react with the polymer (hereinbelow, this reaction is referred to as a "polymerizable group-introduction").

The reaction for introducing a polymerizable group may be carried out by, for example, a process in which exemplary compound P1 having a carboxylic acid moiety and glycidyl methacrylate are allowed to react in the presence of a catalyst such as ammonium salt (hereinbelow, this reaction is referred to as a "GMA reaction"), or by a process in which the halogen group in the polymer is converted to a terminal ethylenically unsaturated bond by dehydrohalogenation.

(GMA Reaction)

The GMA reaction is preferably carried out with a catalyst. Specific examples of the catalyst include ammonium salts (for example, tetrabutyl ammonium bromide or tetrabutyl ammonium chloride), amines (for example, N,N-dimethyldodecylamine or diisopropylethylamine), phosphorus compounds (for example, triphenylphosphine), and betaines (for example, trimethyl glycine).

In addition, the amount of the catalyst such as an ammonium salt is not specifically limited. However, the catalyst is used preferably in an amount of 0.01 to 0.5 equivalents, and more preferably in an amount of 0.03 to 0.3 equivalents, with respect to the dye monomer represented by formula (1). The catalyst may be used alone or in combination of two or more types.

The organic solvent used for GMA reaction is not specifically limited, as long as the reaction is not impaired. Preferred examples of the solvent include propylene glycol methyl ether acetate, N-methylpyrrolidone, cyclohexanone, butyl acetate, a halogen-based solvent (for example, dichloromethane) and acetonitrile. The solvent may be used alone or in combination of two or more types.

The reaction temperature for GMA reaction may be selected from the temperature range of from 0° C. to 150° C., depending on the raw materials used, etc. The temperature range is preferably from 30° C. to 120° C., and more preferably 40° C. to 100° C.

Through these processes, a specific dye polymer useful for the present invention can be obtained.

Representative schemes will be described below, but the present invention is not limited thereto.

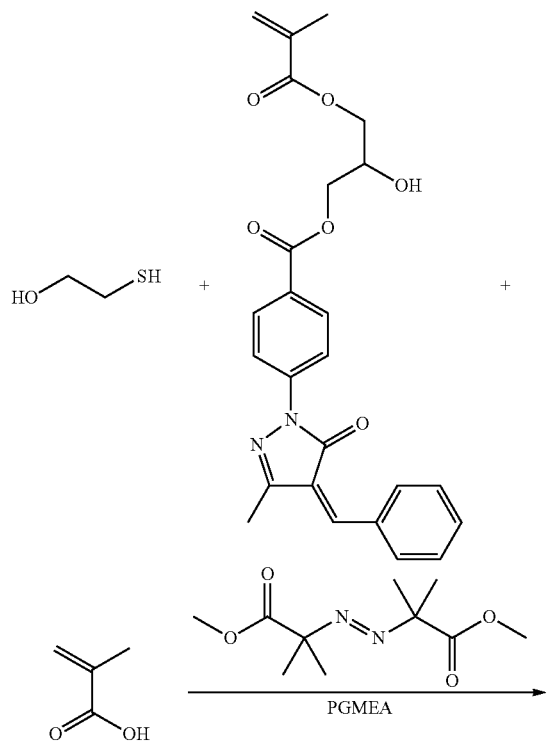

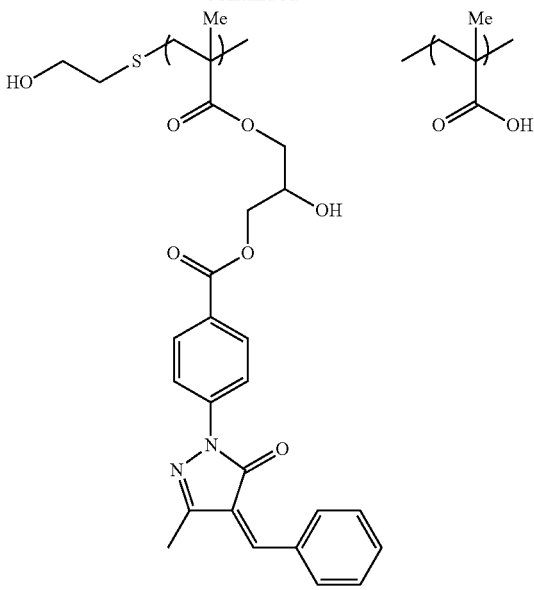

Specific examples of specific dye polymer obtained using the chain-transfer agent will be described together with the used chain-transfer agent and weight average molecular weight, but the present invention is not limited thereto.

Specific Example A1

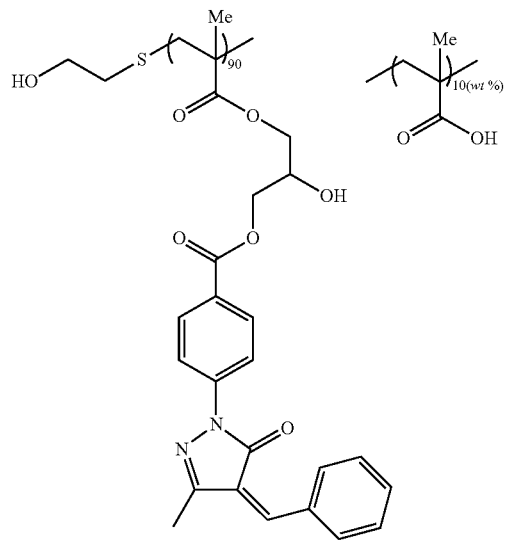

Mw 30000
Chain Transfer Agent 4 LogP value 0.04

Specific Example A2

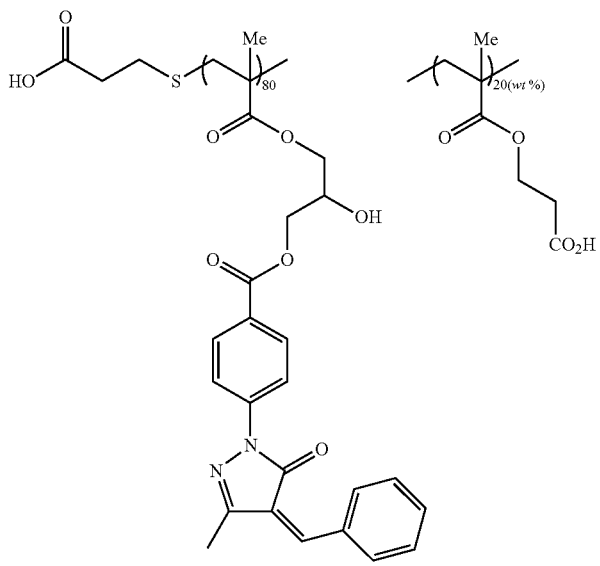

Mw 10000
Chain Transfer Agent 14 LogP value 0.11

-continued
Specific Example A3
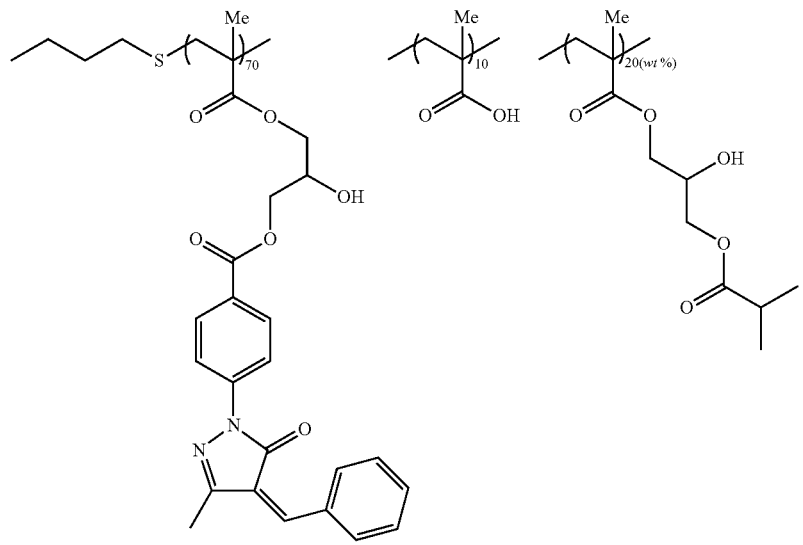
Mw 5000
Chain Transfer Agent 14 LogP value 1.80
Specific Example A4
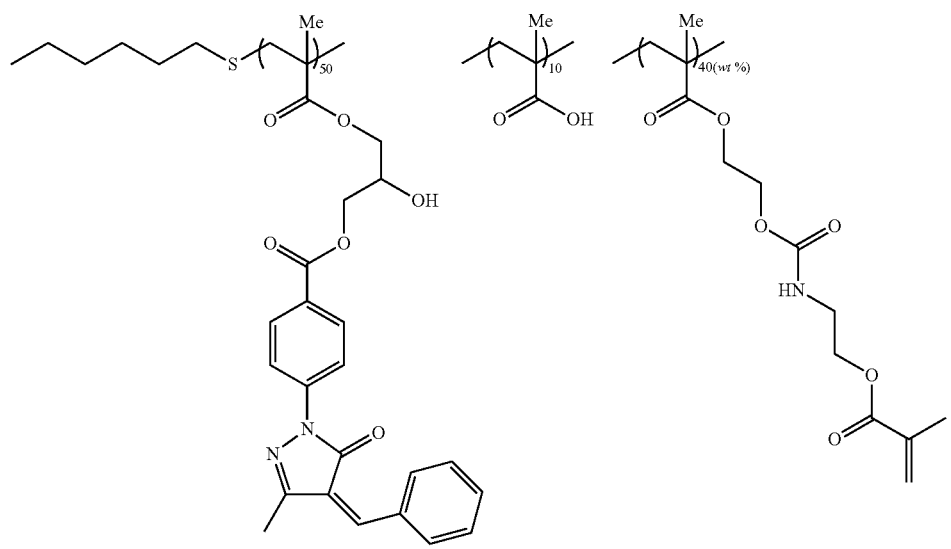
Mw 40000
Chain Transfer Agent 14 LogP value 2.63

Specific Example A5
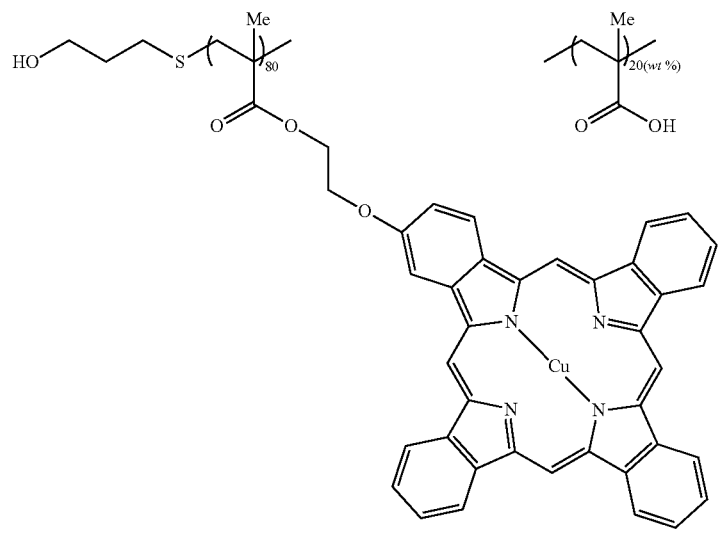
Mw 12000
Chain Transfer Agent 5 LogP value 0.14
Specific Example A6
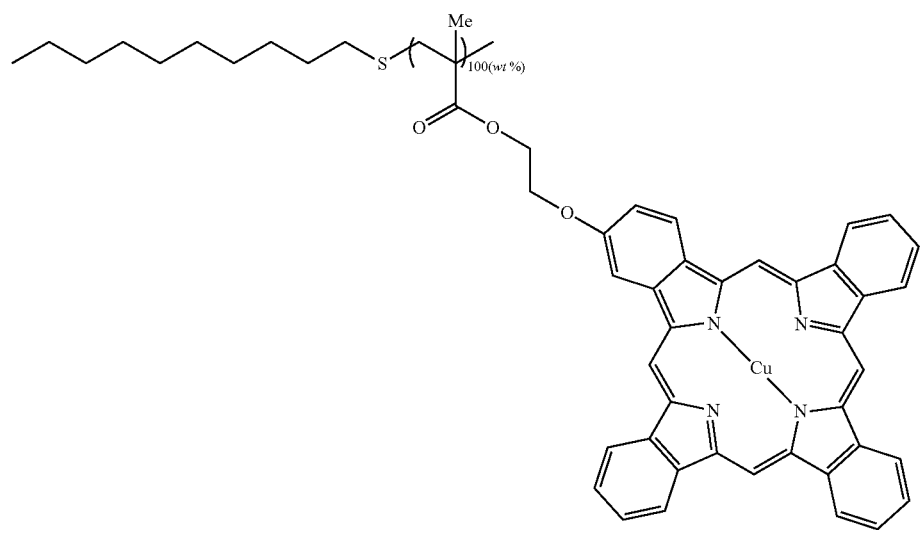
Mw 6000
Chain Transfer Agent 3 LogP value 4.30

Specific Example A7
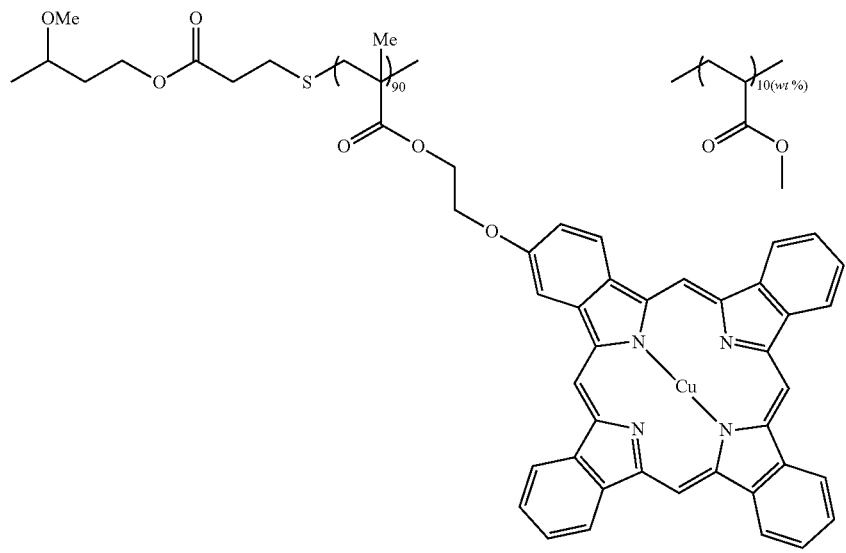
Mw 5000
Chain Transfer Agent 12 LogP value 0.65
Specific Example A8
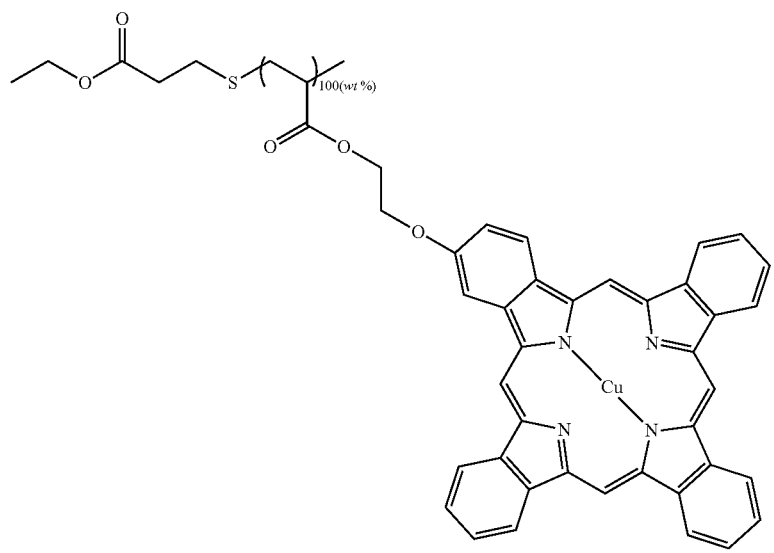
Mw 9000
Chain Transfer Agent 9 LogP value 0.72

Specific Example A9
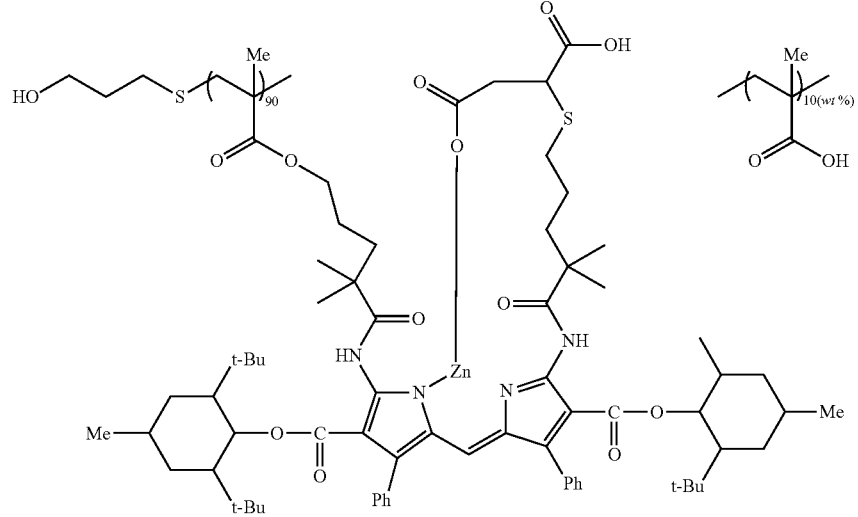
Mw 5000
Chain Transfer Agent 5 LogP value 0.14
Specific Example A10
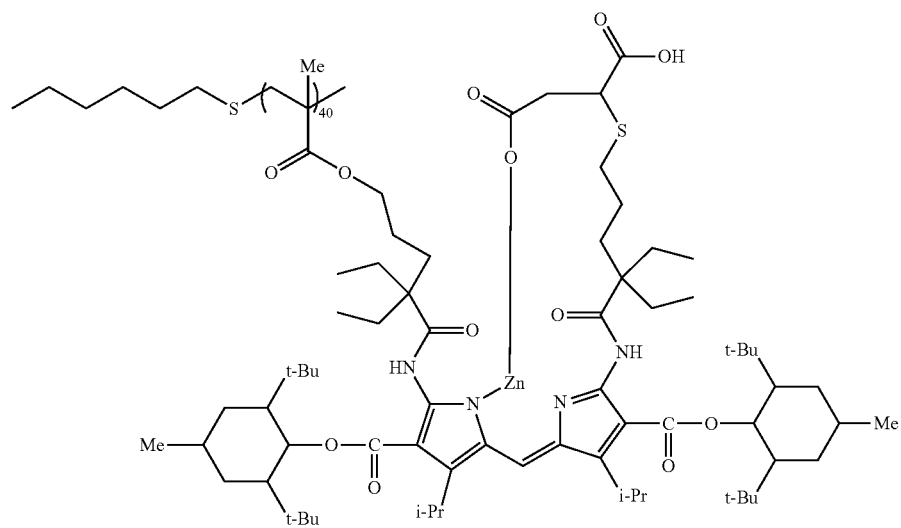

-continued
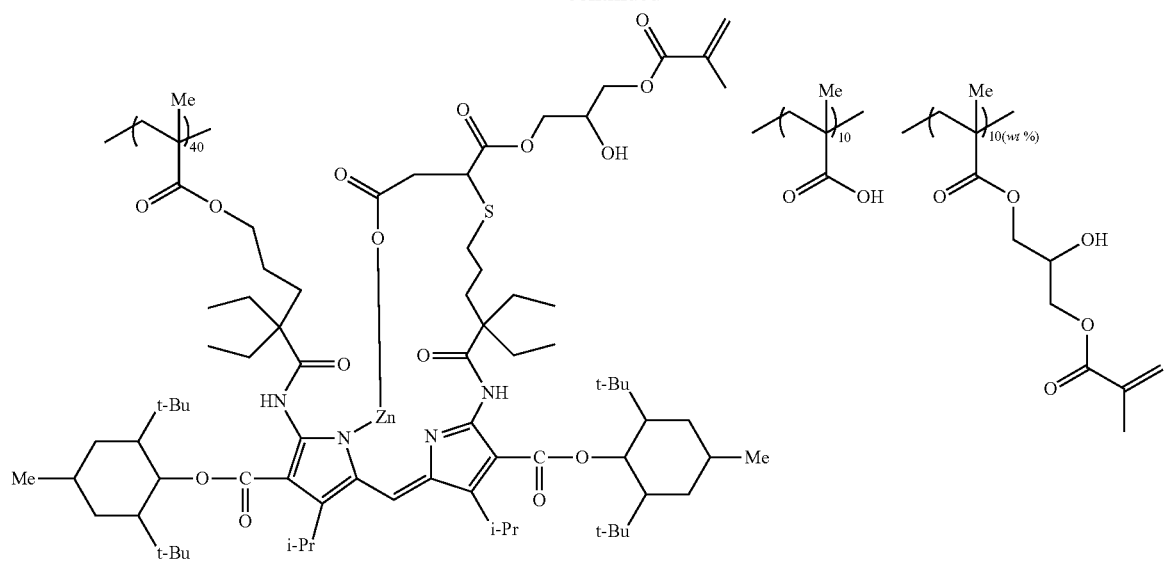
Mw 9000
Chain Transfer Agent 1 LogP value 2.63
Specific Example A11
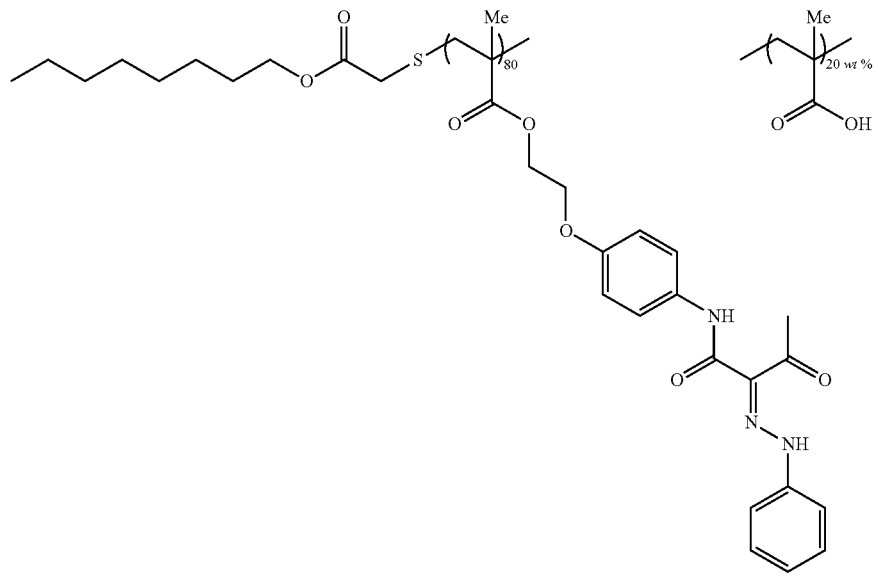
Mw 20000
Chain Transfer Agent 8 LogP value 3.00

Specific Example A12
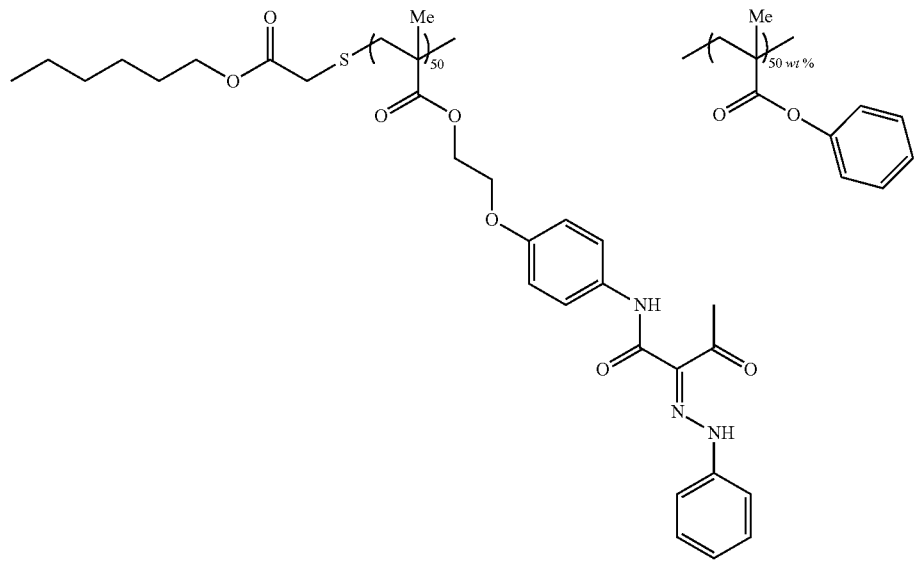
Mw 7000
Chain Transfer Agent 8 LogP value 3.00
Specific Example A13
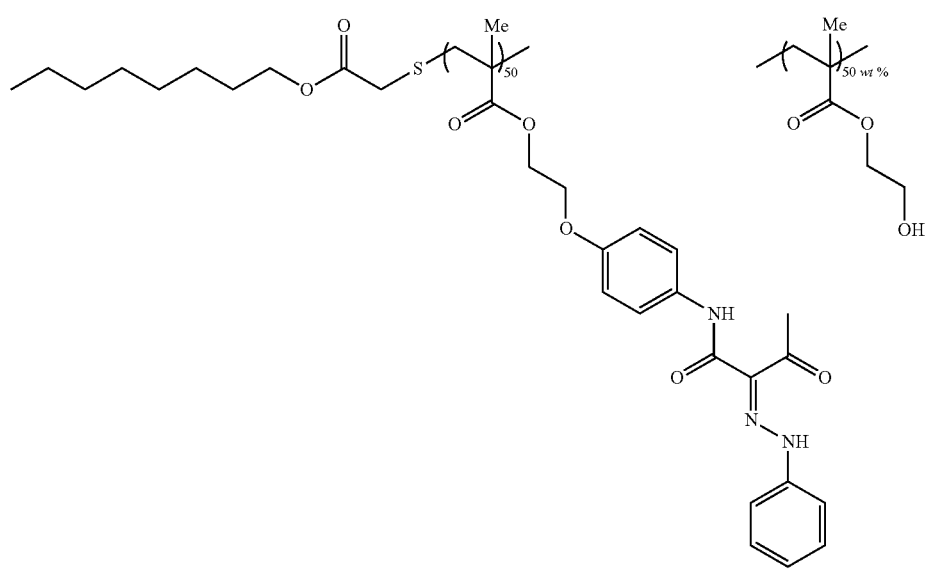
Mw 7000
Chain Transfer Agent 8 LogP value 3.00

Specific Example A14
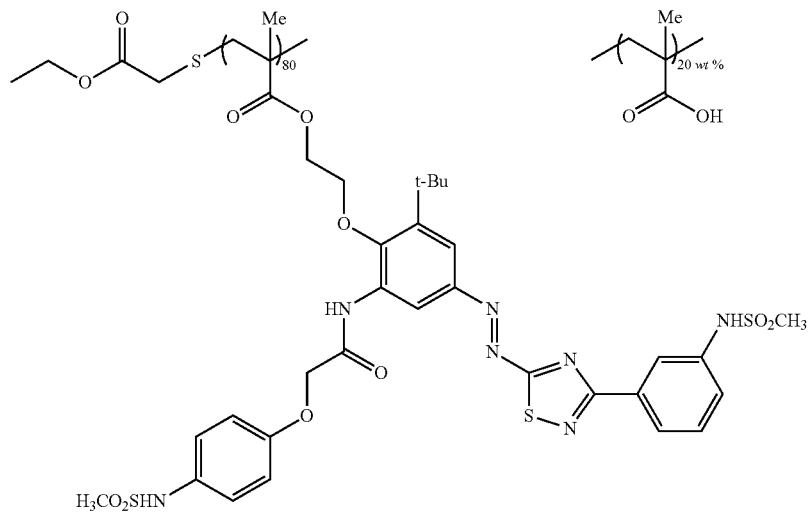
Mw 8000
Chain Transfer Agent 18 LogP value 0.42
Specific Example A15
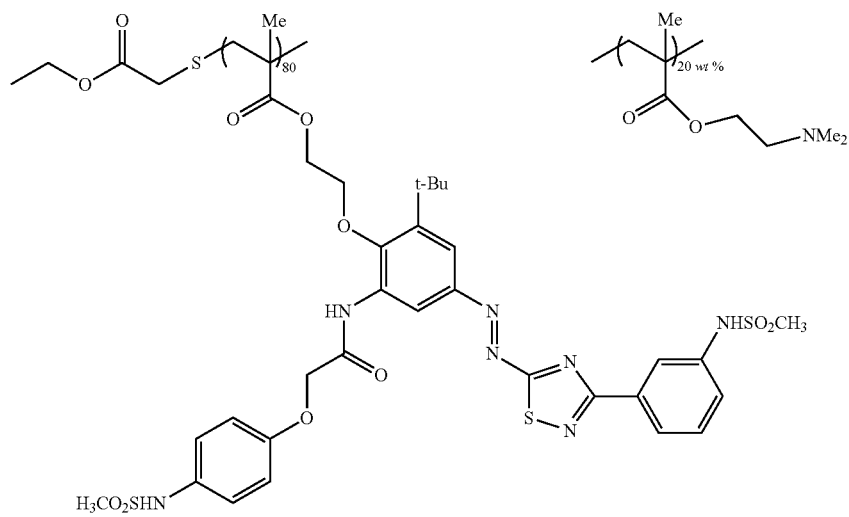
Mw 20000
Chain Transfer Agent 18 LogP value 0.42

-continued
Specific Example A16
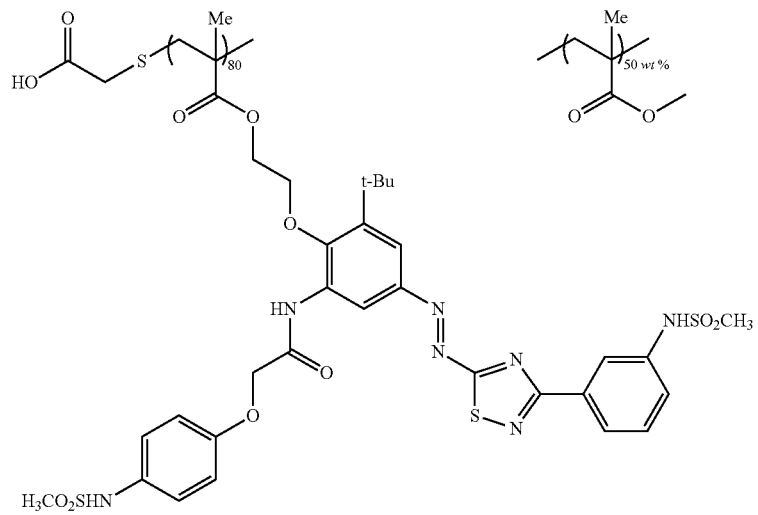
Mw 3000
Chain Transfer Agent 15 LogP value -0.18
Specific Example 17
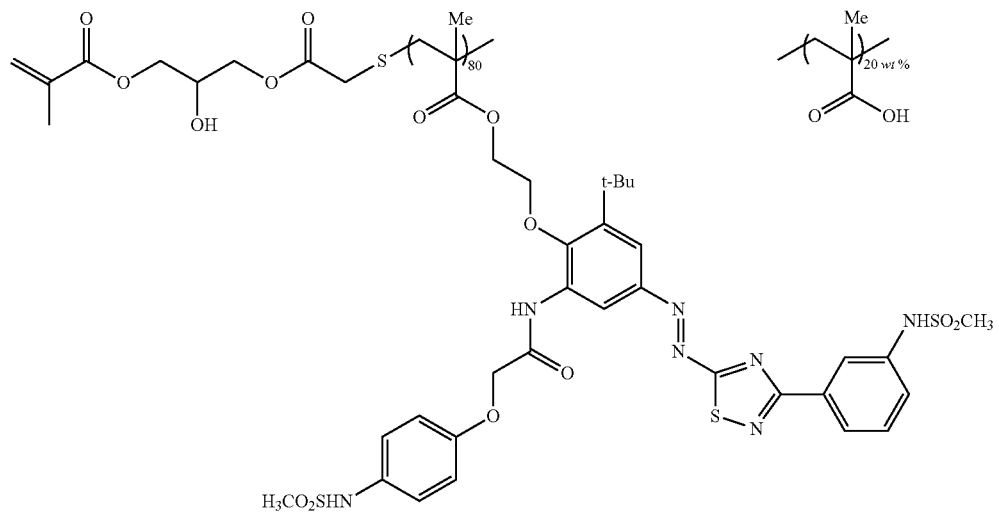
Mw 5000
Chain Transfer Agent 15LogP value -0.18

-continued
Specific Example 18
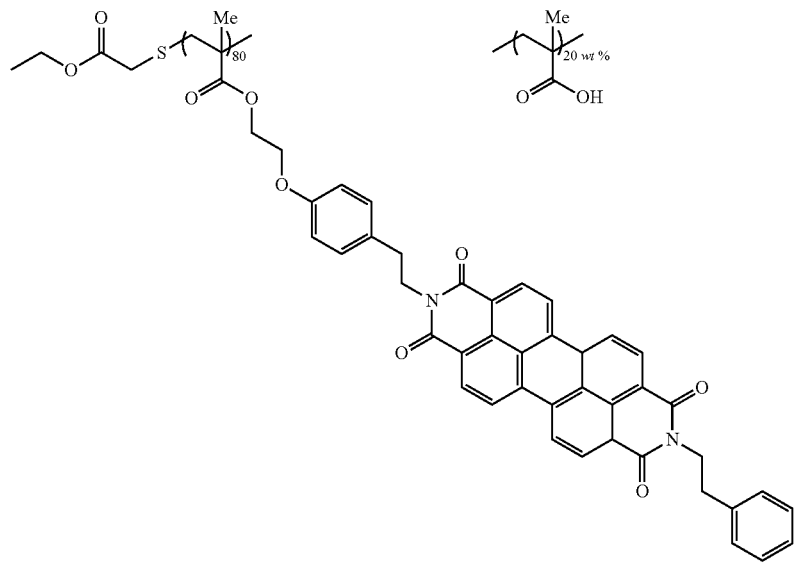
Mw 9000
Chain Transfer Agent 18 LogP value 0.42
Specific Example 19
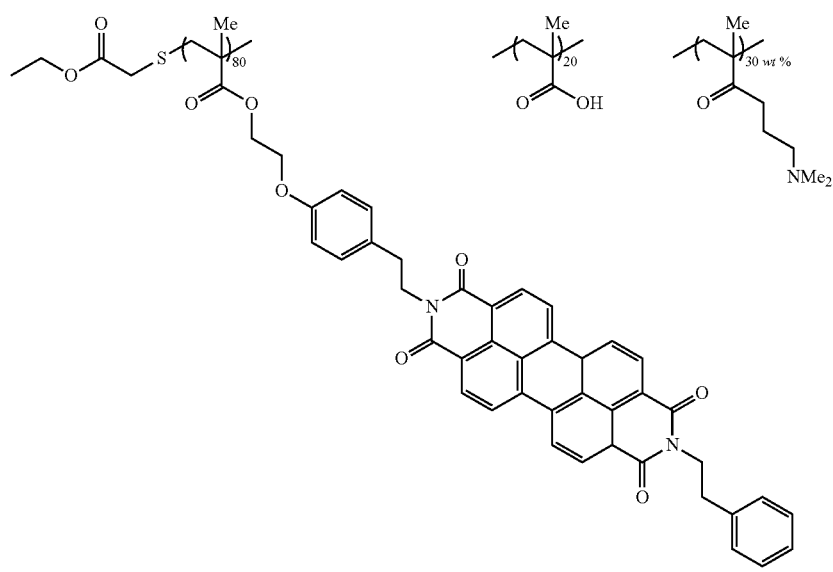
Mw 9000
Chain Transfer Agent 18 LogP value 0.42

Specific Example A20
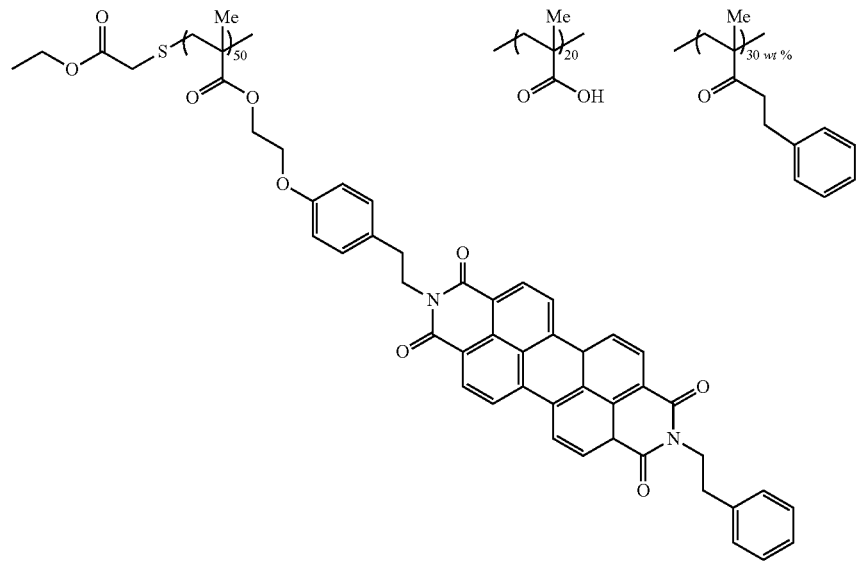
Mw 12000
Chain Transfer Agent 18 LogP value 0.42
Specific Example A21
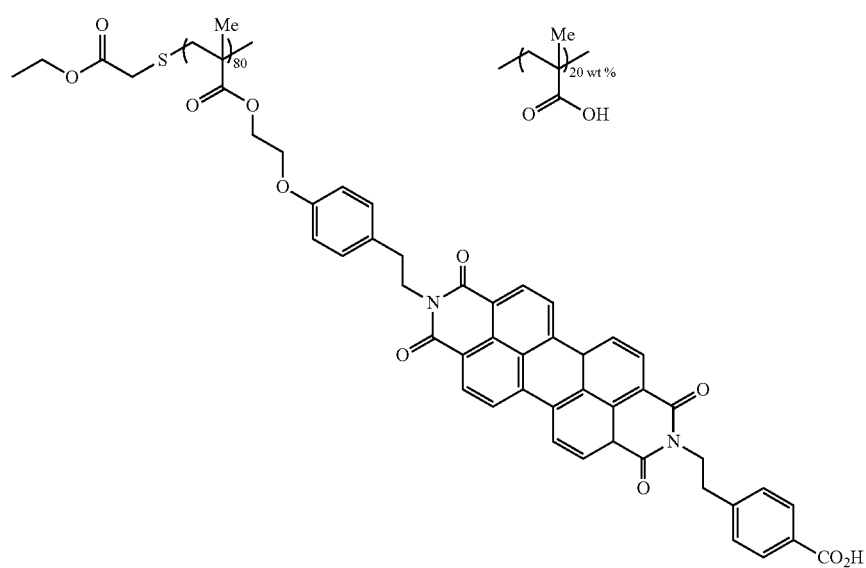
Mw 40000
Chain Transfer Agent 18 LogP value 0.42

-continued
Specific Example A22
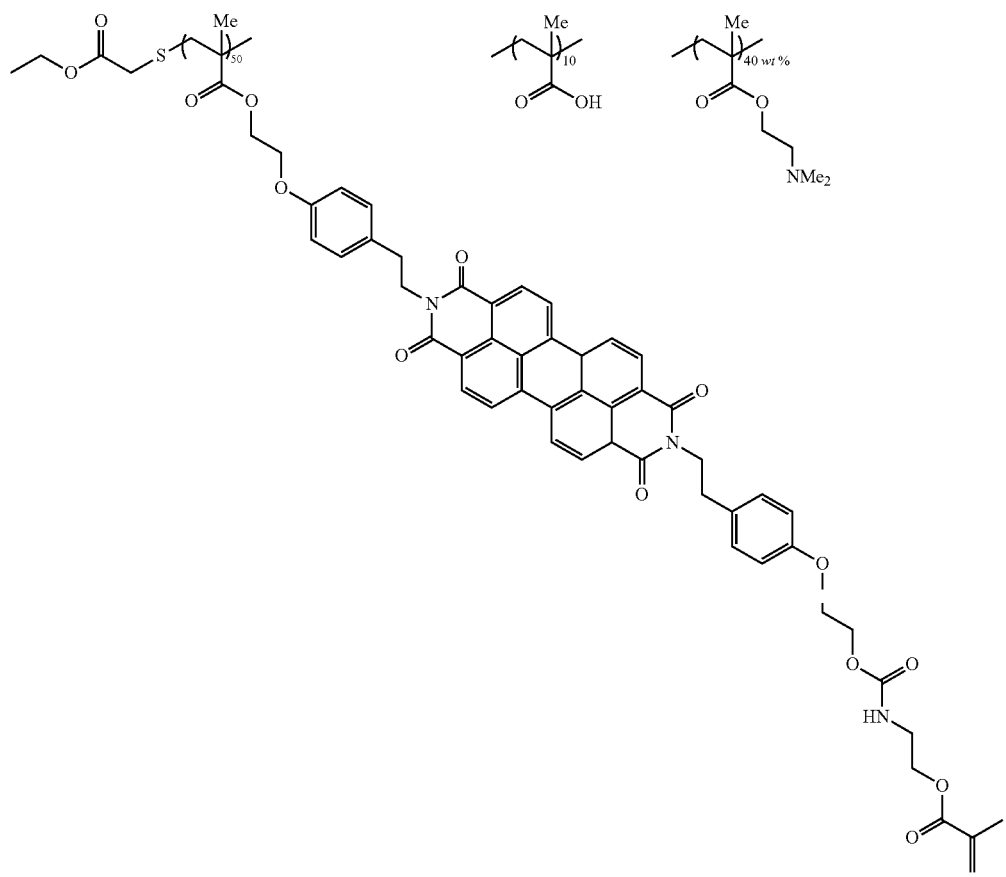
Mw 4000
Chain Transfer Agent 18 LogP value 0.42
Specific Example A23
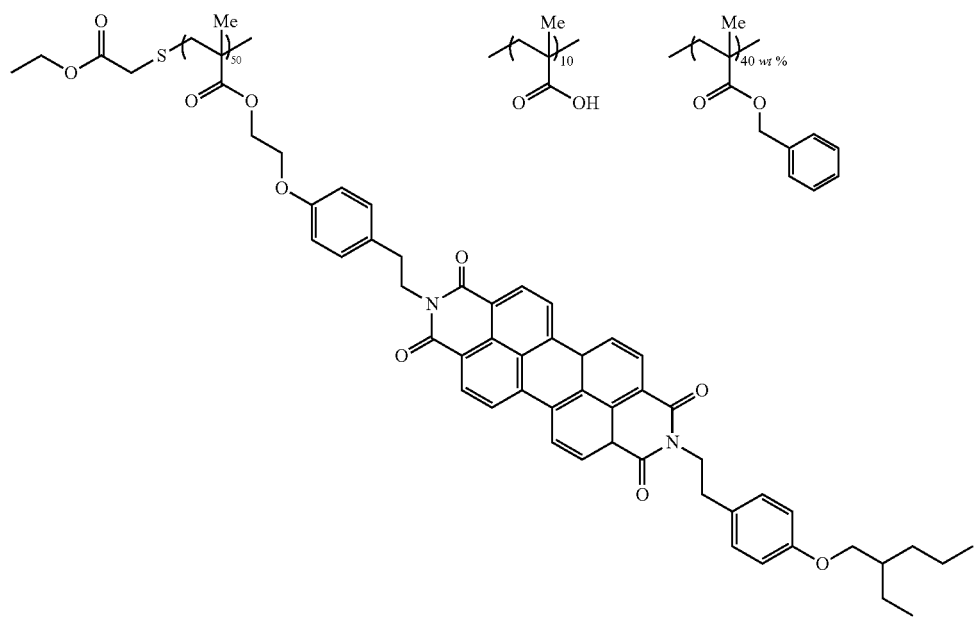
Mw 4000
Chain Transfer Agent 18 LogP value 0.42

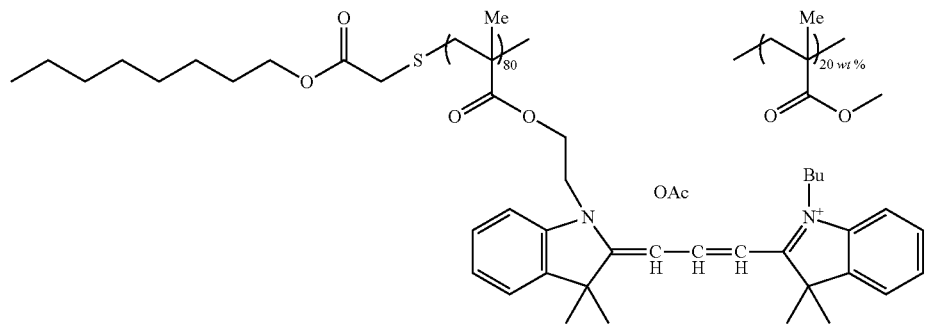
Chain Transfer Agent 8 LogP 3.00
Mw 30000
Specific Example A24
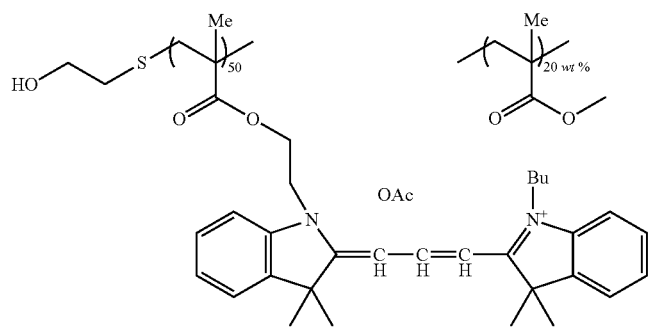
Chain Transfer Agent 4 LogP 0.04
Mw 15000
Specific Example A25
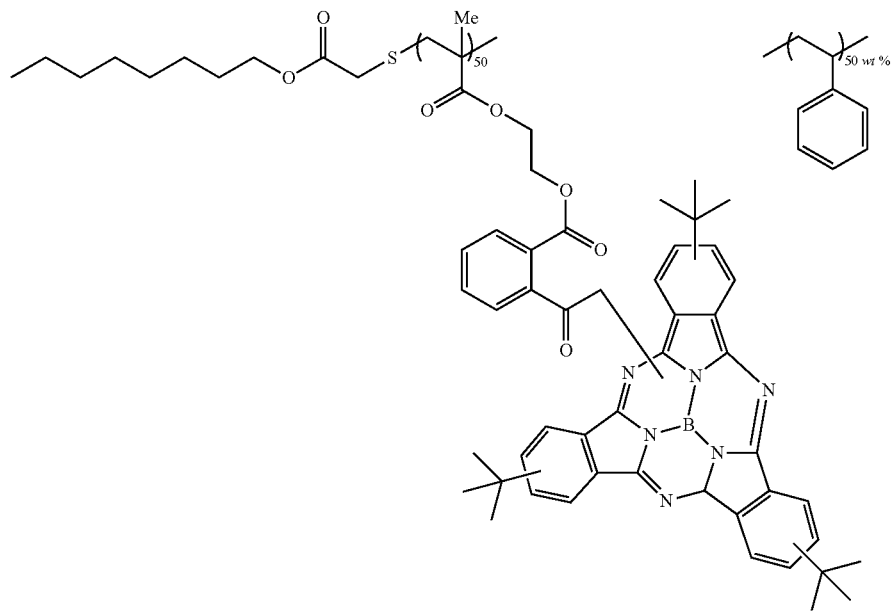
Chain Transfer Agent 8 LogP 3.00
Mw 5000
Specific Example A26

Specific Example A27
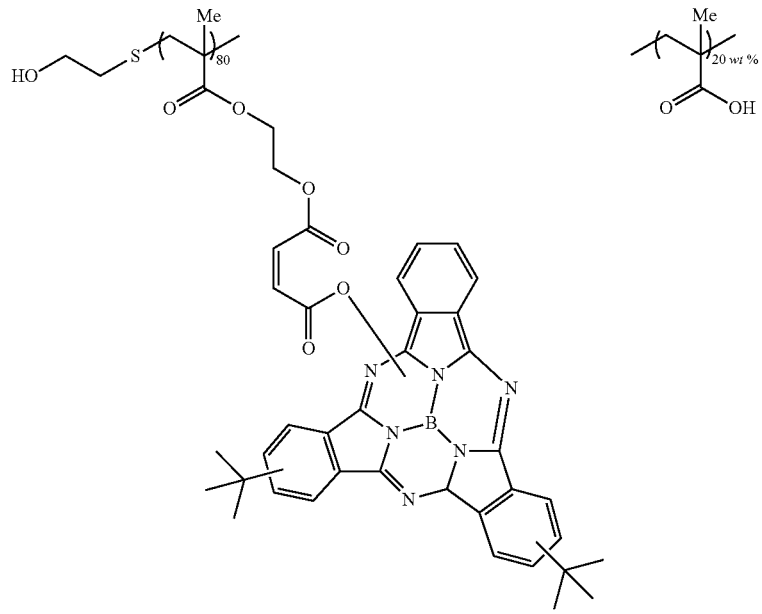
Chain Transfer Agent 4 LogP 0.04
Mw 15000
Specific Example A28
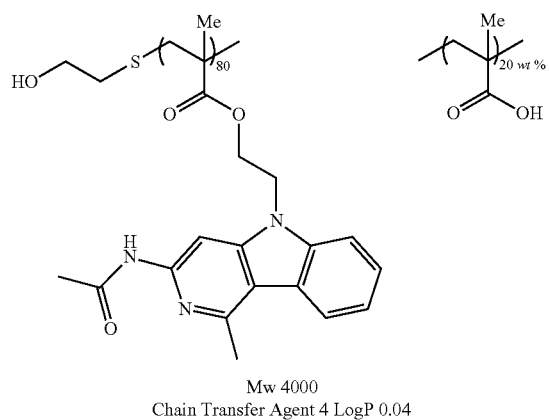
Mw 4000
Chain Transfer Agent 4 LogP 0.04
Specific Example A29
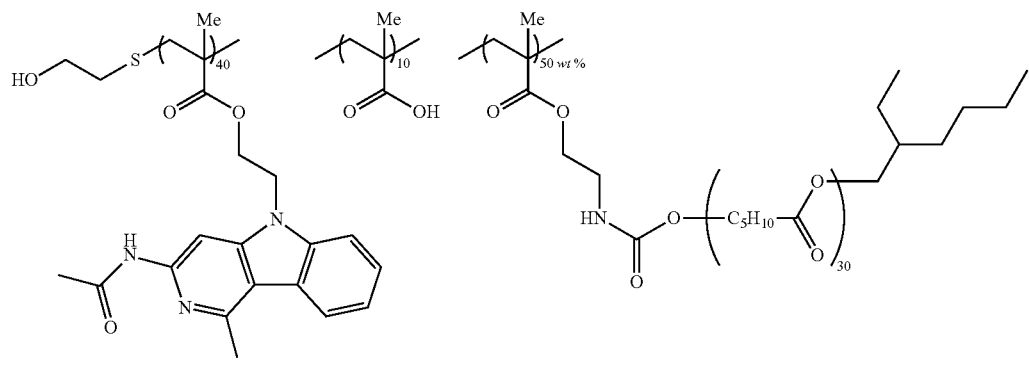
Mw 20000
Chain Transfer Agent 4 LogP 0.04

Specific Example A30
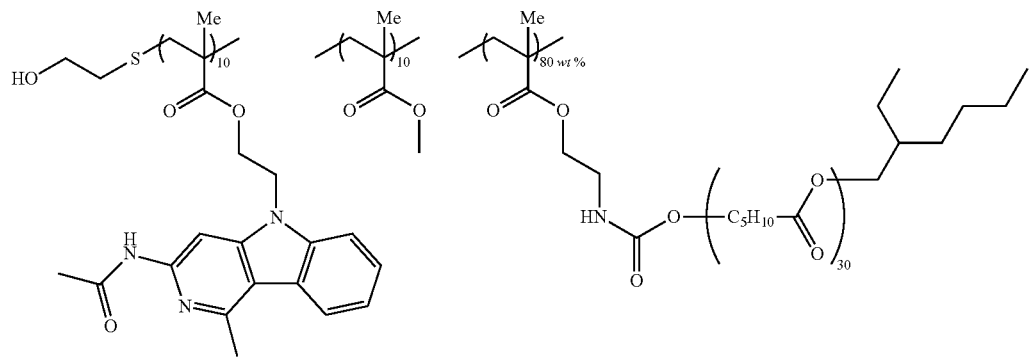
Mw 30000
Chain Transfer Agent 4 LogP 0.04
Specific Example A31
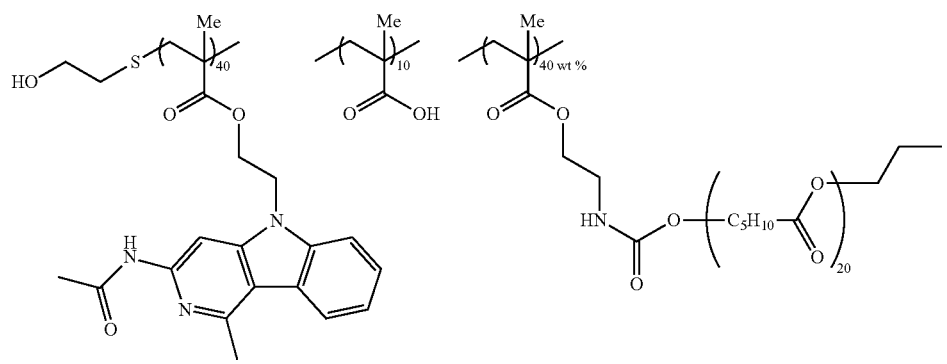
Mw 60000
Chain Transfer Agent 4 LogP 0.04
Exemplary compound A32
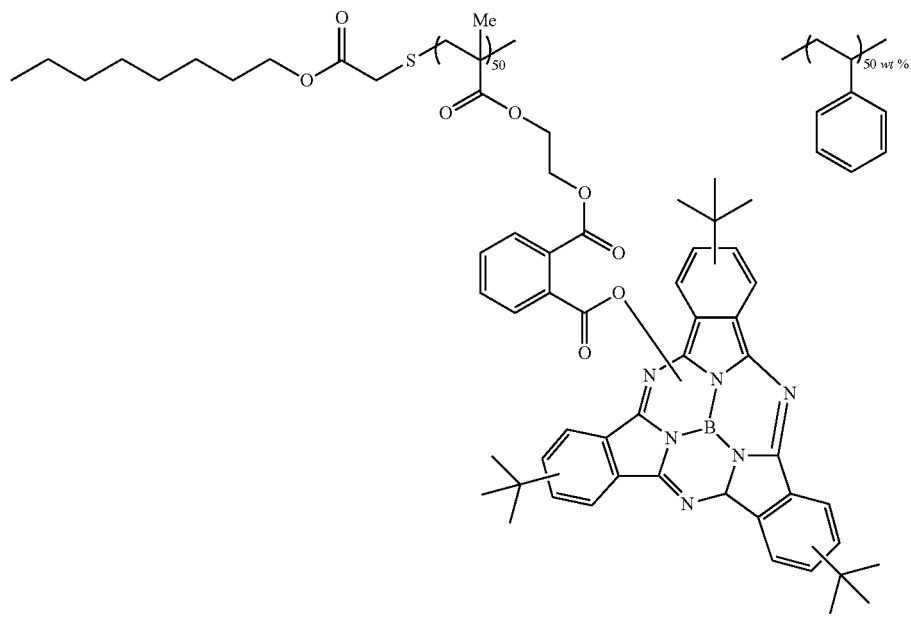
Chain Transfer agent 8 LogP 3.00
Mw 5000

Exemplary compound A33
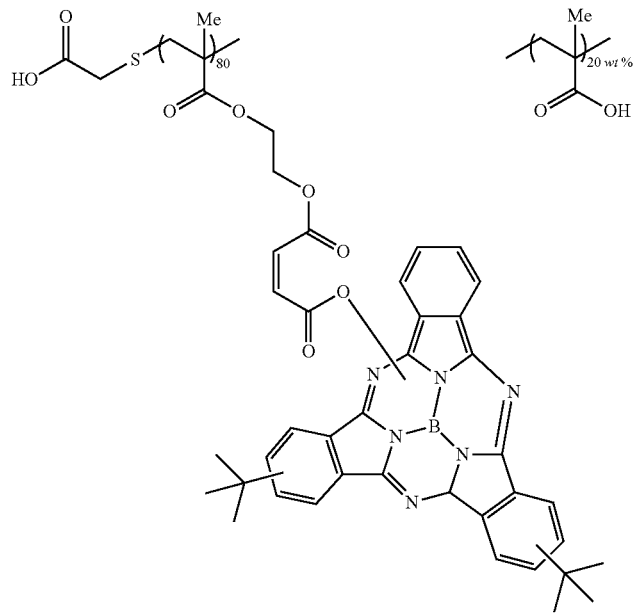
Chain Transfer agent 4 LogP 0.04
Mw 15000
Exemplary compound A34
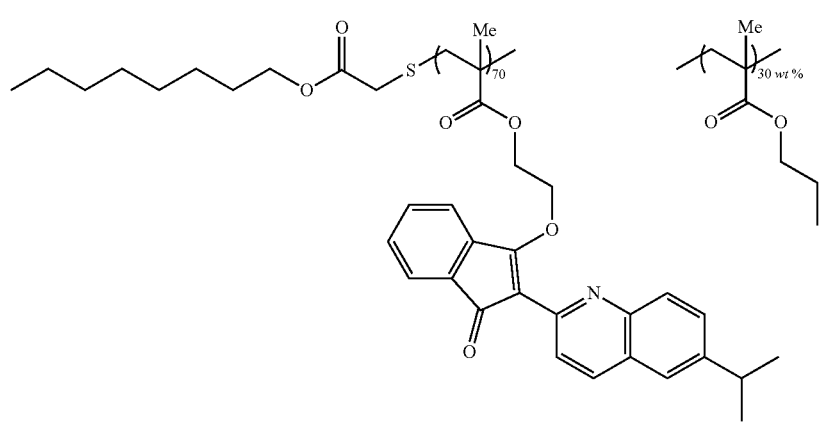
Chain transfer agent 8 LogP 3.00
Mw 5000
Exemplary compound A35
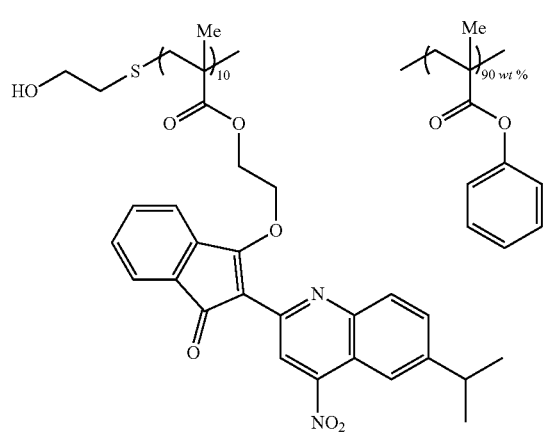
Chain transfer agent 4 LogP 0.04
Mw 10000

-continued
Exemplary compound A36
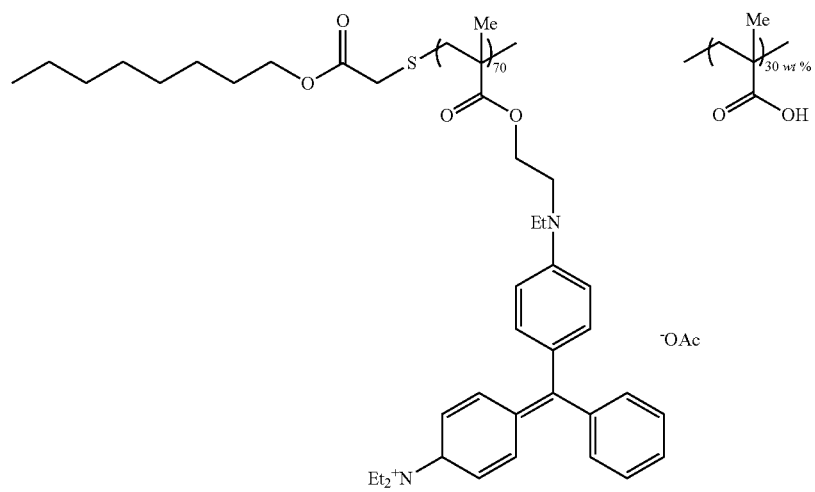
Chain transfer agent 8 LogP 3.00
Mw 600000
Exemplary compound A37
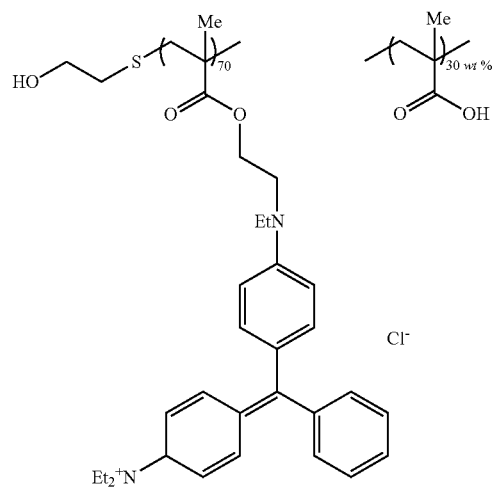
Chain transfer agent 4 LogP 0.04
Mw 10000

Exemplary compound A38
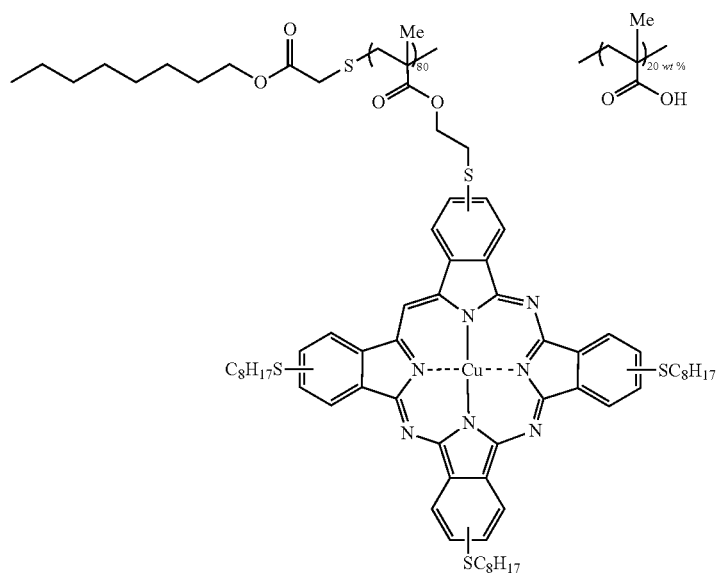
Chain transfer agent 8 LogP 3.00
Mw 8000
Exemplary compound A39
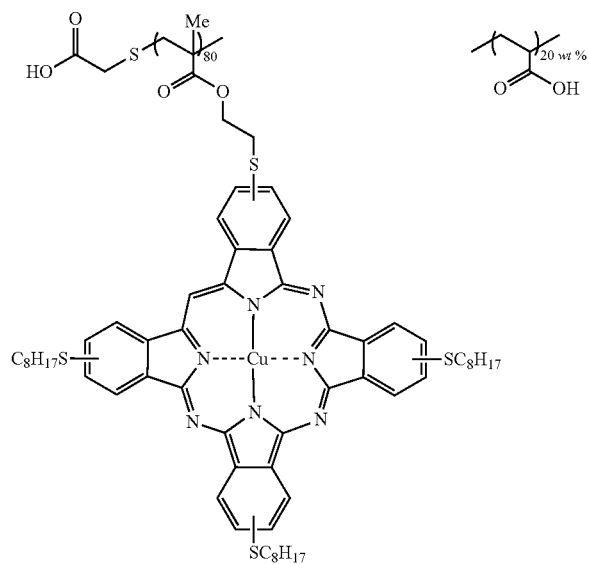
Chain transfer agent 4 LogP 0.04
Mw 4000

-continued

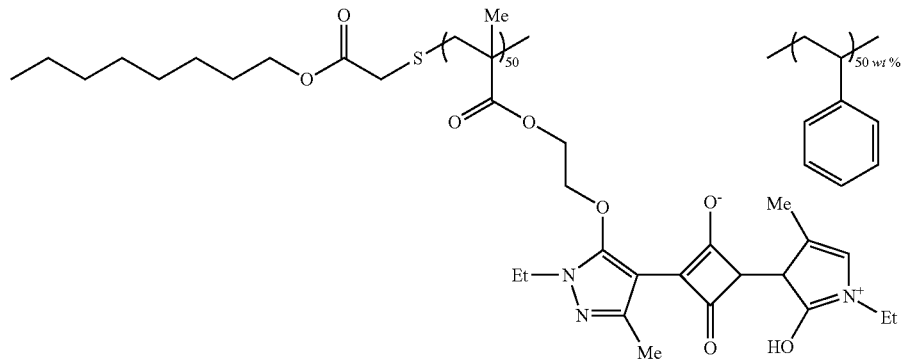

Exemplary compound A40

Chain transfer agent 8 LogP 3.00
Mw 8000

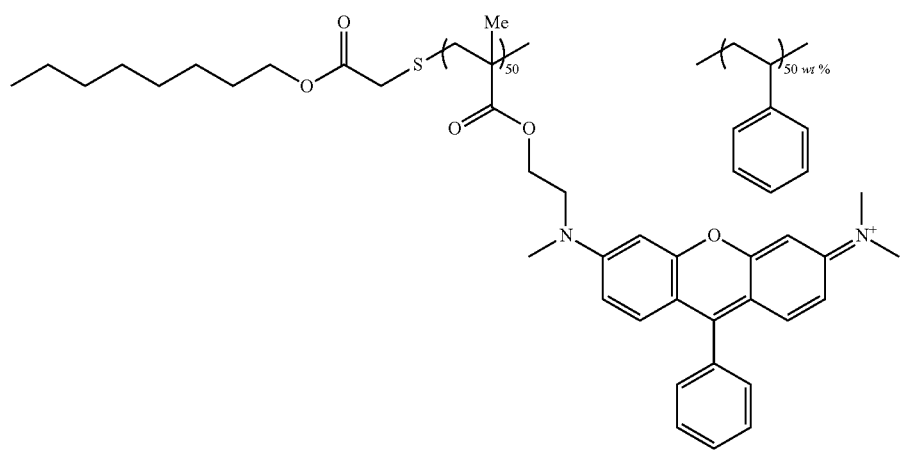

Exemplary compound A41

Chain transfer agent 8 LogP 3.00
Mw 12000

The content of the specific dye polymer in the radiation-sensitive colored composition of the present invention is preferably 1% by mass to 80% by mass, more preferably 10% by mass to 60% by mass, in terms of a solid content, even more preferably 15% by mass to 40% by mass. Here, a solid content refers to all components excluding a solvent in the color-sensitive radiation composition.

<(B) Solvent>

The radiation-sensitive colored composition of the present invention contains a solvent. The solvent is preferably an organic solvent.

Examples of the organic solvent that can be used in the present invention are as follows.

Examples of the solvent include esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, 3-oxypropionic acid alkyl esters such as methyl 3-oxypropionate and ethyl 3-oxypropionate (e.g. methyl 3-methoxypropionate, ethyl 3-methoxypropionate, methyl 3-ethoxypropionate, ethyl 3-ethoxypropionate), 2-oxypropionic acid alkyl esters such as methyl 2-oxypropionate, ethyl 2-oxypropionate, and propyl 2-oxypropionate (e.g. methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers, for example, diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, and propylene glycol propyl ether acetate; ketones, for example, methyl ether ketone, cyclohexanone, and 2-heptanone, and 3-heptanone; and aromatic hydrocarbons, for example, toluene and xylene.

The organic solvent may be used alone or in combination of two or more types.

When the organic solvent is used in combination of two or more types, a mixed solution of two or more selected from 3-ethoxy methyl propionate, 3-ethoxy ethyl propionate, ethylcellosolve acetate, ethyl lactate, diethylene glycol dimethyl ether, butyl acetate, 3-methoxy methyl propionate, 2-heptanone, cyclohexanone, ethyl carbitol acetate, butyl carbitol acetate, propylene glycol methyl ether, and propylene glycol monomethyl ether acetate is particularly preferred.

The amount of organic solvent in the radiation-sensitive colored composition is preferably 10% by mass to 90% by mass, more preferably 20% by mass to 80% by mass, even more preferably 25% by mass to 75% by mass, with respect to the total amount of the color-sensitive radiation composition.

<(C) Polymer Other than (A) Specific Dye Polymer (Other Polymer)>

The radiation-sensitive colored composition of the present invention may optionally contain another polymer that does not contain a structural unit including a dye structure as a polymer component. The other polymer may be for example contained as a binder polymer, or a dispersant of pigment that is used in conjunction, if desired.

(C) The other polymer that can be used in the present invention is not particularly limited so long as it is soluble in an alkali and is preferably selected from viewpoints of heat resistance, development property, availability and the like.

The alkali-soluble polymer is preferably a linear organic polymer soluble in organic solvents and developable with an aqueous weakly alkaline solution. Examples of such linear organic polymers include polymers having a carboxylic acid in their side chain, for example methacrylic acid copolymers, acrylic acid copolymers, itaconic acid copolymers, crotonic acid copolymers, maleic acid copolymers and partially-esterified maleic acid copolymers such as those described in the specifications of JP-59-44615A and JP-54-34327B, JP-58-12577B and JP-54-25957B, and JP-59-53836A and JP-59-71048A. Acidic cellulose derivatives having a carboxylic acid in the side chain are particularly useful.

Other useful polymers include polymers prepared by adding an acid anhydride to a polymer having a hydroxyl group, polyhydroxystyrene resins, polysiloxane resins, poly(2-hydroxyethyl (meth)acrylate), polyvinyl pyrrolidone, polyethylene oxide and polyvinyl alcohol.

Also, the polymer used in the invention may contain, as a copolymer component, monomers having a hydrophilic group, and examples of the monomers include an alkoxyalkyl (meth)acrylate, a hydroxyalkyl (meth)acrylate, a glycerol (meth)acrylate, a (meth)acrylamide, an N-methylolacrylamide, secondary and tertiary alkylacrylamides, a dialkylaminoalkyl (meth)acrylate, a morpholino (meth)acrylate, N-vinylpyrrolidone, N-vinylcaprolactam, vinylimidazole, vinyltriazole, methyl (meth)acrylate, ethyl (meth)acrylate, a branched or straight propyl (meth)acrylate, a branched or straight butyl (meth)acrylate, and phenoxyhydroxypropyl (meth)acrylate.

As other monomers having a hydrophilic group, monomers containing a tetrahydrofurfuryl group, a phosphoric acid moiety, a phosphoric acid ester moiety, a quaternary ammonium salt moiety, an ethyleneoxy chain, a propyleneoxy chain, a sulfonic acid moiety and a salt thereof, or a morpholinoethyl group are also useful.

Also, the radiation-sensitive colored composition is cured by exposure to light and is then used for formation of color regions. In such application, in order to improve the crosslinking efficacy, the polymer may have a polymerizable group in a side chain thereof. For example, polymers containing an allyl group, a (meth)acryl group, an allyloxyalkyl group or the like are also useful.

Examples of the polymers having a polymerizable group include KS Resist-106 (trade name, manufactured by Osaka Organic Chemical Industry Ltd.), and CYCLOMER P series (manufactured by Daicel Chemical Industries, Ltd.).

Moreover, in order to increase the strength of a cured film, an alcohol-soluble nylon or polyether of 2,2-bis(4-hydroxyphenyl)-propane and epichlorohydrin is also useful as (C) other copolymer.

Among the various binders, from a viewpoint of heat resistance, the polymer to be used in the invention is preferably a polyhydroxystyrene resin, a polysiloxane resin, an acryl resin, an acrylamide resin, or an acryl/acrylamide copolymer resin. Alternatively, from a viewpoint of developability control, the polymer to be used in the invention is preferably an acryl resin, an acrylamide resin, or an acryl/acrylamide copolymer resin.

Examples of the acryl resin preferably include a copolymer including a monomer selected from benzyl (meth)acrylate, (meth)acryl, hydroxyethyl (meth)acrylate, and (meth)acrylamide, KS-RESIST-106 (trade name, manufactured by Osaka Organic Chemical Industry Ltd.), and CYCLOMER P-series (Daicel Corporation.

Also, in the present invention, as (C) other polymer used as the binder in the invention, an alkali-soluble phenol resin may also be used. The alkali-soluble phenol resin may be preferably used when the composition of the invention is used as a positive-working composition. Examples of the alkali-soluble phenol resin include novolak resins and vinyl polymers.

Examples of the novolak resins include a product obtained by condensation of a phenol and an aldehyde in the presence of an acid catalyst. Examples of the phenol include phenol, cresol, ethylphenol, butylphenol, xylenol, phenylphenol, catechol, resorcinol, pyrogallol, naphthol, and bisphenol A. The phenol may be used alone or in combination of two or more types.

Examples of the aldehyde include formaldehyde, paraformaldehyde, acetaldehyde, propionaldehyde, and benzaldehyde. Specific examples of the novolak resin include meta-cresol, para-cresol, and condensation products of a mixture thereof with formalin. The molecular weight distribution of the novolak resin may be regulated by fractionation or the like. Alternatively, a low-molecular weight component having a phenolic hydroxy group such as bisphenol C or bisphenol A may be mixed with the novolak resin.

The (C) other polymer used in the present invention is preferably a polymer having a mass average molecular weight (in terms of polystyrene measured by GPC method) of from $1 \times 10^3$ to $2 \times 10^5$, further preferably from $2 \times 10^3$ to $1 \times 10^5$, and particularly preferably from $5 \times 10^3$ to $5 \times 10^4$.

Also, when (C) the other polymer is used as a dispersant of (D) the pigment described above, a polymer having a partial structure having an affinity to the pigment and a partial structure having an affinity to (B) the solvent is preferably used. Examples of such a polymer include polymer compounds having a structural unit represented by the following formula (I) or formula (II) and polymer compounds structural unit having an acid group.

The amount of (C) the other polymer in the radiation-sensitive colored composition of the present invention is preferably 0% by mass to 90% by mass, further preferably 0% by mass to 70% by mass, particularly preferably 0% by mass to 60% by mass, with respect to the total solid contents of the composition.

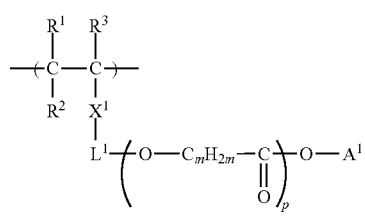

(I)

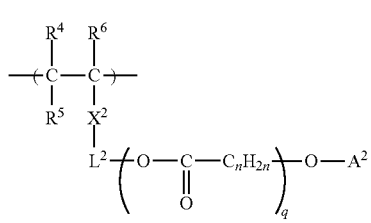

(II)

In formula (I) and formula (II), $R^1$ to $R^6$ each independently represent a hydrogen atom or a monovalent organic group, $X^1$ and $X^2$ each independently represent —CO—, —C(=O)O—, —CONH—, —OC(=O)— or a phenylene group, $L^1$ and $L^2$ each independently represent a single bond or a bivalent organic linking group, $A^1$ and $A^2$ each independently represent a monovalent organic group, m and n each independently represent an integer of 2 to 8, and p and q each independently represent an integer of 1 to 100.

The structural unit represented by formula (I) or formula (II) is contained in (C) other polymer as a repeating unit.

In formula (I) and formula (II), $R^1$ to $R^6$ each independently represent a hydrogen atom or a monovalent organic group. The monovalent organic group is preferably a substituted or unsubstituted alkyl group. The alkyl group is preferably an alkyl group having 1 to 12 carbon atoms, more preferably an alkyl group having 1 to 8 carbon atoms, particularly preferably an alkyl group having 1 to 4 carbon atoms.

When the alkyl group has a substituent group, the substituent group is for example preferably a hydroxyl group, an alkoxy group (preferably having 1 to 5 carbon atoms, more preferably 1 to 3 carbon atoms), a methoxy group, an ethoxy group, a cyclohexyloxy group and the like.

Specific examples of preferred alkyl groups include a methyl group, an ethyl group, a propyl group, a n-butyl group, an i-butyl group, a t-butyl group, an n-hexyl group, a cyclohexyl group, a 2-hydroxyethyl group, a 3-hydroxypropyl group, a 2-hydroxypropyl group, and a 2-methoxyethyl group.

$R^1$, $R^2$, $R^4$, and $R^5$ are preferably a hydrogen atom, and $R^3$ and $R^6$ are most preferably a hydrogen atom or a methyl group in terms of adsorption efficiency to the surface of pigment.

In formula (I) and formula (II), $X^1$ and $X^2$ each independently represent —CO—, —C(=O)O—, —CONH—, —OC(=O)—, or a phenylene group. Among them, —C(=O)O—, —CONH—, or a phenylene group are preferred in terms of adsorption property to the pigment, and —C(=O)O— is most preferred.

In formula (I) and formula (II), $L^1$ and $L^2$ each independently represent a single bond or a bivalent organic linking group. The bivalent organic linking group is preferably a substituted or unsubstituted alkylene group or a bivalent organic linking group having a partial structure containing the alkylene group and a hetero atom or a hetero atom. Here, the alkylene group is preferably an alkylene group having 1 to 12 carbon atoms, more preferably alkylene group having 1 to 8 carbon atoms, particularly preferably alkylene group having 1 to 4 carbon atoms. Also, the hetero atom in the partial structure containing a hetero atom is for example an oxygen atom, a nitrogen atom and a sulfur atom. Among them, an oxygen atom and a nitrogen atom are preferred.

Specific examples of preferred alkylene groups include a methylene group, an ethylene group, a propylene group, a trimethylene group, a tetramethylene group and the like.

When the alkylene group has a substituent group, the substituent group is for example a hydroxyl group or the like.

The bivalent organic linking group is preferably a group in which adjacent oxygen atoms are joined through a hetero atom selected from —C(=O)—, —OC(=O)—, —NHC(=O)— or a partial structure containing the hetero atom at the terminal of the alkylene group, in terms of an adsorption property to the pigment.

In formula (I) and formula (II), $A^1$ and $A^2$ each independently represent a monovalent organic group. The monovalent organic group is preferably a substituted or unsubstituted alkyl group, or a substituted or unsubstituted aryl group.

The (C) other polymer in the present invention preferably contains at least one structural unit represented by formula (I), or contains at least one structural unit represented by formula (II), or at least one structural unit represented by formula (I) and at least one structural unit represented by formula (II). Here, in formula (I) and (II), the following combination is a particularly preferred embodiment. That is, $R^1$, $R^2$, $R^4$, and $R^5$ are preferably a hydrogen atom, and $R^3$ and $R^6$ are preferably a hydrogen atom or a methyl group. $X^1$ and $X^2$ are preferably —C(=O)O—. $L^1$ and $L^2$ are preferably a bivalent organic linking group in which adjacent oxygen atoms are joined through a hetero atom selected from —C(=O)—, —OC(=O)—, —NHC(=O)— or a partial structure containing the hetero atom at the terminal of the alkylene group having 1 to 4 carbon atoms, in terms of adsorption property to the pigment. m and n are preferably 5 and p and q are preferably 5 to 20.

The polymer having a structural unit represented by the following formula (I) or formula (II) exhibits superior pigment dispersibility and excellent compatibility with the specific dye polymer, thus effectively inhibiting color unevenness due to dye nonuniformity, since a graft moiety thereof is hydrophilic.

Hereinafter, specific examples of the polymer having a structural unit represented by the following formula (I) or formula (II) are given as follows, but the present invention is not limited thereto.

Exemplary compound 1

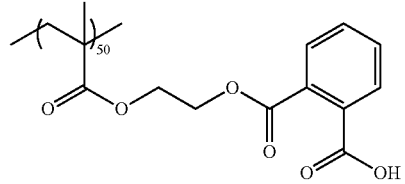

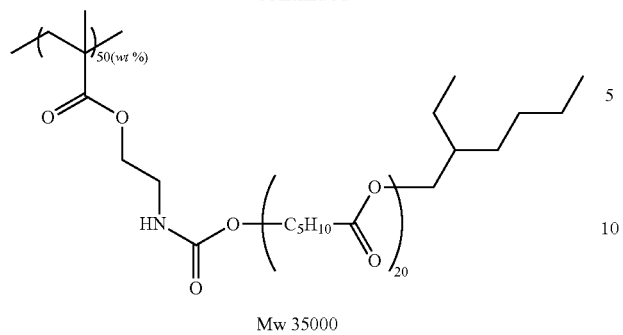
Mw 35000
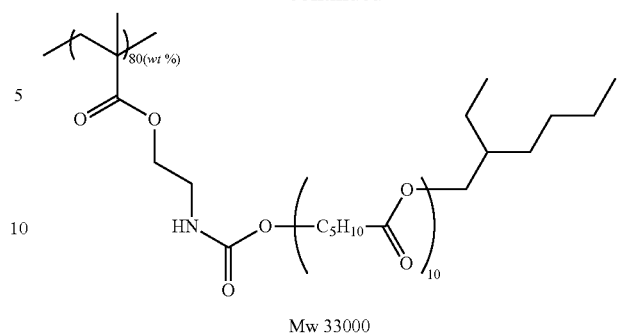
Mw 33000
Exemplary compound 2
Exemplary compound 5
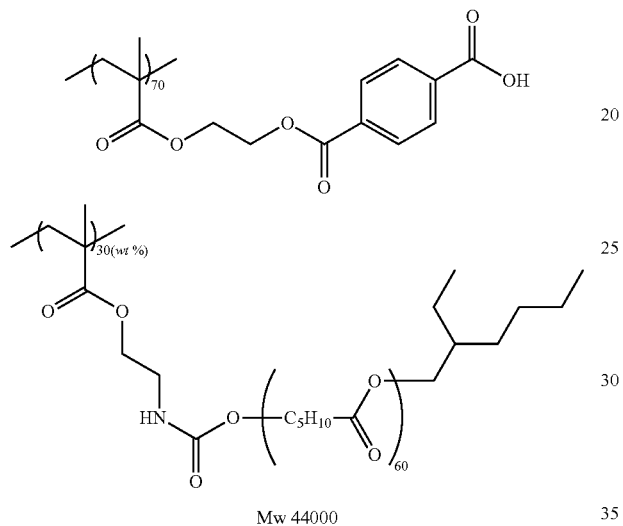
Mw 44000
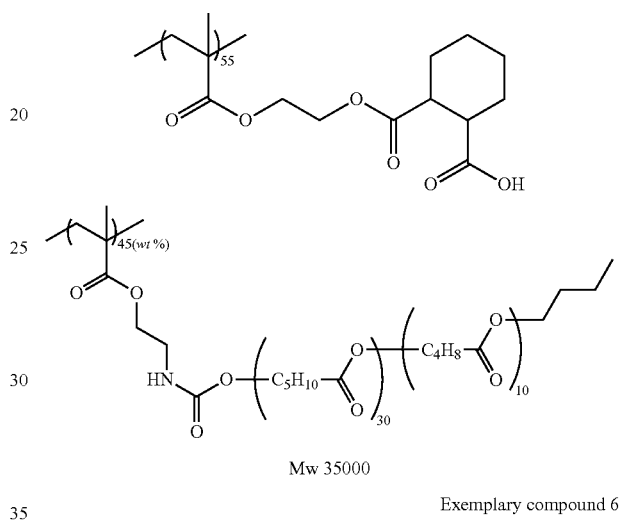
Mw 35000
Exemplary compound 3
Exemplary compound 6
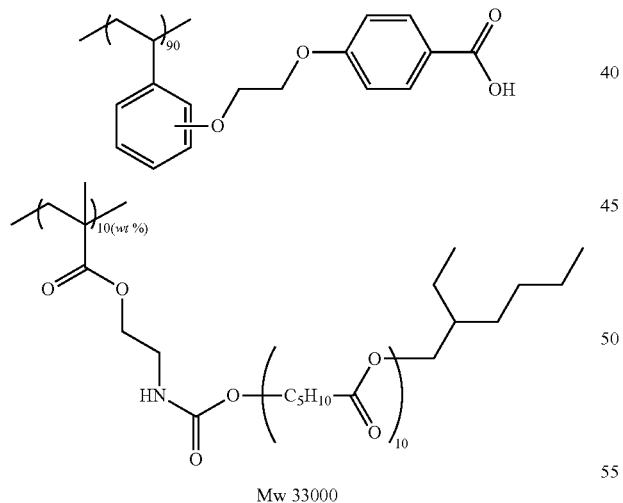
Mw 33000
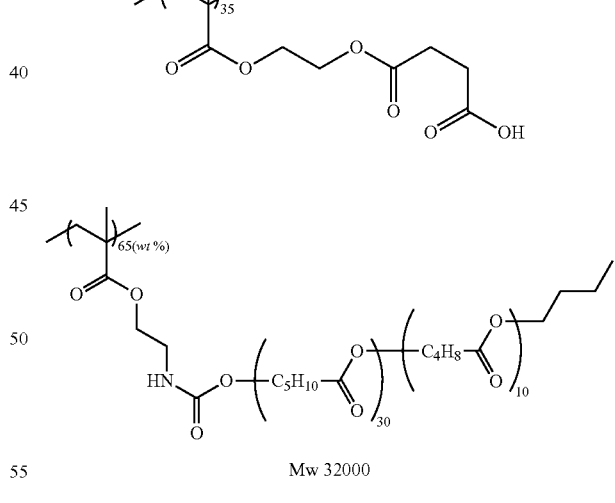
Mw 32000
Exemplary compound 4
Exemplary compound 7
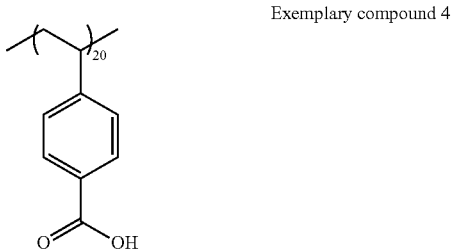

-continued
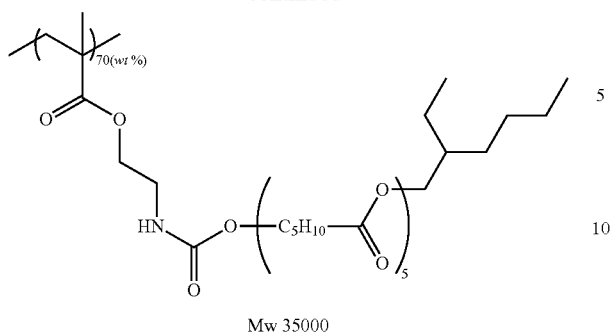
Mw 35000
Exemplary compound 8
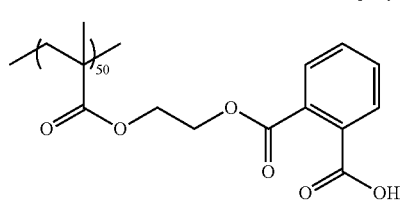
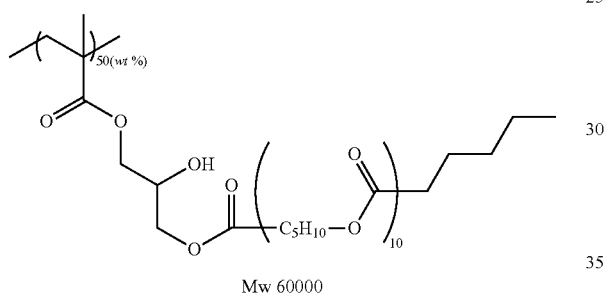
Mw 60000
Exemplary compound 9
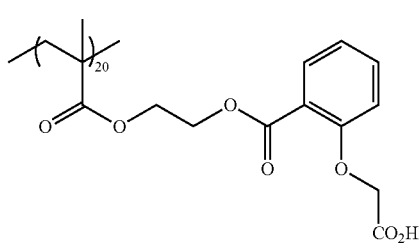
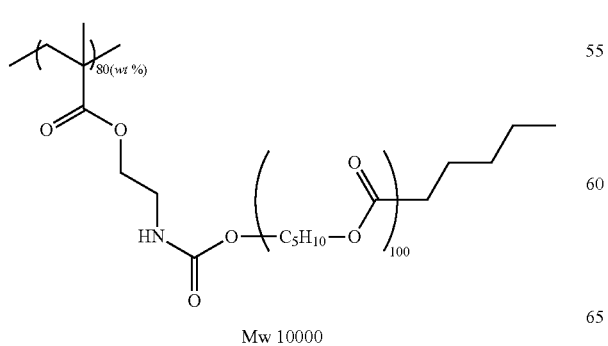
Mw 10000
Exemplary compound 10
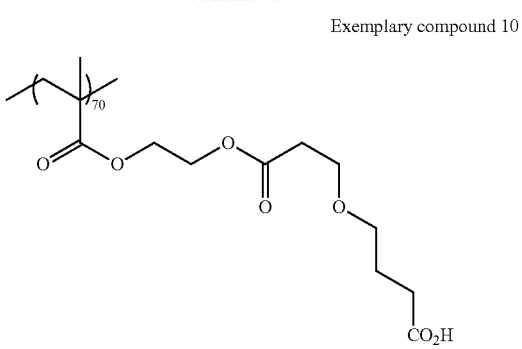
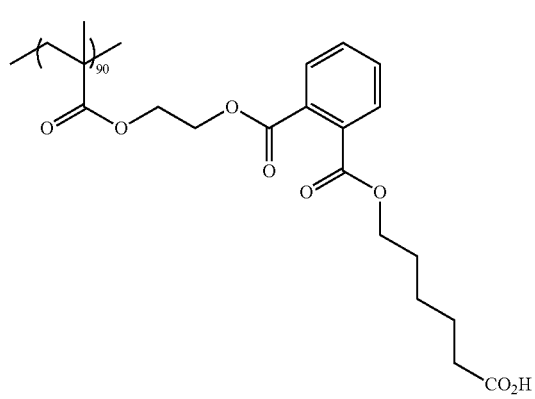
Exemplary compound 11
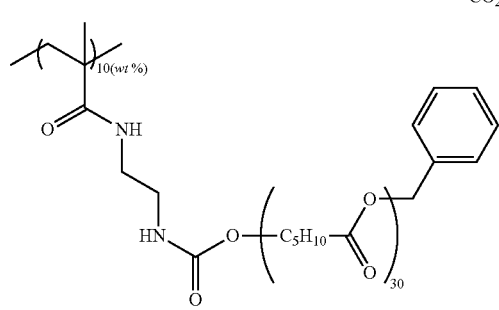
Mw 20000
Exemplary compound 12
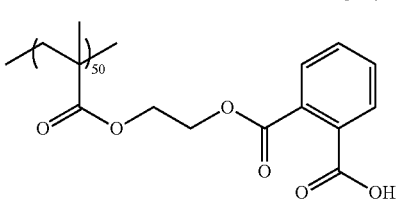

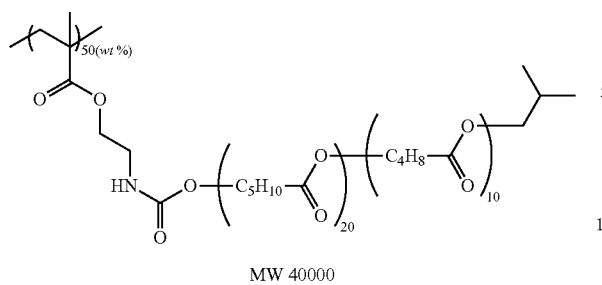
MW 40000
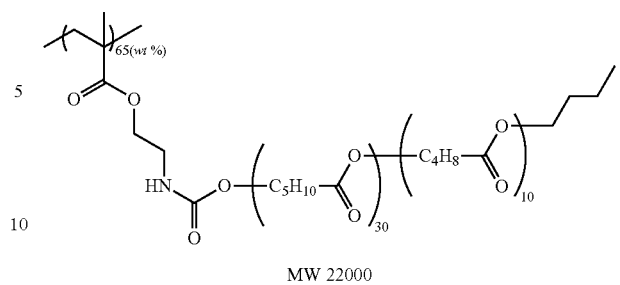
MW 22000
Exemplary compound 13
Exemplary compound 16
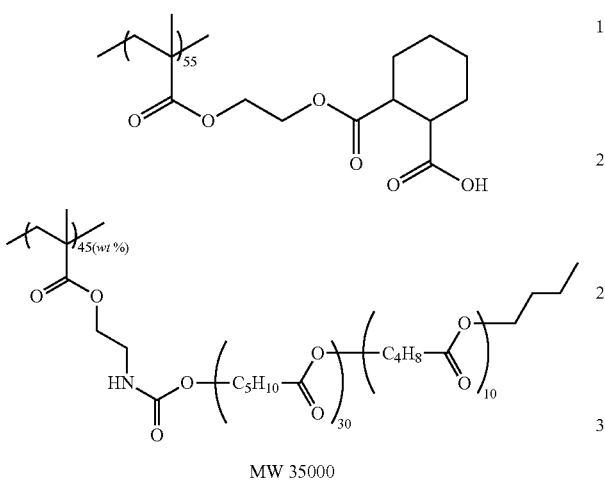
MW 35000
Exemplary compound 14
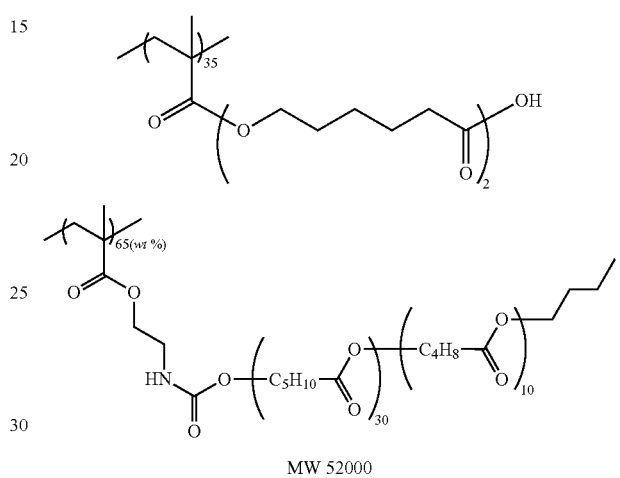
MW 52000
Exemplary compound 17
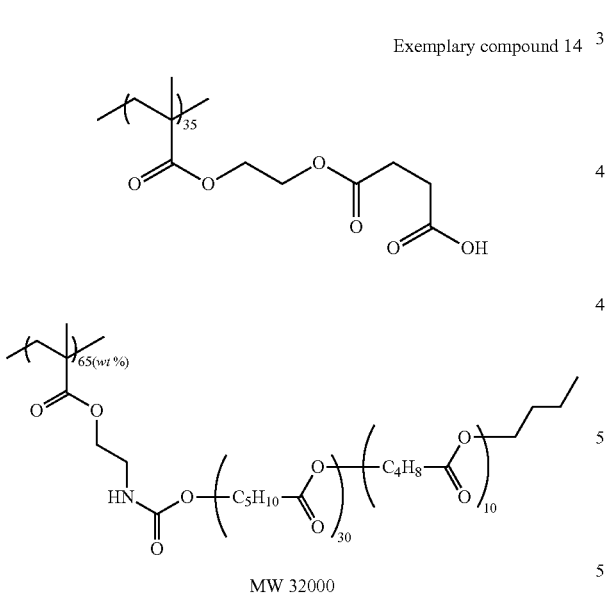
MW 32000
Exemlary compound 15
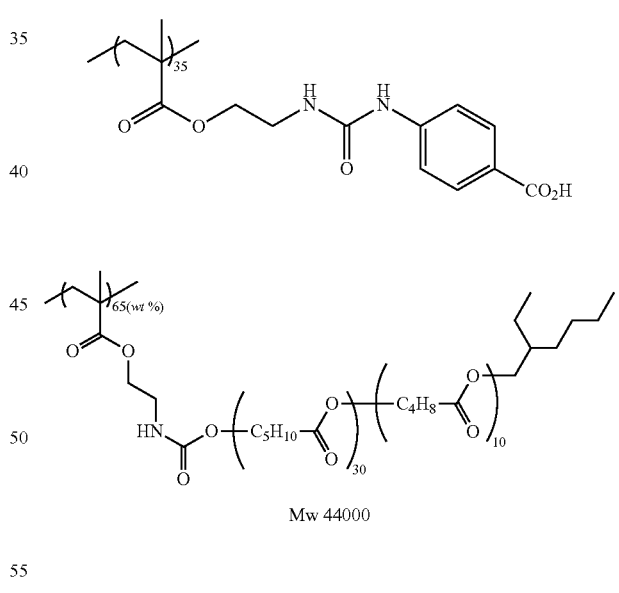
Mw 44000
Exemplary compound 18
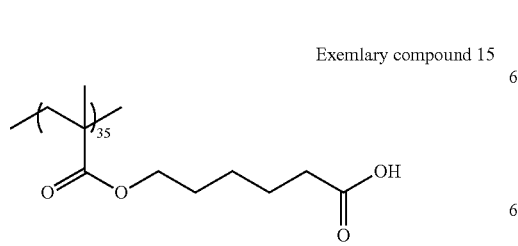
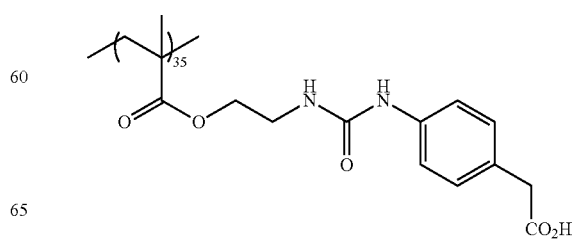

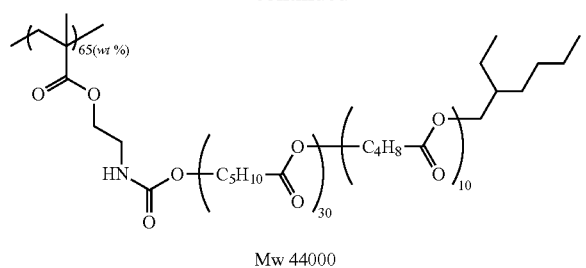
Mw 44000
Exemplary compound 19
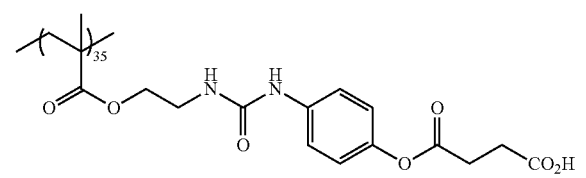
Mw 24000
Exemplary compound 20
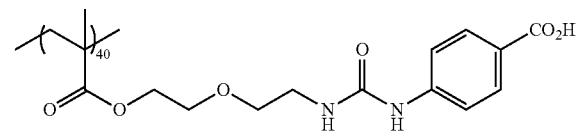
Mw 34000
Exemplary compound 21
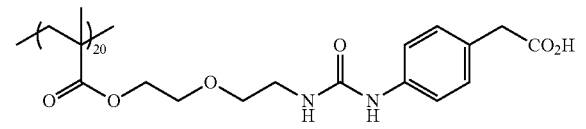
Mw 48000
Exemplary compound 22
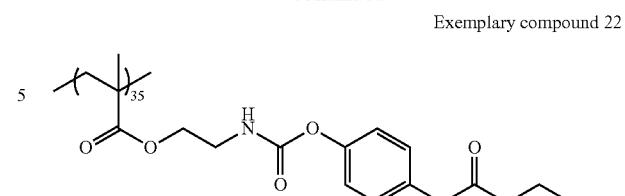
Mw 33000
Exemplary compound 23
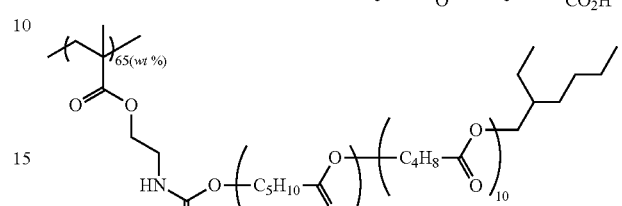
Mw 32000
Exemplary compound 24
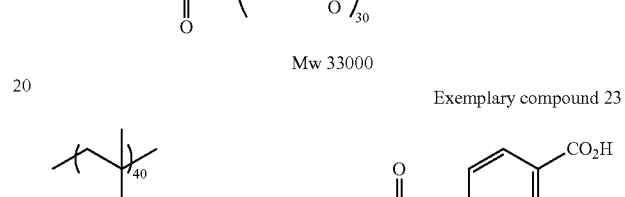
Mw 22000
Exemplary compound 25
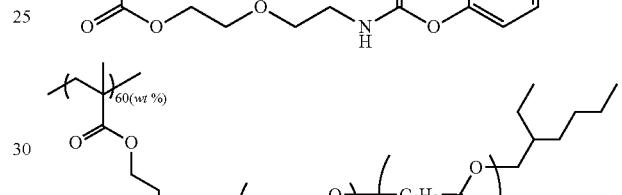

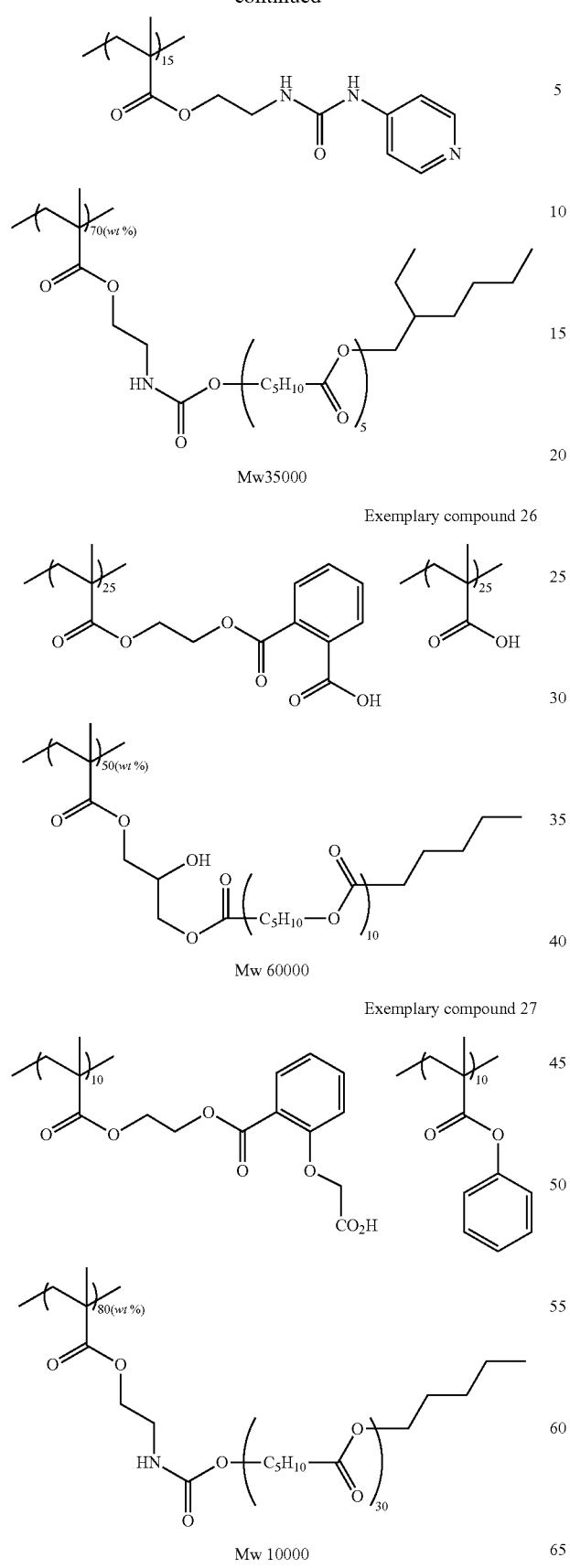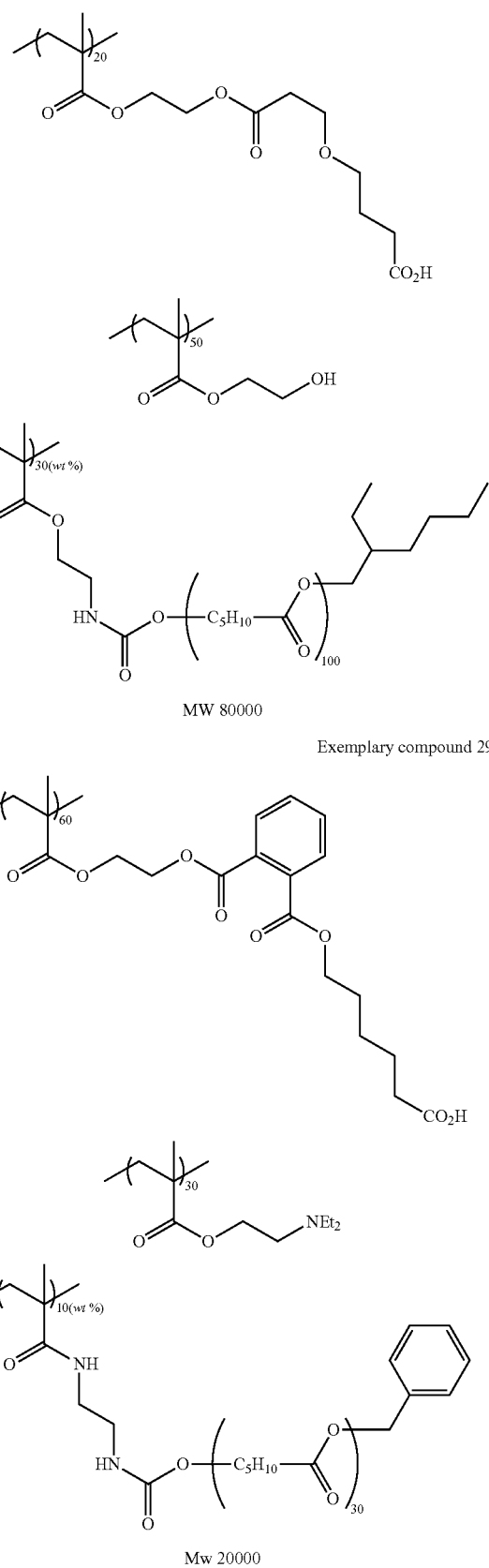

Exemplary compound 30
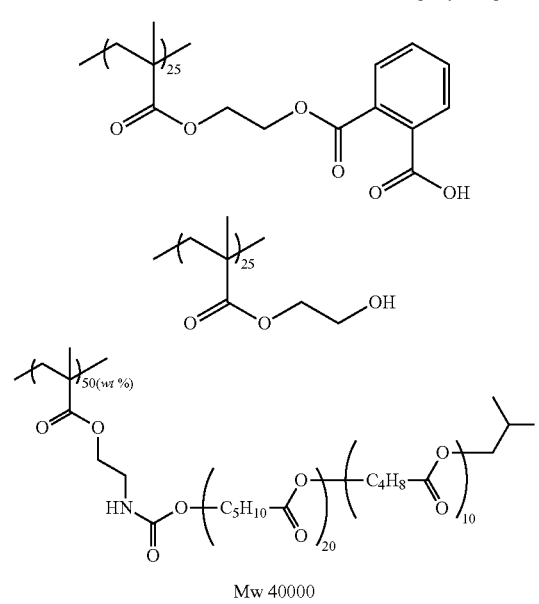
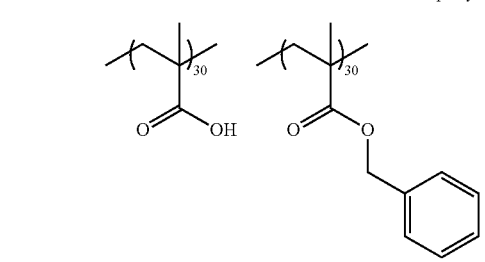
Mw 40000
Exemplary compound 31
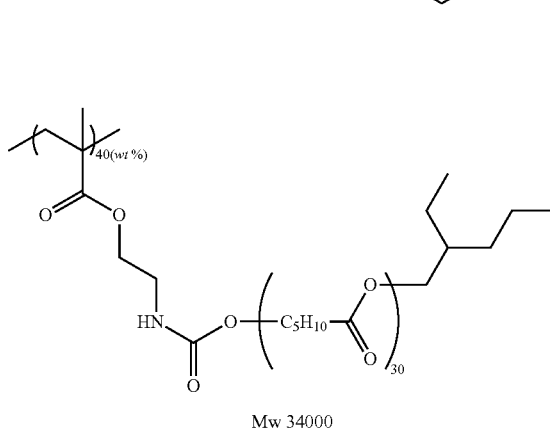
Mw 34000
Exemplary compound 32
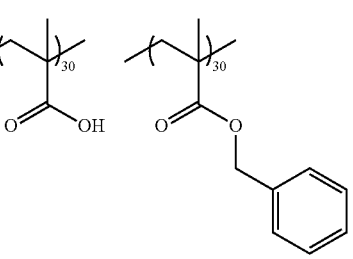
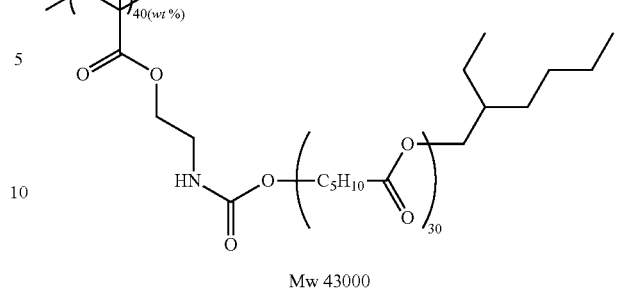
Mw 43000
Exemplary compound 33
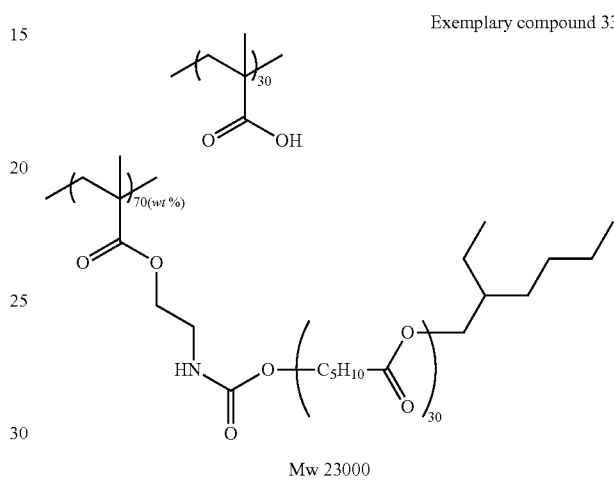
Mw 23000
Exemplary compound 34
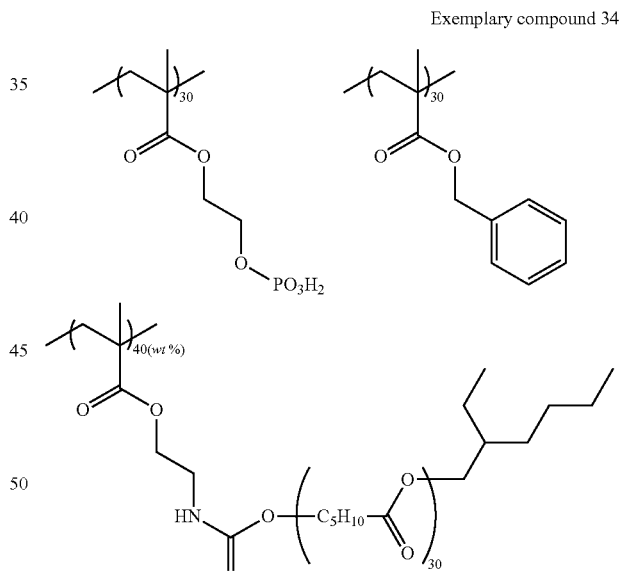
Mw 15000
Exemplary compound 35
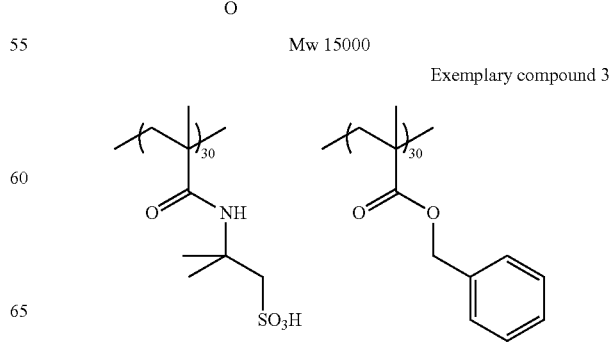

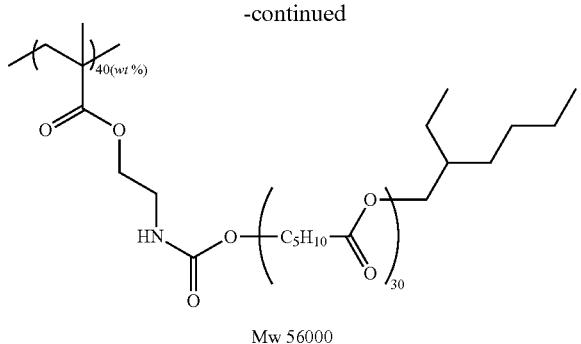

Mw 56000

<(D) Pigment>

The radiation-sensitive colored composition of the present invention preferably contains at least one pigment. The pigment may be suitably selected from conventional various well-known inorganic pigments or organic pigments.

Taking into consideration the fact that color patterns are used for color filters, regardless of inorganic pigments and organic pigments, the obtained color cured films have preferably a high transmissivity. For this reason, a particle size of (D) the pigment is preferably as small as possible. In terms of a handling property, a mean primary particle diameter of the pigment is preferably 5 nm to 200 nm, more preferably 20 nm to 100 nm.

Examples of the inorganic pigment include metal compounds such as metal oxides and metal complex salts. Specific examples include metal oxides of iron, cobalt, aluminum, cadmium, lead, copper, titanium, magnesium, chromium, zinc, antimony, silver and the like, and composite oxides of the metals. Titanium nitrides, silver tin compounds, silver compounds and the like may be used.

Organic pigments preferably used in the present invention are given as follows, but the present invention is not limited thereto.

C.I. Pigment YELLOW 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214 and the like, C.I. Pigment Orange 2, 5, 13, 16, 17:1, 31, 34, 36, 38, 43, 46, 48, 49, 51, 52, 55, 59, 60, 61, 62, 64, 71, 73 and the like, C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279

C.I. Pigment Green 7, 10, 36, 37, 58

C.I. Pigment Violet 1, 19, 23, 27, 32, 37, 42

C.I. Pigment Blue 1, 2, 15, 15:1, 15:2, 15:3, 15:4, 15:6, 16, 22, 60, 64, 66, 79, 80

C.I. Pigment Black 1

These organic pigments may be used alone or in combination thereof to improve color purity.

Among the pigments, phthalocyanine pigment is preferably used as (A) the specific dye polymer having a dipyrromethane dye-derived structure as a dye structure, in terms of suitable color combinations of colors. Specific examples thereof include C.I. pigment blue 15:1, 15:3, 15:6, 16, 22, 60, 66, C.I. pigment green 7, 36, 37, 58, particularly preferably, C.I. pigment blue 15:6.

In the present invention, the particles of the aforementioned pigment may be fine and uniform when used.

The fine particles of pigment can be obtained by a process including mixing the pigment with a water-soluble inorganic salt in a water-soluble organic solvent to prepare a highly viscous liquid composition and crushing the composition.

Also, in the process of obtaining the fine particles of the organic pigment, by being used in combination with a resin that is at least partially soluble in a water-soluble organic solvent in the liquid composition, a processed pigment that is fine and coated with the resin and undergoes little aggregation during drying can be obtained.

Here, the resin that is at least soluble in the water-soluble organic solvent, used for obtaining the processed pigment may be a well-known resin used as a pigment dispersant, but in the present invention, is preferably polymers described as examples of pigment dispersants in the aforementioned (C) other polymer The content of (D) pigment in the colored composition of the present invention is preferably 5% by mass to 50% by mass, more preferably 10% by mass to 30% by mass, even more preferably 10% by mass to 20% by mass.

<(E) Polymerizable Compound>

In a preferred embodiment, the radiation-sensitive colored composition of the present invention contains (E) a polymerizable compound and (F) a polymerization initiator. Through such an embodiment, a color cured film or a color pattern can be formed.

(E) the polymerizable compound is selected from compounds having at least one terminal ethylenically unsaturated bond, preferably two or more terminal ethylenically unsaturated bonds. Such a compound group is well-known in the art and may be used for the present invention without particular limitation. These compounds may have a chemical form selected from a monomer, a prepolymer (a dimer, a trimer or an oligomer), a mixture thereof, or a polymer thereof.

The polymerizable compound of the present invention may be used alone or in combination of two or more types.

More specifically, examples of the monomer and a prepolymer thereof include an unsaturated carboxylic acid (such as acrylic acid, methacrylic acid, itaconic acid, crotonic acid, isocrotonic acid and maleic acid), its esters and amides, and polymers thereof. Among these, preferred are esters of an unsaturated carboxylic acid and an aliphatic polyhydric alcohol compound, amides of an unsaturated carboxylic acid and an aliphatic polyvalent amine compound, and polymers thereof. Other preferred examples include an addition reaction product of unsaturated carboxylic acid esters or amides having a nucleophilic substituent such as hydroxyl group, amino group and mercapto group, with monofunctional or polyfunctional isocyanates or epoxies, and a dehydration condensation reaction product with a monofunctional or polyfunctional carboxylic acid. An addition reaction product of unsaturated carboxylic acid esters or amides having an electrophilic substituent such as an isocyanate group and an epoxy group, with monofunctional or polyfunctional alcohols, amines or thiols, and a substitution reaction product of unsaturated carboxylic acid esters or amides having a leaving substituent such as a halogen group or a tosyloxy group, with monofunctional or polyfunctional alcohols, amines or thiols, are also preferred. As another example, compounds where the above-described unsaturated carboxylic acid is replaced by an unsaturated phosphonic acid, a styrene, a vinyl ether or the like, may be also used.

As for these specific compounds, compounds described in paragraphs 0095 to 0108 of JP-A-2009-288705 may be suitably used also in the present invention.

Also, an ethylenically unsaturated group-containing compound having at least one addition-polymerizable ethylene group and having a boiling point of 100° C. or more under atmospheric pressure is also preferred as the polymerizable compound. Examples thereof include monofunctional acrylates or methacrylates such as polyethylene glycol mono(meth)acrylate, polypropylene glycol mono(meth)acrylate and phenoxyethyl (meth)acrylate; polyfunctional acrylates or methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, a compound obtained by adding ethylene oxide or propylene oxide to a polyfunctional alcohol (e.g., glycerin, trimethylolethane) and (meth)acrylating the adduct, urethane acrylates described in JP-B-48-41708, JP-B-50-6034 and JP-A-51-37193, polyester acrylates described in JP-A-48-64183, JP-B-49-43191 and JP-B-52-30490, and epoxy acrylates as a reaction product of an epoxy resin and (meth)acrylic acid; and a mixture thereof.

Examples thereof include multifunctional (meth)acrylates obtained by reacting a multifunctional carboxylate with a compound having a cyclic ether group such as glycidyl(meth)acrylate and an ethylenically unsaturated group.

Also, other preferred polymerizable compounds include compounds having a fluorene ring and having 2 or more ethylenic polymerizable groups, and cardo resins, as disclosed in JP-A No. 2010-160418, JP-A No. 2010-129825, and Japan Patent No. 4364216.

Also, examples of the compound having at least one ethylenic unsaturated group, which is addition-polymerizable, and having a boiling point of 100° C. or more include compounds as disclosed in paragraphs [0254] to [0257] of JP-A No. 2008-292970.

Furthermore, radical polymerizable monomers represented by the following Formulae (MO-1) to (MO-5) may also be used. In the formulae, when T represents an oxyalkylene group, R is bonded to the terminal of the carbon atom side of the oxyalkylene group.

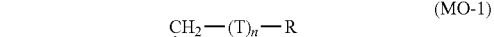

(MO-1)

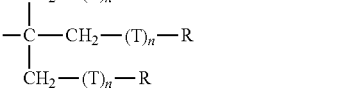

(MO-2)

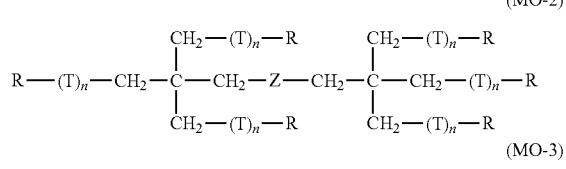

(MO-3)

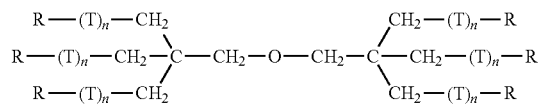

(MO-4)

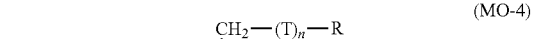

(MO-5)

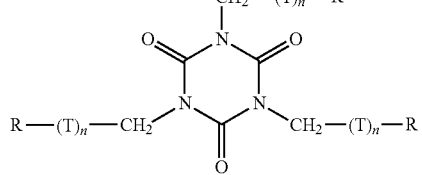

R:

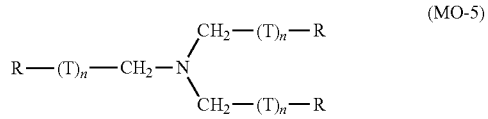

T:

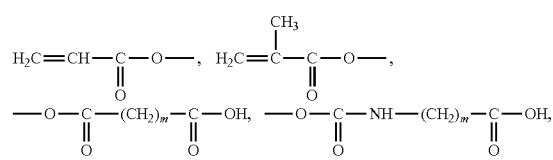

Z:

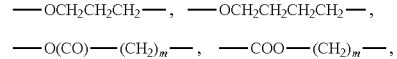

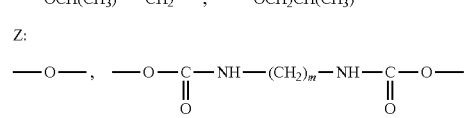

In Formulae (MO-1) to (MO-5), n represents 0 to 14; m represents 1 to 8; and when plural R's and T's are present in a molecule, the plural R's and T's may be identical or different.

In each of the radical polymerizable monomers represented by Formulae (MO-1) to (MO-5), at least one of plural R's represents a group represented by —OC(=O)CH=CH$_2$ or —OC(=O)C(CH$_3$)=CH$_2$.

As specific examples of polymerizable compounds represented by Formulae (MO-1) to (MO-5), compounds described in paragraphs [0248] to [0251] of JP 2007-269779A may be useful for the present invention.

Also, as the polymerizable compound, a compound which is disclosed as a compound of Formula (1) or (2), together with specific examples thereof, in JP-10-62986A and which is obtained by (meth)acrylation of the polyfunctional alcohol to which ethylene oxide, propylene oxide, or the like has been added, may be used.

In particular, the polymerizable compound is preferably dipentaerythritol triacrylate (examples of commercially-available products thereof including KAYARAD D-330, trade name, manufactured by Nippon Kayaku Co., Ltd.), dipentaerythritol tetraacrylate (examples of commercially-available products thereof including KAYARAD D-320, trade name, manufactured by Nippon Kayaku Co., Ltd.), dipentaerythritol penta(meth)acrylate (examples of commercially-available products thereof including KAYARAD D-310, trade name, manufactured by Nippon Kayaku Co., Ltd.), dipentaerythritol hexa(meth)acrylate (examples of commercially-available products thereof including KAYARAD DPHA, trade name, manufactured by Nippon Kayaku Co., Ltd.), or a modified product thereof in which the (meth)acryloyl group has an ethylene glycol or propylene glycol reside therethrough. The oligomer types thereof can also be used.

Preferred embodiments of the polymerizable compound will be given below.

The polymerizable compound may have an acid group such as carboxyl group, sulfonate group, phosphate group, as a multifunctional monomer. When the ethylenic compound is a mixture as above, the compound may be used without any treatment as long as it has an unreacted carboxyl group, but an acid group may be incorporated by reacting a non-aromatic carboxyl anhydride with the hydroxyl group of the ethylenic compound. In this case, specific examples of the used non-aromatic carboxyl anhydride include tetrahydrophthalic anhydride, alkylated tetrahydrophthalic anhydride, hexahydrophthalic anhydride, alkylated hexahydrophthalic anhydride, succinic anhydride, maleic anhydride and the like.

In the present invention, the monomer having an acid group is an ester of an aliphatic polyhydroxy compound and unsaturated carboxyl acid and is preferably a multifunctional monomer in which an acid group is provided by reacting a non-aromatic carboxyl anhydride with an unreacted hydroxyl group of an aliphatic polyhydroxy compound, particularly preferably, this ester in which the aliphatic polyhydroxy compound is pentaerythritol and/or dipentaerythritol. Examples of commercially available products thereof include M-510 and M-520, manufactured by Toagosei Co., Ltd., polybasic acid-modified acryl oligomers.

Such a monomer may be used alone. The monomers may be used in combination of two or more types since use of a single compound for preparation is difficult. Also, if necessary, a multifunctional monomer having no acid group as the monomer may be used in combination with a multifunctional monomer having an acid group.

The multifunctional monomer having an acid group preferably has an acid value of 0.1 to 40 mg-KOH/g, particularly preferably 5 to 30 mg-KOH/g. When the acid value of the multifunctional monomer is excessively low, developing and solution properties are deteriorated, and when the acid value is excessively high, preparation or handling is difficult, photopolymerization property is deteriorated, and curability such as surface evenness of pixels is deteriorated. Accordingly, when two or more types of multifunctional monomers of other acid groups are used in combination, or multifunctional monomers having no acid group are used in combination, the acid group of total multifunctional monomers is preferably adjusted to this range.

Also, a multifunctional monomer having a caprolactone structure as a polymerizable monomer is a preferred embodiment.

The multifunctional monomer having a caprolactone structure is not particularly limited so long as it has a caprolactone structure in the molecule, but examples thereof include polyvalent alcohols such as trimethylolethane, ditrimethylolethane, trimethylolpropane, ditrimethylolpropane, pentaerythritol, dipentaerythritol, tripentaerythritol, glycerine, diglycerol, trimethylolmelamine, and ∈-caprolactone modified multifunctional (meth)acrylate obtained by esterification of (meth)acrylate and ∈-caprolactone. Of these, a multifunctional monomer having a caprolactone structure represented by the following formula (Z-1) is preferred.

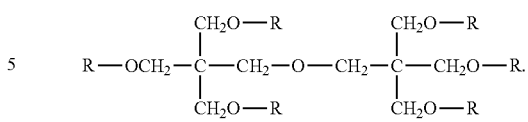

In formula (Z-1), all of six R are groups represented by the following formula (Z-2), or 1 to 5 of six R are groups represented by the following formula (Z-2) and the residues are groups represented by the following formula (Z-3).

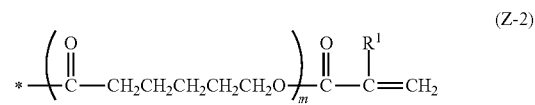

In formula (Z-2), R1 represents a hydrogen atom or a methyl group, "*" represents an integer of 1 or 2 and "*" represents a bonding means.

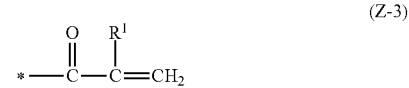

In formula (Z-3), R1 represents a hydrogen atom or a methyl group, and "*" represents a bonding means.)

Examples of the multifunctional monomer having a caprolactone structure include, as commercial products, KAYARAD DPCA series (manufactured by Nippon Kayaku Co., Ltd.), DPCA-20 (compound in formulae (1) to (3) in which m=1, the number of groups represented by formula (2)=2, and all of $R^1$ are hydrogen atoms), DPCA-30 (compound in which m=1, the number of groups represented by formula (2)=3, and all of $R^1$ are hydrogen atoms), DPCA-60 (compound in formula above, in which m=1, the number of groups represented by formula (2)=6, and all of $R^1$ are hydrogen atoms), DPCA-120 (compound in the formula above in which m=2, the number of groups represented by formula (2)=6, and all of $R^1$ are hydrogen atoms) and the like.

In the present invention, the multifunctional monomer having a caprolactone structure may be used alone or in combination of two or more types.

Also, specific monomers of the present invention are preferably at least one selected from the group consisting of compounds represented by formula (Z-4) or (Z-5).

In formula (Z-4) and (Z-5), E each independently represent, —(($CH_2$)$_y$$CH_2$O)—, or —((CH2)yCH($CH_3$)O)—, y each independently represent an integer of 0 to 10, and X each independently represents an acryloly group, a methacryloly group, a hydrogen atom, or a carboxyl group.

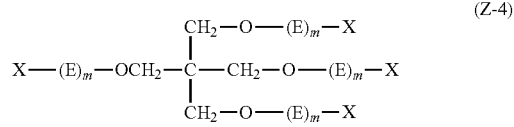

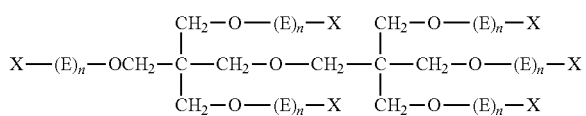

(Z-5)

In formula (Z-4), the sum of the acryloly group and the methacryloly group are 3 or 4, m each independently represent an integer of 0 to 10, the sum of respective m is an integer of 0 to 40. When the sum of respective m is 0, one of X is a carboxyl group.

In formula (ii), the sum of the acryloly group and methacryloly group is 5 or 6, n each independently represent an integer of 0 to 10, and the sum of respective n is an integer of 0 to 60. When the sum of n is 0, any one of X is a carboxyl group.

In formula (Z-4), m is preferably an integer of 0 to 6, more preferably an integer of 0 to 4.

Also, the sum of m is preferably an integer of 2 to 40, more preferably an integer of 2 to 16, particularly preferably an integer of 4 to 8.

In formula (Z-5), n is preferably an integer of 0 to 6, more preferably an integer of 0 to 4.

Also, the sum of respective n is preferably an integer of 3 to 60, more preferably an integer of 3 to 24, particularly preferably an integer of 6 to 12.

Also, —((CH$_2$)$_y$CH$_2$O)— or —((CH$_2$)$_y$CH(CH$_3$)O)— in formula (Z-4) or formula (Z-5) has preferably a structure in which an end of oxygen atom side is bonded to X.

The compound represented by formula (Z-4) or formula (Z-5) may be used alone or in combination of two or more types. In particular, in formula (ii), all of six X are preferably acryloly groups.

Also, the total content of the compound represented by formula (Z-4) or formula (Z-5) is preferably 20% by mass or more, more preferably 50% by mass or more.

The compound represented by formula (Z-4) or formula (Z-5) can be synthesized by a conventional well-known process, a process including reacting ethylene oxide or propylene oxide with pentaerythritol or dipentaerythritol through a ring-opening addition reaction to bond ring-opened skeletons and a process including reacting terminal hydroxyl group of ring-opened skeleton with (meth)acryloyl chloride to incorporate a (meth)acryloly group. Respective processes are well-known and those skilled in the art can readily synthesize compounds represented by formula (i) or (ii).

Of the compounds represented by formula (Z-4) or formula (Z-5), pentaerythritol derivatives and/or dipentaerythritol derivatives are more preferred.

Specific examples thereof include the compounds represented by the following formulae (a) to (f) (hereinafter, referred to as "exemplary compounds (a) to (f)"). Of these, exemplary compounds (a), (b), (e) and (f) are preferred.

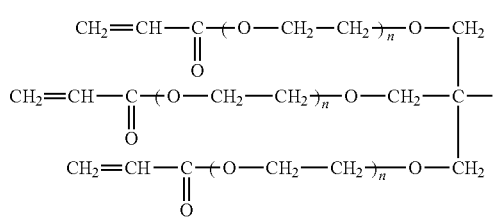 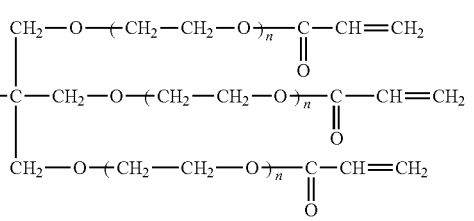

(a)

(the sum of respective n is 6)

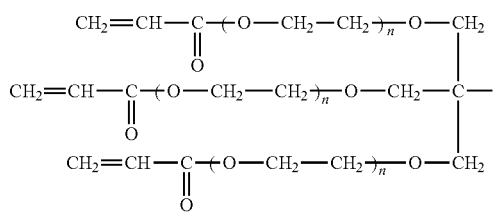 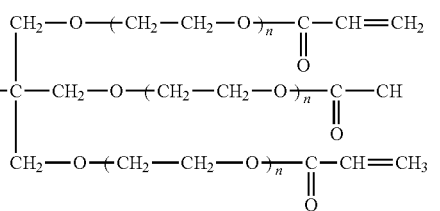

(b)

(the sum of respective n is 12)

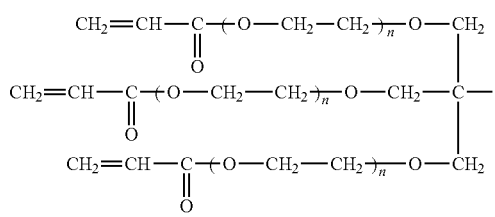 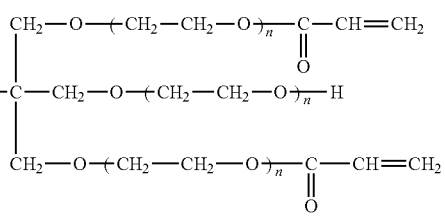

(c)

(the sum of respective n is 12)

-continued

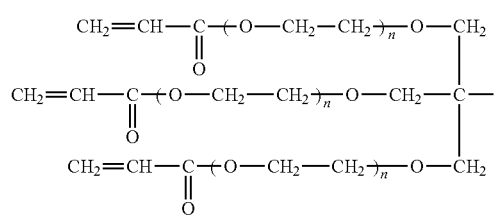

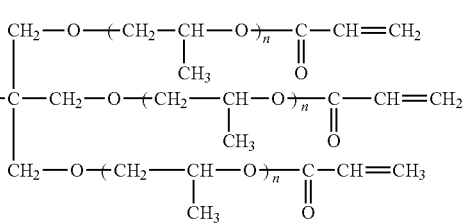

(d)

(the sum of respective n is 6)

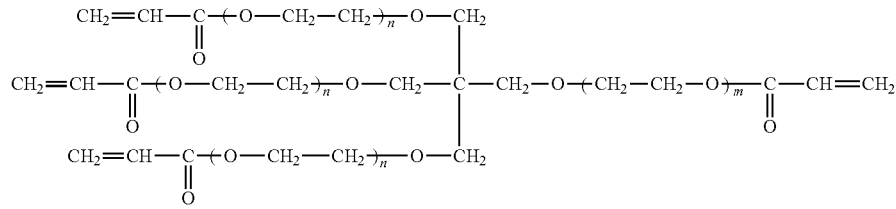

(e)

(the sum of respective n is 4)

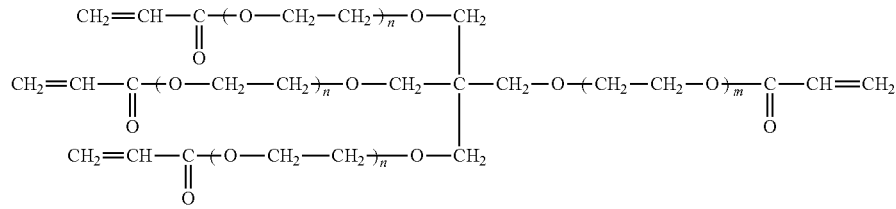

(f)

(the sum of respective n is 12)

Examples of commercial products of polymerizable compounds represented by formula (Z-4), (Z-5) include SR-494, tetrafunctional acrylate having four ethylene oxy chains, (manufactured by Sartomer Company, Inc.), and DPCA-60 hexafunctional acrylate having six pentylene oxy chains and TPA-330, trifunctional acrylate having three isobutylene oxy chains (both manufactured by Nippon Kayaku Co., Ltd.).

Also, examples of polymerizable compounds include urethane acrylates such as those described in JP-48-41708B, JP-51-37193A, JP-2-32293B, and JP-2-16765B, and urethane compounds having ethylene oxide skeletons such as those described in JP-58-49860B, JP-56-17654B, JP-62-39417B, and JP-62-39418B. Also, by using addition polymerizable compounds having an amino structure or a sulfide structure in the molecule described in JP-63-277653A, JP-63-260909A, JP-1-105238B as the polymerizable compound, curable compositions with considerably superior photosensitive speed can be obtained. Commercial products of polymerizable compounds include urethane oligomers UAS-10, UAB-140 (manufactured by Nippon Paper Chemicals Co., Ltd.), UA-7200 (manufactured by Shin-Nakamura Chemical Co, Ltd.), DPHA-40 H (manufactured by Nippon Kayaku Co., Ltd.), UA-306 H, UA-306 T, UA-306 I, AH-600, T-600, and AI-600 (manufactured by Kyouei-Sha Company Ltd.) and TO-1382 (Dong-A Synthesis Do., Ltd.)

Details of how to use the polymerizable compound, such as the structure, the number of kinds of the polymerizable compound, the amount or the like, may be arbitrarily selected in view of the eventual characteristics of the color-sensitive radiation composition. For example, from the viewpoint of sensitivity, a structure including more unsaturated groups per molecule, typically two or more unsaturated groups, is preferred. From the viewpoint of increasing the strength of a colored cured film, at least trifunctional compounds are preferred. It is also effective to adjust both sensitivity and strength by combining compounds having different numbers of functional groups or different types of polymerizable group (such as acrylic acid ester, methacrylic acid ester, styrene compound or vinyl ether compound). The selection and the use of the polymerizable compound is an important factor also in terms of compatibility with other compounds included in the colored curable composition (such as a photopolymerization initiator, a colorant (pigment) or a binder), or dispersibility. For example, compatibility may be improved by using a compound having a low purity or using two or more kinds of compounds in combination. A specific structure may be selected and used from the viewpoint of improving adhesiveness with respect to a hard surface, such as a support.

The content of the polymerizable compound in the total solid content of the radiation-sensitive colored composition (when two or more kinds of polymerizable compounds are used, the total content thereof) is not particularly limited, and is preferably from 0.1 to 90% by mass, more preferably from 1.0 to 80% by mass, particularly preferably from 2.0 to 70% by mass, with respect to the total solids of the color-sensitive radiation composition.

<(F) Polymerization Initiator>

The radiation-sensitive colored composition of the present invention may contain a polymerization initiator.

(F) The polymerization initiator in the present invention may be the following polymerization initiator known as a photopolymerization initiator.

Any photopolymerization initiator may be used without particular limitation in the present invention so long as it is capable of initiating polymerization of the polymerizable compound and may be appropriately selected from well-known photopolymerization initiators. For example, those having photosensitivity to light in the region from ultraviolet to visible are preferred. Also, the initiator may be an activator capable of causing a certain action with the photoexcited sensitizer to produce an active radical or an initiator capable of initiating cationic polymerization according to the kind of the monomer.

Also, the photopolymerization initiator preferably contains at least one component having a molecular extinction coefficient of at least about 50 in the range of about 300 to about 800 nm (more preferably 330 to 500 nm).

Examples of (F) the photopolymerization initiator of the present invention include halogenated hydrocarbon derivatives (for example, a halogenated hydrocarbon compound having a triazine skeleton and a halogenated hydrocarbon compound having an oxadiazole skeleton), acylphosphine compounds such as acylphosphine oxide, hexaarylbiimidazole, oxime compounds such as oxime derivatives, organic peroxides, thio compounds, ketone compounds, aromatic onium salts, ketoxime ethers, aminoacetophenone compounds, hydroxyacetophenone and the like. Of these, an oxime compound is preferred.

Examples of the halogenated hydrocarbon compound having a triazine skeleton include compounds described in Wakabayashi et al., Bull. Chem. Soc. Japan, 42, 2924 (1969), compounds described in British Patent 1388492, compounds described in JP-53-133428A, compounds described in German Patent 3337024, compounds described in F. C. Schaefer et al., J. Org. Chem., 29, 1527 (1964), compounds described in JP-A-62-58241, compounds described in JP-5-281728A, compounds described in JP-5-34920A, and compounds described in U.S. Pat. No. 4,212,976.

The compounds described in U.S. Pat. No. 4,212,976 include, for example, a compound having an oxadiazole skeleton (e.g., 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-buthoxystyryl)-1,3,4-oxadiazole, 2-tribromomethyl-5-styryl-1,3,4-oxadiazole).

Examples of the radical polymerization initiator other than those described above include acridine derivatives (e.g., 9-phenylacridine, 1,7-bis(9,9'-acridinyl)heptane), N-phenylglycine, polyhalogen compounds (e.g., carbon tetrabromide, phenyl tribromomethyl sulfone, phenyl trichloromethyl ketone), coumarins (e.g., 3-(2-benzofuroyl)-7-diethylaminocoumarin, 3-(2-benzothroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazole-2-ylcoumarin, coumarin compounds described in JP-A-5-19475, JP-A-7-271028, JPA-2002-363206, JP-A-2002-363207, JP-A-2002-363208 and JP-A-2002-363209), acylphosphine oxides (e.g., bis(2,4,6-trimethylbenzoyl)-phenylphosphine oxide, bis(2,6-dimethoxybenzoyl)-2,4,4-trimethyl-pentylphenylphosphine oxide, Lucirin TPO), metallocenes (e.g., bis($\eta$5-2,4-chyclopentadien-1-yl)-bis(2,6-difluoro-3-(1H-pyrrol-1-yl)-phenyl)titanium, $\eta$5-cyclopentadienyl-$\eta$6-cumenyl-iron(1+)-hexafluorophosphate (1−)), and compounds described in JP-53-133428A, JP-57-1819B (the term "JP-B" as used herein means an "examined Japanese patent publication"), JP-57-6096B, and U.S. Pat. No. 3,615,455.

Examples of the ketone compounds include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acids and tetramethyl esters thereof, 4,4'-bis(dialkylamino)benzophenones (e.g., 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone, 4-dimethylaminoacetophenone, benzil, anthraquinone, 2-tert-butylanthraquinone, 2-methylanthraquinone, phenanthraquinone, xanthone, thioxanthone, 2-chloro-thioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, benzoin ethers (e.g., benzoin methyl ether, benzoin ethyl ether, benzoin propyl ether, benzoin isopropyl ether, benzoin phenyl ether, benzyl dimethyl ketal), acridone, chloroacridone, N-methylacridone, N-butylacridone, and N-butyl-chloroacridone.

The polymerization initiator is preferably a hydroxyacetophenone compound, an aminoacetophenone compound, and an oxime compound. More specifically, for example, an aminoacetophenone-based initiator described in JP-10-291969A, an acylphosphine oxide-based initiator described in Japanese Patent 4225898 may be also used.

Aminoacetophenone-based initiators described in JP-10-291969A and acylphosphine-based initiators described in JP Patent No. 4225898 may be also used.

As the aminoacetophenone-based initiators, commercial products IRGACURE-907, IRGACURE-369 and IRGACURE-379 (trade names, all manufactured by BASF Japan) may be used. As the aminoacetophenone-based initiator, the compound described in JP-2009-191179A, in which an absorption wavelength is matched to a light source with a long wavelength such as 365 nm or 405 nm may be also used. As the acylphosphine-based initiator, commercial products IRGACURE-819 and DAROCUR-TPO (trade names, both produced by BASF Japan) may be used.

The polymerization initiators are more preferably oxime compounds. Specific examples of oxime compounds include compounds described in JP-2001-233842A, compounds described in JP-2000-80068A, and compounds described in JP-2006-342166A.

Examples of the oxime compound such as an oxime derivative, which is suitably used as the photopolymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound include compounds described in J. C. S. Perkin II, pp. 1653-1660 (1979), J. C. S. Perkin II, pp. 156-162 (1979), Journal of Photopolymer Science and Technology, pp. 202-232 (1995), JP-2000-66385A, JP-2000-80068A, JP-T-2004-534797 (the term "JP-T" as used herein means a published Japanese translation of a PCT patent application), and JP-2006-342166A.

As the commercial product, IRGACURE-OXE01 (produced by BASF Japan) and IRGACURE-OXE02 (produced by BASF Japan) may be also suitably used.

Further examples of useful oxime compounds include compounds in which oxime is linked to N of carbazole, described in Japanese Patent No. 2009-519904, compounds described in U.S. Pat. No. 7,626,957 in which a hetero substituent group is incorporated into a benzophenone moiety, compounds described in JP-2010-15025A in which a nitro group is incorporated into a dye moiety and ketooxime compounds described in US Patent Publication No. 2009-292039 and WO 2009-131189, compounds described in U.S. Pat. No. 7,556,910 in which a triazine skeleton and an oxime skeleton are present in one molecule, compounds described in JP-2009-221114A having a maximum absorption of 405 nm and thus superior sensitivity to a g-ray light source.

Furthermore, cyclic oxime compounds described in JP-2007-231000A and JP-2007-322744A may be also suitably used. Of cyclic oxime compounds, cyclic oxime compounds described in JP-2010-32985A and JP-2010-185072A in which a condensed ring is incorporated into a carbazole dye are particularly preferred from viewpoint of realizing high light absorbency and high sensitivity.

Also, compounds described in JP-2009-242469A in which an unsaturated bond is present in a specific moiety of an oxime compound also regenerate active radicals from polymer inactive radicals and are thus suitable for use in order to realize high sensitivity.

Most preferably, oxime compounds having a specific substituent group described in JP-2007-269779A or oxime compounds having a thioaryl group described in JP-2009-191061A may be used.

Specifically, the oxime compound is preferably a compound represented by the following formula (OX-1). Incidentally, the oxime compound may be an oxime compound where the N—O bond of the oxime bond is an (E) form, an oxime compound where the bond is a (Z) form, or a mixture of a (E) form and a (Z) form.

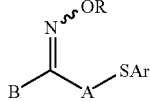 (OX-1)

(In formula (OX-1), each of R and B independently represents a monovalent substituent, A represents a divalent organic group, and Ar represents an aryl group.)

In formula (OX-1), the monovalent substituent represented by R is preferably a monovalent nonmetallic atomic group.

Examples of the monovalent nonmetallic atomic group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. The substituent may be further substituted with another substituent.

Examples of the substituent include a halogen atom, an aryloxy group, an alkoxycarbonyl group, an aryloxycarbonyl group, an acyloxy group, an acyl group, an alkyl group and an aryl group.

The alkyl group which may have a substituent is preferably an alkyl group having a carbon number of 1 to 30, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having a carbon number of 6 to 30, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-, m- or p-tolyl group, a xylyl group, an o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having a carbon number of 2 to 20, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and 4-methoxyphenyloxycarbonyl group.

The heterocyclic group which may have a substituent is preferably an aromatic or aliphatic heterocyclic ring containing a nitrogen atom, an oxygen atom, a sulfur atom or a phosphorus atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolidinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthryl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

In formula (OX-1), the monovalent substituent represented by B is an aryl group, a heterocyclic group, an arylcarbonyl group, or a heterocyclic carbonyl group. These groups may have one or more substituents. Examples of the substituent include the substituents described above. Also, the above-described substituent may be further substituted with another substituent.

Above all, the structures shown below are preferred.

In the structures, Y, X and n have the same meanings as Y, X and n in Formula (OX-2) described later, and preferred examples are also the same.

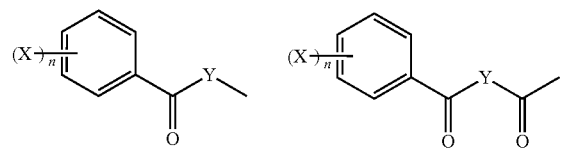

In formula (OX-1), the divalent organic group represented by A include an alkylene group having 1 to 12 carbon atoms, a cyclohexylene group, and an alkynylene group. These groups may have one or more substituents. Examples of the substituent include the substituents described above. Also, the above-described substituents may be further substituted with another substituent.

Above all, from the viewpoint of increasing the sensitivity and suppressing the coloration by heating or with aging, A represented by formula (OX-1) is preferably an unsubstituted alkylene group, an alkyl group (e.g. a methyl group, an ethyl group, a tert-butyl group, a dodecyl group)-substituted alkylene group, an alkenyl group (e.g. vinyl group, allyl group)-substituted alkylene group, or an aryl group (e.g. phenyl group, p-tolyl group, xylyl group, cumenyl group, naphthyl group, anthryl group, phenanthryl group, styryl group)-substituted alkylene group.

In formula (OX-1), the aryl group represented by Ar is preferably an aryl group having 6 to 30 carbon atoms and may have a substituent. Examples of the substituent are the same as those of the substituent introduced into a substituted aryl group described as a specific example of the aryl group which may have a substituent. Among these, from the viewpoint of increasing the sensitivity and suppressing the coloration by heating or aging, a substituted or unsubstituted phenyl group is preferred.

In formula (OX-1), in view of sensitivity, the structure of "SAr" formed by Ar and S adjacent thereto in formula (OX-1) is preferably a structure shown below. Me represents a methyl group, and Et represents an ethyl group.

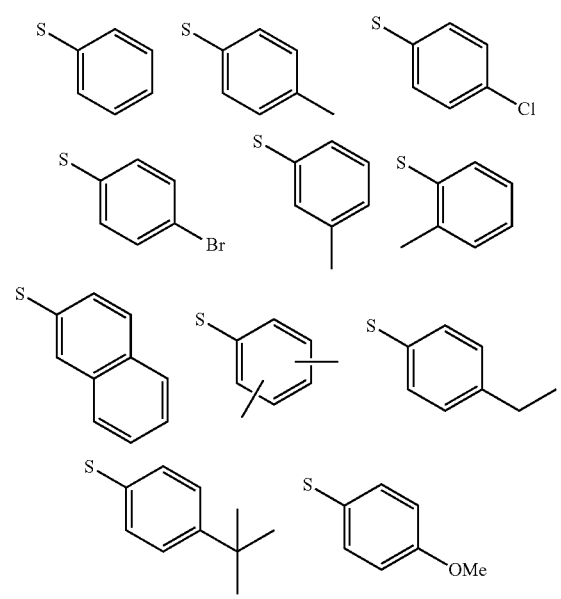

-continued

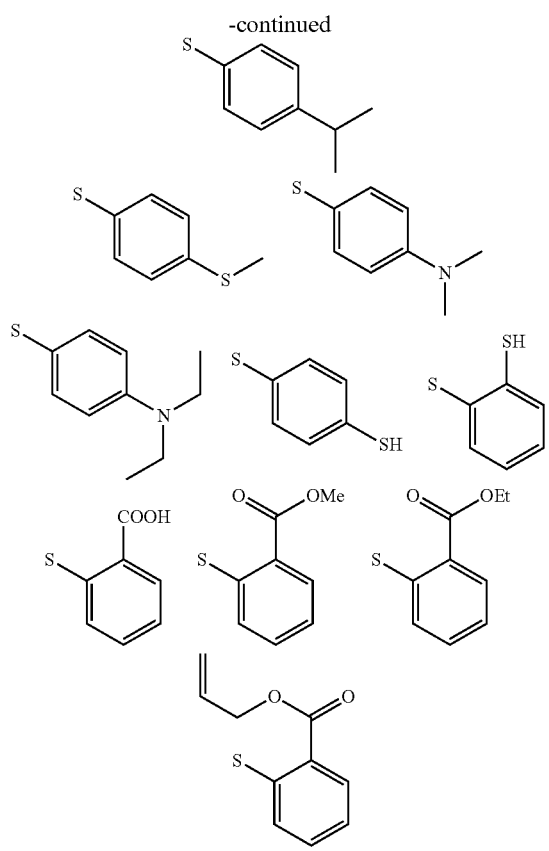

The oxime compound is preferably a compound represented by the following formula (OX-2):

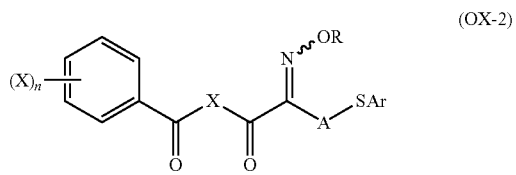

(OX-2)

(In formula (OX-2), R and X each independently represent a monovalent substituent group, A and Y each independently represent a bivalent organic group, Ar represents an aryl group and n represents an integer of 0 to 5.)

In formula (OX-2), R, A, and Ar have the same meanings as R, A, and Ar in formula (OX-1) and preferred examples are also the same.

The monovalent substituent represented by X in formula (OX-2) includes an alkyl group, an aryl group, an alkoxy group, an aryloxy group, an acyloxy group, an acyl group, an alkoxycarbonyl group, an amino group, a heterocyclic group, and a halogen atom. These groups may have one or more substituents. Examples of the substituent include the substituents described above. The above-described substituents may be further substituted with another substituent.

Among these, in formula (OX-2), X is preferably an alkyl group from the viewpoint of enhancing solvent solubility and absorption efficiency in the long wavelength region.

Also, in formula (2), n represents an integer of 0 to 5 and is preferably an integer of 0 to 2.

In formula (OX-2), the divalent organic group represented by Y includes the structures shown below. In the groups shown below, "*" indicates the bonding position to the carbon atom adjacent to Y in formula (OX-2).

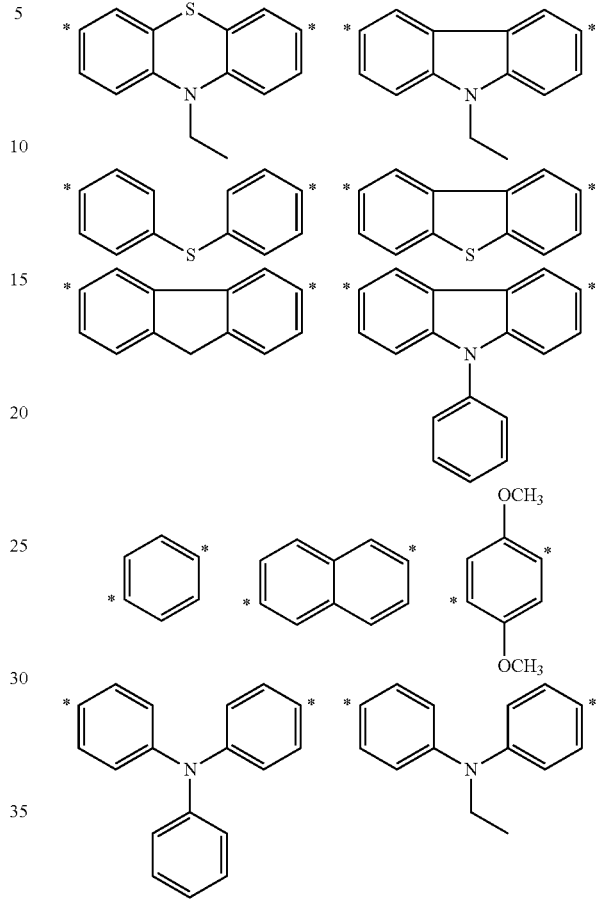

Of the examples of the photopolymerization initiator, the structures shown below are preferred from the viewpoint of increasing the sensitivity.

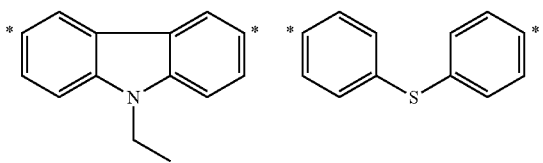

Furthermore, the oxime compound is preferably a compound represented by the following formula (OX-3):

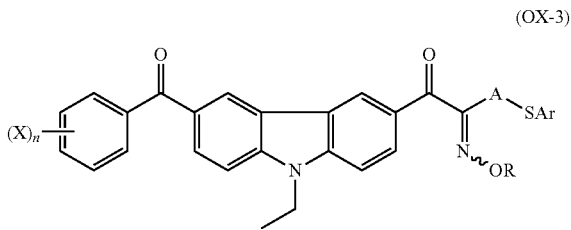

(OX-3)

(In formula (OX-3), R and X each independently represent a monovalent substituent group, A represents a bivalent organic group, Ar represents an aryl group and n is an integer of 0 to 5.)

In formula (OX-3), R, X, A, Ar and n have the same meanings as R, X, A, Ar and n in formula (OX-2), and preferred examples are also the same.

Hereinafter, specific examples of the oxime compound which are suitably used are illustrated below, but the present invention is not limited thereto.

(C-4)
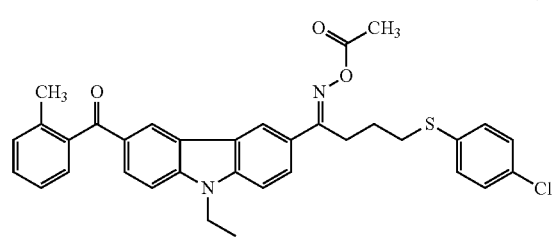

(C-9)
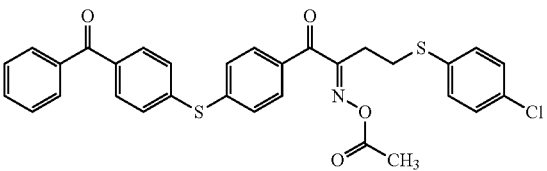

(C-10)
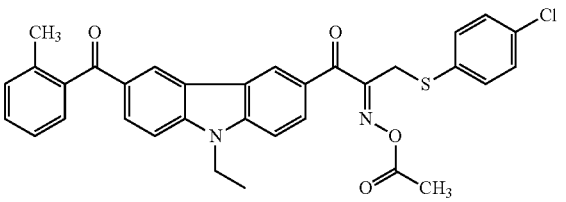

(C-5)
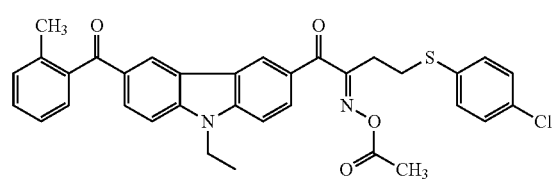

(C-11)
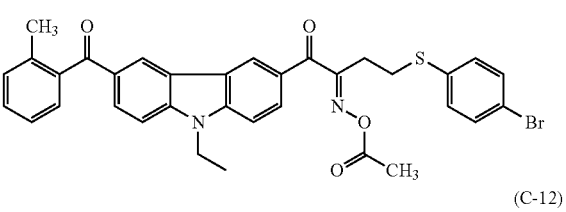

(C-6)
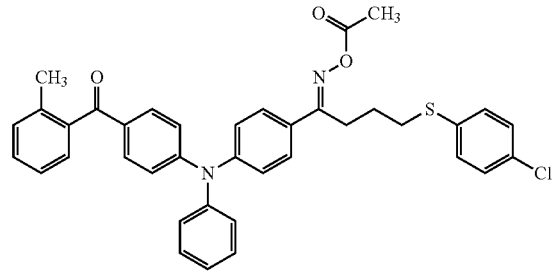

(C-12)
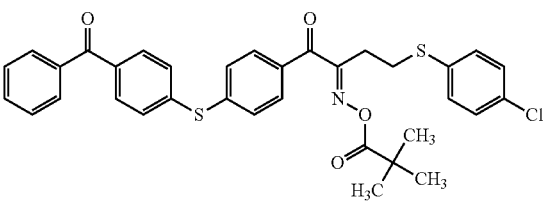

(C-7)
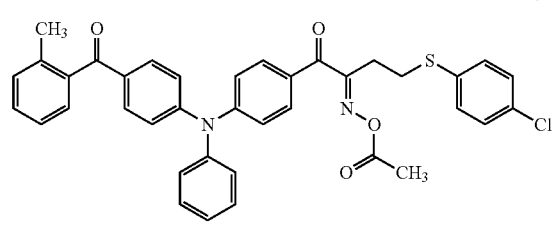

(C-13)
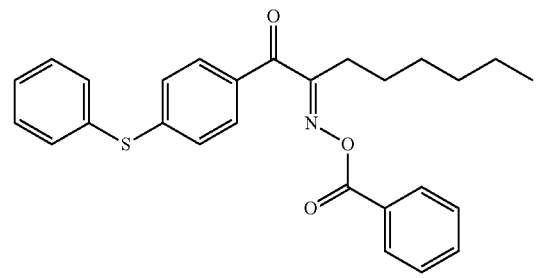

(C-8)
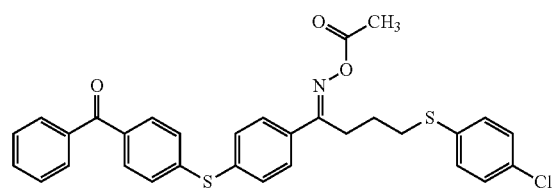

(C-14)

The oxime compound is a compound having a maximum absorption wavelength in the wavelength region of 350 to 500 nm, preferably a compound having an absorption wavelength in the wavelength region of 360 to 480 nm, more preferably a compound having high absorbance at 365 nm and 455 nm.

In view of sensitivity, the molar extinction coefficient at 365 nm or 405 nm of the oxime compound is preferably from 1,000 to 300,000, more preferably 2,000 to 300,000, still more preferably from 5,000 to 200,000.

The molar extinction coefficient of the compound may be measured by a known method but is preferably measured, for example, by using, specifically, an ultraviolet-visible spectrophotometer (Cary-5 spectrophotometer manufactured by Varian) with an ethyl acetate solvent at a concentration of 0.01 g/L.

The polymerization initiator used in the present invention may be used in combination of two or more types.

From the viewpoint of exposure sensitivity, (F) the polymerization initiator used for the radiation-sensitive colored composition of the present invention is preferably a compound selected from the group consisting of trihalomethyltriazine compounds, benzyl dimethyl ketal compounds, α-hydroxy ketone compounds, α-aminoketone compounds, acylphosphine compounds, phosphine oxide compounds, metallocene compounds, oxime compounds, triarylimidazole dimers, onium compounds, benzothiazole compounds, benzophenone compounds, acetophenone compounds and derivatives thereof, cyclopentadienebenzene iron complexes and salts thereof, halomethyloxadiazole compounds, 3-aryl-substituted coumarin compounds.

(F) the polymerization initiator is more preferably, a trihalomethyltriazine compound, an α-aminoketone compound, an acylphosphine compound, a phosphine oxide compound, an oxime compound, a triarylimidazole dimer, an onium compound, a benzophenone compound, an acetophenone compound, and is most preferably a compound selected from the group consisting of trihalomethyltriazine compounds, α-aminoketone compounds, oxime compounds, triarylimidazole dimers, and benzophenone compounds.

In particular, when the radiation-sensitive colored composition of the present invention is used for production of a color filter for solid-state imaging devices, fine patterns should be formed in a sharp shape. For this reason, curability and development without leaving residues on non-exposed regions are important. From this viewpoint, an oxime compound is particularly preferably used as a polymerization initiator. In particular, when fine patterns are formed in solid-state imaging devices, a stepper is used for exposure for curing, but the stepper may be damaged by halogens and it is necessary to make the amount of polymerization initiator low. Under these circumstances, an oxime compound is most preferably used as (F) the polymerization initiator for formation of fine patterns such as solid-state imaging devices.

The content of (F) polymerization initiator in the radiation-sensitive colored composition of the present invention is preferably 0.1% by mass to 50% by mass, more preferably 0.5% by mass to 20% by mass, even more preferably 1% by mass to 15% by mass, with respect to the total contents of the color-sensitive radiation composition. Within this range, superior sensitivity and pattern formability can be obtained.

<Other Components>

The colored composition of the present invention may optionally contain well-known various additives such as surfactants, antioxidants, pH adjustors and anti-aggregation agents.

[Various Additives]

The radiation-sensitive colored composition of the present invention may be optionally mixed with various additives such as fillers, the aforementioned polymer compounds, adherence enhancing agents, antioxidants, UV absorbers, anti-aggregation agents and the like. For example, additives described in paragraphs 0274 to 0276 of 2008-292970 may be used.

Specific examples of the additives include fillers such as glass and alumina; polymer compounds other than the binder resins such as polyvinyl alcohol, polyacrylic acid, polyethylene glycol monoalkyl ether and polyfluoroalkyl acrylate; adherence enhancing agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; antioxidants such as 2,2-thiobis(4-methyl-6-t-butylphenol) and 2,6-di-t-butylphenol; ultraviolet-absorbents such as 2-(3-t-butyl-5-methyl-2-hydroxydiphenyl)-5-chlorobenzothiazole and alkoxybenzophenone; and anti-aggregation agents such as sodium polyacrylate.

Organic carboxylic acids, preferably low molecular weight organic, carboxylic acids with a molecular weight of 1000 or less may be added for enhancing the alkali solubility of non-exposed regions and the development ability of the radiation-sensitive colored composition of the present invention.

Examples of the organic carboxylic acid include aliphatic monocarboxylic acids such as formic acid, acetic acid, propionic acid, butyric acid, valeric acid, pivalic acid, caproic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acid such as tricarballylic acid, aconitic acid and camphoronic acid; aromatic monocarboxylic acids such as benzoic acid, toluic acid, cuminic acid, hemelitic acid and mesitylenic acid; aromatic polycarboxylic acids such as phthalic acid, isophthalic acid, terephthalic acid, trimellitic acid, trimesic acid, mellophanic acid and pyromellitic acid; and other carboxylic acids such as phenylacetic acid, hydroatropic acid, hydrocinnamic acid, mandelic acid, phenylsuccinic acid, atropic acid, cinnamic acid, methylcinnamic acid, benzylcinnamic acid, cinnamilydenic acetic acid, cumalic acid and umbelic acid.

[Surfactants]

From the viewpoint of further enhancing the coatability, various surfactants may be added to the photosensitive composition of the present invention. As the surfactant, various surfactants such as a fluorine-containing surfactant, a non-ionic surfactant, a cationic surfactant, an anionic surfactant and a silicone-containing surfactant may be used.

In particular, when the photosensitive composition of the present invention contains a fluorine-containing surfactant, the liquid characteristics (especially, fluidity) of a coating solution prepared is more enhanced, so that the coating thickness uniformity or the liquid saving can be more improved.

That is, in the case of forming a film by using a coating solution to which a radiation-sensitive colored composition containing a fluorine-containing surfactant is applied, the interface tension between the coating surface and the coating solution is reduced, whereby wettability to the coating surface is improved and the coatability on the coating surface is enhanced. This is effective in that even when a thin film of about several μm is formed with a small liquid volume, a film having a uniform thickness with little thickness unevenness can be more suitably performed.

The content of fluorine in the fluorine-containing surfactant is preferably from 3 to 40% by mass, more preferably from 5 to 30% by mass, still more preferably from 7 to 25% by mass. The fluorine-containing surfactant having a fluorine content in the range above is effective in view of coating film uniformity of the coated film and liquid saving and also has good solubility in the color-sensitive radiation composition.

Examples of fluorine surfactants include Megafack-F171, -F172, -F173, -F176, -F177, -F141, -F142, -F143, -F144, -R30, -F437, -F475, -F479, -F482, -F554, -F780, -F781 (all manufactured by Dainippon Ink and Chemicals, Incorporated), Florado FC430, -FC431, -FC171 (manufactured by Sumitomo 3M Limited), Surflon S-382, -SC-101, -SC-103, -SC-104, -SC-105, -SC1068, -SC-381, -SC-383, -S393, -KH-40 (all manufactured by Asahi Glass Co., Ltd) and the like.

Specific examples of the nonionic surfactant include polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester (such as Pluronic L10, L31, L61, L62, 10R5, 17R2, 25R2, Tetronic 304, 701, 704, 901, 904 and 150R1, all manufactured by BASF), Solsperse 20000 (manufactured by Lubrizol Japan Ltd.) and the like.

Specific examples of the cationic surfactant include phthalocyanine derivatives (trade name: EFKA-745, manufactured by Morishita & Co., Ltd.), organosiloxane polymer KP341 (trade name, manufactured by Shin-Etsu Chemical Co., Ltd.), (meth)acrylic (co)polymers POLYFLOW No. 75, No. 90 and No. 95 (trade name, manufactured by Kyoeisha Chemical Co., Ltd.), and W001 (trade name, available from Yusho Co., Ltd.)

Specific examples of the anionic surfactant include W004, W005, and W017 (all trade names, available from Yusho Co., Ltd.).

Examples of the silicone surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, TORAY SILICONE SH8400 (all trade names, manufactured by Toray Silicone Co., Ltd.), TSF-4440, TSF-4300, TSF-4445, TSF-444(4)(5)(6)(7)6, TSF-4460, TSF-4452 (all trade names, manufactured by Momentive Performance Materials Inc.), KP341 (trade name, manufactured by Shin-Etsu Silicone Co., Ltd.), and BYK323, BYK330 (all trade names, manufactured by BYK Chemie).

The surfactants may be used alone or in a combination of two or more kinds thereof.

The content of surfactants is preferably 0.001% by mass to 10% by mass, more preferably 0.01% by mass to 5% by mass with respect to the total content of the color-sensitive radiation composition.

[Polymerization Inhibitor]

The radiation-sensitive colored composition of the present invention preferably contains a small amount of polymerization inhibitor in order to prevent unnecessary thermal polymerization of the polymerizable compound during preparation or storage.

Examples of the polymerization inhibitor that can be used in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene bis(4-methyl-6-t-butylphenol), and an N-nitrosophenylhydroxyamine cerium (I) salt.

The amount of the polymerization inhibitor is preferably from about 0.005% by mass to about 5% by mass with respect to the total mass of the composition.

The radiation-sensitive colored composition of the present invention may be optionally mixed with various additives such as fillers, the aforementioned polymer compounds, adherence enhancing agents, antioxidants, UV absorbers, anti-aggregation agents and the like. For example, additives described in paragraphs 0274 to 0276 of 2008-292970 may be used.

-Method for Preparing Color-sensitive Radiation Composition-

The radiation-sensitive colored composition of the present invention may be prepared by simultaneously mixing the aforementioned respective components, or dissolving respective components in a solvent and then mixing the same in order. Also, addition order or operation conditions during mixing are not particularly limited. For example, all of the components may be dissolved in a solvent in a single step to prepare a color-sensitive radiation composition, or each of the components may be prepared as two or more solutions such that these solutions are mixed to prepare the composition when it is used (applied).

The thus prepared radiation-sensitive colored composition may be subjected to filtration before it is used, with a filter having a pore diameter of preferably from 0.01 µm to 3.0 µm, and more preferably a pore diameter of from 0.05 µm to 0.5 µm.

The radiation-sensitive colored composition of the present invention is suitably used in the formation of colored pixels of color filters or the like for liquid crystal displays (LCDs) or solid-state image sensors (for example, CCD or CMOS), printing inks, inkjet inks or paints. In particular, the composition is suitably used in the formation of color filters for solid-state image sensors such as CCD and CMOS.

The radiation-sensitive colored composition of the present invention is particularly suitable for formation of color filters for solid-state imaging devices in which micro-size color patterns are formed on a thin film and superior rectangular cross-section profiles are required.

The color filter of the present invention may be used for liquid crystal display apparatuses or solid-state image sensors and are suitable for liquid crystal display apparatus application. The color filter of the present invention contains a dye polymer having a metal complex dye structure with superior spectral characteristics and heat resistance as a coloring agent, but inhibits occurrence of color unevenness caused by the coloring agent. For this reason, by using the color filter of the present invention, liquid crystal display apparatuses that exhibit superior color tones of displayed images and thus excellent display characteristics.

<Liquid Crystal Display Apparatus>

The color filter of the present invention is suitable as a color filter for liquid crystal display apparatuses, since it can inhibit occurrence of color unevenness and has color pixels with superior light resistance. The liquid crystal display apparatus including the color filter has superior color tone of display image, thereby displaying high-quality images with superior display properties.

The definition of a display device and the explanation of each display device are described, for example, in "Electronic Display Devices (Akio Sasaki, Kogyo Chosakai Publishing Co., Ltd., 1990)", "Display Devices (Sumiaki Ibuki, Sangyo Tosho Publishing Co., Ltd., 1989)" and the like.

Liquid crystal display apparatuses are described, for example, in "Next Generation Liquid Crystal Display Techniques (Tatsuo Uchida, Kogyo Chosakai Publishing Co., Ltd., 1994)". The liquid crystal display apparatus to which the present invention may be applied is not particularly limited, and the present invention may be applied to various liquid crystal display apparatuses described, for example, in "Next Generation Liquid Crystal Display Techniques".

The color filter of the present invention is particularly effectively used in a color TFT liquid crystal display apparatus. Color TFT liquid crystal display apparatuses are described, for example, in "Color TFT Liquid Crystal Display (Kyoritsu Shuppan Co., Ltd., 1996)".

Further, the present invention may be applied to a liquid crystal display apparatus with a wider view angle such as an in-plane switching (IPS) system or a multi-domain vertical alignment (MVA) system, or STN, TN, VA, OCS, FFS, R-OCB and the like.

The color filter of the present invention may also be applied to a COA (Color-filter On Array) system, which has high, brightness and high definition. In the COA type liquid crystal display apparatus, the color filter layer needs to satisfy the properties required for an interlayer dielectric film, such as a low dielectric constant and a resistance to a removing liquid, in addition to the ordinary requirements as mentioned above. It is thought that the transmissivity of the color filter with respect to an ultraviolet laser used as an exposure light can be increased by selecting the method of performing exposure or selecting the color or the film thickness of the colored pixels. As a result, curability of the colored pixels is improved and the colored pixels can be formed without chipping, peeling or unevenness, thereby improving the resistance to a removing liquid of the colored layer provided directly or indirectly on the TFT substrate. For these reasons, the color filter of the present invention is useful for a COA type liquid crystal display apparatus. In order to achieve a low dielectric constant, a resin coating may be provided on the color filter layer.

In the colored layer formed by the COA system, in order to electrically connect the ITO electrode disposed on the colored layer with the terminal of a driving substrate disposed under the colored layer, an electrically-conducting path such as a rectangular through hole having a side length of about 1 µm to 15 µm or a U-shaped depressed area needs to be formed. The size (i.e., the side length) of the electrically-conducting path is preferably 5 µm or less, and an electrically-conducting path having a size of 5 µm or less can be formed according to the present invention. These image display systems are described, for example, on page 43 of "EL, PDP, LCD Display—Latest Trends of Technology and Markets (Research Study Division of Toray Research Center, Inc., 2001)" and the like.

The liquid crystal display apparatus of the present invention includes, in addition to the color filter of the present invention, various kinds of other members such as an electrode substrate, a polarization film, a phase difference film, a back light, a spacer, and a view angle compensation film. The color filter of the present invention can be applied to a liquid crystal display apparatus including these known members. Details of these members are described, for example, in "'94 Market of Liquid Crystal Display Related Materials And Chemicals (Kentaro Shima, CMC Publishing Co., Ltd., 1994)" and "2003 Current State And Perspective Of Liquid Crystal Related Market (second volume, Ryokichi Omote, Fuji Chimera Research Institute, Inc., 2003)".

Back lights are described, for example, in SID meeting Digest 1380 (2005) (A. Konno et al) and Monthly Display, 2005 December, pages 18-24 (Hiroyasu Shima) and pages 25-30 (Takaaki Yagi).

When the color filter of the present invention is used in a liquid crystal display apparatus, a high contrast may be obtained when combined with a known three-wavelength cold-cathode tube. However, when combined with an LED light source of red, green and blue is used as a back light, a liquid crystal display apparatus that exhibits high brightness, high color purity, and excellent color reproducibility can be achieved.

[Color Filter for Solid-state Imaging Devices and Method for Producing the Same]

The method for producing a color filter for solid-state imaging devices of the present invention includes applying the radiation-sensitive colored composition of the present invention to a support to form a radiation-sensitive colored composition layer (hereinafter, this process will be referred to as a "radiation-sensitive colored composition layer forming process") and exposing the radiation-sensitive colored composition layer through a mask (hereinafter, this process will be referred to as an "exposing process") and developing the radiation-sensitive colored composition layer after exposure to form a color pattern (hereinafter, this will be also referred to as a "color pixel") (hereinafter, this process will be also referred to as a "developing process").

Also, the color filter for solid-state imaging devices of the present invention is produced in accordance with the method for producing a color filter for solid-state imaging devices.

The color filter for solid-state imaging devices of the present invention may at least have a color pattern produced in accordance with the method for producing a color filter for solid-state imaging devices. A specific form of the color filter for solid-state imaging devices of the present invention is for example preferably a multi-color filter in which the color pattern is combined with other color pattern other than (for example, color filter with three or more colors having at least having a red pattern, a blue pattern and a green pattern).

Hereinafter, the color filter for solid-state imaging devices may be simply referred to as a "color filter".

<Process for Forming Radiation-sensitive Colored Composition Layer>

In the process for forming a radiation-sensitive colored composition layer, the radiation-sensitive colored composition of the present invention is applied to a support to form a radiation-sensitive colored composition layer.

The support that can be use for this process may for example be a substrate for solid-state imaging device provided with an imaging device (light-receiving device) such as charge coupled device (CCD) or complementary metal-oxide semiconductor (CMOS) on a substrate (for example, silicone substrate).

The color pattern of the present invention may be provided on the surface (front surface) on which an imaging device is formed or the surface (back surface) on which an imaging device is not formed of the substrate for solid-state imaging devices.

In the substrate for solid-state imaging devices, a light-shielding film may be provided between respective imaging devices or the back surface of substrate for solid-state imaging devices.

Also, a primer layer may be provided on the support, if desired, to improve adhesion with an upper layer, prevent diffusion of materials or planarize the surface.

The application of colored curable composition of the present invention to the support may be carried out using various applications methods such as slit application, an ink-jet method, rotation application, casting application, roll coating, and screen printing.

The colored curable composition layer preferably has a film thickness of 0.1 µM to 10 µm, more preferably 0.2 µm to 5 µm, even more preferably, 0.2 µm to 3 µm.

The drying of the colored curable composition applied to the support may be carried out at a temperature of 50° C. to 140° C. for 10 seconds to 300 seconds.

<Exposing Process>

In the exposing process, the radiation-sensitive colored composition layer formed in the process for forming the radiation-sensitive colored composition layer is pattern-exposed through a mask having a predetermined mask pattern using an exposure apparatus such as a stepper exposure apparatus.

Radiation ray (light) that can be used for exposure is particularly preferably ultraviolet light such as g-rays and i-rays (particularly preferably i-rays). The irradiation amount (exposed amount) is preferably 30 to 1500 mJ/cm$^2$, more preferably 50 to 1000 mJ/cm$^2$, even more preferably, 80 to 500 mJ/cm$^2$.

<Developing Process>

Substantially, the colored curable composition layer of a region in which light is not irradiated during the exposure process is eluted into an alkali aqueous solution through alkali development treatment and only a photocured region remains.

A developing solution is preferably an organic alkali developing solution that does not cause damage to imaging devices or circuits present underneath. A developing temperature is commonly 20° C. to 30° C., a developing time is generally 20 seconds to 90 seconds. In order to further remove residues, the developing may be carried out for 120 seconds to 180 seconds. Also, in order to improve a residue removal property, a process for removing the developing solution at every 60 seconds and providing a new developing solution may be repeated several times.

Examples of the alkalifying agent used for the developing solution include organic alkaline compounds such as ammonia water, ethylamine, diethylamine, dimethylethanolamine, tetramethylammonium hydroxide, tetramethylammonium hydroxide, choline, pyrrole, piperidine, 1,8-diazabicyclo[5,4,0]-7-undecene and an alkaline aqueous solution in which the alkalifying agent is diluted with pure water at a concentration of 0.001 to 10% by mass, preferably 0.01 to 1% by mass is preferably used as a developing solution.

In addition, the developing solution may be use an inorganic alkali, and examples of preferred inorganic alkali include sodium hydroxide, potassium hydroxide, sodium carbonate, sodium silicate, and sodium metasilicate.

In addition, when a developing solution prepared from such an aqueous alkali solution is used, washing (rinsing) with water is performed after the development.

Then, heating (post-baking) may be carried out after drying. When a multi-colored color pattern is formed, a cured film can be formed by repeating the aforementioned process for respective colors in order. As a result, a color filter can be obtained.

The post-baking is heating treatment after development in order to complete curing and is commonly carried out by heat-curing treatment at 100° C. to 240° C., preferably 200° C. to 240° C.

The developed film may be subjected to such a post-bake treatment using a hot plate or convection oven (air circulation drier), or a heater such as high-frequency heater in a continuous or batch manner.

In addition, the production method of the present invention may include, in addition to the processes, processes well-known as a method for producing a color filter for solid-state imaging device. For example, the method may optionally include, after the aforementioned colored curable composition layer forming process, an exposing process and a developing process, curing the formed color pattern by heating and/or exposing.

Also, when the colored curable composition of the present invention is used, for example, clogging of a nozzle at the discharge port of the coating apparatus, or a piping part of the coating apparatus, or contamination of the colored curable composition or pigment in the coating apparatus by adhesion, precipitation or drying may occur. For this reason, in order to efficiently remove the contaminants caused by the colored curable composition, the solvent composed of components described above is preferably used as the washing solution. Also, washing solutions described, for example, in JP-7-128867A, JP-7-146562A, JP-8-278637A, JP-2000-273370A, JP-2006-85140A, JP-2006-291191A, JP-2007-2101A, JP-2007-2102A and JP-2007-281523A may be also suitably used as the washing solution for removal by washing of the colored curable composition of the present invention.

As for the washing solution, an alkylene glycol monoalkyl ether carboxylate or an alkylene glycol monoalkyl ether is preferably used.

One of these solvents usable as the washing solution may be used alone, or two or more thereof may be mixed and used.

In the case of mixing two or more solvents, a mixed solvent obtained by mixing a solvent having a hydroxyl group and a solvent not having a hydroxyl group is preferred. The mass ratio of the solvent having a hydroxyl group to the solvent not having a hydroxyl group is from 1/99 to 99/1, preferably from 10/90 to 90/10, more preferably from 20/80 to 80/20. In particular, the mixed solvent is preferably a mixed solvent of propylene glycol monomethyl ether acetate (PGMEA) and propylene glycol monomethyl ether (PGME) in a ratio of 60/40. Incidentally, for enhancing permeability of the washing solution to the photosensitive composition, a surfactant described above as the surfactant which can be contained in the photosensitive composition may be added to the washing solution.

The color filter for solid-state imaging devices of the present invention uses the radiation-sensitive colored composition of the present invention, thus reducing peeling defects and residue defects and exhibiting superior heat resistance of color patterns. Also, by forming color filter using the azo pigment represented by formula (1), red spectral characteristics are superior.

The color filter for solid-state imaging devices of the present invention are suitably used for solid-state imaging devices such as CCDs and CMOSs and are particularly suitable for CCDs or CMOSs with a high-resolution higher than a million pixels. The color filter for solid-state imaging devices of the present invention may be for example used as a color filter that is disposed between a light-receiving portion of respective pixels constituting CCDs or CMOSs and a microlens to trap light.

In the color filter for solid-state imaging devices, a color pattern (colored pixel) preferably has a film thickness of 2.0 μm or less, more preferably 1.0 μm or less.

Also, the color pattern (colored pixel) has a size (pattern, width) of 2.5 μm or less, more preferably 2.0 μm or less, particularly preferably 1.7 μm or less.

[Solid-state Imaging Device]

The solid-state imaging device of the present invention includes the color filter for solid-state imaging devices of the present invention. The configuration of the solid-state imaging device of the present invention is not particularly limited so long as the solid-state imaging device includes the color filter for solid-state imaging devices of the present invention and functions as a solid-state imaging device. For example, the following configuration will be given.

The solid-state imaging device includes a plurality of photodiodes and a transmit electrode composed of poly silicone constituting a light-receiving area of solid-state imaging devices (such as CCD image sensors and CMOS image sensors) provided on a support, a light-shielding film made of tungsten, in which only a light-receiving portion of photodiodes opens, provided on the photodiodes and the transmit electrode, a device-protective film made of nitride silicone on the light-shielding film such that the device-protective film covers the entire surface of the light-shielding film and the light-receiving portion of photodiodes, and the color filter for solid-state imaging devices of the present invention provided on the device protective film.

Also, the solid-state imaging device may include a light-trapping portion (such as microlens, hereinafter, the same) on the device protective layer or under the color filter (the side near to the support), or a light-trapping portion on the color filter.

EXAMPLES

Hereinafter, the present invention will be described with reference to examples in more detail, but the present invention is not limited to the following example within the scope of the present invention. In addition, "parts" is based on weight, unless specifically otherwise mentioned.

Synthesis Example 1

Synthesis of Dye Polymer I

The following raw material A was synthesized based on Liebigs Annalen der Chemie, (1990), #8 p. 741-744.

A solution of the obtained raw material A (30.6 g), glycidyl methacylate (14.2 g), p-methoxyphenol (1.24 g), and, tetrabutylammonium bromide (3.22 g) in 200 g of N-methyl-2-pyrrolidone (hereinafter, referred to as NMP) was prepared and stirred under heating at 100° C. for 5 hours.

Then, 1 L of ethyl acetate and 1 L of 1N HCl hydrochloric acid solution were added thereto, the mixture was stirred, an organic layer was separated and then concentrated to obtain 35 g of an intermediate B having the following structure.

A solution of the obtained intermediate B (10 g), methacrylic acid (1.53 g), octyl thioglycolate (chain-transfer agent: LogP value 3.00, 1.64 g), and dimethyl 2,2'-azobis(2-methylpropionate) ("V-601" manufactured by Wako Pure Chemical Industries, Ltd.)) (0.92 g) in 16.9 g of propylene glycol monomethyl ether acetate (hereinafter, referred to as PGMEA) was added dropwise to 10 g of PGMEA at 85° C. for 3 hours under a nitrogen atmosphere and further stirred at 85° C. for 2 hours. Then, the resulting reaction solution was added dropwise to a solution of 200 mL of methanol and 25 mL of water under stirring. The precipitated powder was dried under reduced pressure to obtain 9 g of a dye polymer I. The resulting dye polymer 1 had a weight average molecular weight (Mw) of 10000 and an acid value of 80 mg KOH/g. The scheme was as follows.

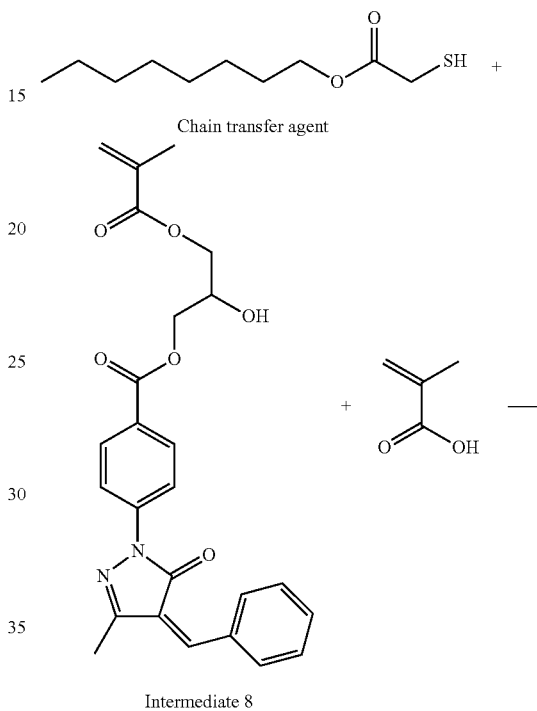

Intermediate 8

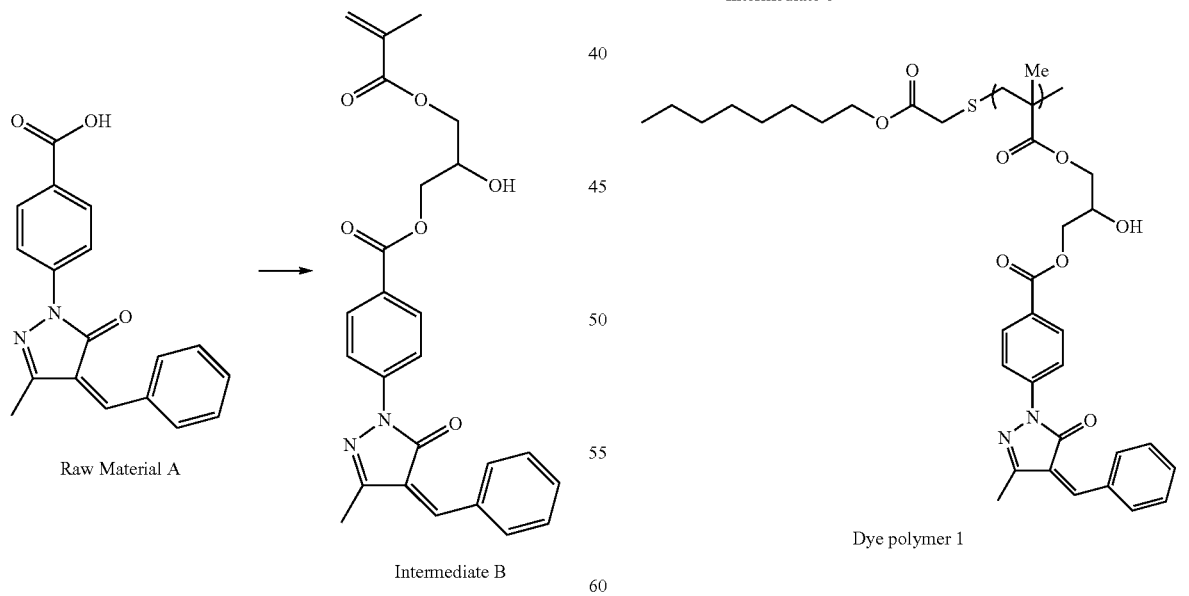

Dye polymer 1

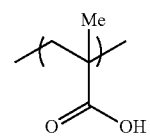

Synthesis Example 2 to 8

Synthesis of Dye Polymer II, III, IV, V, IX, X and XI

Dye polymer II, III, IV, V, IX, X, and XI having the following structure were synthesized in the same manner as in Synthesis of dye polymer I except that the chain-transfer agent added to the intermediate B was changed as follows:

Dye polymer II (chain-transfer agent ethyl thioglycolate: LogP value 0.42)

Dye polymer III (chain-transfer agent: 2-mercaptoethanol: LogP value 0.04)

Dye polymer IV (chain-transfer agent: the following compound: LogP value 4.14)

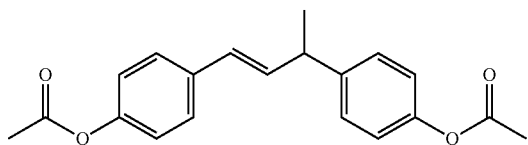 [SMILES: CC(=O)Oc1ccc(/C=C/C(C)c2ccc(OC(C)=O)cc2)cc1]

Dye polymer V (chain-transfer agent: 1-hexanethiol: LogP value 2.63)

Dye polymer IX (chain-transfer agent: 1-dodecanethiol: LogP value 5.14)

Dye polymer X (chain-transfer agent: 1-octadecanethiol: LogP value 7.64)

Dye polymer XI (chain-transfer agent: octadecyl thioglycolate: LogP value 7.17)

Synthesis Example 9

Synthesis of Dye Polymer VIII

A solution of M-53 (the following structure: 7.0 g), methacrylic acid (0.45 g), octyl thioglycolate (0.17 g), dimethyl-2,2'-azobis(2-methylpropionate) (0.096 g) in 12.2 g of PGMEA was added dropwise to 5.21 g of PGMEA heated at 80° C. under stirring for 4 hours. After dropwise addition, the reaction solution was further stirred for 2 hours at 80° C. Then, a solution of dimethyl 2,2'-azobis(2-methylpropionate) (0.029 g) and octyl thioglycolate (0.051 g) in 0.35 g of PGMEA was added thereto, followed by further stirring at 80° C. for 2 hours. A reaction solution obtained by adding 175 ml of PGMEA and 200 ml of methanol 200 ml to the stirred solution was added dropwise to 800 ml of acetonitrile under stirring. The precipitated crystals were filtered and the resulting crystals were dried under reduced pressure to obtain 3.99 g of P1 (the following structure).

The resulting P1 had a weight average molecular weight (Mw) of 7000 and an acid value of 185 mg KOH/g. The fact that the product has the structure of P1 was confirmed from loss of peaks of 5.53 and 6.11 in the polymerizable group moiety of M-53 through $^1$H-NMR and incorporation of methacrylic acid through measurement of an acid value.

A solution of P1 (5.0 g) and glycidyl methacylate (0.47 g), p-methoxyphenol (5.5 mg) in 31.0 g of PGMEA was heated under stirring at 100° C. for 5 hours. The resulting solution was added dropwise to 350 ml of acetonitrile under stirring. The precipitated crystals were filtered and the resulting crystals were dried under reduced pressure to obtain 3.59 g of a dye polymer VIII.

The resulting VIII had a weight average molecular weight (Mw) of 8000 and an acid value of 110 mg KOH/g. The fact that the product has the structure of VIII was confirmed from loss of peaks in the epoxy moiety of glycidyl methacylate through $^1$H-NMR and decrease in acid value of glycidyl methacylate through measurement of an acid value. The scheme was as follows.

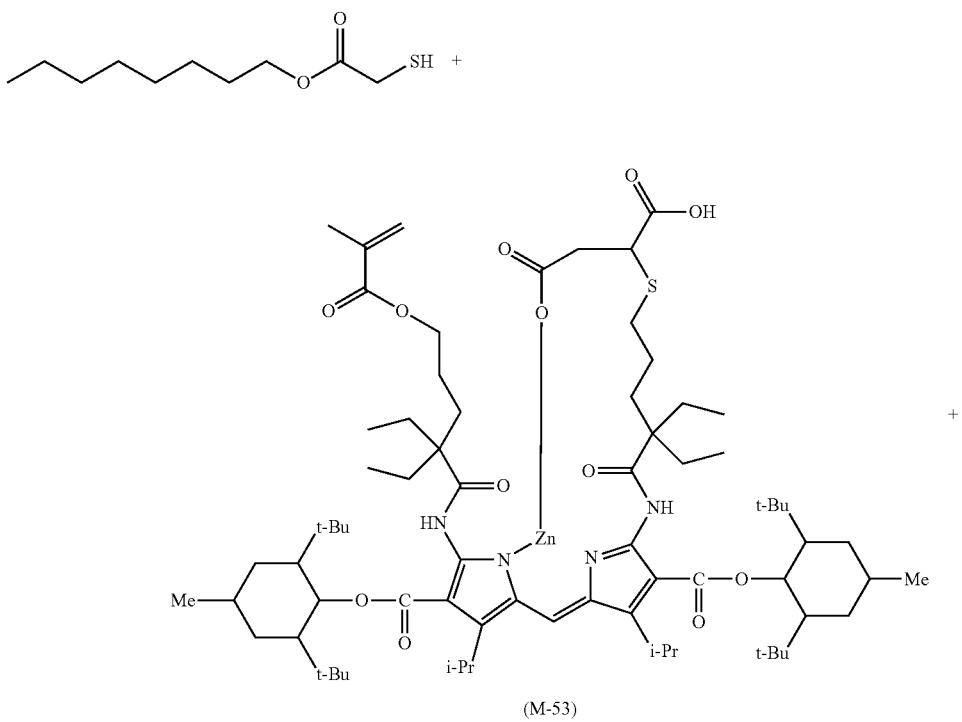

(M-53)

-continued
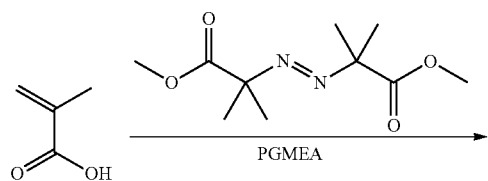
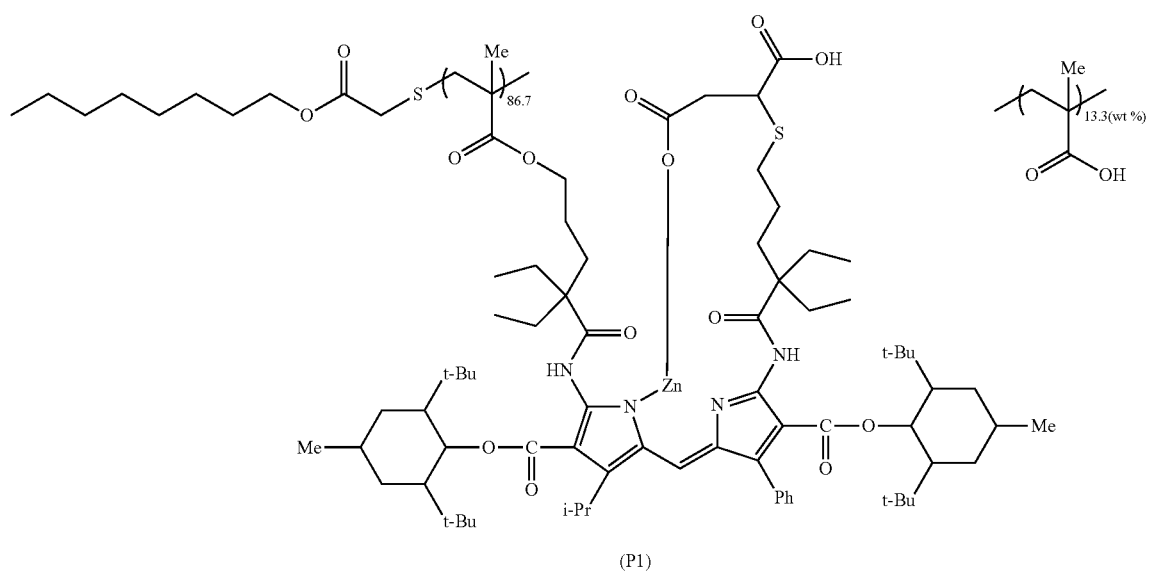
(P1)
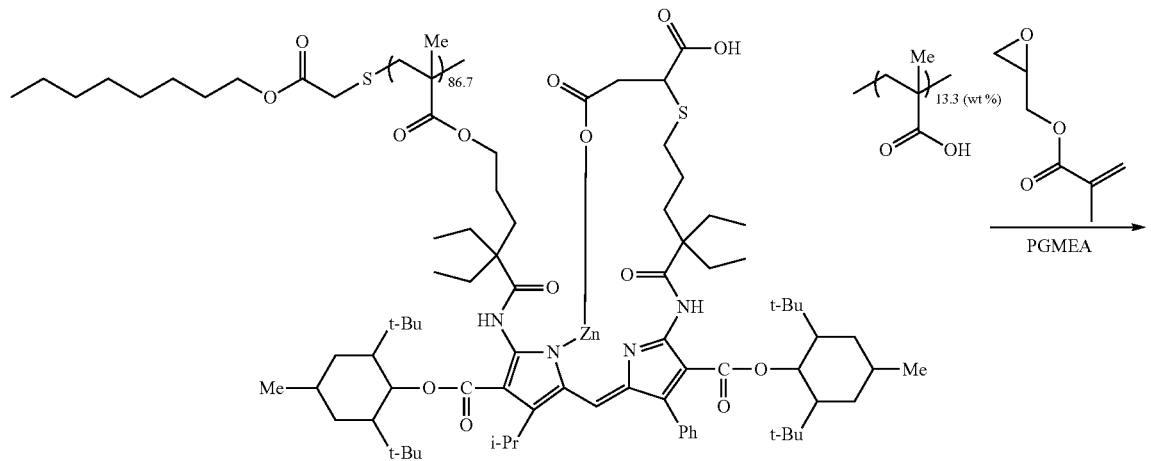
(P1)

-continued
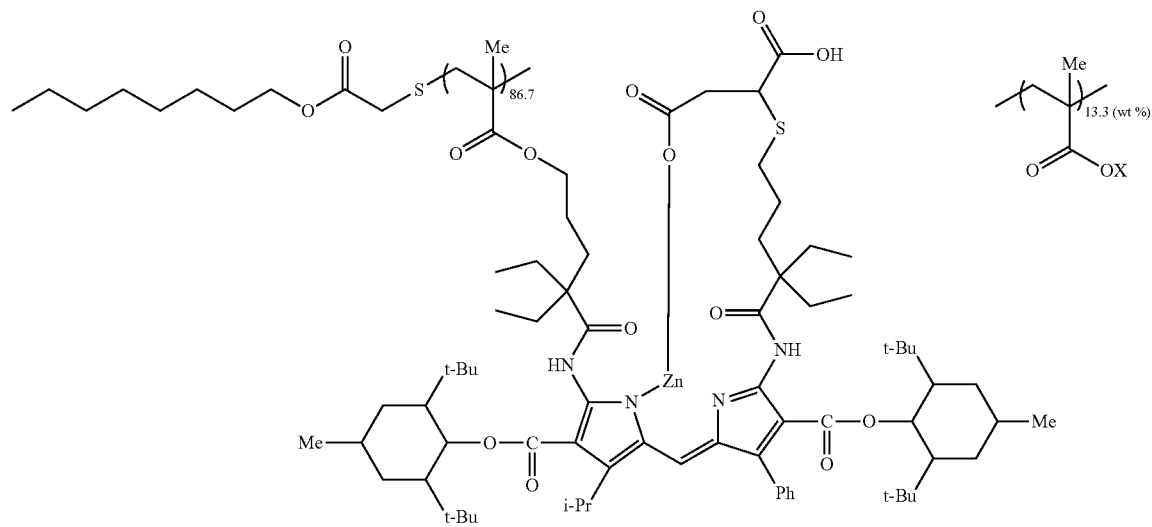
(VI.II)
X = H or
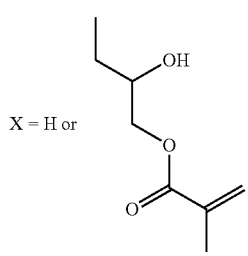
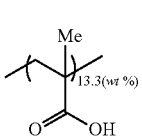
(II)
Mw 8000
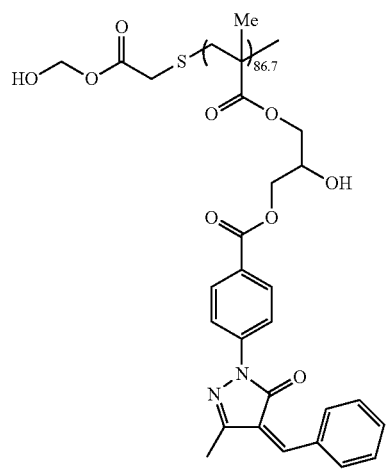
(III)
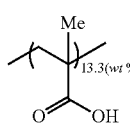
Mw 7000

(IV)
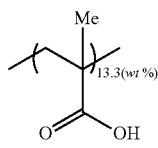
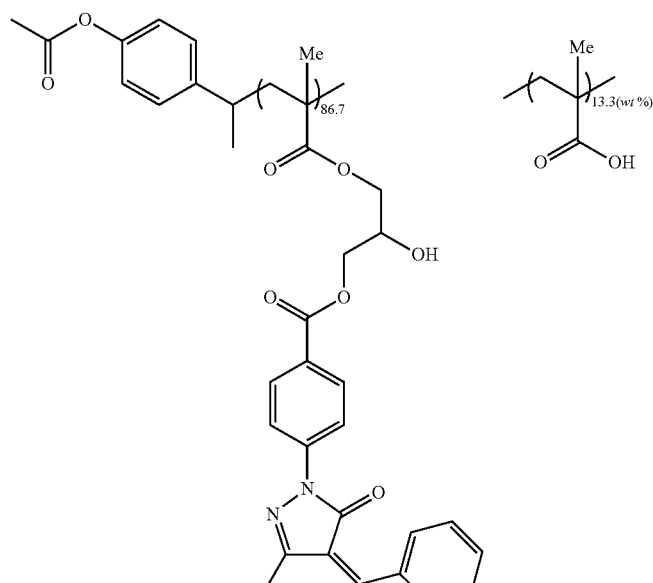
Mw 9000
(V)
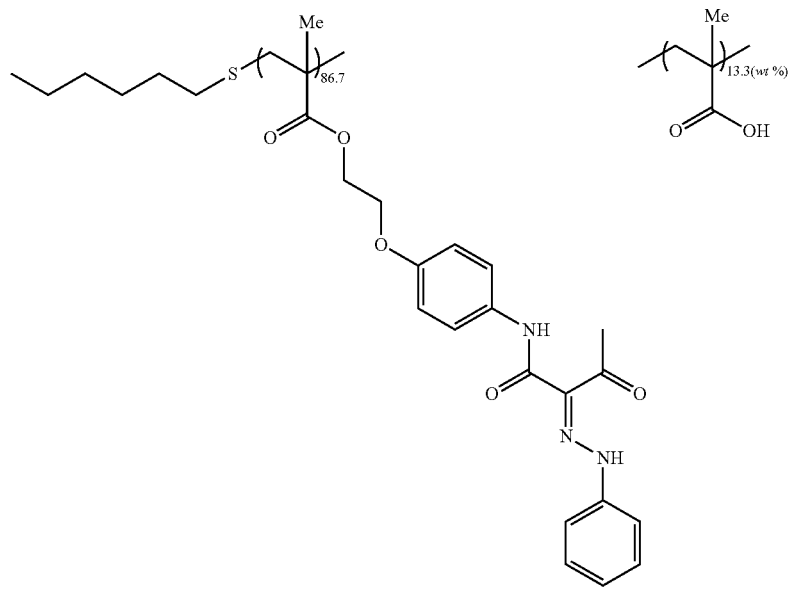
Mw 7000

-continued
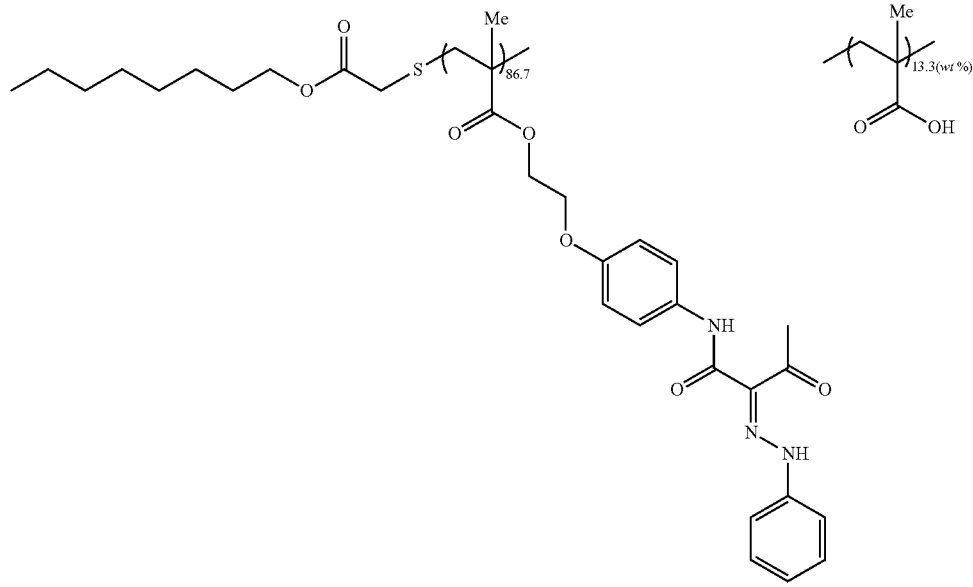
(VI)
Mw 5000
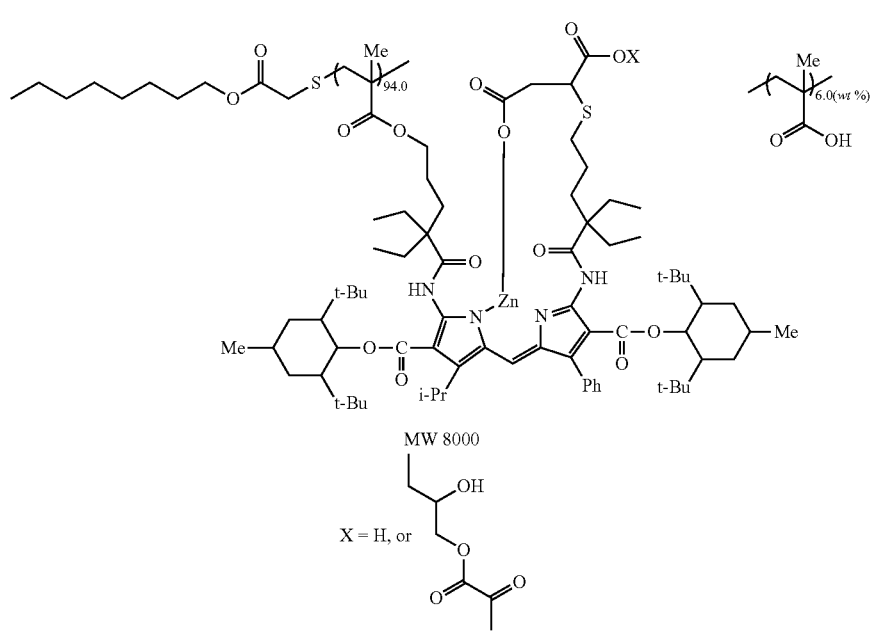
(VIII)
MW 8000
X = H, or 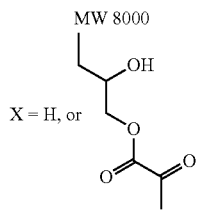

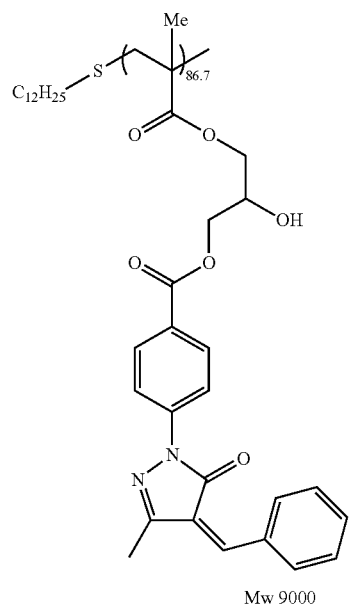

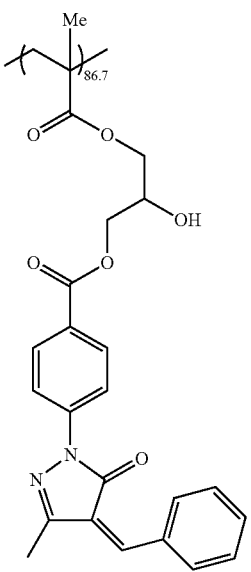

(IX) Mw 9000

(X) Mw 11000

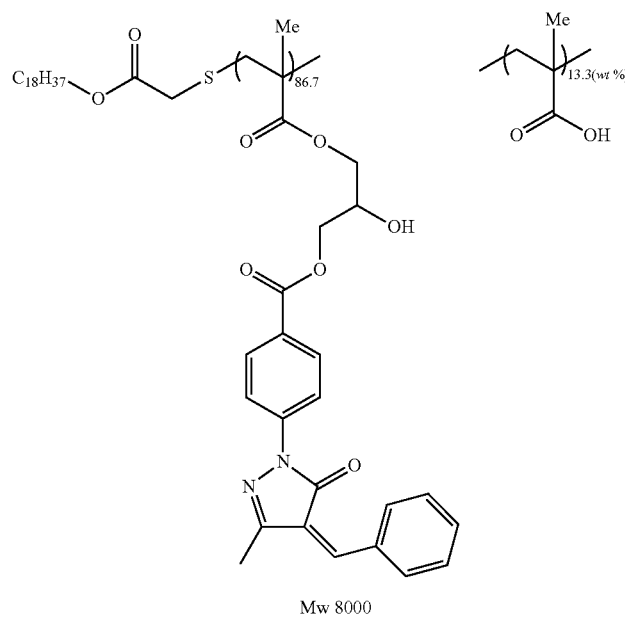

(XI) Mw 8000

Synthesis Example 10 to 15

Synthesis of Dye Polymers XII, XIII, XIV, XV, XVI and XVII

Dye polymers XII, XIII, XIV, XV, XVI and XVII having the following structure were synthesized in the same manner as in Synthesis of dye polymer I except that octyl thioglycolate (LogP: 3.00) was used as the added chain-transfer agent and the following monomers were used as dye monomers for synthesis.

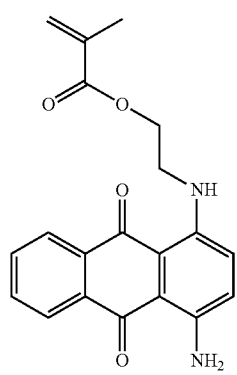
Dye polymer XII
raw material monomer
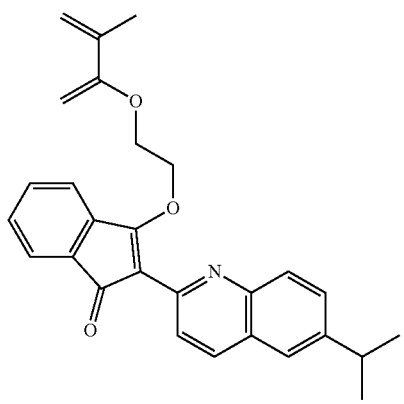
Dye polymer XIII
raw material monomer
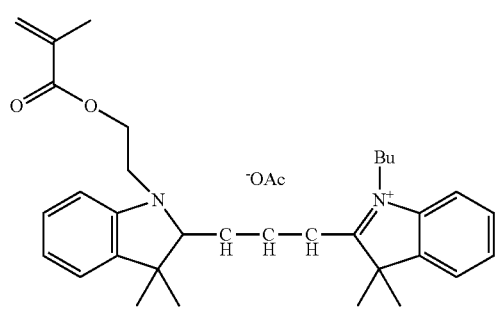
Dye polymer XIV
raw material monomer
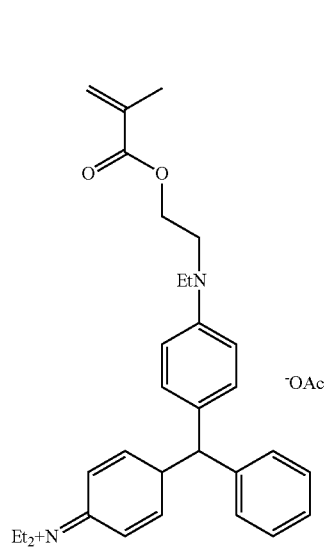
Dye polymer XV
raw material monomer
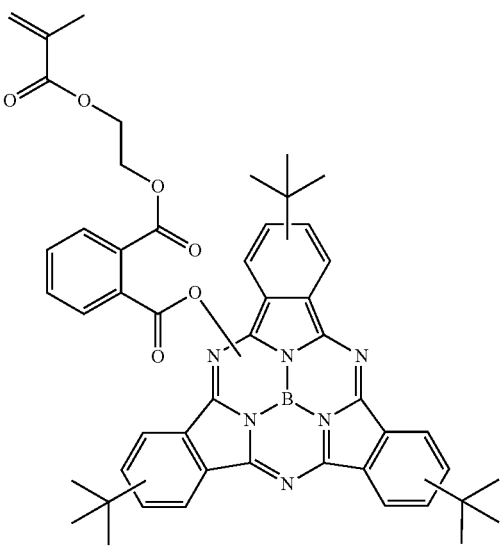
Dye polymer XVI
raw material monomer -continued
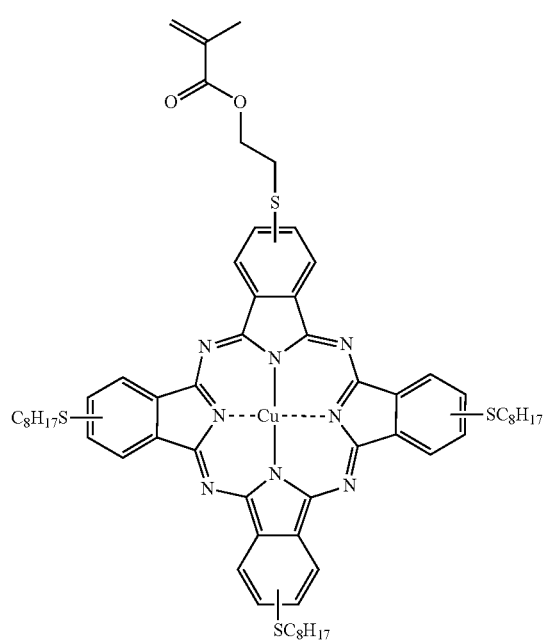
Dye polymer XVII
raw material monomer
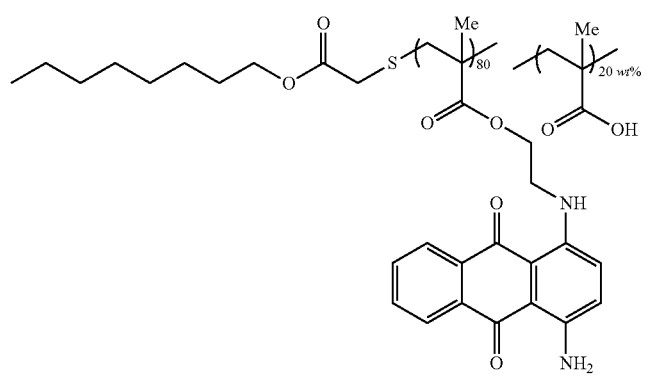
Dye polymer XII Mw 6000
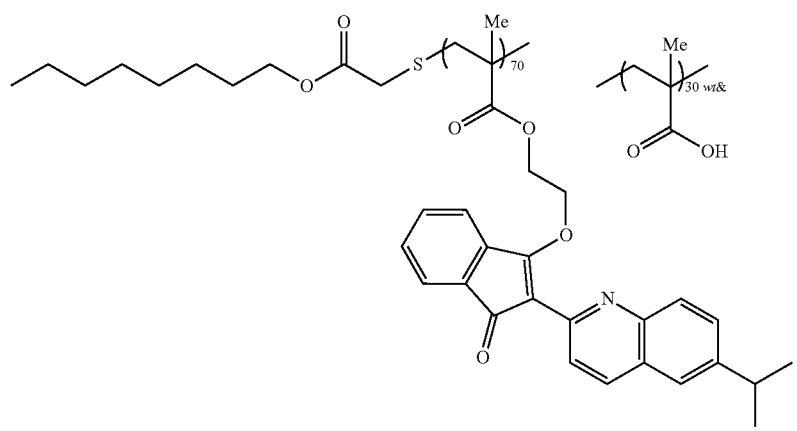
Dye polymer XIII Mw 7000
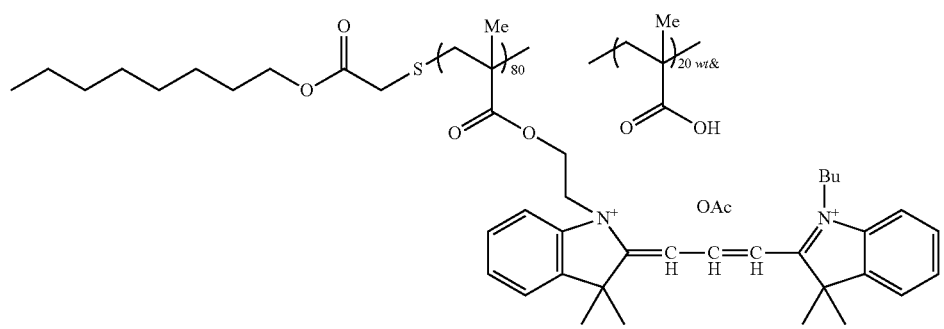
Dye polymer XIV Mw 7000

-continued
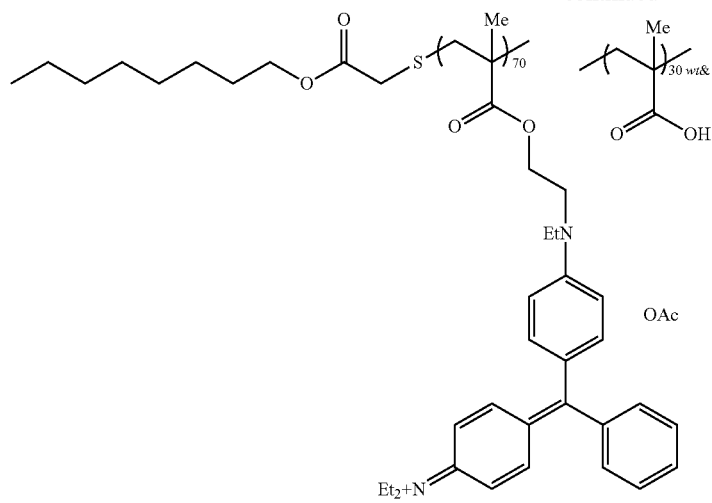
Dye polymer XV Mw 6000
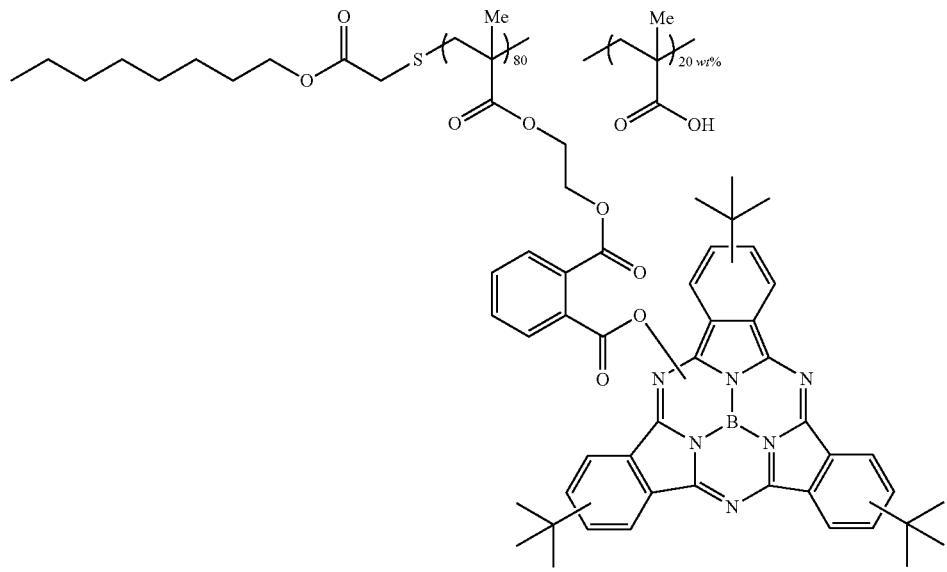
Dye polymer XVI Mw 9000

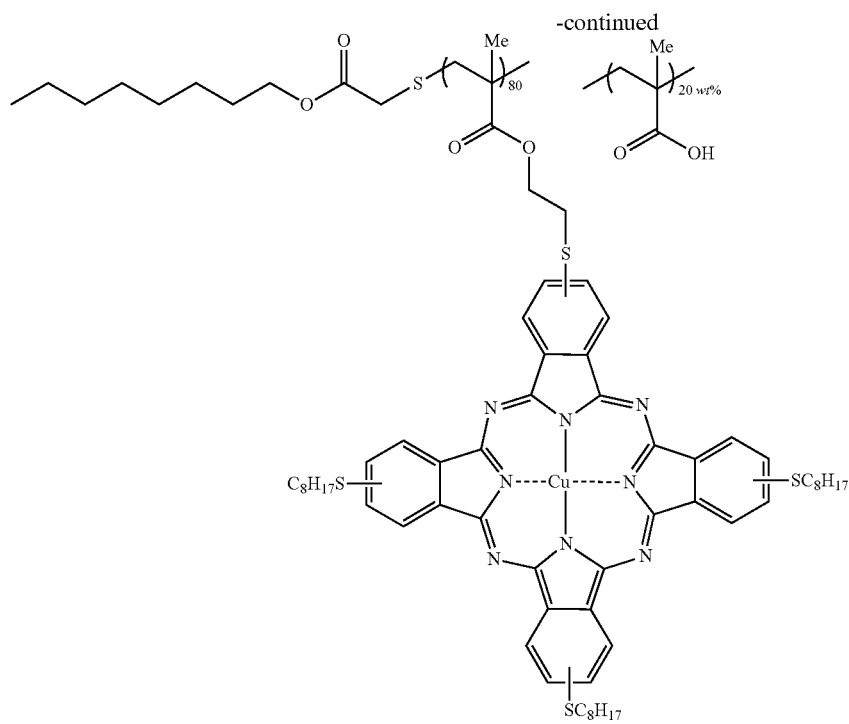

Dye polymer XVII Mw 10000

(Synthesis of Pigment Dispersant)
<Synthesis of Resin 1>

600.0 g of ∈-caprolactone and 22.8 g of 2-ethyl-1-hexanone were added to a 500 mL three-neck flask, stirred and dissolved while purging nitrogen, 0.1 g of monobutyl tin oxide was added thereto, the mixture was heated at 100° C., followed by stirring for 8 hours. Loss of raw material was confirmed by gas chromatography and the solution was cooled to 80° C. 0.1 g of 2,6-di-t-butyl-4-methylphenol was added to the cooled reaction solution, and 27.2 g of 2-methacryloyloxyethyl isocyanate was further added thereto, followed by stirring for 5 hours. Loss of raw material was confirmed by $^1$H-NMR and the solution was cooled to room temperature to obtain 200 g of a precursor M1 in the form of a solid. The fact that the precursor had a structure of M1 was confirmed by $^1$H-NMR, IR, and mass spectrometry.

50.0 g of a precursor M1, 50.0 g of NK ester CB-1 (manufactured by Shin-Nakamura Chemical Co, Ltd.), 2.3 g of dodecylmercaptan and 233.3 g of PGMEA were added to three-neck flask containing nitrogen, stirred with a stirrer (manufactured by Shinto Scientific Co., Ltd): three-one motor) and heated while purging nitrogen to the flask to elevate the temperature to 75° C. 0.2 g of dimethyl 2,2'-azobis (2-methylpropionate) ("V-601" manufactured by Wako Pure Chemical Industries, Ltd.) was added thereto, followed by stirring at 75° C. for 2 hours. After 2 hours, 0.2 g of V-601 was further added thereto, followed by heating under stirring for 3 hours to obtain a 30% solution of a resin 1 having the following structure.

<Synthesis of Resins 2 to 4>
The following resins 2 to 4 were synthesized in the same manner as in the synthesis of the resin 1.

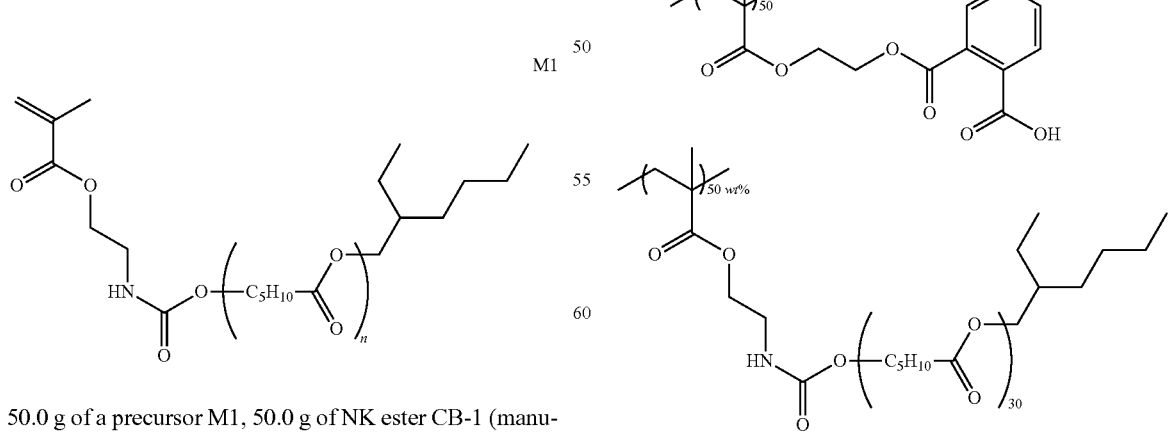

-continued

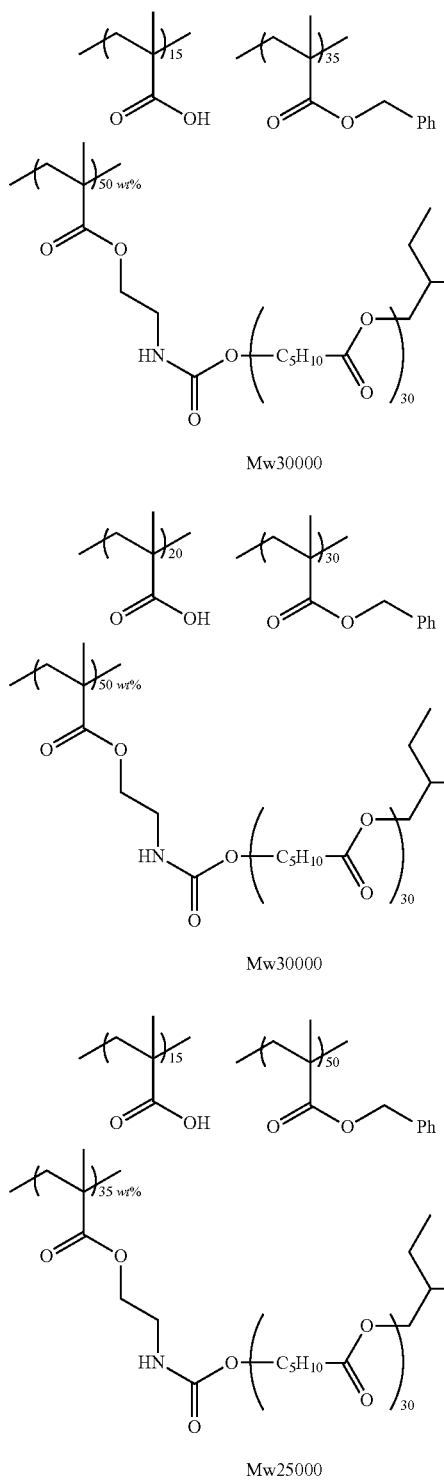

Resin 2

Mw30000

Resin 3

Mw30000

Resin 4

Mw25000

<Adjustment of Pigment-dispersed Composition>

(Pigment-dispersed Composition 1)

The following components having a composition (1) were mixed by stirring at 3,000 r.p.m. for 3 hours using a homogenizer to prepare a mixed solution containing a pigment.

[Composition (1)]

| | |
|---|---|
| Pigment Blue 15:6 | 95 parts |
| The pigment derivative (I) | 15 parts |
| Dispersant (30% solution of resin 1) | 125 parts |
| PGMEA | 750 parts |

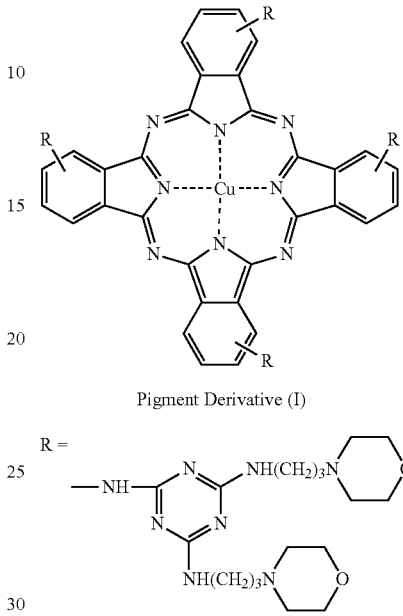

Pigment Derivative (I)

R =

Then, the resulting mixed solution was dispersed in a Dispermat (manufactured by GETZMANN Company) as a bead disperser using 0.3 mmϕ zirconia beads for 6 hours to obtain a pigment dispersion (P-1).

<Preparation of Color-sensitive Radiation Composition>

First, preparation of radiation-sensitive colored composition for forming color filters will be described with reference to examples.

EXAMPLE 1

The following radiation-sensitive colored resin composition R-1 was prepared using the pigment dispersion (P-1) thus obtained.

| | |
|---|---|
| Pigment dispersion (P-1) | 1000 parts |
| KAYARAD DPHA (manufactured by Nippon Kayaku Co., Ltd.) (photopolymerizable compound) | 100 parts |
| 1-Phenyl-1,2-propanedione-2-(o-ethoxycarbonyl) oxime (photopolymerization initiator) | 30 parts |
| Dye polymer I | 100 parts |
| Resin (30% PGMEA solution of methacrylic acid benzyl/methacrylic acid/copolymer (molar ratio = 70/30, weight average molecular weight 30000)) | 10 parts |
| PGMEA (solvent) | 300 parts |

The following components of the composition were mixed and dissolved to prepare a resist solution for a primer layer.

<Composition of Resist Solution for Primer Layers>

| | |
|---|---|
| PGMEA (solvent) | 19.20 parts |
| Ethyl lactate | 36.67 parts |
| Resin (30% PGMEA solution of benzyl methacrylate/methacrylic acid/methacrylic acid-2-hydroxy ethyl copolymer (molar ratio = 70/22/8)) | 30.51 parts |

-continued

| | |
|---|---|
| Ethylenically unsaturated double bond-containing compound (KAYARAD DPHA (manufactured by Nippon Kayaku Co., Ltd.) | 12.20 parts |
| Polymerization Inhibitor (p-methoxyphenol) | 0.0061 parts |
| Fluorine surfactants (F-475, manufactured by DIC) | 1.0 parts |
| Photopolymerization initiator (trihalomethyltriazine-based photopolymerization initiator)(TAZ-107, manufactured by Midori Kagaku Co., Ltd.) | 0.586 parts |

[Production of Primer Layer-provided Silicone Substrate]

A 6-inch silicone wafer was heated in an oven at 200° C. for 30 minutes. Then, the resist solution for primer layers was applied to a dry thickness of 1.5 μm to the silicone wafer, heated and dried in an oven at 220° C. for one hour, to form a primer layer and thereby to obtain a primer layer-provided silicone wafer substrate.

-Formation of Solid-state Imaging Device Color Pattern-

A radiation-sensitive colored resin composition R-1 was applied to the primer layer of the primer layer-provided silicone wafer thus obtained to a colored layer dry thickness of 0.7 μm using a coater/developer having spin coating function (Act-8 manufactured by Tokyo Electron Ltd.

Then, the colored applied substrate was heated (pre-baked) using a 100° C. hot plate for 120 seconds and exposed in an amount of 500 mJ/cm$^2$ at a wavelength of 365 nm, through an island pattern mask having a pattern with four sides of 1.5 μm using an i-ray projection stepper, FPA-3000i5+ (manufactured by Canon Co., Ltd.). Then, the silicone wafer provided with the exposed color layer was loaded on a horizontal rotation table of a spin-shower developer (DW-30-type, manufactured by Chemitronics Co., Ltd.), and was paddle-developed at 23° C. for 60 seconds using a CD-2000 (manufactured by Fujifilm Electronic Materials Co., Ltd.). Then, the developed silicone wafer was fixed on the horizontal rotation table in a vacuum chuck manner. While the silicone wafer was rotating at 50 r.p.m. using a rotation machine, a rinsing treatment by supplying purer water radially from the ejection nozzle above the reaction center, followed by spray-drying were performed to obtain a wafer substrate provided with a colored pixel.

EXAMPLES 2 TO 12, COMPARATIVE EXAMPLES 1 TO 3

A solid-state imaging device color pattern was formed in the same manner as in Example 1 except that the dye polymer and the resin used in Example 1 were changed to those described in the following Table 1.

<Evaluation of Radiation-sensitive Colored Composition> i) Color Unevenness

Evaluation of color unevenness was carried out using a substrate for evaluation formed in the same manner as in the method for forming solid-state imaging device color pattern except that a glass substrate was used instead of the primer layer-provided wafer and exposure was performed without using any mask. Brightness distribution was analyzed in accordance with the following method based on a ratio of a number of pixels in which a deviation from an average brightness is within ±5% to a number of total pixels.

A method for measuring brightness distribution will be described. First, the brightness distribution of a glass substrate adhered to a colored layer was analyzed using images obtained from a microscope MX-50 (manufactured by Olympus Co., Ltd.).

In addition, in brightness distribution, the brightness in which the most pixels are present is defined as an average brightness.

-Evaluation Criteria-

5: a number of pixels in which a deviation from an average brightness is within ±5% is not lower than 99% of total pixels.

4: a number of pixels in which a deviation from an average brightness is within ±5% is not lower than 98% and is lower than 99% of total pixels.

3: a number of pixels in which a deviation from an average brightness is within ±5% is not lower than 97% and is lower than 98% of total pixels.

2: a number of pixels in which a deviation from an average brightness is within ±5% is not lower than 95% and is lower than 97% of total pixels.

1: a number of pixels in which a deviation from an average brightness is within ±5% is lower than 95% total pixels.

ii) Test of Residue (Development Property)

Residues were evaluated by observing the presence of residues in regions where light was not irradiated through the exposure process (non-exposed region) by SEM. The evaluation criteria were as follows.

-Evaluation Criteria-

4: residues were not seen in non-exposed region at all.

3: residues were slightly seen in non-exposed region, which had no practical problem.

2: residues were slightly seen in non-exposed region.

1: residues were remarkably seen in non-exposed region.

TABLE 1

| | Type of chain transfer agent | Log P | Polymer structure | Resin | Color unevenness | Development property |
|---|---|---|---|---|---|---|
| Example 1 | CH$_3$(CH$_2$)$_6$CH$_2$-O-C(=O)-CH$_2$-SH | 3.00 | Dye polymer I | Resin 1 | 3 | 2 |
| Example 2 | CH$_3$CH$_2$-O-C(=O)-CH$_2$-SH | 0.42 | Dye polymer II | Resin 1 | 4 | 3 |
| Example 3 | HO-CH$_2$CH$_2$-SH | 0.04 | Dye polymer III | Resin 1 | 5 | 3 |

TABLE 1-continued

| | Type of chain transfer agent | Log P | Polymer structure | Resin | Color unevenness | Development property |
|---|---|---|---|---|---|---|
| Example 4 | 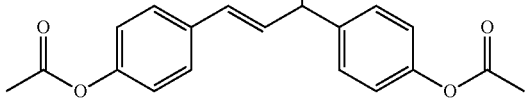 | 4.14 | Dye polymer IV | Resin 1 | 3 | 2 |
| Example 5 | C$_6$H$_{13}$SH | 2.63 | Dye polymer V | Resin 1 | 3 | 3 |
| Example 6 | 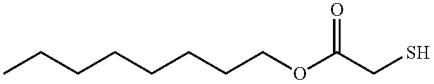 | 3.00 | Dye polymer VI | Resin 1 | 4 | 3 |
| Example 7 | 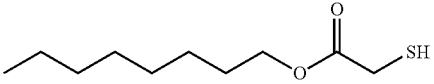 | 3.00 | Dye polymer VIII | Resin 1 | 5 | 4 |
| Example 8 | 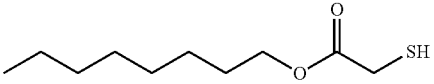 | 3.00 | Dye polymer I | Resin 2 | 4 | 3 |
| Example 9 | 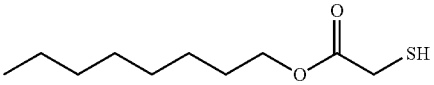 | 3.00 | Dye polymer I | Resin 3 | 4 | 4 |
| Example 10 | 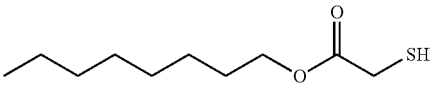 | 3.00 | Dye polymer I | Resin 4 | 5 | 4 |
| Example 11 | 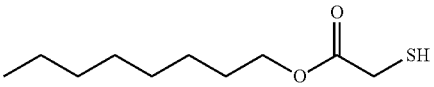 | 3.00 | Dye polymer VIII | Resin 4 | 5 | 4 |
| Example 12 | 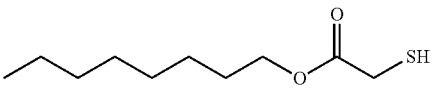 | 3.00 | Dye polymer I | Disperbyk-111 (manufactured by BYK Chemie) | 5 | 4 |
| Comparative Example 1 | C$_{12}$H$_{25}$SH | 5.14 | Dye polymer IX | Resin 1 | 2 | 1 |
| Comparative Example 2 | C$_{18}$H$_{37}$SH | 7.64 | Dye polymer X | Resin 1 | 1 | 1 |
| Comparative Example 3 | 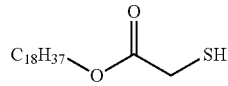 | 7.17 | Dye polymer XI | Resin 1 | 1 | 1 |

As apparent from Table 1, color patterns formed from the radiation-sensitive colored composition of the present invention exhibited inhibited color unevenness. Also, as can be seen from the fact that development residues could, be not seen, a development property was superior.

It can be seen from Examples 1 to 3 that, as hydrophilicity of the chain-transfer agent increases, inhibition effect of color unevenness improves.

Also, comparing Example 1 and Example 5 and Example 7 and Example 11, specific dye polymers having superior terminal hydrophilicity and smaller weight average molecular weight were superior in compatibility with a dispersant, permeability of a developing solution through hydrophilicity, inhibition effect of color unevenness, and an improvement effect on a development property.

EXAMPLES 13 TO 18

A solid-state imaging device color pattern was formed in the same manner as in Example 1 except that the dye polymers and the resins used in Example 1 were changed to those described in the following Table 2. The color patterns thus obtained were evaluated in the same manner as in Example 1. The results are described in the following Table 2.

TABLE 2

| | Type of chain transfer agent | LogP | Polymer structure | Resin | Color unevenness | Development property |
|---|---|---|---|---|---|---|
| Example 13 | 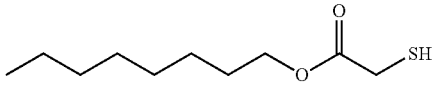 | 3.00 | Dye polymer XII | Resin 1 | 5 | 4 |
| Example 14 | 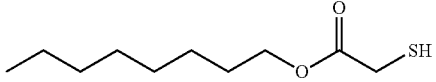 | 3.00 | Dye polymer XIII | Resin 1 | 5 | 4 |
| Example 15 | 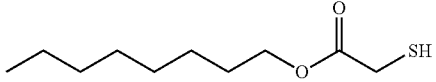 | 3.00 | Dye polymer XIV | Resin 1 | 5 | 4 |
| Example 16 | 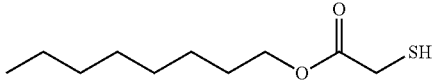 | 3.00 | Dye polymer XV | Resin 1 | 5 | 4 |
| Example 17 | 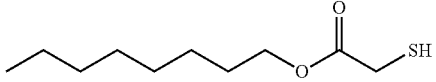 | 3.00 | Dye polymer XVI | Resin 1 | 5 | 4 |
| Example 18 | 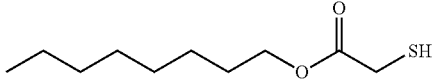 | 3.00 | Dye polymer XVII | Resin 1 | 5 | 4 |

As apparent from Table 2, color patterns formed from the radiation-sensitive colored composition of the present invention exhibited inhibited color unevenness. Also, as can be seen from the fact that development residues could be not seen, a development property was superior.

As can be confirmed from the fore-going, although dye skeletons contained in dye polymers were changed, the radiation-sensitive colored composition of the present invention exhibited superior effects.

EXAMPLE 19

<Production of Color Filters>

A mixed solution consisting of 40 parts of the following pigment, 50 parts of Disperbyk-161 as a dispersant (manufactured by BYK, 30% solution), and 110 parts of PGMEA as a solvent were mixed and dispersed with a bead mill for 15 hours, to prepare pigment dispersions (P-2) and (P-3).

Pigment Used as P-2:
  Pigment Red 254:Pigment Red 177=7:3
Pigment Used as P-3:
  Pigment Green 36:Pigment Yellow 150=7:3

Coating solutions of radiation-sensitive colored composition R-2 or R-3 were prepared by stirring and mixing the dispersed pigment dispersions (P-2) or (P-3) under the following composition ratio.

| | |
|---|---|
| Coloring agent (pigment dispersions (P-2) or (P-3)) | 350 parts |
| Polymerization initiator (oxime-based photopolymerization initiator) (IRGACURE OXE01, manufactured by BASF) | 30 parts |
| TO-1382(manufactured by Toagosei Co., Ltd.)) (polymerizable compound, manufactured by Toagosei Co., Ltd., carboxyl group-containing tetrafunctional acrylate) | 25 parts |
| KAYARAD DPHA (manufactured by Nippon Kayaku Co., Ltd.) | 30 parts |
| Resin (30% PGMEA solution of benzyl methacrylate/methacrylic acid/copolymer(molar ratio = 70/30, weight average molecular weight 30000)) | 0.4 parts |
| Solvent (PGMEA) | 200 parts |
| Substrate adhesive (3-methacryloxypropyltrimethoxysilane) | 1 part |

A red (R) color pattern with a size of 1.6×1.6 μm was formed on a wafer using the radiation-sensitive colored composition R-2 for red (R). Also, chromatic color patterns such as a green (G) color pattern with a size of 1.6×1.6 μm and a blue (B) color pattern with a size of 1.6×1.6 μm were sequentially formed in the same manner as above using the radiation-sensitive colored composition R-3 for red (G) and the radiation-sensitive colored composition for blue (B), respectively, to form a color filter for solid-state imaging devices.

-Evaluation-

It was confirmed that the solid-state imaging device provided with the full-color color filters exhibited high resolution and superior color separation property.

-Production of Color Filters for Liquid Crystal Display Apparatuses-

A red (R) color pattern with a size of 80×80 μm was formed on a black matrix in the same manner as in Example 1 using the radiation-sensitive colored composition R-2 for red (R). Also, chromatic color patterns such as a green (G) color pattern and a blue (B) color pattern were sequentially formed in the same manner as above using the radiation-sensitive colored composition R-2 for red (G) and the radiation-sensitive colored composition R-1 for blue (B), respectively, to form a color filter for solid-state imaging devices.

—Evaluation—

An ITO transparent electrode, an orientation film and the like were processed on a full-color color filter to provide a liquid crystal display apparatus. The radiation-sensitive colored composition of the present invention exhibited superior coated surface uniformity and the liquid crystal display apparatus does not have display color unevenness and exhibit superior image qualities.

As apparent from the fore-going, the radiation-sensitive colored composition of the present invention enables formation of color patterns that have little color unevenness and superior development property.

What is claimed is:

1. A radiation-sensitive colored composition comprising:
   (A) a dye polymer containing a structural unit having a dye structure polymerized using a chain-transfer agent having a LogP value of 5 or less; and
   (B) a solvent.

2. The radiation-sensitive colored composition according to claim 1, wherein the chain-transfer agent having a LogP value of 5 or less is an alkyl mercaptan.

3. The radiation-sensitive colored composition according to claim 1, wherein the chain-transfer agent having a LogP value of 5 or less is an alkyl mercaptan having 10 or less carbon atoms.

4. The radiation-sensitive colored composition according to claim 1, wherein the chain-transfer agent having a LogP value of 5 or less is an alkyl mercaptan having at least one structure selected from an ester structure, and an ether structure in the molecule.

5. The radiation-sensitive colored composition according to claim 1, wherein the dye structure is derived from a dipyrromethane metal complex compound or a tautomer of the dipyrromethane metal complex compound obtained from a dipyrromethane compound represented by formula (III) and a metal or metal compound Formula (III)

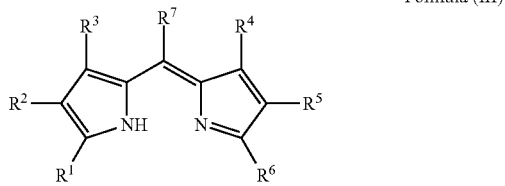

[in formula (III), $R^1$, $R^2$, $R^3$, $R^4$, $R^5$, and $R^6$ each independently represent a hydrogen atom or a monovalent substituent group, $R^7$ represents a hydrogen atom, a halogen atom, an alkyl group, an aryl group or a heterocyclic group, $R^1$ and $R^6$ are not bonded together to form a ring].

6. The radiation-sensitive colored composition according to claim 1, further comprising (C) a polymer having a different structure from (A) the dye polymer.

7. The radiation-sensitive colored composition according to claim 6, wherein (C) the polymer having a different structure from (A) is a pigment dispersant.

8. The radiation-sensitive colored composition according to claim 1, further comprising (D) a pigment.

9. The radiation-sensitive colored composition according to claim 1, further comprising (E) a polymerizable compound and (F) a polymerization initiator.

10. A color filter having a color pattern, formed on a substrate using the radiation-sensitive colored composition according to claim 1.

11. A solid-state imaging device comprising the color filter according to claim 10.

12. A liquid crystal display apparatus comprising the color filter according to claim 10.

13. A method for producing a color pattern comprising:
   applying the radiation-sensitive colored composition according to claim 1 to a support to form a radiation-sensitive colored layer;
   exposing the formed radiation-sensitive colored layer; and
   developing the radiation-sensitive colored layer after exposure to remove a non-exposed region.

14. A method for producing a color filter comprising:
   applying a radiation-sensitive colored composition according to claim 1 to a substrate to form a radiation-sensitive colored layer;
   exposing the formed radiation-sensitive colored layer; and
   developing the radiation-sensitive colored layer after exposure to remove a non-exposed region.

* * * * *